(12) United States Patent
Fujita et al.

(10) Patent No.: US 9,720,319 B2
(45) Date of Patent: Aug. 1, 2017

(54) COLORED COMPOSITION, CURED FILM, COLOR FILTER, METHOD FOR MANUFACTURING COLOR FILTER, SOLID-STATE IMAGING ELEMENT, IMAGE DISPLAY DEVICE, AND COMPOUND

(71) Applicant: FUJIFILM Corporation, Tokyo (JP)

(72) Inventors: Akinori Fujita, Fujinomiya (JP);
Satoshi Higuchi, Fujinomiya (JP);
Takashi Katoh, Fujinomiya (JP);
Yasuhiro Ishiwata, Fujinomiya (JP);
Koutaro Okabe, Fujinomiya (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/083,644

(22) Filed: Mar. 29, 2016

(65) Prior Publication Data
US 2016/0216604 A1 Jul. 28, 2016

Related U.S. Application Data

(63) Continuation of application No. PCT/JP2014/075349, filed on Sep. 25, 2014.

(30) Foreign Application Priority Data

Sep. 30, 2013 (JP) .................. 2013-204059
Dec. 19, 2013 (JP) .................. 2013-262312
Aug. 12, 2014 (JP) .................. 2014-164405

(51) Int. Cl.
*G02B 5/23* (2006.01)
*G03F 7/00* (2006.01)
(Continued)

(52) U.S. Cl.
CPC .............. *G03F 7/0007* (2013.01); *C08F 2/44* (2013.01); *C08F 220/34* (2013.01);
(Continued)

(58) Field of Classification Search
CPC .......... G03F 7/0007; G03F 7/028; G03F 7/20; G03F 7/32; C08F 226/02; C09B 69/103; G02B 5/20
(Continued)

(56) References Cited

U.S. PATENT DOCUMENTS 5,788,914 A   8/1998  Oi et al.
7,740,995 B2  6/2010  Aizawa et al.
(Continued)

FOREIGN PATENT DOCUMENTS

JP     6-75375 A    3/1994
JP     9-157536 A   6/1997
(Continued)

OTHER PUBLICATIONS

International Preliminary Report on Patentability issued from the International Bureau in counterpart International Application No. PCT/JP2014/075349, mailed on Apr. 14, 2016.
(Continued)

*Primary Examiner* — Bijan Ahvazi
(74) *Attorney, Agent, or Firm* — Sughrue Mion, PLLC

(57) ABSTRACT

Provided are a colored composition having excellent heat resistance, excellent solvent resistance, and an excellent voltage holding ratio; a cured film; a color filter; a method for manufacturing a color filter; a solid-state imaging element; an image display device; and a compound. The colored composition includes a colorant comprising a repeating unit having a triarylmethane structure containing a cation, and a counter anion, and a polymerizable compound.

25 Claims, 1 Drawing Sheet

(51) Int. Cl.

| | | |
|---|---|---|
| *C08F 2/44* | (2006.01) | |
| *C08F 220/34* | (2006.01) | |
| *G03F 7/033* | (2006.01) | |
| *G03F 7/038* | (2006.01) | |
| *G03F 7/105* | (2006.01) | |
| *C09B 11/12* | (2006.01) | |
| *C09B 69/10* | (2006.01) | |
| *G02B 5/22* | (2006.01) | |
| *C08F 226/02* | (2006.01) | |
| *G02B 5/20* | (2006.01) | |
| *G03F 7/028* | (2006.01) | |
| *G03F 7/20* | (2006.01) | |
| *G03F 7/32* | (2006.01) | |
| *G02F 1/1335* | (2006.01) | |
| *G03F 1/00* | (2012.01) | |
| *C08F 222/10* | (2006.01) | |

(52) U.S. Cl.
CPC ............ *C08F 226/02* (2013.01); *C09B 11/12* (2013.01); *C09B 69/103* (2013.01); *G02B 5/20* (2013.01); *G02B 5/223* (2013.01); *G03F 7/028* (2013.01); *G03F 7/033* (2013.01); *G03F 7/0388* (2013.01); *G03F 7/105* (2013.01); *G03F 7/20* (2013.01); *G03F 7/32* (2013.01); *C08F 222/1006* (2013.01)

(58) Field of Classification Search
USPC ................... 252/586; 349/106; 430/7, 281.1; 552/110
See application file for complete search history.

(56) References Cited

U.S. PATENT DOCUMENTS

| | | |
|---|---|---|
| 8,197,994 B2 | 6/2012 | Mizukawa et al. |
| 8,367,282 B2 | 2/2013 | Mizukawa et al. |
| 8,779,159 B2 | 7/2014 | Mizukawa et al. |
| 2007/0037076 A1 | 2/2007 | Aizawa et al. |
| 2008/0076044 A1 | 3/2008 | Mizukawa et al. |
| 2010/0230647 A1 | 9/2010 | Mizukawa et al. |
| 2010/0317819 A1 | 12/2010 | De Keyzer et al. |
| 2012/0138877 A1 | 6/2012 | Mizukawa et al. |
| 2012/0238752 A1 | 9/2012 | Mizukawa et al. |
| 2013/0141810 A1 | 6/2013 | Lee et al. |
| 2016/0062235 A1 | 3/2016 | Itou et al. |

FOREIGN PATENT DOCUMENTS

| | | | | |
|---|---|---|---|---|
| JP | 2000-95805 A | | 4/2000 | |
| JP | 2001-124919 | * | 5/2001 | ............... G02B 5/20 |
| JP | 2001-124919 A | | 5/2001 | |
| JP | 2007-39478 A | | 2/2007 | |
| JP | 2008-292970 A | | 12/2008 | |
| JP | 2010-520508 A | | 6/2010 | |
| JP | 2011-227408 A | | 11/2011 | |
| JP | 2012-073291 A | | 4/2012 | |
| JP | 2012-083652 A | | 4/2012 | |
| JP | 2012-108469 A | | 6/2012 | |
| JP | 2012-194466 A | | 10/2012 | |
| JP | 2012-201694 A | | 10/2012 | |
| JP | 2013-010814 | * | 1/2013 | ............. C09B 69/10 |
| JP | 2013-10814 A | | 1/2013 | |
| JP | 2013-25194 A | | 2/2013 | |
| WO | 2014/181834 A1 | | 11/2014 | |

OTHER PUBLICATIONS

Office Action dated Oct. 25, 2016, from the Japanese Patent Office in counterpart Japanese Application No. 2014-188517.
Office Action dated Oct. 10, 2016, from the State Intellectual Property Office of People's Republic of China in counterpart Chinese Application No. 201480053273.0.
International Search Report for PCT/JP2014/075349 dated Dec. 22, 2014 [PCT/ISA/210].
Written Opinion for PCT/JP2014/075349 dated Dec. 22, 2014 [PCT/ISA/237].

* cited by examiner

COLORED COMPOSITION, CURED FILM, COLOR FILTER, METHOD FOR MANUFACTURING COLOR FILTER, SOLID-STATE IMAGING ELEMENT, IMAGE DISPLAY DEVICE, AND COMPOUND

CROSS-REFERENCE TO RELATED APPLICATIONS

This application is a Continuation of PCT International Application No. PCT/JP2014/075349 filed on Sep. 25, 2014, which claims priority under 35 U.S.C §119(a) to Japanese Patent Application No. 2013-204059 filed on Sep. 30, 2013, Japanese Patent Application No. 2013-262312 filed on Dec. 19, 2013 and Japanese Patent Application No. 2014-164405 filed on Aug. 12, 2014. Each of the above application(s) is hereby expressly incorporated by reference, in its entirety, into the present application.

BACKGROUND OF THE INVENTION

1. Field of the Invention

The present invention relates to a colored composition, a cured film, a color filter, a method for manufacturing a color filter, a solid-state imaging element, an image display device, and a compound.

2. Description of the Related Art

In the related art, color filters have been manufactured by producing a colored composition including a pigment dispersion composition obtained by dispersing an organic pigment or an inorganic pigment, a polyfunctional monomer, a polymerization initiator, an alkali-soluble resin, and as desired, other components, and forming a colored pattern using the colored composition in accordance with photolithography, an ink jet method, or the like.

Recently, there is a trend toward more utilization of color filters not only in monitors but also in televisions (TVs) in the application to liquid crystal display elements (LCDs). With the trend of this expanding utilization, color filters are required to have high-grade color characteristics in terms of chromaticity, contrast, or the like. Further, with regard to color filters for use in image sensors (solid-state imaging elements), there has been a demand for further improvement in color characteristics such as reduction in color unevenness or improvement of chromatic resolving power.

However, color filters using pigment dispersion systems in the related art tend to cause problems such as occurrence of scattering due to coarse particles of a pigment or an increase in viscosity due to poor dispersion stability, and thus, it is often difficult to further improve contrast and brightness.

Therefore, not only the use of a pigment but also the use of a dye as a colorant has been studied from the related art (see, for example, JP1994-75375A (JP-H06-75375A)). It is considered that the use of a dye as a colorant is useful since the hue or brightness of the display image in displaying an image can be improved due to the color purity of the dye itself or the vividness of its hue, and also the contrast can be improved because of nonexistence of coarse particles.

As examples of the dye, compounds having various kinds of colorant bases such as a phthalocyanine dye, a dipyrromethene dye, a pyrimidine azo dye, a pyrazole azo dye, a xanthene dye, and a triarylmethane dye are known (see, for example, JP2008-292970A, JP2007-039478A, JP1997-157536A (JP-H09-157536A), JP2013-25194A, JP2012-201694A, JP2012-108469A, and JP2000-095805A).

An example of related art includes US2013/141810A.

SUMMARY OF THE INVENTION

Here, as a colored composition used for a color filter or the like, those having more excellent heat resistance, excellent solvent resistance, and an excellent voltage holding ratio are required.

The present invention aims to solve such the problems and has an object to provide a colored composition having excellent heat resistance, excellent solvent resistance, and an excellent voltage holding ratio. In particular, the present invention has an object to provide a colored composition which is useful as a colored composition for a blue filter.

The present inventors have conducted extensive studies, and as a result, they have found that it is possible to solve the problems by blending a colorant comprising a repeating unit having a triarylmethane structure containing a cation, and a counter anion into a composition.

Specifically, the problems were solved by the following means <1>, and preferably by <2> to <21>.

<1> A colored composition including a colorant comprising a repeating unit having a triarylmethane structure containing a cation, and a counter anion, and a polymerizable compound, in which the triarylmethane structure containing a cation is represented by General Formula (TP1) and/or General Formula (TP2):

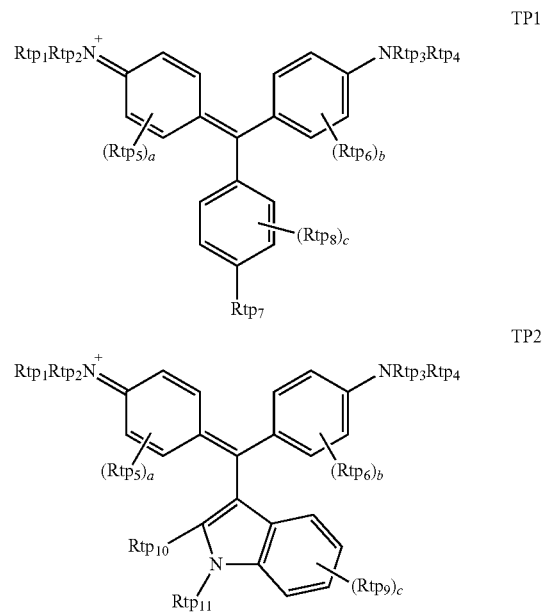

(in General Formulae (TP1) and (TP2), $Rtp_1$ to $Rtp_4$ each independently represent a hydrogen atom, an alkyl group, or an aryl group; $Rtp_5$, $Rtp_6$, $Rtp_8$, $Rtp_9$, and $Rtp_{11}$ each independently represent a substituent; $Rtp_7$ represents a hydrogen atom, an alkyl group, an aryl group, or $NRtp_{71}Rtp_{72}$; $Rtp_{71}$ and $Rtp_{72}$ each independently represent a hydrogen atom, an alkyl group, or an aryl group; $Rtp_{10}$ represents a hydrogen atom, an alkyl group, or an aryl group; a, b, and c each independently represent an integer of 0 to 4; in the case where a, b, and c are 2 or more, two of $Rtp_5$, $Rtp_6$, and $Rtp_8$ may be bonded to each other to form a ring; and any one of $Rtp_1$ to $Rtp_{11}$, $Rtp_{71}$, and $Rtp_{72}$ represents a site for binding to the repeating unit).

<2> The colored composition as described in <1>, in which the counter anion is selected from:

at least one selected from a fluorine anion, a chlorine anion, a bromine anion, an iodine anion, a cyanide ion, a perchloric acid anion, a borate anion, $PF_6^-$, and $SbF_6^-$, and at least one selected from $—SO_3^-$, $—COO^-$, $—PO_4^-$, a structure represented by the following General Formula (A1), and a structure represented by the following General Formula (A2), General Formula (A1)

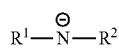

(in General Formula (A1), $R^1$ and $R^2$ each independently represent $—SO_2—$ or $—CO—$)

General Formula (A2), and

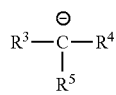

(in General Formula (A2), $R^3$ represents or $—CO—$; and $R^4$ and $R^5$ each independently represent $—SO_2—$, $—CO—$, or $—CN$).

<3> The colored composition as described in <1> or <2>, in which the triarylmethane structure containing a cation is represented by the following General Formula (TP3):

TP3

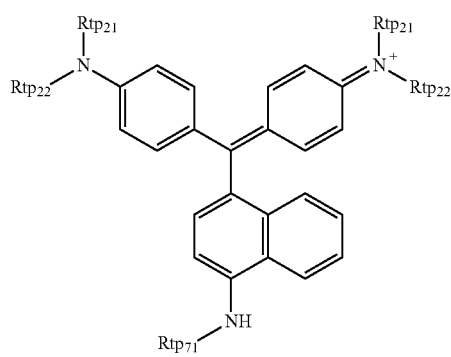

(in General Formula (TP3), $Rtp_{21}$ represents a hydrogen atom or an alkyl group having 1 to 6 carbon atoms, $Rtp_{22}$ represents an aryl group having 6 to 10 carbon atoms, and $Rtp_{71}$ represents an alkyl group or an aryl group; and any one of $Rtp_{21}$, $Rtp_{22}$, and $Rtp_{71}$ represents a site for binding to the repeating unit).

<4> The colored composition as described in any one of <1> to <3>, in which the repeating unit having the triarylmethane structure containing a cation is represented by the following General Formula (TP3-1):

TP3-1

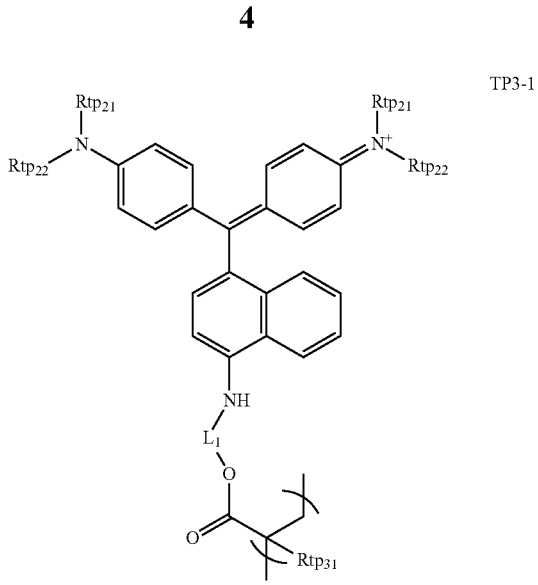

(in General Formula (TP3-1), $Rtp_{21}$'s each independently represent a hydrogen atom or an alkyl group having 1 to 6 carbon atoms, and $Rtp_{22}$'s each independently represent an aryl group having 6 to 10 carbon atoms; and $L_1$ represents a divalent linking group having 2 to 30 carbon atoms, and $Rtp_{31}$ represents a hydrogen atom or a methyl group).

<5> The colored composition as described in any one of <1> to <4>, in which the repeating unit having the triarylmethane structure containing a cation is represented by the following General Formula (TP3-2):

TP3-2

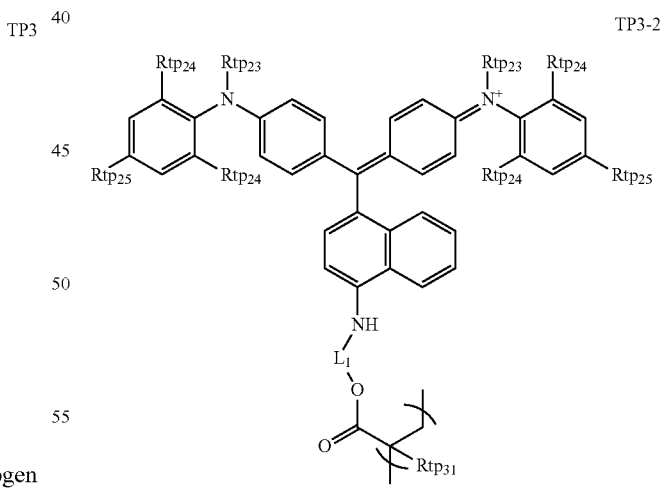

(in General Formula (TP3-2), $Rtp_{23}$ and $Rtp_{24}$ each independently represent an alkyl group having 1 to 4 carbon atoms and $Rtp_{25}$ represents a hydrogen atom or an alkyl group having 1 to 3 carbon atoms; $Rtp_{31}$ represents a hydrogen atom or a methyl group; and $L_1$ represents a divalent linking group).

<6> The colored composition as described in any one of <1> to <3>, in which the repeating unit having the triarylmethane structure containing a cation is represented by the following General Formula (TP4) or (TP5):

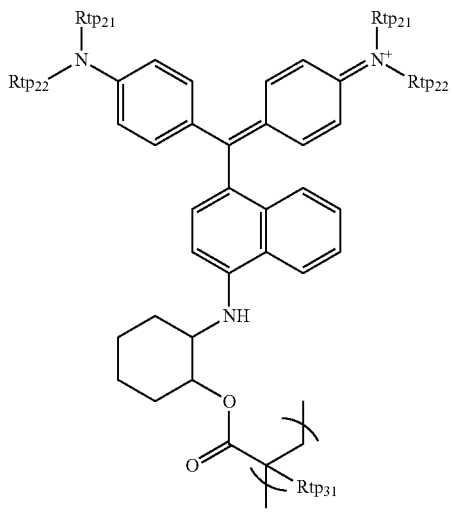

TP4

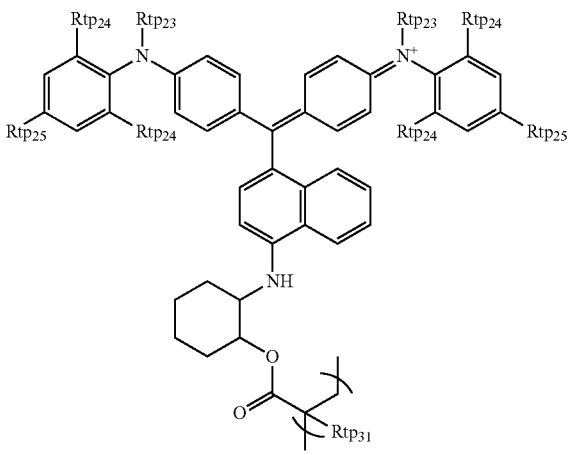

TP6

(in General Formula (TP6), $Rtp_{23}$ and $Rtp_{24}$ each independently represent an alkyl group having 1 to 4 carbon atoms and $Rtp_{25}$ represents a hydrogen atom or an alkyl group having 1 to 3 carbon atoms; and $Rtp_{31}$ represents a hydrogen atom or a methyl group).

<9> The colored composition as described in <8>, in which in General Formula (TP6), $Rtp_{31}$ is a methyl group.

<10> The colored composition as described in any one of <1> to <9>, in which the counter anion is a sulfonylimide anion, a sulfonylmethide anion, or a sulfonic acid anion.

<11> The colored composition as described in any one of <1> to <10>, further including a repeating unit derived from at least one of a (meth)acrylic acid, a (meth)acrylic acid ester, and a (meth)acrylic acid amide.

<12> The colored composition as described in any one of <1> to <11>, in which the counter anion is included in a compound containing a crosslinkable group.

<13> The colored composition as described in any one of <1> to <12>, in which the counter anion is included in the repeating unit.

<14> The colored composition as described in any one of <1> to <13>, further including at least one selected from a xanthene dye, a dipyrromethene metal complex compound, an oxazine pigment, and a phthalocyanine pigment.

<15> A colored composition including a colorant comprising a colorant comprising a repeating unit having a triarylmethane structure containing a cation, and a counter anion, and a polymerizable compound, in which the triarylmethane structure containing a cation is represented by General Formula (TP1A) or General Formula (TP2A):

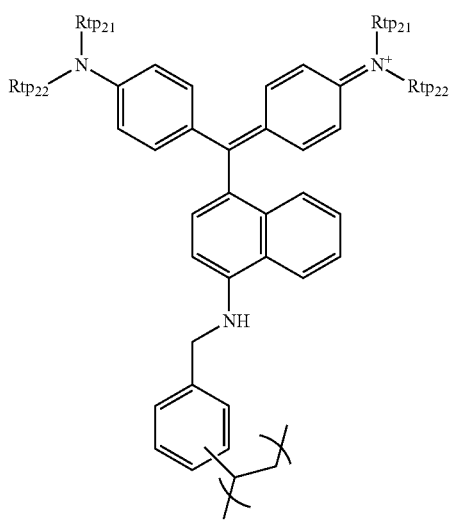

TP5

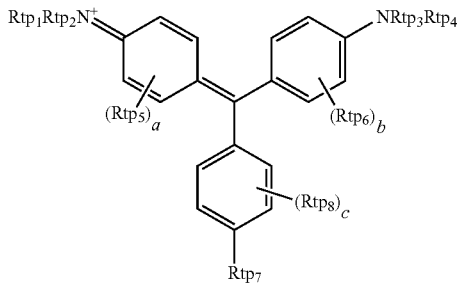

TP1A (in General Formulae (TP4) and (TP5), $Rtp_{21}$'s each independently represent a hydrogen atom or an alkyl group having 1 to 6 carbon atoms and $Rtp_{22}$'s each independently represent an aryl group having 6 to 10 carbon atoms; and $Rtp_{31}$ represents a hydrogen atom or a methyl group).

<7> The colored composition as described in <6>, in Which in General Formula (TP4), $Rtp_{31}$ is a methyl group.

<8> The colored composition as described in any one of <1> to <6>, in which the repeating unit having the triarylmethane structure containing a cation is represented by the following General Formula (TP6):

-continued

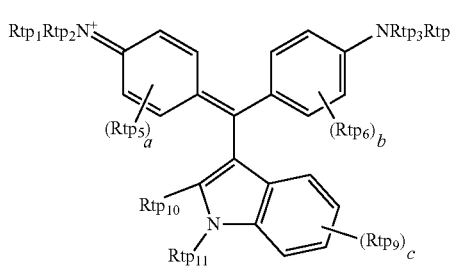

(in General Formulae (TP1A) and (TP2A), $Rtp_1$ to $Rtp_4$ each independently represent a hydrogen atom, an alkyl group, or an aryl group; $Rtp_5$, $Rtp_6$, $Rtp_8$, $Rtp_9$, and $Rtp_{11}$ each independently represent a substituent; $Rtp_7$ represents a hydrogen atom, an alkyl group, an aryl group, or $NRtp_{71}Rtp_{72}$; $Rtp_{71}$ and $Rtp_{72}$ each independently represent a hydrogen atom, an alkyl group, or an aryl group; $Rtp_{10}$ represents a hydrogen atom, an alkyl group, or an aryl group; a, b, and c each independently represent an integer of 0 to 4; in the case where a, b, and c are 2 or more, two of $Rtp_5$, $Rtp_6$, and $Rtp_8$ may be bonded to each other to form a ring; any one of $Rtp_1$ to $Rtp_{11}$, $Rtp_{71}$ and $Rtp_{72}$ represents a site for binding to the repeating unit; and at least one of $Rtp_1$ to $Rtp_{11}$, $Rtp_{71}$ and $Rtp_{72}$ may be substituted with General Formula (P)), General Formula (P)

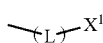

(in General Formula (P), L represents a single bond or a divalent linking group, $X^1$ is selected from $—SO_3^-$, $—COO^-$, $—PO_4^-$, and at least one selected, from a group including a structure represented by the following General Formula (A1) and a group including a structure represented by the following General Formula (A2)), General Formula (A1)

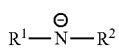

(in General Formula (A1), $R^1$ and $R^2$ each independently represent $—SO_2—$ or $—CO—$)

General Formula (A2)

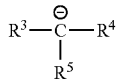

in General Formula (A2), $R^3$ represents $—SO_2—$ or $—CO—$; and $R^4$ and $R^5$ each independently represent $—SO_2—$, $—CO—$, or $—CN$)).

<16> The colored composition as described in any one of <1> to <15>, further including photopolymerization initiator.

<17% The colored composition as described in any one of <1> to <16%, further including bistrifluoromethanesulfonylimide lithium.

<18> The colored composition as described in any one of <1> to <17>, which is used for forming a colored layer of a color filter.

<19> A colored cured film obtained by curing the colored composition as described in any one of <1% to <18%.

<20> A color filter including the colored cured film as described in <19>.

<21> A method for manufacturing a color filter, including a step of applying the colored composition as described in any one of <1> to <18> onto a support to form a colored composition layer, a step of patternwise exposing the colored composition layer, and a step of removing an unexposed area by development to form a colored pattern.

<22> A method for manufacturing a color filter, including a step applying the colored composition as described in any one of <1> to <18> onto a support to form a colored composition layer, and curing the colored composition layer to form a colored layer, a step of forming a photoresist layer on the colored layer, a step of patterning the photoresist layer by exposure and development to obtain a resist pattern, and a step of dry-etching the colored layer using a resist pattern as an etching mask.

<23> A color filter manufactured by the method for manufacturing a color filter as described in <21> or <22>.

<24> A solid-state imaging element including the color filter as described in <20% or a color filter manufactured by the method for manufacturing a color filter as described in <21> or <22>.

<25> An image display device including the color filter as described in <20> or a color filter manufactured by the method for manufacturing a color filter as described in <21> or <22>.

<26> A compound represented by the following General Formula (TP7):

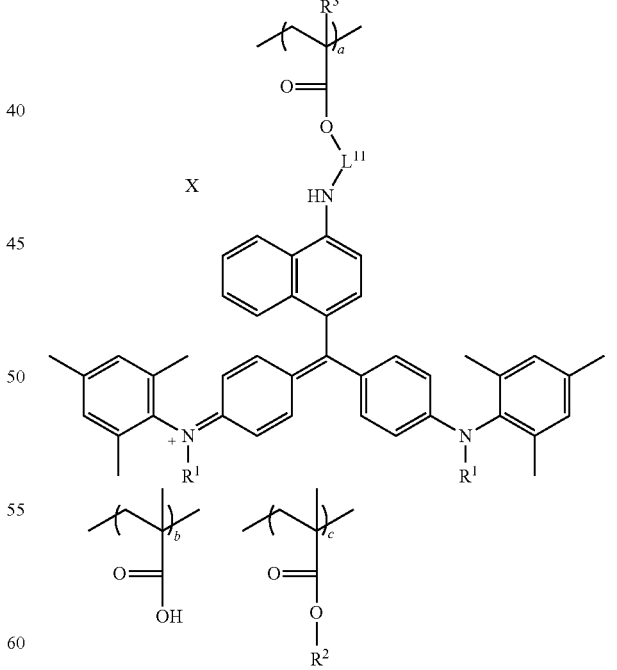

(in General Formula (TP7), $R^1$'s each independently represent a hydrogen atom or an alkyl group having 1 to 6 carbon atoms, $R^3$ represents a hydrogen atom or a methyl group, and $L^{11}$ represents a divalent linking group having 2 to 30 carbon atoms; $R^2$ represents a hydrocarbon group having 1 to 10 carbon atoms or a cyclic ether group having 3 to 10 carbon atoms; X represents a compound containing a sulfonylimide anion, a sulfonylmethide anion, or a sulfonic acid anion; and a, b, and c are the molar ratios of the repeating units, a represents a number of more than 0, and b and c each independently represent a number of 0 or more).

<27> The compound as described in <26>, represented by the following General Formula (TP8):

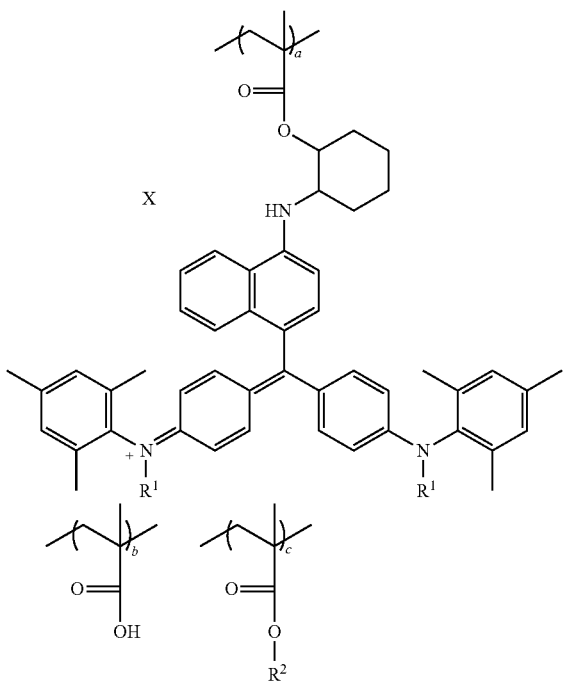

(in General Formula (TP8), $R^1$'s each independently represent a hydrogen atom or an alkyl group having 1 to 6 carbon atoms, and $R^2$ represents a hydrocarbon group having 1 to 10 carbon atoms or a cyclic ether group having 3 to 10 carbon atoms; X represents a compound containing a sulfonylimide anion, a sulfonylmethide anion, or a sulfonic acid anion; and a, b, and c are the molar ratios of the repeating units, a represents a number of more than 0, and b and c each independently represent a number of 0 or more).

According to the present invention, it is possible to provide a colored composition having excellent heat resistance, excellent solvent resistance, and an excellent voltage holding ratio.

DESCRIPTION OF THE PREFERRED EMBODIMENTS

Figure 1:
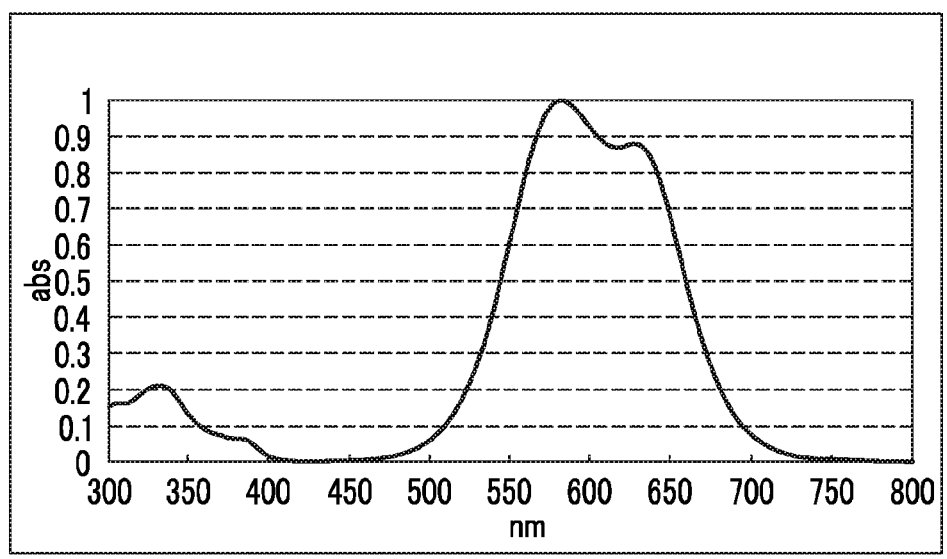
FIG. 1 is a view showing the absorption spectrum of a colorant D-40.

Hereinafter, the contents of the present invention will be described in detail. Further, in the present specification, a numeral value range represented by "(a value) to (a value)" means a range including the numeral values represented before and after the range as a lower limit value and an upper limit value, respectively.

In the present specification, the total solid content refers to the total mass of the components remaining when a solvent is excluded from the entire composition of a colored composition.

In citations for a group (atomic group) in the present specification, when the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

Furthermore, "radiation" in the present specification means, for example, a bright line spectrum of a mercury lamp, far ultraviolet rays represented by an excimer laser, extreme ultraviolet rays (EUV rays), X-rays, electron beams, or the like. In addition, in the present invention, light means actinic rays or radiation. "Exposure" in the present specification includes, unless otherwise specified, not only exposure by a mercury lamp, far ultraviolet rays represented by an excimer laser, X-rays, EUV rays, or the like, but also writing by particle rays such as electron beams and ion beams.

Furthermore, in the present specification, "(meth)acrylate" represents either or both of acrylate and methacrylate, "(meth)acryl." represents either or both of acryl and methacryl, and "(meth)acryloyl" represents either or both of acryloyl and methacryloyl.

In addition, in the present specification, a. "monomer material" and a "monomer" have the same definition. The monomer in the present specification refers to a compound which is distinguished from an oligomer or a polymer and has a weight average molecular weight of 2,000 or less. In the present specification, a polymerizable compound refers to a compound having a polymerizable functional group, and may be a monomer or a polymer. The polymerizable functional group refers to a group involved in a polymerization reaction.

In the formulae in the present specification, Me represents a methyl group, Et represents an ethyl group, Pr represents a propyl group, Bu represents a butyl group, and Ph represents a phenyl group.

In the present specification, a term "step" includes not only an independent step, but also steps which are not clearly distinguished from other steps if an intended action of the steps is obtained.

The weight average molecular weight in the present invention refers to a value as measured by gel permeation chromatography (GPC) unless otherwise specified. Measurement by GPC can be carried out by removing a solvent from a polymer obtained for isolation, diluting the isolated solid content to 0.1% by mass with tetrahydrofuran, and using three columns of TSK gel Super Multipore HZ-H (manufactured by Tosoh Corporation, 4.6 mm ID×15 cm) connected in series in HLC-8020GPC (manufactured by Tosoh Corporation). The measurement can be carried out under the conditions of a sample concentration of 0.35% by mass, a flow rate of 0.35 mL/min, a sample injection amount of 10 μL, and a measurement temperature of 40° C., using an RI detector.

<Colored Composition>

The colored composition of the present invention includes a colorant comprising a repeating unit having a triarylmethane structure containing a cation, and a counter anion, and a polymerizable compound.

By adopting such a configuration, it is possible to provide a colored composition having excellent heat resistance, excellent solvent resistance, and an excellent voltage holding ratio.

Hereinafter, with regard to a colorant, a first embodiment and a second embodiment will be described, in order.

The first embodiment is a case other than the second embodiment which will be described later. For example, a case where there is no covalent bond in the bonding portion in a triarylmethane structure containing a cation and a counter anion or a case where a counter anion is covalently bonded to a triarylmethane skeleton portion of a triarylmethane structure containing a cation through a repeating unit can be exemplified.

As the second embodiment, a case where a counter anion is partially covalently bonded to a triarylmethane skeleton portion of a triarylmethane structure containing a cation or a case where a counter anion is covalently bonded to a triarylmethane skeleton portion of a triarylmethane structure containing a cation through a linking group (excluding a repeating unit) can be exemplified.

First Embodiment of Colorant

Hereinafter, the triarylmethane structure containing a cation, other structures of a repeating unit, and other repeating units, and the counter anion in the repeating unit having the triarylmethane structure containing a cation will be described in order.

<<Triarylmethane Structure>>

The triarylmethane structure containing a cation is represented by the following General Formula (TP1) and/or General Formula (TP2).

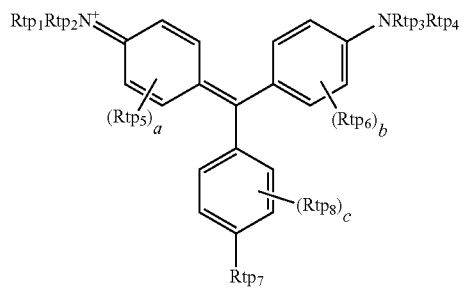

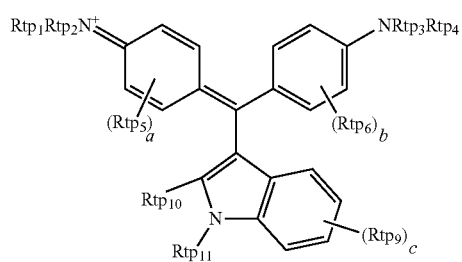

(In General Formulae (TP1) and (TP2), $Rtp_1$ to $Rtp_4$ each independently represent a hydrogen atom, an alkyl group, or an aryl group, $Rtp_5$, $Rtp_6$, $Rtp_8$, $Rtp_9$, and $Rtp_{11}$ each independently represent a substituent, $Rtp_7$ represents a hydrogen atom, an alkyl group, an aryl group, or $NRtp_{71}Rtp_{72}$, $Rtp_{71}$ and $Rtp_{72}$ each independently represent a hydrogen atom, an alkyl group, or an aryl group, $Rtp_{10}$ represents a hydrogen atom, an alkyl group, or an aryl group, a, b, and c each independently represent an integer of 0 to 4, and in the case where a, b, and c are 2 or more, two of $Rtp_5$, $Rtp_6$, and $Rtp_8$ may be bonded to each other to form a ring, and any one of $Rtp_1$ to $Rtp_{11}$, $Rtp_{71}$ and $Rtp_{72}$ represents a site for binding to the repeating unit).

In General Formula (TP1), $Rtp_1$ to $Rtp_4$ each independently represent a hydrogen atom, an alkyl group, or an aryl group, with the hydrogen atom or the alkyl group being preferable.

The alkyl group preferably has 1 to 10 carbon atoms, more preferably has 1 to 5 carbon atoms, and still more preferably has 1 to 3 carbon atoms. The alkyl group may be in any one type of linear, branched, and cyclic forms, with the linear or branched form being preferable. The alkyl group is preferably unsubstituted. Examples of the substituent include the substituents exemplified in the section of the substituent group A which will be described later.

The aryl group preferably has 6 to 18 carbon atoms, more preferably has 6 to 12 carbon atoms, and still more preferably has 6 carbon atoms. Examples of the substituent Which the aryl group may have include the substituents exemplified in the section of the substituent group A which will be described later.

In General Formula (TP1), $Rtp_7$ represents a hydrogen atom, an alkyl group, an aryl group, or $NRtp_{71}Rtp_{72}$, with the hydrogen atom or $NRtp_{71}Rtp_{72}$ being preferable, and $NRtp_{71}Rtp_{72}$ being more preferable.

The alkyl group preferably has 1 to 10 carbon atoms, more preferably has 1 to 5 carbon atoms, and still more preferably has 1 to 3 carbon atoms. The alkyl group may be in any one type of linear, branched, and cyclic forms, with the linear type being preferable. Examples of the substituent which the aryl group may have include the substituents exemplified in the section of the substituent group A Which will be described later. The aryl group preferably has 6 to 18 carbon atoms, more preferably has 6 to 12 carbon atoms, and still more preferably has 6 carbon atoms.

$Rtp_{71}$ and $Rtp_{72}$ each independently represent a hydrogen atom, an alkyl group, or an aryl group, with the hydrogen atom or the alkyl group being preferable.

The alkyl group preferably has 1 to 10 carbon atoms, more preferably has 1 to 8 carbon atoms, and still more preferably has 1 to 6 carbon atoms. The alkyl group may be in any one type of linear, branched, and cyclic forms. The alkyl group is preferably unsubstituted. Examples of the substituent which the aryl group may have include the substituents exemplified, in the section of the substituent group A Which will be described later. The aryl group preferably has 6 to 18 carbon atoms, more preferably has 6 to 12 carbon atoms, and still more preferably has 6 carbon atoms. Examples of the substituent which the aryl group may have include the substituents exemplified in the section of the substituent group A which will be described later.

In General Formula (TP1), $Rtp_5$, $Rtp_6$, and $Rtp_8$ each independently represent a substituent. Examples of the substituent include the substituents exemplified in the section of the substituent group A which will be described later. In particular, the substituent is preferably a linear or branched alkyl group having 1 to 5 carbon atoms, an alkenyl group having 1 to 5 carbon atoms, an aryl group having 6 to 15 carbon atoms, a carboxyl group, or a sulfo group, with the linear or branched alkyl group having 1 to 5 carbon atoms, the alkenyl group having 1 to 5 carbon atoms, the phenyl group, or the carboxyl group being more preferable. In particular, $Rtp_5$ and $Rtp_6$ are each independently preferably an alkyl group having 1 to 5 carbon atoms. Further, for $Rtp_5$, two alkenyl groups are preferably bonded to each other to form a ring. The ring is preferably a benzene ring.

In General Formula (TP1), a, b, and c each independently represent an integer of 0 to 4, and in particular, a and b preferably represent 0 or 1, and more preferably represent 0, and c preferably represents 0 to 2.

In General Formula (TP2), $Rtp_1$ to $Rtp_4$ each independently represent a hydrogen atom, an alkyl group, or an aryl group, and have the same definitions as $Rtp_1$ to $Rtp_4$ in General Formula (TP1), and preferred ranges thereof are the same.

In General Formula (TP2), $Rtp_5$ and $Rtp_6$ each independently represent a substituent and have the same definitions as $Rtp_5$ and $Rtp_6$ in General Formula (TP1), and preferred ranges thereof are the same.

In General Formula (TP2), $Rtp_9$ and $Rtp_{11}$ each independently represent a substituent, and as the substituent, the substituents exemplified in the section of the substituent group A which will be described later can be used.

$Rtp_9$ is preferably an aryl group, more preferably an aryl group having 6 to 12 carbon atoms, and still more preferably a phenyl group.

$Rtp_{11}$ is preferably an alkyl group, more preferably an alkyl group having 1 to 5 carbon atoms, and still more preferably an alkyl group having 1 to 3 carbon atoms. The alkyl group is preferably linear or branched, and more preferably linear.

In General Formula (TP2), $Rtp_{10}$ represents a substituent, and as the substituent, the substituents exemplified in the section of the substituent group A which will be described later can be used. In particular, $Rtp_{10}$ is preferably an aryl group having 6 to 12 carbon atoms, and more preferably a phenyl group.

In General Formula (TP2), a, b, and c each independently represent an integer of 0 to 4, and in particular, a and h preferably represent 0 or 1, and more preferably represent 0, and c preferably represents 0 to 2, and still preferably represents 0.

Any one of $Rtp_1$ to $Rtp_{11}$, $Rtp_{71}$ and $Rtp_{72}$ represents a site for bonding to the repeating unit, and in particular, $Rtp_{71}$ or $Rtp_{72}$ is preferably a site for bonding to the repeating unit.

The triarylmethane structure containing a cation is preferably represented by the following General Formula (TP3).

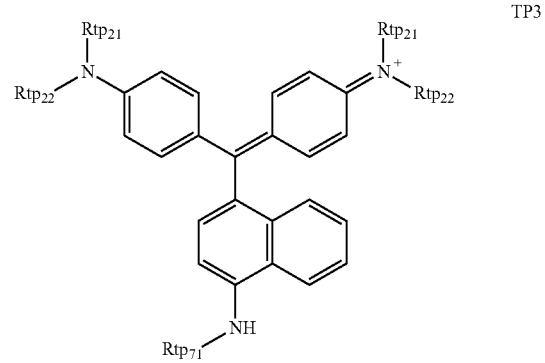

In Formula (TP3), $Rtp_{21}$ represents a hydrogen atom or an alkyl group having 1 to 6 carbon atoms, $Rtp_{22}$ represents an aryl group having 6 to 10 carbon atoms, and $Rtp_{71}$ represents a hydrogen atom, an alkyl group, or an aryl group; and any one of $Rtp_{21}$, $Rtp_{22}$, and $Rtp_{71}$ represents a site for bonding to the repeating unit.

In Formula (TP3), $Rtp_{21}$ is preferably an alkyl group having 1 to 6 carbon atoms. The alkyl group may be in any one type of linear, branched, and cyclic forms, with the linear type being preferable. The alkyl group has preferably has 1 to 4 carbon atoms, and more preferably has 1 to 3 carbon atoms. The substituent which the alkyl group may have include the substituents exemplified in the section of the substituent group A which will be described later. By adopting such a configuration, light fastness can further be improved.

In Formula (TP3), $Rtp_{21}$ represents an aryl group having 6 to 10 carbon atoms. $Rtp_{22}$ is preferably an an group having a substituent at at least an ortho position. The substituent which the aryl group may have include the substituents exemplified in the section of the substituent group A which will be described, later, with the alkyl group having 1 to 3 carbon atoms being preferable. By adopting such a configuration, heat resistance can further be improved.

$Rtp_{71}$ is preferably an alkyl group or an aryl group, with the alkyl group being preferable. The alkyl group may be in any one type of linear, branched, and cyclic forms, with the cyclic type being preferable. The alkyl group preferably has 1 to 8 carbon atoms, and more preferably has 1 to 6 carbon atoms. The aryl group preferably has 6 to 12 carbon atoms, and more preferably has 6 to 10 carbon atoms.

$Rtp_{21}$, any one of $Rtp_{22}$ and $Rtp_{71}$ represents a site for bonding to the repeating unit, and $Rtp_{71}$ is preferably a site for bonding to the repeating unit.

The triarylmethane structure containing a cation has the cation non-localized as follows, and thus, the following two kinds of structures have the same definitions, both of which are included in the present invention. Further, the cationic site may be at any position in the molecule.

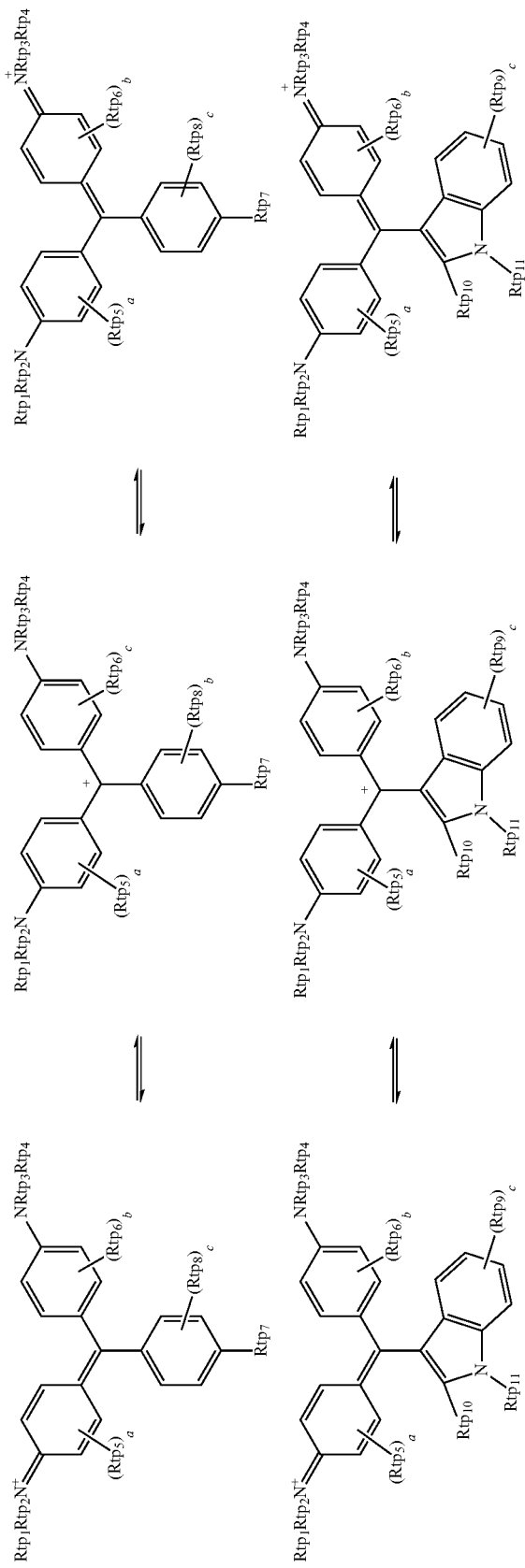

Substituent Group A:

Examples of the substituent include a halogen atom, an alkyl group, a cycloalkyl group, an alkenyl group, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an amino group (including an alkylamino group and an aniline group), an acylamino group, an aminocarbonylamino group, an alkoxycarbonylamino group, an aryloxycarbonylamino group, a sulfamoylamino group, an alkylsulfonylamino or arylsulfonylamino group, a mercapto group, an alkylthio group, an arylthio group, a heterocyclic thio group, a sulfamoyl group, a sulfo group, an alkylsulfinyl or arylsulfinyl group, an alkylsulfonyl or arylsulfonyl group, an acyl group, an aryloxycarbonyl group, an alkoxycarbonyl group, a carbamoyl group, an arylazo or heterocyclic azo group, an imide group, a phosphino group, a phosphinyl group, a phosphinyloxy group, a phosphinylamino group, and a silyl group. These will be described in detail below.

Examples of the substituent include a halogen atom (for example, a fluorine atom, a chlorine atom, a bromine atom, and an iodine atom), a linear or branched alkyl group (a linear or branched substituted or unsubstituted alkyl group, and preferably an alkyl group having 1 to 30 carbon atoms, for example, methyl, ethyl, n-propyl, isopropyl, tert-butyl, n-octyl, 2-chloroethyl, 2-cyanoethyl, and 2-ethylhexyl), a cycloalkyl group (preferably a substituted or unsubstituted cycloalkyl group having 3 to 30 carbon atoms, for example, cyclohexyl and cyclopentyl, or a polycycloalkyl group, for example, a group having a polycyclic structure such as a bicycloalkyl group (preferably a substituted or unsubstituted bicycloalkyl group having 5 to 30 carbon atoms, for example, bicyclo[1,2,2]heptan-2-yl and bicyclo[2,2,2]octan-3-yl), and a tricycloalkyl group. Among these, a monocyclic cycloalkyl group and a bicycloalkyl group are more preferable, and a monocyclic cycloalkyl group is particularly preferable), a linear or branched alkenyl group (a linear or branched substituted or unsubstituted alkenyl group, which is preferably an alkenyl group having 2 to 30 carbon atoms, for example, vinyl, allyl, prenyl, geranyl, and oleyl), a cycloalkenyl group (preferably a substituted or unsubstituted cycloalkenyl group having 3 to 30 carbon atoms, for example, 2-cyclopenten-1-yl and 2-cyclohexen-1-yl, a polycyclic alkenyl group, for example, a bicycloalkenyl group (which is preferably a substituted or unsubstituted bicycloalkenyl group having 5 to 30 carbon atoms, for example, bicyclo[2,2,1]hepto-2-en-1-yl and bicyclo[2,2,2]octo-2-en-4-yl), or a tricycloalkenyl group. Among these, a monocyclic cycloalkenyl group is particularly preferable), an alkynyl group (preferably a substituted or unsubstituted alkynyl group having 2 to 30 carbon atoms, for example, an ethynyl, a propargyl group, and a trimethylsilylethynyl group), an aryl group (preferably a substituted or unsubstituted aryl group having 6 to 30 carbon atoms, for example, phenyl, p-tolyl, naphthyl, m-chiorophenyl, and o-hexadecanoylaminophenyl), a heterocyclic group (preferably a substituted or unsubstituted, saturated or unsaturated, aromatic or non-aromatic, and monocyclic or ring-fused 5- to 7-membered heterocyclic group, more preferably a heterocyclic group of which ring-constituting atoms are selected from a carbon atom, a nitrogen atom, and a sulfur atom, and which has at least any one of hetero atoms including a nitrogen atom, an oxygen atom, and a sulfur atom, and still more preferably a 5- or 6-membered aromatic heterocyclic group having 3 to 30 carbon atoms, for example, 2-furyl, 2-pyridyl, 4-pyridyl, 2-pyrimidinyl, and 2-benzothiazolyl), a cyano group, a hydroxyl group, a nitro group, a carboxyl group, an alkoxy group (preferably a substituted or unsubstituted alkoxy group having 1 to 30 carbon atoms, for example, methoxy, ethoxy, isopropoxy, tert-butoxy, n-octyloxy, and 2-methoxyethoxy), an aryloxy group (preferably a substituted or unsubstituted aryloxy group having 6 to 30 carbon atoms, for example, phenoxy, 2-methylphenoxy, 2,4-di-tert-amylphenoxy, 4-tert-butylphenoxy, 3-nitrophenoxy, and 2-tetradecanoylaminophenoxy), a silyloxy group (preferably a silyloxy group having 3 to 20 carbon atoms, for example, trimethylsilyloxy and tert-butyldimethylsilyloxy), a heterocyclic oxy group (preferably a substituted or unsubstituted heterocyclic oxy group having 2 to 30 carbon atoms, in which a heterocyclic moiety is preferably the heterocyclic moiety explained for the aforementioned heterocyclic group, the heterocyclic oxy group is, for example, 1-phenyltetrazol-5-oxy or 2-tetrahydropyranyloxy), an acyloxy group (preferably a formyloxy group, a substituted or unsubstituted alkylcarbonyloxy group having 2 to 30 carbon atoms, and a substituted or unsubstituted arylcarbonyloxy group having 6 to 30 carbon atoms, for example, formyloxy, acetyloxy, pivaloyloxy, stearoyloxy, benzoyloxy, and p-methoxyphenylcarbonyloxy), a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholinocarbonyloxy. N,N-di-n-octylaminocarbonyloxy, and N-n-octylcarbamoyloxy), an alkoxycarbonyloxy group (preferably a substituted or unsubstituted alkoxycarbonyloxy group having 2 to 30 carbon atoms, for example, methoxycarbonyloxy, ethoxycarbonyloxy, tert-butoxycarbonyloxy, and n-octylcarbonyloxy), an aryloxycarbonyloxy group (preferably a substituted or unsubstituted aryloxycarbonyloxy group having 7 to 30 carbon atoms, for example, phenoxycarbonyloxy, p-methoxyphenoxycarbonyloxy, and p-n-hexadecyloxyphenoxycarbonyloxy), an amino group (preferably an amino group, a substituted or unsubstituted alkylamino group having 1 to 30 carbon atoms, a substituted or unsubstituted arylamino group having 6 to 30 carbon atoms, and a heterocyclic amino group having 0 to 30 carbon atoms, for example, amino, methylamino, dimethylamino, anilino, N-methyl-anilino, diphenylamino, and N-1,3,5-triazin-2-ylamino), an acylamino group (preferably a formylamino group, a substituted or unsubstituted alkylcarbonylamino group having 1 to 30 carbon atoms, and a substituted or unsubstituted arylcarhonylamino group having 6 to 30 carbon atoms, for example, formylamino, acetylamino, pivaloylamino, lauroylamino, benzoylamino, and 3,4,5-tri-n-octyloxyphenyl carbonylamino), an aminocarbonylamino group (preferably a substituted or unsubstituted aminocarbonylamino group having 1 to 30 carbon atoms, for example, carbamoylamino, N,N-dimethylaminocarbonylamino, N,N-diethylaminocarbonylamino, and morpholinocarbonylamino), an alkoxycarbonylamino group (preferably a substituted or unsubstituted alkoxycarbonylamino group having 2 to 30 carbon atoms, for example, methoxycarbonylamino, ethoxycarbonylamino, tert-butoxycarbonylamino, n-octadecyloxycarbonylamino, and N-methyl-methoxycarbonylamino), an aryloxycarbonylamino group (preferably a substituted or unsubstituted aryloxycarbonylamino group having 7 to 30 carbon atoms, for example, phenoxycarbonylamino, p-chlorophenoxycarbonylamino, and m-n-octyloxyphenoxycarbonylamino), a sulfamoylamino group (preferably a substituted or unsubstituted sulfamoylamino group having 0 to 30 carbon atoms, for example, sulfamoylamino, N,N-dimethylaminosulfonylamino, and N-n-octylaminosulfonylamino), an alkylsulfonylamino or arylsulfonylamino group (preferably a substituted or unsubstituted alkylsulfonylamino group having 1 to 30 carbon atoms, or a substituted or unsubstituted arylsulfonylamino group having 6 to 30 carbon atoms, for example, methylsulfonylamino, butylsulfonylamino, phenylsulfonylamino, 2,3,5-tri chlorophenylsulfonylamino, and p-methylphenylsulfonylamino), a mercapto group, an alkylthio group (preferably a substituted or unsubstituted alkylthio group having 1 to 30 carbon atoms, for example, methylthio, ethylthio, and n-hexadecylthio), an arylthio group (preferably a substituted or unsubstituted arylthio group having 6 to 30 carbon atoms, for example, phenylthio, p-chlorophenylthio, and m-methoxyphenylthio), a heterocyclic thio group (preferably a substituted or unsubstituted heterocyclic thio group having 2 to 30 carbon atoms, in which a heterocyclic moiety is preferably the heterocyclic moiety explained for the aforementioned heterocyclic group, for example, 2-benzothiazolylthio and 1-phenyltetrazol-5-ylthio), a sulfamoyl group (preferably a substituted or unsubstituted sulfamoyl group having 0 to 30 carbon atoms, for example, N-ethylsulfamoyl, N-(3-dodecyloxypropyl)sulfamoyl, N,N-dimethylsulfamoyl, N-acetylsulfamoyl, N-benzoylsulfamoyl, and N—(N'-phenylcarbamoyl)sulfamoyl), a sulfo group, an alkylsulfinyl or arylsulfinyl group (preferably a substituted or unsubstituted alkylsulfinyl group having 1 to 30 carbon atoms or a substituted or unsubstituted arylsulfinyl group having 6 to 30 carbon atoms, for example, methylsulfinyl, ethylsulfinyl, phenylsulfinyl, and p-methylphenylsulfinyl), an alkylsulfonyl or arylsulfonyl group (preferably a substituted or unsubstituted alkylsulfonyl group having 1 to 30 carbon atoms or a substituted or unsubstituted arylsulfonyl group having 6 to 30 carbon atoms, for example, methylsulfonyl, ethylsulfonyl, phenylsulfonyl, and p-methylphenylsulfonyl), an acyl group (preferably a formyl group, a substituted or unsubstituted alkyl carbonyl group having 2 to 30 carbon atoms, or a substituted or unsubstituted arylcarbonyl group having 7 to 30 carbon atoms, for example, acetyl, pivaloyl, 2-chloroacetyl, stearoyl, benzoyl, and p-n-octyloxyphenylcarbonyl), an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, and p-tert-butylphenoxycarbonyl), an alkoxycarbonyl group (preferably a substituted or unsubstituted alkoxycarbonyl group having 2 to 30 carbon atoms, for example, methoxycarbonyl, ethoxycarbonyl, tert-butoxycarbonyl, and n-octadecyloxycarbonyl), a carbamoyl group (preferably substituted or unsubstituted carbamoyl having 1 to 30 carbon atoms, for example, carbamoyl, N-methylcarbamoyl, N,N-dimethylcarbamoyl, N,N-di-n-octylcarbamoyl, and N-(methylsulfonyl)carbamoyl), an arylazo or heterocyclic azo group (preferably a substituted or unsubstituted arylazo group having 6 to 30 carbon atoms, or a substituted or unsubstituted heterocyclic azo group having 3 to 30 carbon atoms (in which a heterocyclic moiety is preferably the heterocyclic moiety explained for the aforementioned heterocyclic group), for example, phenylazo, p-chlorophenylazo, and 5-ethylthio-1,3,4-thiadiazol-2-ylazo), an imide group (preferably a substituted or unsubstituted imide group having 2 to 30 carbon atoms, for example, N-succinimide and N-phthalimide), a phosphino group (preferably a substituted or unsubstituted phosphino group having 2 to 30 carbon atoms, for example, dimethylphosphino, diphenylphosphino, and methylphenoxyphosphino), a phosphinyl group (preferably a substituted or unsubstituted phosphinyl group having 2 to 30 carbon atoms, for example, phosphinyl, dioctyloxyphosphinyl, and diethoxyphosphinyl), a phosphinyloxy group (preferably a substituted or unsubstituted phosphinyloxy group having 2 to 30 carbon atoms, for example, diphenoxyphosphinyloxy and dioctyloxyphosphinyloxy), a phosphinylamino group (preferably a substituted or unsubstituted phosphinylamino group having 2 to 30 carbon atoms, for example, dimethoxyphosphinylamino and dimethylaminophosphinylamino), and a silyl group (preferably a substituted or unsubstituted silyl group having 3 to 30 carbon atoms, for example, trimethylsilyl, tert-butyldimethylsilyl, and phenyldimethylsilyl).

As the substituent group A, a methyl group, an ethyl group, an n-propyl group, an n-butyl group, a chloro atom, and a methoxy group are particularly preferable.

<<Repeating Unit>>

Hereinafter, the repeating unit having the triarylmethane structure containing a cation will be described. The repeating unit having a triarylmethane structure containing a cation is preferably a structure represented by the following General Formula (A).

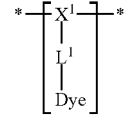

General Formula (A)

(in General Formula (A), $X^1$ represents the main chain of a repeating unit, $L^1$ represents a single bond or a divalent linking group, and Dye represents a triarylmethane structure containing a cation)

In General Formula (A), $X^1$ is preferably the main chain of a repeating unit, usually, the main chain derived from a compound having a linking group thrilled by a polymerization reaction, for example, a (meth)acryl group, a styrene group, a vinyl group, or an ether group. Further, an embodiment having an alkylene group of a cycle of the main chain is also preferable. Further. $X^1$ is bonded to other repeating units at two sites represented by *.

In the case where $L^1$ is represented by a divalent linking group, an alkylene group having 1 to 30 carbon atoms (a methylene group, an ethylene group, a trimethylene group, a propylene group, a butylene group, or the like), an arylene group having 6 to 30 carbon atoms (a phenylene group, a naphthalene group, or the like), a heterocyclic linking group, —CH=CH—, —O—, —S—, —C(=O)—, —CO—, —NR—, —CONR—, —OC—, —SO—, —SO$_2$— and a linking group formed by combination of two or more of these groups are preferable. Here, R's each independently represent a hydrogen atom, an alkyl group, an aryl group, or a heterocyclic group.

$L^1$ is preferably a single bond or an alkylene group having 1 to 30 carbon atoms (preferably an alkylene group having 1 to 10 carbon atoms, an alkylene group having 5 to 20 carbon atoms), and more preferably a divalent linking group formed by combination of two or more groups of —(CH$_2$)n- (n is an integer of 1 to 10), an arylene group having 6 to 12 carbon atoms (preferably a phenylene group or a naphthalene group), —NH—, —CO—, —O—, and —SO$_2$—. $L^1$ is particularly preferably —(CH$_2$)n- (n is preferably an integer of 5 to 10) or an arylene group having 6 to 12 carbon atoms (preferably a phenylene group or a naphthalene group).

In the case where $L^1$ represents a single bond, $X^1$ is bonded to any one of $Rtp_1$ to $Rtp_{11}$, $Rtp_{71}$ and $Rtp_{72}$ in General Formulae (TP1) and (TP2), and preferably bonded to $Rtp_{71}$ or $Rtp_{72}$.

In the case where $L^1$ represents a divalent linking group, $L^1$ is bonded to any one of $Rtp_1$ to $Rtp_{11}$, $Rtp_{71}$ and $Rtp_{72}$ in General Formulae (TP1) and (TP2), and preferably bonded to $Rtp_{71}$ or $Rtp_{72}$.

Specific examples of combination of $X^1$ and $L^1$ are shown below, but the present invention is not limited thereto.

Particularly, $X^1$ is preferably selected from (meth)acryl-based linking chains represented by (XX-1) and (XX-2), styrene-based linking chains represented by (XX-10) to (XX-17), and a vinyl-based linking chain represented by (XX-24), and more preferably selected from (meth)acryl-based linking chains represented by (XX-1) and (XX-2) and a styrene-based linking chain represented by (XX-11).

In (XX-1) to (XX-24), it is linked to the cation having triarylmethane structure at the site represented by *. Me represents a methyl group. Further, R in (XX-18) and (XX-19) represents a hydrogen atom, an alkyl group having 1 to 5 carbon atoms, or a phenyl group.

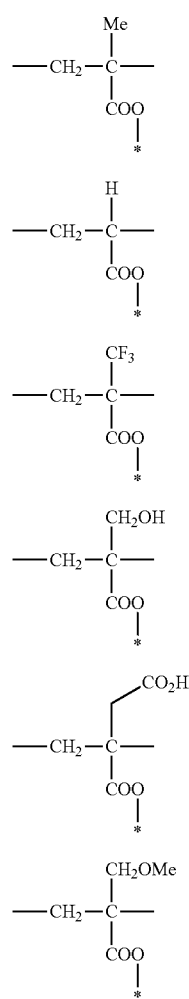

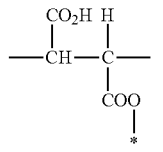

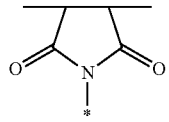

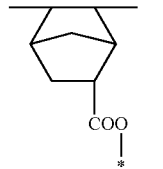

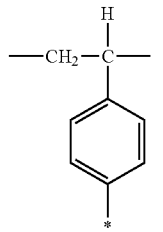

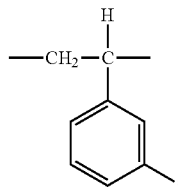

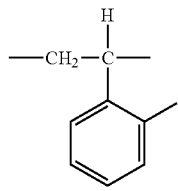

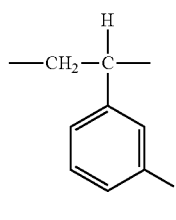

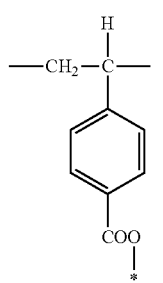

(XX-15) 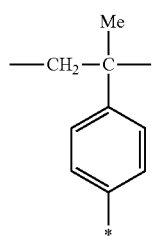
(XX-16) 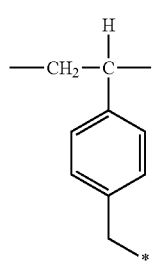
(XX-17) 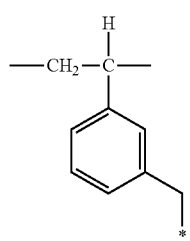
(XX-18) 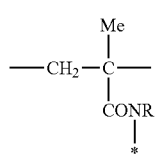
(XX-19) 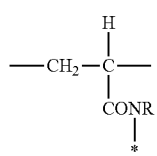
(XX-20) 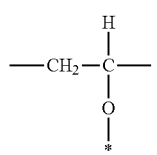
(XX-21) 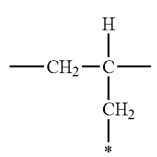
(XX-22) 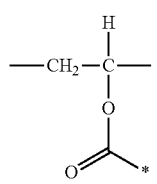
(XX-23) 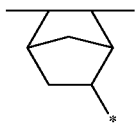
(XX-24) 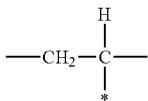
Furthermore, as specific examples of combination of $X^1$ and $L^1$, the following ones are also preferable. Among the following specific examples, n represents an integer of 1 to 9. Further, they are bonded with the cation having a triarylmethane structure at the site represented by *.
(XX-25) 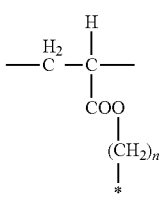
(XX-26) 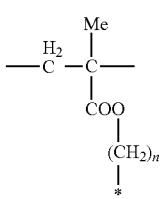
(XX-27) 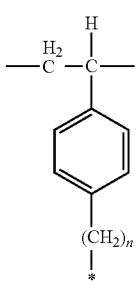
(XX-28) 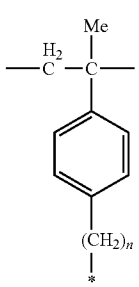

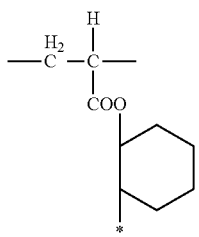

(XX-29)

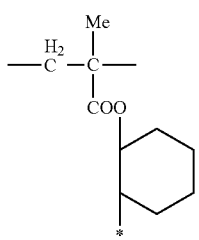

(XX-30)

The repeating unit having a triarylmethane structure containing a cation is preferably represented by the following General Formula (TP3-1).

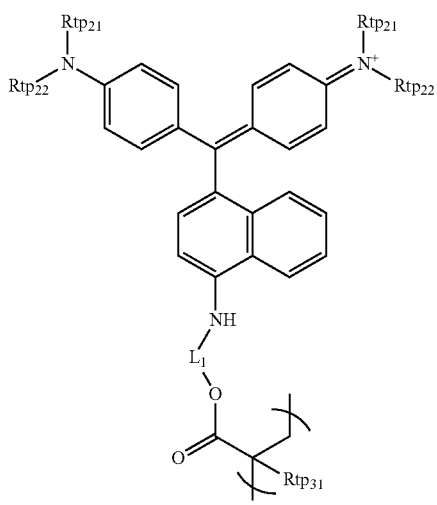

TP3-1

In General Formula (TP3-1), $Rtp_{21}$'s each independently represent a hydrogen atom or an alkyl group having 1 to 6 carbon atoms, and $Rtp_{22}$'s each independently represent an aryl group having 6 to 10 carbon atoms; and $L_1$ represents a divalent linking group having 2 to 30 carbon atoms, and $Rtp_{31}$ represents a hydrogen atom or a methyl group. $Rtp_{21}$ and $Rtp_{22}$ have the same definitions as $Rtp_{21}$ and $Rtp_{22}$ in Formula (TP3) as described above, and preferred ranges thereof are the same. $L_1$ has the same definition as $L^1$ in General Formula (A), and a preferred range thereof is the same.

Further, the repeating unit having the triarylmethane structure containing a cation is preferably represented by the following General Formula (TP3-2).

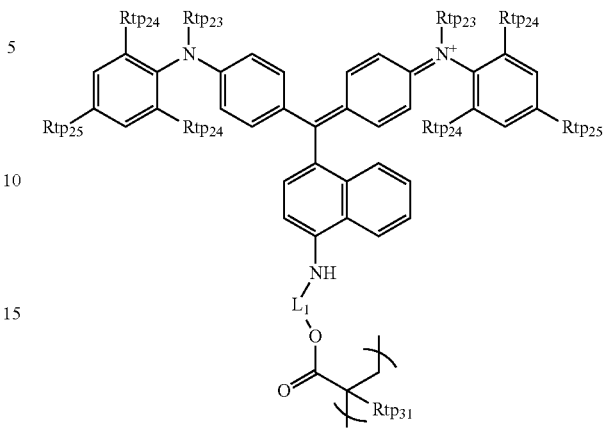

TP3-2

In General Formula (TP3-2), $Rtp_{23}$ and $Rtp_{24}$ each independently represent an alkyl group having 1 to 4 carbon atoms, and $Rtp_{25}$ represents a hydrogen atom or an alkyl group having 1 to 3 carbon atoms; $Rtp_{31}$ represents a hydrogen atom or a methyl group; and $L_1$ represents a divalent linking group.

$Rtp_{23}$'s are each independently preferably an alkyl group having 1 to 3 carbon atoms. The alkyl group is preferably linear.

$Rtp_{24}$'s are each independently preferably an alkyl group having 1 or 2 carbon atoms. In the case where $Rtp_{25}$ represents an alkyl group having 1 to 3 carbon atoms, the alkyl group preferably has 1 or 2 carbon atoms.

$L_1$ has the same definition as $L^1$ in General Formula (A) as described above, and a preferred range thereof is the same.

The repeating unit having a triarylmethane structure containing a cation is preferably represented by the following General Formula (TP4) or (TP5).

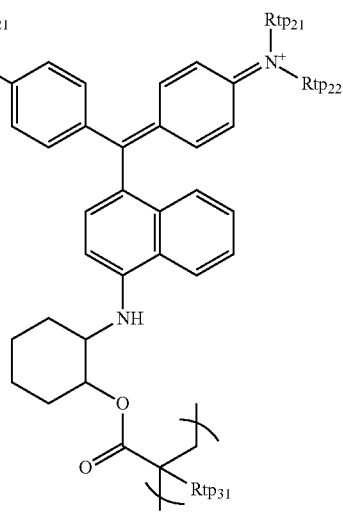

TP4

TP5

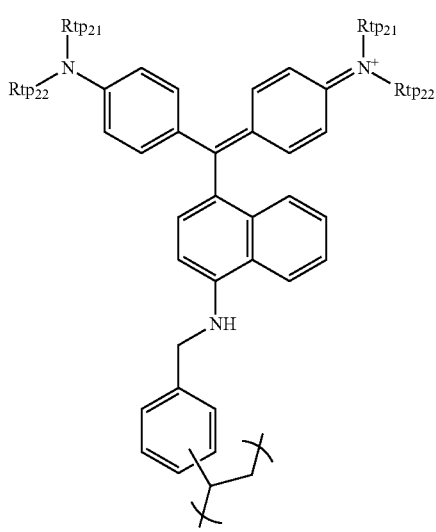

In Formula (TP4), Rtp$_{21}$'s each independently represent a hydrogen atom or an alkyl group having 1 to 6 carbon atoms, and Rtp$_{22}$'s each independently represent an aryl group having 6 to 10 carbon atoms. Rtp$_{31}$ represents a hydrogen atom or a methyl group. Rtp$_{21}$ and Rtp$_{22}$ have the same definitions as Rtp$_{21}$ and Rtp$_{22}$ in Formula (TP3) as described above, and preferred ranges thereof are the same.

In Formula (TP5), Rtp$_{21}$'s each independently represent a hydrogen atom or an alkyl group having 1 to 6 carbon atoms, and Rtp$_{22}$'s each independently represent an aryl group having 6 to 10 carbon atoms. Rtp$_{21}$ and Rtp$_{22}$ have the same definitions as Rtp$_{21}$ and Rtp$_{22}$ in Formula (TP3) as described above, and preferred ranges thereof are the same.

The repeating unit having a triarylmethane structure containing a cation is preferably represented by the following General Formula (TP6).

TP6

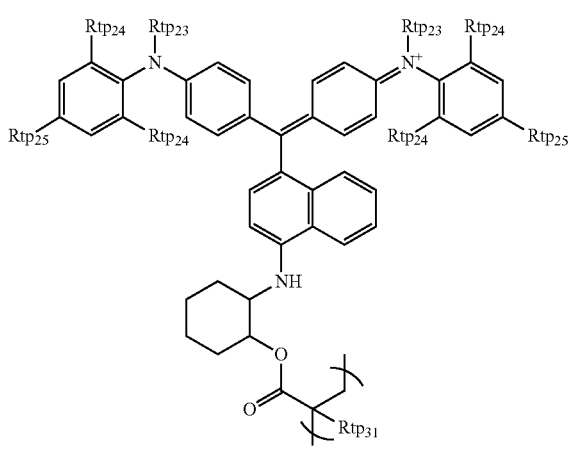

In Formula (TP6), Rtp$_{23}$ and Rtp$_{24}$ each independently represent an alkyl group having 1 to 4 carbon atoms, and Rtp$_{25}$ represents a hydrogen atom or an alkyl group having 1 to 3 carbon atoms. Rtp$_{31}$ represents a hydrogen atom or a methyl group.

Rtp$_{23}$'s are each independently preferably an alkyl group having 1 to 3 carbon atoms. The alkyl group is preferably linear.

Rtp$_{24}$'s are each independently preferably an alkyl group having 1 or 2 carbon atoms.

In the case where Rtp$_{25}$ represents an alkyl group having 1 to 3 carbon atoms, the alkyl group preferably has 1 or 2 carbon atoms.

Specific examples of the repeating unit having the triarylmethane structure containing a cation include the following structures, but the present invention is not limited thereto. Further, specific examples of the repeating unit having the triarylmethane structure containing a cation include repeating units derived from monomers having a triarylmethane structure which will be described later.

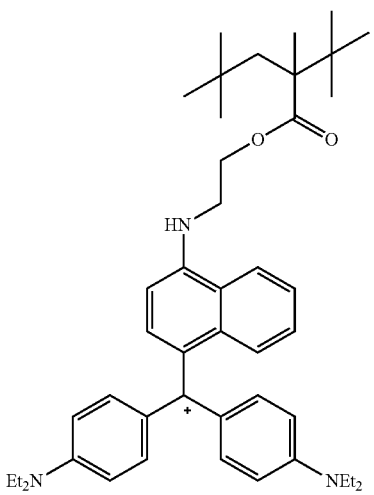

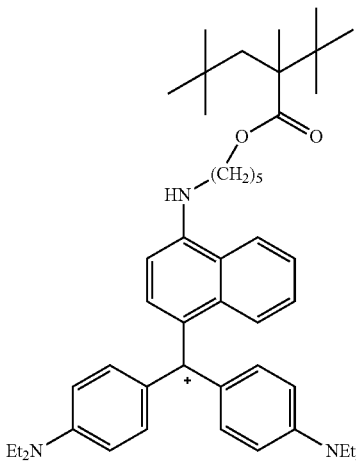

29
-continued
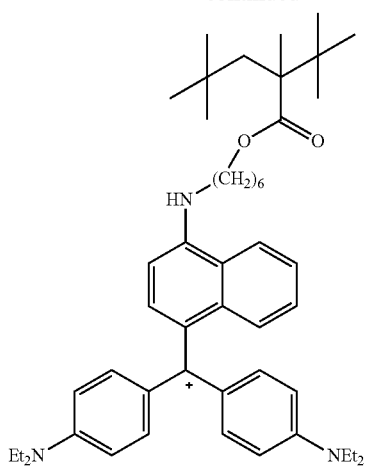
30
-continued
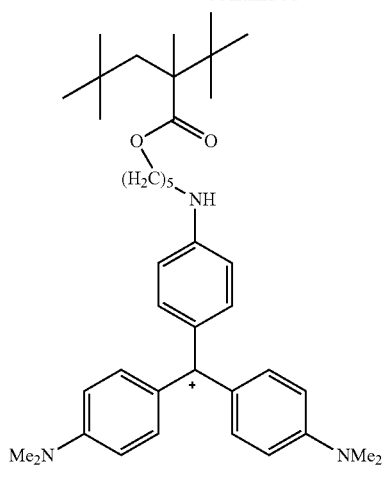
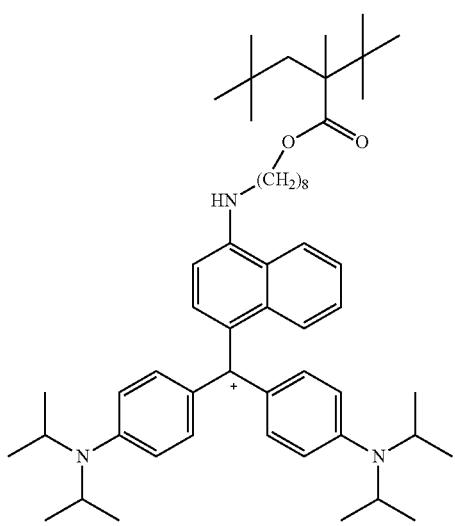
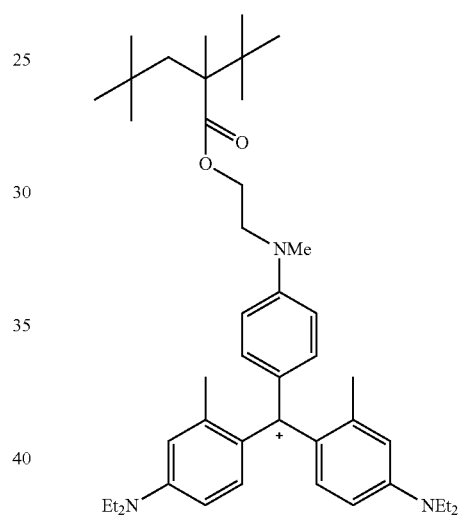
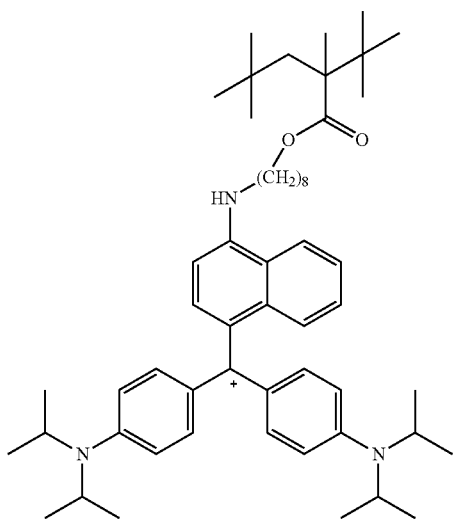
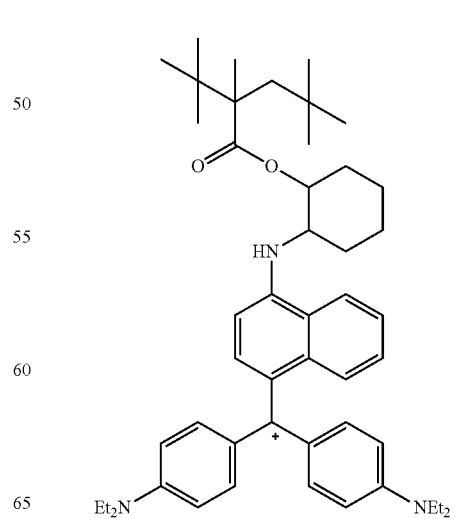

31
-continued
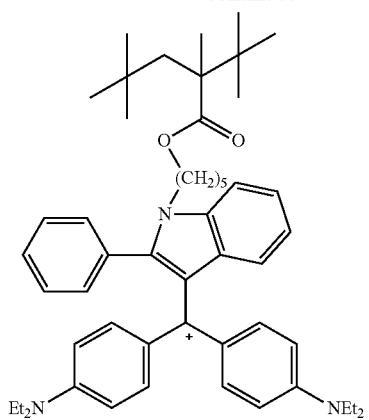
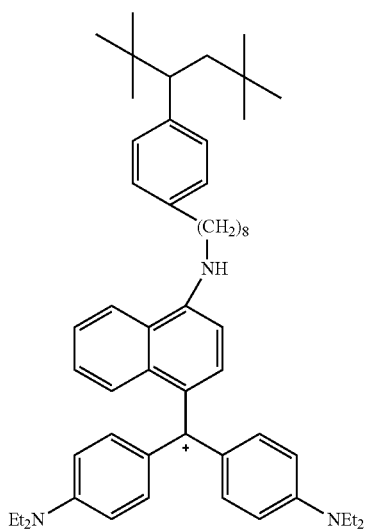
32
-continued
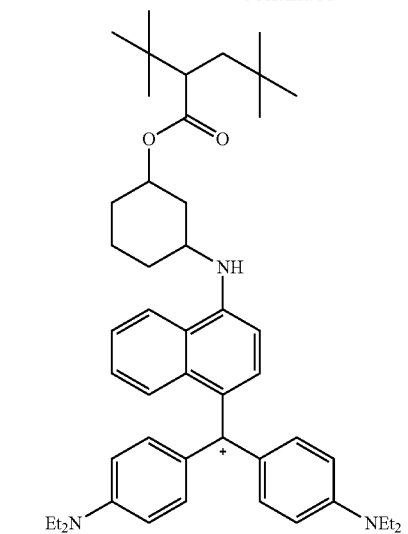
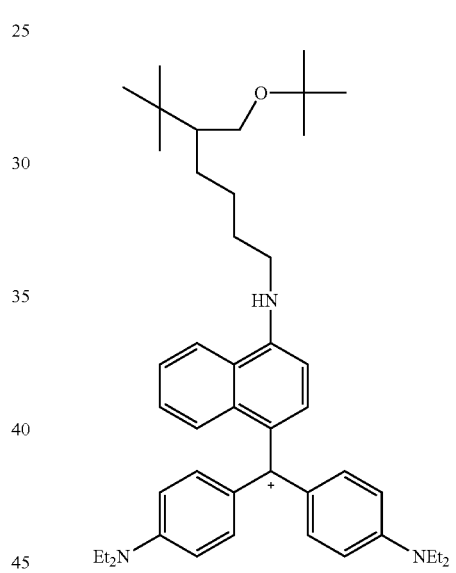
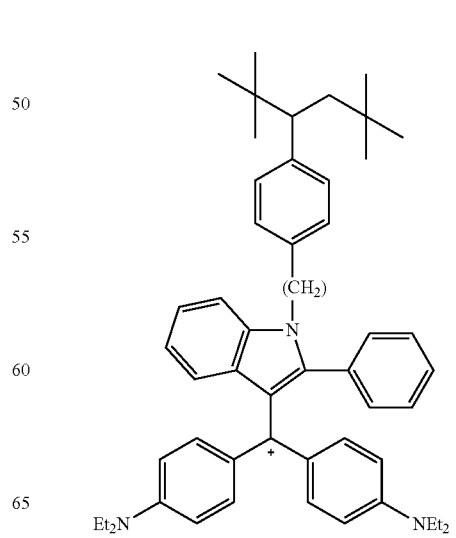

33
-continued
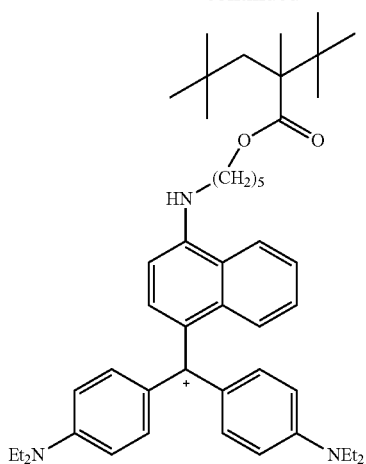
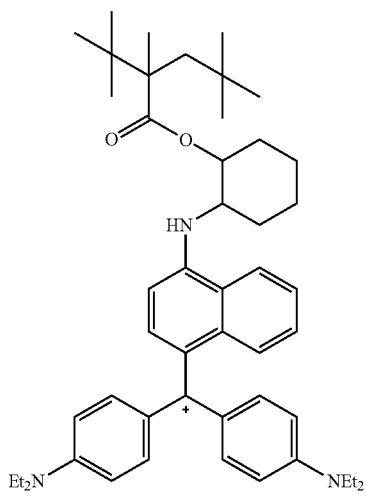
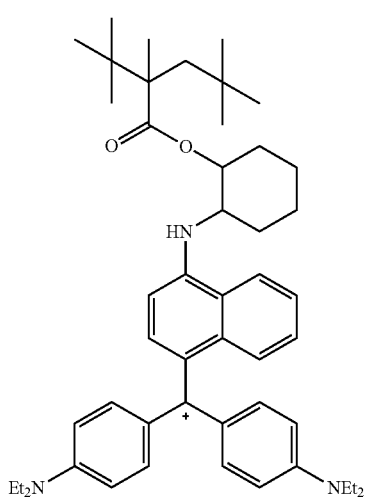
34
-continued
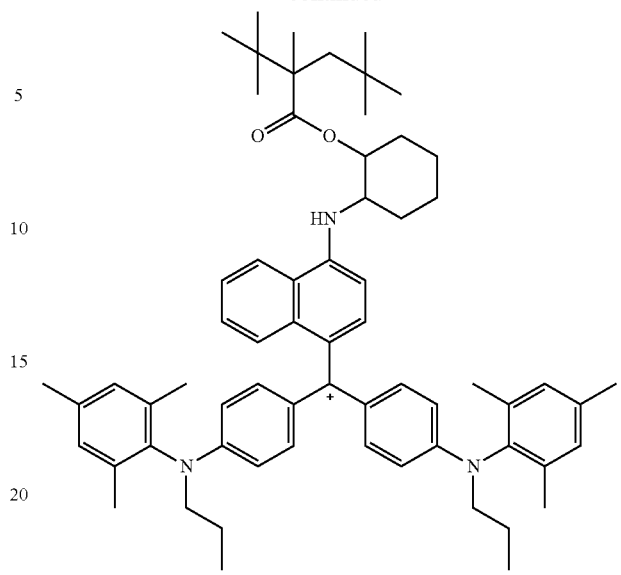
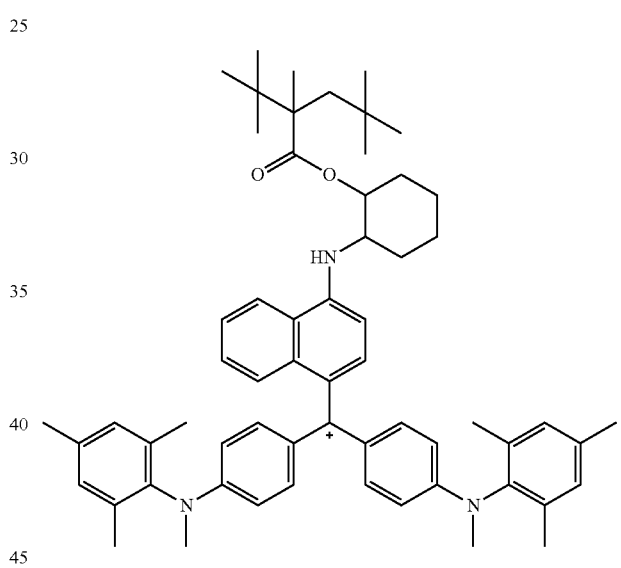
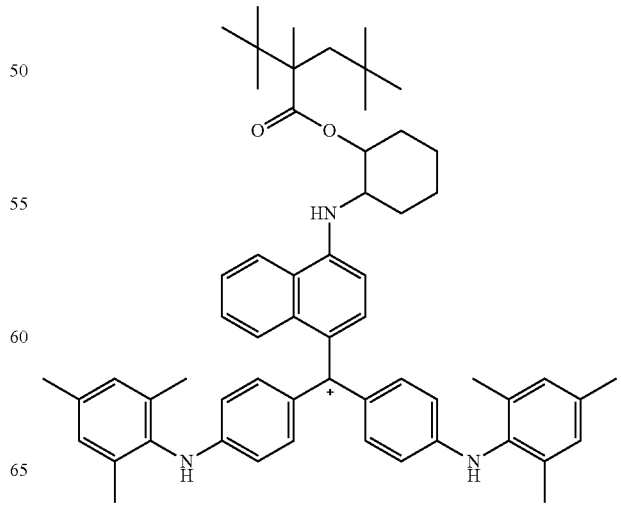

35
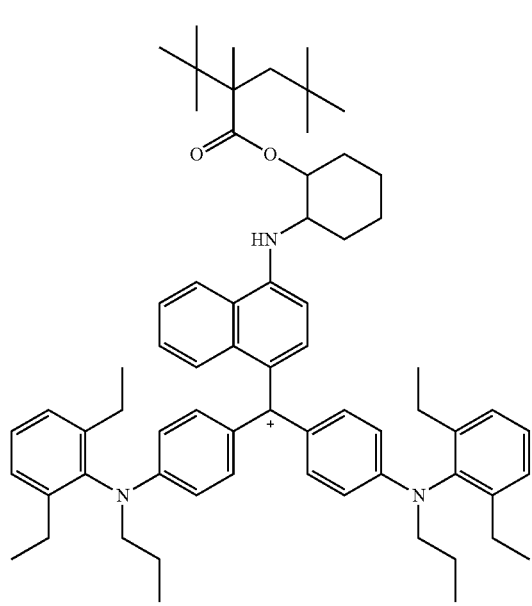 [SMILES: CCCN(c1ccc([C+](c2ccc(N(CCC)c3ccccc3C)cc2)c2ccc(NC3CCCCC3OC(=O)C(C)(CC(C)(C)C)C(C)(C)C)c3ccccc23)cc1)c1ccccc1C]
36
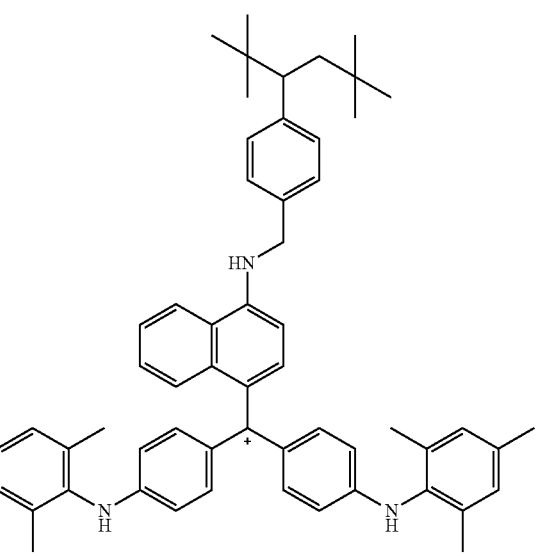
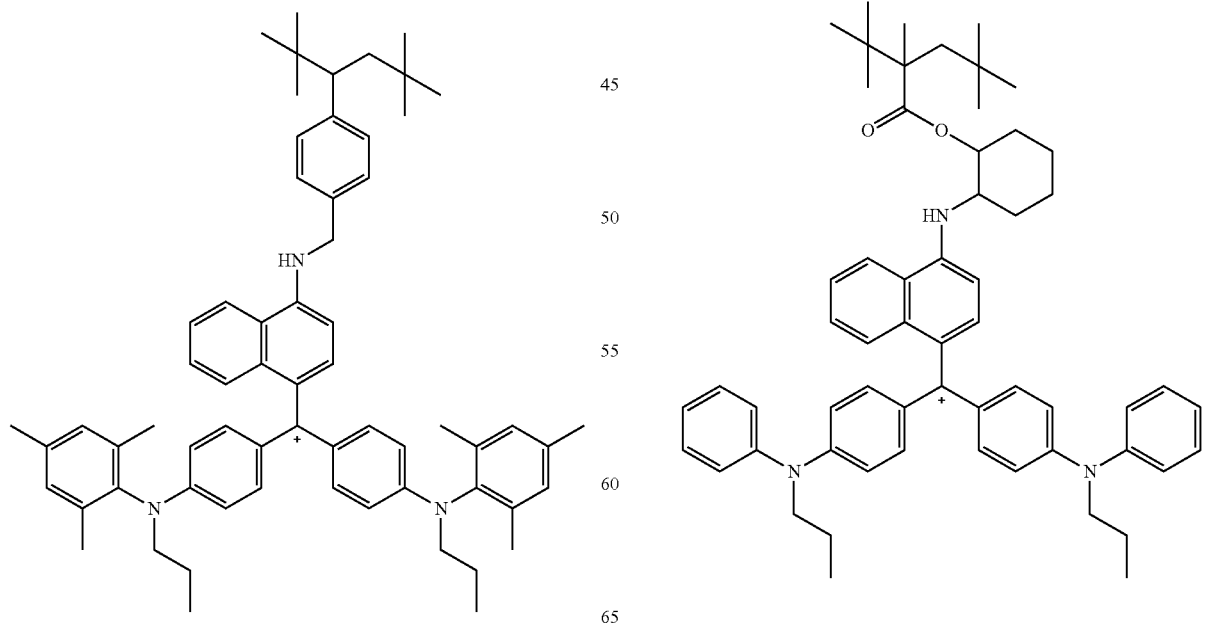

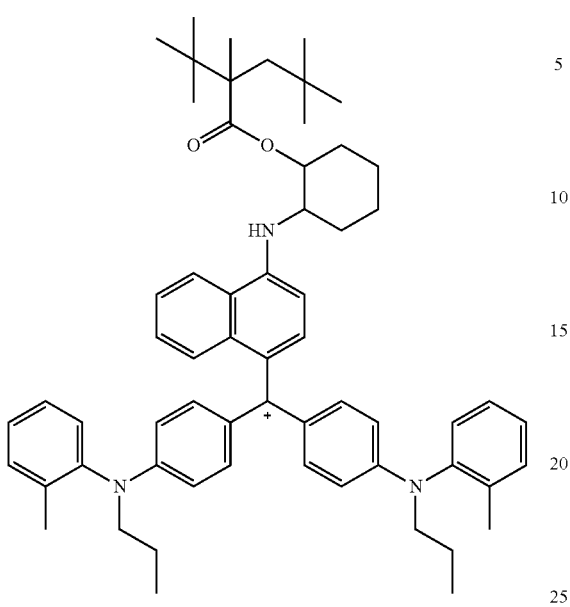

<<Other Repeating Units>>

A colorant including a repeating unit having a triarylmethane structure containing a cation may have other repeating units. By incorporating other repeating units, the compatibility with an alkali-soluble binder can be further improved, or the matteness when formed into a film can be inhibited.

Examples of such other repeating units include repeating units having at least one of a polymerizable group, an acid group, and an oil-soluble group.

As the polymerizable group, known polymerizable groups which can be crosslinked by a radical, an acid, or heat can be used, and examples thereof include a group having an ethylenically unsaturated bond, and a cyclic ether group (an epoxy group and an oxetanyl group). Particularly, a group having an ethylenically unsaturated bond is preferable, a (meth)acryloyl group is more preferable, and (meth)acryloyl groups derived from glycidyl (meth)acrylate and 3,4-epoxycyclohexyl methyl (meth)acrylate are still more preferable.

The polymerizable group is preferably included as a repeating unit having a polymerizable group. An embodiment in which the repeating unit having the triarylmethane structure containing a cation further includes a repeating unit having an ethylenically unsaturated bond is preferable.

Furthermore, in the case where the colorant including the repeating unit having the triarylmethane structure containing a cation further includes a repeating unit having a polymerizable group, the amount of the repeating unit having a polymerizable group is, for example, preferably 10 parts by mass to 50 parts by mass, and more preferably 10 parts by mass to 30 parts by mass, with respect to 100 parts by mass of all the repeating units.

Examples of the repeating unit having a polymerizable group include specific examples as follows, but the present invention is not limited thereto.

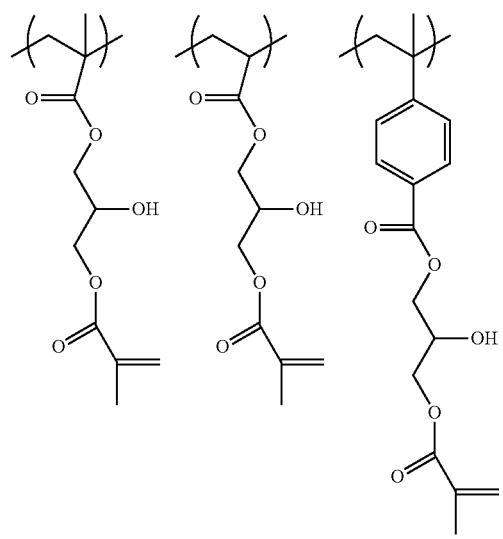

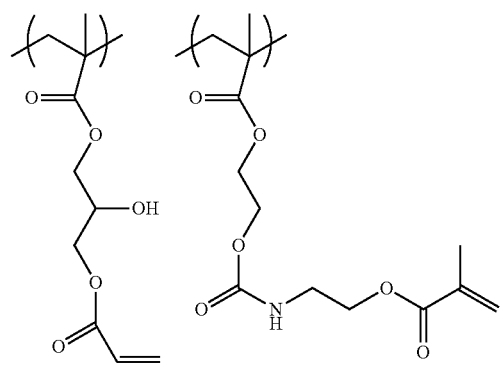

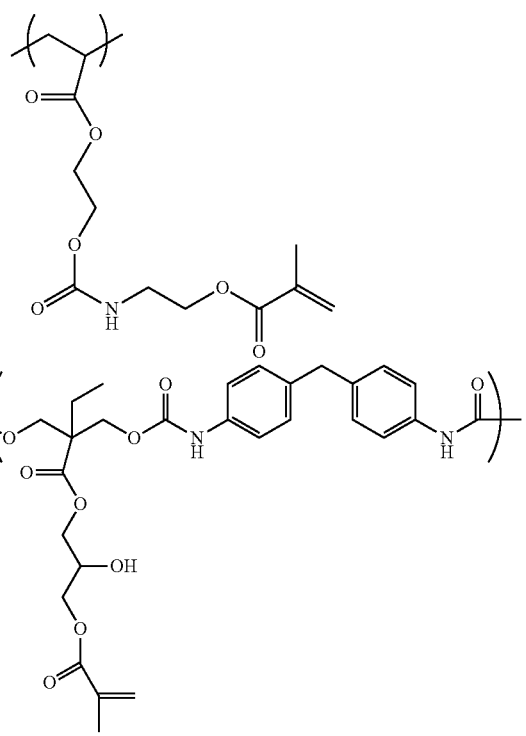

-continued

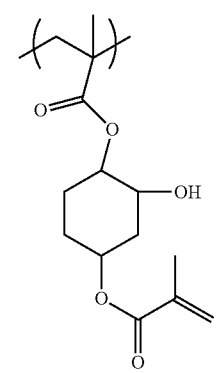
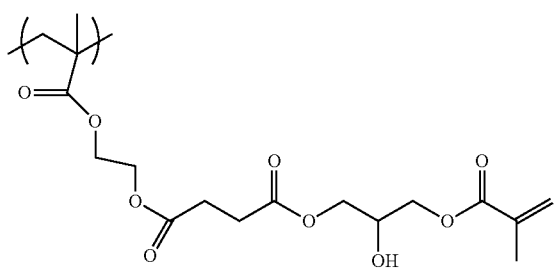
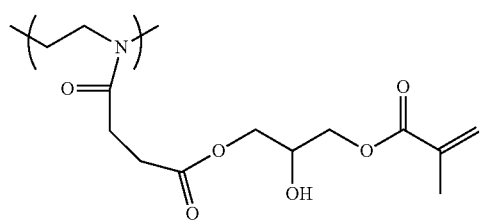
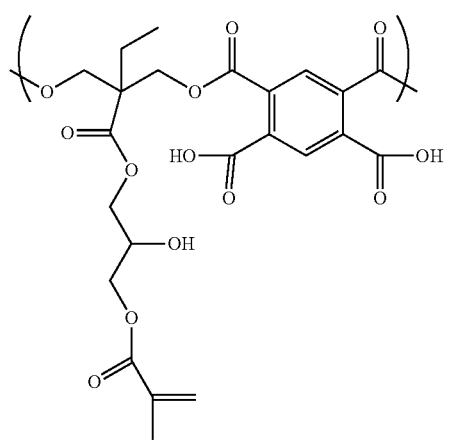
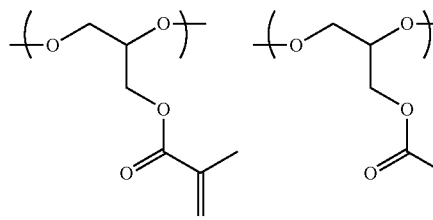
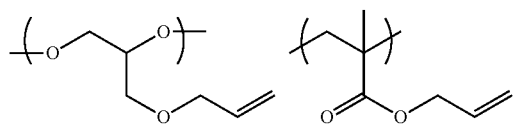

-continued

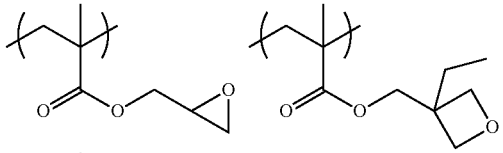
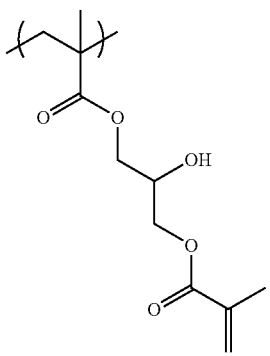
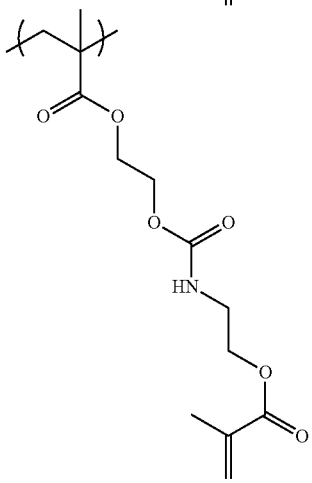

Examples of the acid group include a carboxylic acid group, a sulfonic acid group, and a phosphorous acid group. By incorporating a repeating unit having a carboxylic acid group, the developing performance can further be improved.

Furthermore, in the case where the colorant including the repeating unit having the triarylmethane structure containing a cation further includes a repeating unit having an acid group, the proportion of the repeating units containing a repeating unit having an acid group is, for example, preferably 10 moles to 80 moles, and more preferably 10 moles to 60 moles, with respect to 100 moles of all the repeating units.

Examples of the oil-soluble group include a hydrocarbon group, a hydrocarbon group containing an ester group, a hydrocarbon containing an ether group, a hydrocarbon containing an aromatic group, and a hydrocarbon group containing an amide group.

In addition, a repeating unit having a functional group including a development accelerating group such as lactone, acid anhydride, amide, —COCH$_2$CO—, and a cyano group, or a hydrophobicity- or hydrophilicity-regulating group such as a long chain-alkyl group, a cyclic alkyl group, an aralkyl group, an aryl group, a polyalkylene oxide group, a hydroxyl group, a maleimide group, and an amino group can also be included.

Examples of the method for introducing the functional group include a method for introducing the functional group into a colorant including the repeating unit having the triarylmethane structure containing a cation and a method of copolymerizing a monomer having the functional group.
Specific examples of other repeating units are shown below, but the present invention is not limited thereto.
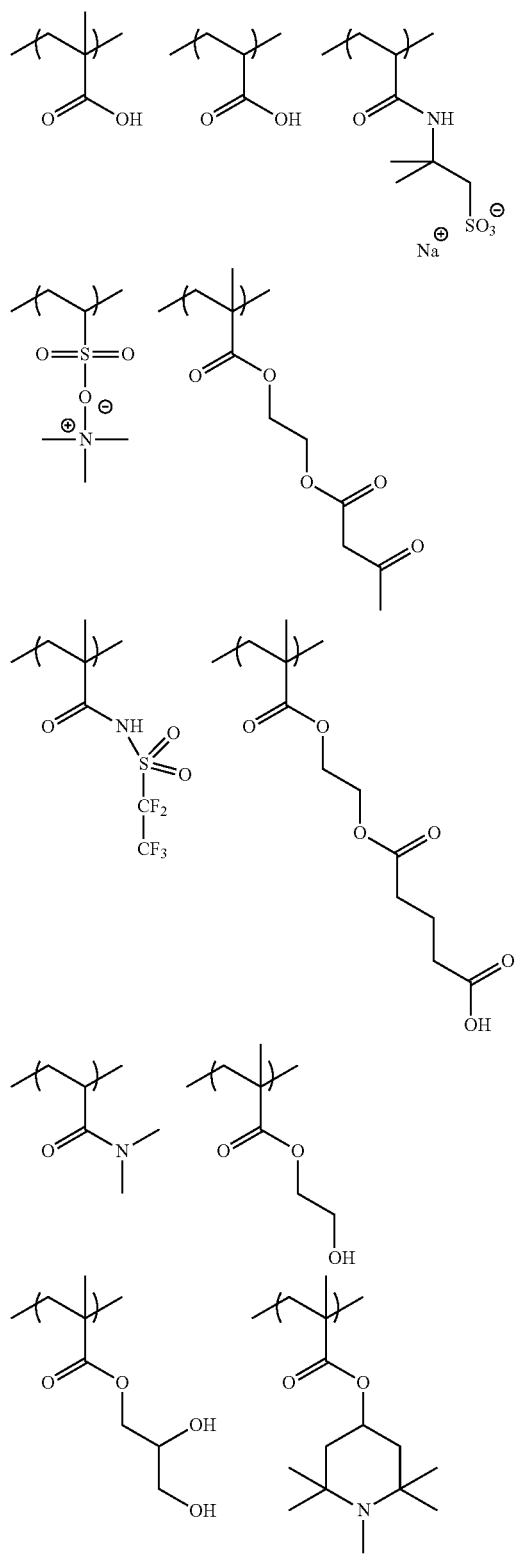
-continued
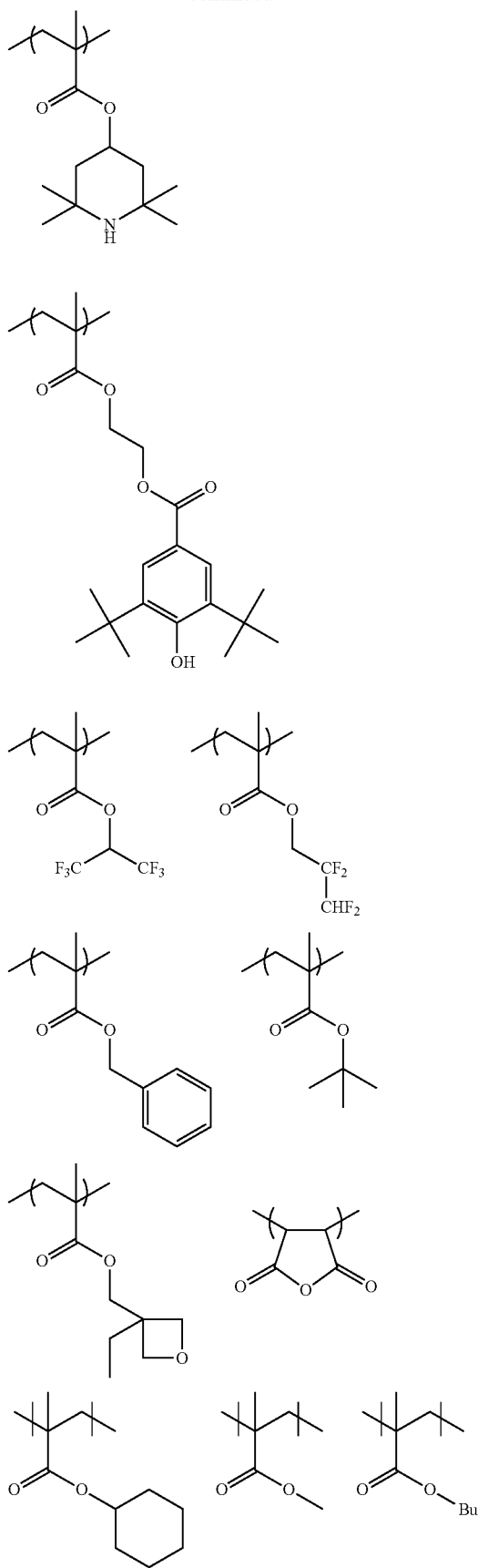

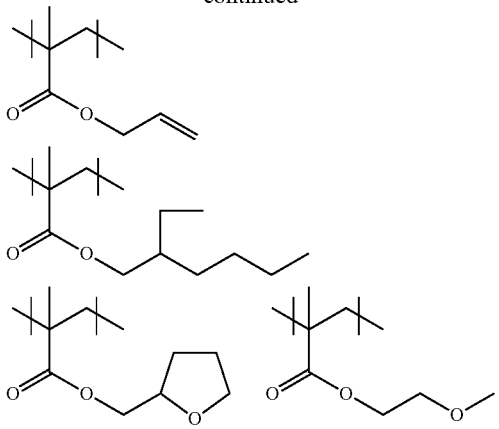

Specific examples of the repeating unit which the colorant of the present invention may have include a repeating unit derived from at least one of a (meth)acrylic acid, a (meth)acrylic acid ester, and a (meth)acrylic acid amide.

As a polymer which forms a repeating unit, having a triarylmethane structure containing a cation, either of a homopolymer constituted only with a dye compound component having a polymerizable group and a copolymer of the dye compound component with other polymerizable compounds can be preferably used.

Furthermore, in the case Where the polymer having a repeating unit having a triarylmethane structure containing a cation is a copolymer, the proportion of the repeating unit having the triarylmethane structure containing a cation is, for example, preferably 10 moles to 100 moles, and more preferably 60 to 90 moles, with respect to 100 moles of all the repeating units.

The molecular weights of the repeating unit having the triarylmethane structure containing a cation and the colorant having a counter anion is preferably 1,000 to 30,000 in terms of weight average molecular weight, and more preferably 3,000 to 20,000 in terms of weight average molecular weight.

When forming a repeating unit having the triarylmethane structure containing a cation, a chain transfer agent may be added. As the chain transfer agent, alkylmercaptan is preferable, and an alkylmercaptan having 4 or more carbon atoms or an alkylmercaptan substituted with a carboxyl group, an ether group, or an ester group is preferable. In particular, from the viewpoint of off odor, dodecylmercaptan or dipentaerythritol hexa-3-mercaptopropionate, and from the viewpoint of further improving developability, thiomalic acid or mercaptopropionic acid is preferable.

<<Counter Anion>>

A counter anion is the counter anion of a cation in a repeating unit having the triarylmethane structure containing the cation. The counter anion may be formed of only a counter anion or may be included as a part of the structure of a compound.

In the case of being formed of only the counter anion, examples of the counter anion include a fluorine anion, a chlorine anion, a bromine anion, an iodine anion, a cyanide ion, a perchloric acid anion, a borate anion ($BF_4^-$ or the like), $PF_6^-$, and $SbF_6^-$.

Examples of the case where the counter anion is included as a part of the structure of a compound include a case where it exists as a counter anion, aside from the repeating unit having a triarylmethane structure.

The borate anion is a group represented by $B(R^{10})_4^-$, in Which examples of $R^{10}$ include a fluorine atom, a cyano group, a fluoroalkyl group, an alkoxy group, and an aryloxy group.

In the case where the counter anion is included as a part of the structure of a compound, it may be included in a part of a polymer having a repeating unit or may be included in a so-called low-molecular compound having a molecular weight of 2,000 or less. In the case of the low-molecular compound, an embodiment in which at least one of an alkyl group, an aryl group, and a crosslinkable group is included, in addition to an anionic site. In the present invention, in particular, an embodiment of a low-molecular compound containing an alkyl group, an embodiment in which the counter anion is included in a compound containing a crosslinkable group, and an embodiment in which the counter anion is included in the repeating unit are preferable, and an embodiment in which a counter anion is included in the repeating unit is more preferable.

In the case where the counter anion is included as a part of the structure of a compound, the anion portion is preferably at least one selected from $-SO_3^-$, $-COO^-$, $-PO_3^-$, a structure represented by the following General Formula (A1), and a structure represented by the following General Formula (A2).

General Formula (A1)

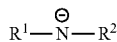

(in General Formula (A1), $R^1$ and $R^2$ each independently represent $-SO_2-$ or $-CO-$)

In General Formula (A1), it is preferable that at least one of $R^1$ and $R^2$ represents $-SO_2-$, and it is more preferable that both of $R^1$ and $R^2$ represent $-SO_2-$.

General Formula (A1) is more preferably represented by the following General Formula (A1-1).

General Formula (A1-1)

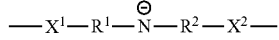

(in General Formula (A1-1), $R^1$ and $R^2$ each independently represent $-SO_2-$ or $-CO-$, and $X^1$ and $X^2$ each independently represent an alkylene group or an arylene group)

In General Formula (A1-1), $R^1$ and $R^2$ have the same definitions as $R^1$ and $R^2$ in General Formula (A1), and preferred ranges thereof are the same.

In the case where $X^1$ represents an alkylene group, the alkylene group preferably has 1 to 8 carbon atoms, and more preferably has 1 to 6 carbon atoms. In the case where $X^1$ represents an arylene group, the arylene group preferably has 6 to 18 carbon atoms, more preferably has 6 to 12 carbon atoms, and still more preferably has 6 carbon atoms. In the case where $X^1$ has a substituent, it is preferably substituted with a fluorine atom.

$X^2$ preferably represents an alkyl group or an aryl group, with the alkyl group being preferable. The alkyl group preferably has 1 to 8 carbon atoms, more preferably has 1 to 6 carbon atoms, still more preferably has 1 to 3 carbon atoms, and particularly preferably 1 carbon atom. In the case where $X^2$ has a substituent, it is preferably substituted with a fluorine atom.

General Formula (A2)

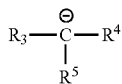

(in General Formula (A2), $R^3$ represents —$SO_2$— or —CO—, and $R^4$ and $R^5$ each independently represent —$SO_2$—, —CO—, or —CN)

In General Formula (A2), it is preferable that at least one of $R^3$ to $R^5$ represents —$SO_2$—, and it is more preferable that at least two of $R^3$ to $R^5$ represent —$SO_2$—.

Specific examples of the case where the counter anion is included as a part of the structure of a compound include examples of R—$SO_3^-$, R—$COO^-$, or R—$PO_4^-$, in which R is a halogen atom, an alkyl group which may be substituted with a halogen atom, or an aryl group which may be substituted with a halogen atom.

Furthermore, specific examples of a compound containing a group represented by General Formula (A1) include compounds in which $R^1$ is bonded to a halogen atom, an alkyl group which may be substituted with a halogen atom, or an aryl group which may be substituted with a halogen atom.

Furthermore, specific examples of the compound containing the group represented by General Formula (A2) include cases where $R^4$ and $R^5$ are each a halogen atom, an alkyl group which may be substituted with a halogen atom, or an aryl group which may be substituted with a halogen atom.

In the case where the counter anion is included as a part of the structure of a compound, a compound containing a sulfonylimide anion, a compound containing a sulfonylmethide anion, or a compound containing a sulfonic acid anion is preferable.

The compound containing a sulfonylimide anion may be a monomer or a multimer. The compound containing a sulfonyl imide anion is preferably represented by the following General Formula (AN1).

General Formula (AN1)

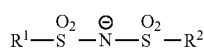

In Formula (AN1), $R^1$ and $R^2$ each independently represent an alkyl group or an aryl group. $X^1$ and $X^2$ may be bonded to each other to form a ring.

$R^1$ represents an alkyl group or an aryl group. The alkyl group may be any one of linear, branched, and cyclic type. The alkyl group preferably has 1 to 6 carbon atoms, and more preferably has 1 to 3 carbon atoms. The alkyl group is preferably an alkyl group substituted with a fluorine atom. The alkyl group substituted with a fluorine atom preferably has 1 to 6 carbon atoms, and more preferably has 1 to 3 carbon atoms. The alkyl group may have a substituent. In particular, a perfluoroalkyl group is preferable, and a perfluoromethyl group is more preferable.

The aryl group preferably has 6 to 18 carbon atoms, and more preferably has 6 to 12 carbon atoms. The aryl group is preferably a group substituted with a fluorine atom.

$R^2$ has the same definition as $R^1$, and a preferred range thereof is the same.

As a specific example of the compound containing a sulfonylimide anion, a bistrifluoromethanesulfonylimide is preferable. By adopting such a configuration, heat resistance can further be improved.

The compound containing a sulfonylmethide anion is preferably a compound represented by the following General Formula (AN2).

General Formula (AN2)

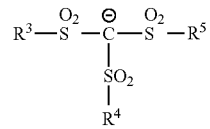

In Formula (AN2), $R^3$ to $R^5$ each independently represent an alkyl group or an aryl group.

$R^3$ represents an alkyl group or an aryl group. The alkyl group may be in any one type of linear, branched, and cyclic forms. The alkyl group preferably has 1 to 6 carbon atoms, and more preferably has 1 to 3 carbon atoms. The alkyl group is preferably an alkyl group substituted with a fluorine atom. The alkyl group substituted with a fluorine atom preferably has 1 to 6 carbon atoms, and more preferably has 1 to 3 carbon atoms. The alkyl group may have a substituent. In particular, a perfluoroalkyl group is preferable, and a perfluoromethyl group is more preferable.

The aryl group preferably has 6 to 18 carbon atoms, and more preferably has 6 to 12 carbon atoms. The aryl group is preferably is preferably an aryl group substituted with a fluorine atom.

$R^4$ has the same definition as $R^3$, and a preferred range thereof is the same.

$R^5$ has the same definition as $R^3$, and a preferred range thereof is the same.

As a specific example of the compound containing a sulfonylmethide anion, tristrifluoromethanesulfonylmethide is preferable.

The compound containing a sulfonic acid anion is preferably represented by the following General Formula (AN3).

 R—$SO_3^-$      General Formula (AN3)

In Formula (AN3), R represents an alkyl group or an aryl group. In the case where R represents an alkyl group, it is preferably an alkyl group substituted with a fluorine atom. The alkyl group preferably has 1 to 6 carbon atoms, and more preferably has 1 to 3 carbon atoms. In particular, a perfluoroalkyl group is preferable, and a perfluoromethyl group is more preferable.

In the case Where R represents an aryl group, it is preferably an aryl group substituted with a fluorine atom, the aryl group preferably has 6 to 18 carbon atoms, and more preferably has 6 to 12 carbon atoms.

As a specific example of the compound containing a sulfonic acid anion, a trifluoromethanesulfonic acid anion is preferable.

Specific examples of other counter anions include the following ones, but the present invention is not limited thereto. In the present specification, specific examples of the following other counter anions are referred to as a "counter anion A".

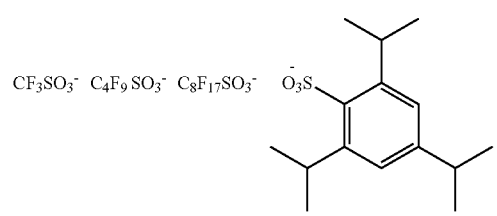

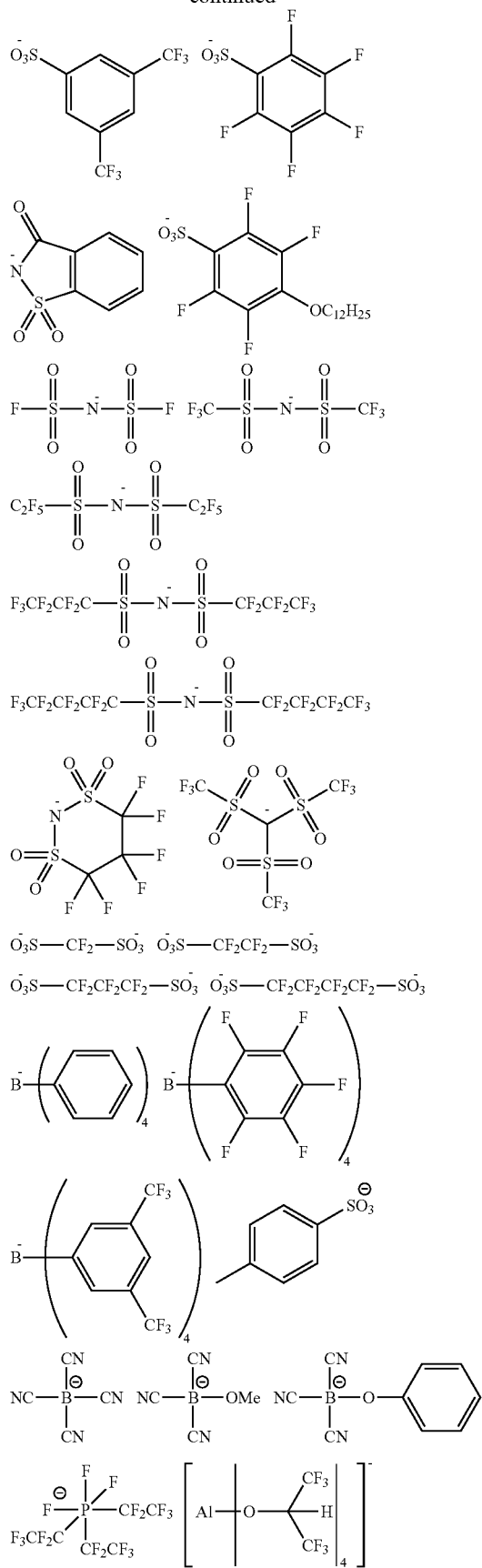

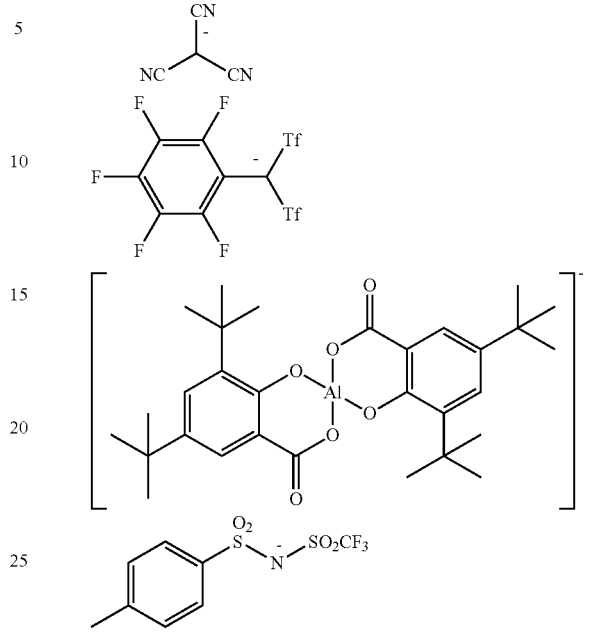

Hereinbelow, in the case where the counter anion is included in a compound containing a crosslinkable group, a case where the counter anion is included in the repeating unit will be described in detail.

As the crosslinkable group, known polymerizable groups which can be crosslinked by a radical, an acid, or heat can be used, and specific examples thereof include a (meth)acryl group, a styrene group, a vinyl group, a cyclic ether group, and a methylol group, with at least one selected from a (meth)acryl group, a styrene group, a vinyl group, and a cyclic ether group being preferable, one selected from a (meth)acryl group, a styrene group, and a vinyl group being more preferable, and a (meth)acryl group or a styrene group being still more preferable.

The number of the crosslinkable groups in the compound containing a crosslinkable group is preferably 1 to 3, and more preferably 1.

Furthermore, the crosslinkable group and the counter anion may be directly bonded or bonded via a linking group, and are preferably bonded via a linking group.

A specific example of a case where the counter anion is included in the compound containing a crosslinkable group is preferably represented by the following General Formula (B).

General Formula (B)

$$\begin{array}{c} P \\ | \\ L \\ | \\ \text{anion} \end{array}$$

(in General Formula (B), P represents a crosslinkable group. L represents a single bond or a divalent linking group, and the anion represents the counter anion)

In General Formula (B), P represents a crosslinkable group, and examples thereof include the crosslinkable groups as described above.

In General Formula (B), in the case where L represents a divalent linking group, an alkylene group having 1 to 30 carbon, atoms (for example, a methylene group, an ethylene group, a trimethylene group, a propylene group, and a butylene group), an arylene group having 6 to 30 carbon atoms, a heterocyclic linking group, —CH=CH—, —O—, —S—, —C(=O)—, —CO—, —NR—, —CONR—, —OC—, —SO—, —SO$_2$—, and a linking group formed by combination of two or more of these groups are preferable. Here, R each independently represent a hydrogen atom, an alkyl group, an aryl group, or a heterocyclic group.

In particular, the linking group is preferably a linking group formed by combination of two or more of an alkylene group having 1 to 10 carbon atoms (preferably —(CH$_2$)n- (n represents an integer of 1 to 10), an arylene group having 6 to 12 carbon atoms (preferably a phenylene group or a naphthalene group), —NH—, —CO—, —O—, and —SO$_2$—.

In the case where the counter anion is included as a part of the structure of a compound, functional groups other than the crosslinkable group may be included. Examples of such other functional groups include other functional explained for the aforementioned repeating unit having the triarylmethane structure containing a cation, and preferred examples are also the same. In the case where the counter anion is included as a part of the structure of a compound, the number of polymerizable groups in the compound is preferably 1 to 3, and more preferably 1.

In the case where the counter anion is included as a part of the structure of a compound, the number of acid groups in the compound is preferably 1 to 3, and more preferably 1.

Specific examples of a case where the counter anion is included in the compound containing a crosslinkable group are shown below, but the present invention is not limited thereto.

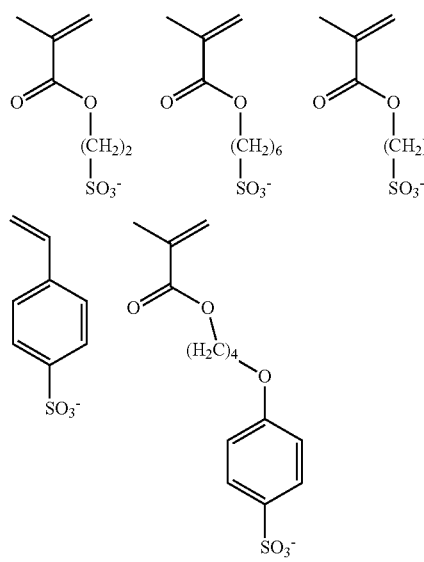

-continued

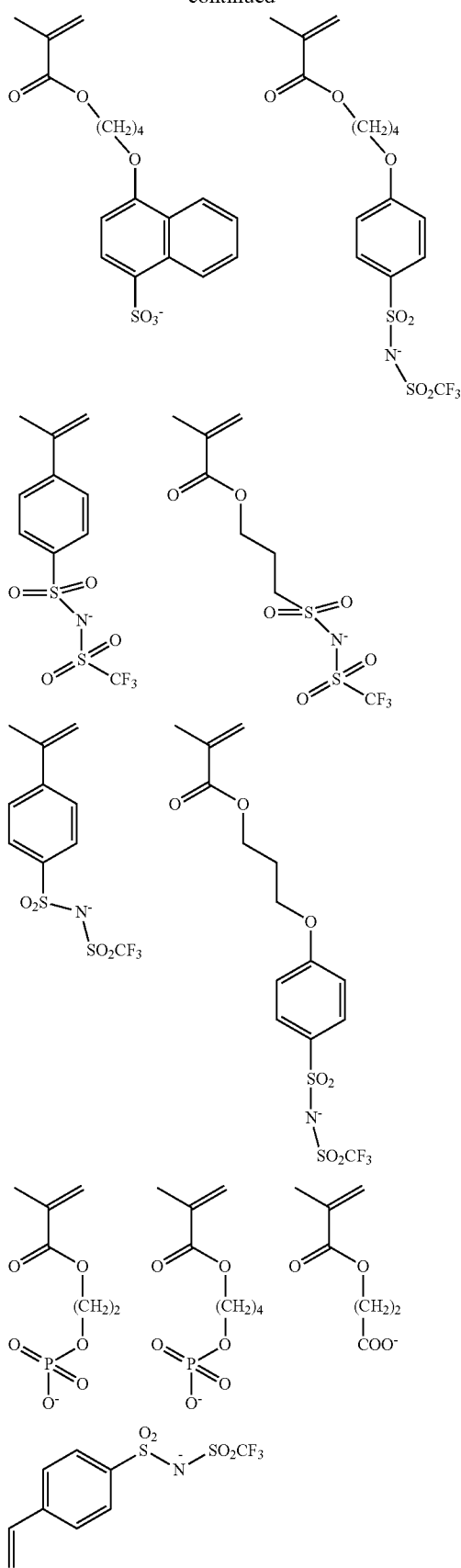

The molecular weight of the compound containing a crosslinkable group is preferably 200 to 2,000, and more preferably 200 to 500.

In the case where the counter anion is included in the repeating unit (hereinafter also referred to as an anion multimer), the counter anion may be included in the side branch, the main chain, or both of the main chain and the side chain.

The anion multimer is preferably represented by the following General Formula (C) and/or the following General Formula (D).

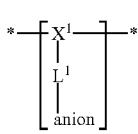

General Formula (C)

(in General Formula (C), $X^1$ represents the main chain of the repeating unit, $L^1$ represents a single bond or a divalent linking group, and the anion represents the counter anion)

In General Formula (C), $X^1$ is preferably the main chain of the repeating unit, usually, a linking group formed by a polymerization reaction, and examples thereof include a (meth)acryl-based, styrene-based, and vinyl-based ones. Further, two sites represented by * form a repeating unit.

In the case where $L^1$ is a divalent linking group, an alkylene group having 1 to 30 carbon atoms (a methylene group, an ethylene group, a trimethylene group, a propylene group, and a butylene group), an arylene group having 6 to 30 carbon atoms (a phenylene group, a naphthalene group, or the like), a heterocyclic linking group, —CH=CH—, —O—, —S—, —C(=O)—, —CO—, —NR—, —CONR—, —OC—, —SO—, —SO$_2$—, and a linking group formed by combination of two or more of these groups are preferable. Here, R's each independently represent a hydrogen atom, an alkyl group, an aryl group, or a heterocyclic group.

In particular, $L^1$ is preferably a single bond, or a divalent linking group funned by combination of two or more groups of an alkylene group having 1 to 10 carbon atoms (preferably —(CH$_2$)n- (n an integer of 5 to 10), an arylene group having 6 to 12 carbon atoms (preferably a phenylene group or a naphthalene group), —NH—, —CO$_2$—, —O—, and —SO$_2$—.

Specific examples of a combination of $X^1$ and $L^1$ include (XX-1) to (XX-24) as described above, but the present invention is not limited thereto. Further, the anion multimer is linked to the counter anion at the site represented by * in (XX-1) to (XX-24).

The anion multimer is preferably represented by the following General Formula (AN4).

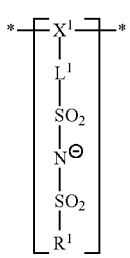

General Formula (AN4)

In Formula (AN4), $X^1$ represents the main chain of the repeating unit, L represents a single bond or a divalent linking group, and $R^1$ represents an alkyl group or an aryl group.

$X^1$ and $L^1$ have the same definitions as $X^1$ and $L^1$ in General Formula (C), and preferred ranges thereof are the same.

$R^1$ represents an alkyl group or an aryl group. The alkyl group may be any one of linear, branched, and cyclic type. The alkyl group preferably has 1 to 6 carbon atoms, and more preferably has 1 to 3 carbon atoms. The alkyl group is preferably an alkyl group substituted with a fluorine atom. The alkyl group substituted with a fluorine atom preferably has 1 to 6 carbon atoms, and more preferably has 1 to 3 carbon atoms. The alkyl group may have a substituent. In particular, a perfluoroalkyl group is preferable, and a perfluoromethyl group is more preferable. The aryl group preferably has 6 to 18 carbon atoms, and more preferably has 6 to 12 carbon atoms. The aryl group is preferably an aryl group substituted with a fluorine atom.

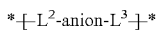

General Formula (D)

(in General Formula (D), $L^2$ and $L^3$ each independently represent a single bond or a divalent linking group, and the anion represents the counter anion)

In General Formula (D), in the case where $L^2$ and $L^3$ represent a divalent linking group, an alkylene group having 1 to 30 carbon atoms, an arylene group having 6 to 30 carbon atoms, heterocyclic linking group, —CH=CH—, —O—, —S—, —C(=O)—, —CO$_2$—, —NR—, —CONR—, —O$_2$C—, —SO—, —SO$_2$—, and a linking group formed by combination of two or more of these groups are preferable. Here, R's each independently represent a hydrogen atom, an alkyl group, an aryl group, or a heterocyclic group.

$L^2$ is preferably an arylene group having 6 to 12 carbon atoms (particularly a phenylene group). The arylene group having 6 to 30 carbon atoms is preferably substituted with a fluorine atom.

$L^3$ is preferably a group formed by combination of an arylene group having 6 to 12 carbon atoms (particularly a phenylene group) and —O—, and at least one kind of arylene group having 6 to 12 carbon atoms is preferably substituted with a fluorine atom.

As the polymer which forms an anion multimer, a homopolymer constituted with only a dye compound component having a crosslinkable group or a copolymer of the dye compound component with other polymerizable compounds can be preferably used, but the homopolymer is more preferable.

The molecular weights of the anion multimer is preferably 1,000 to 30,000 in terms of weight average molecular weight, and the weight average molecular weight is more preferably 3,000 to 20,000.

In the case where the anion multimer is formed, a chain transfer agent may be added. The chain transfer agent is preferably an alkylmercaptan, preferably an alkylmercaptan having 4 or more and 8 or less carbon atoms, or an alkylmercaptan substituted with a carboxyl group, an ether group, or an ester group.

The content of the halogen ions contained in the anion multimer is preferably 10 ppm to 3,000 ppm or less, more preferably 10 ppm to 2,000 ppm, and still more preferably 10 ppm to 1,000 ppm.

Specific examples of the anion multimer are shown below, but the present invention is not limited thereto.
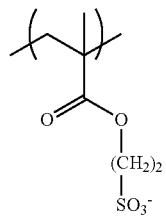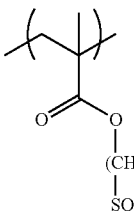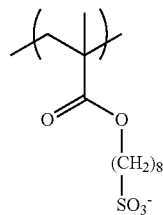
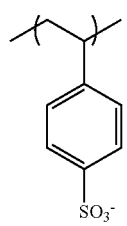
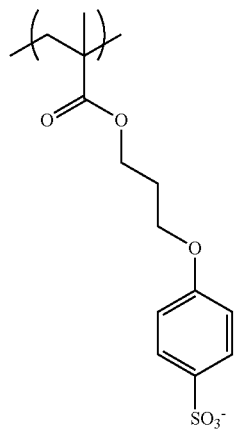
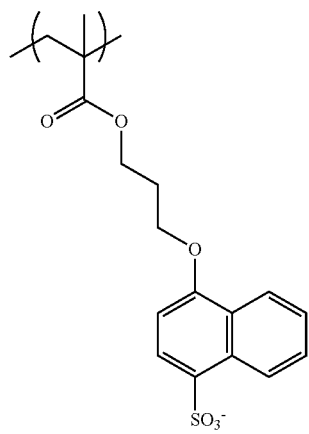
-continued
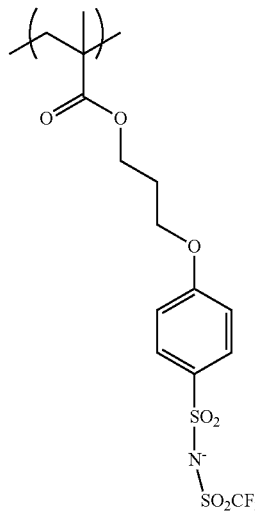
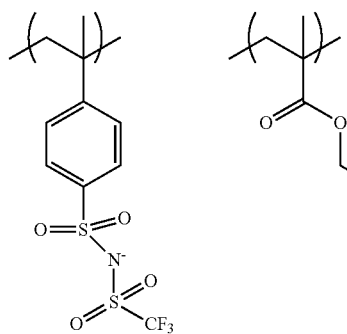
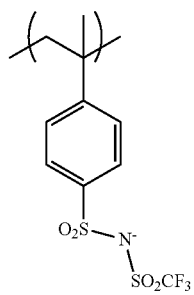
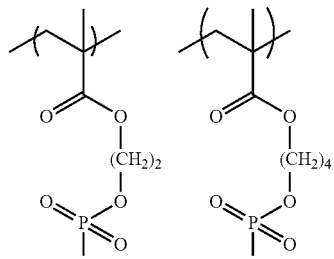
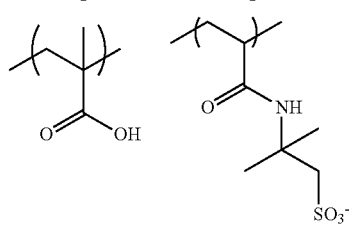

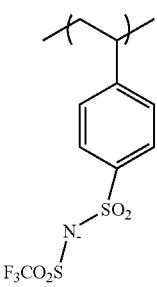
The following specific examples show the state where the anion structures are not dissociated, but it is certain that a state where the anion structures are dissociated is also included in the scope of the present invention.
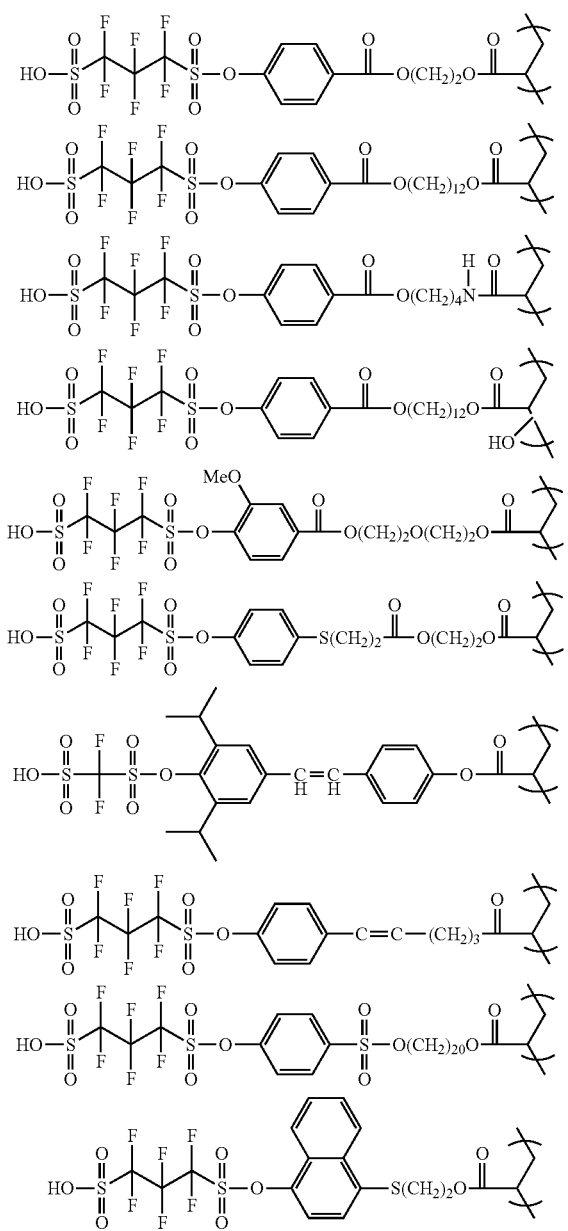
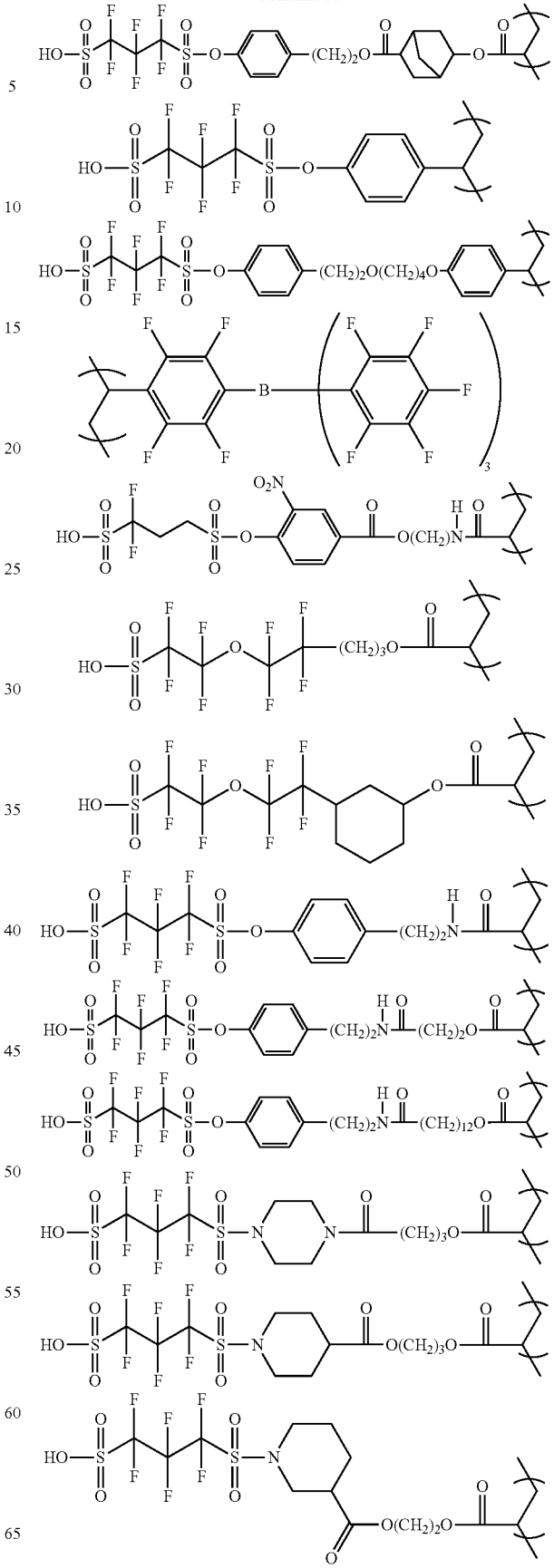

57
-continued
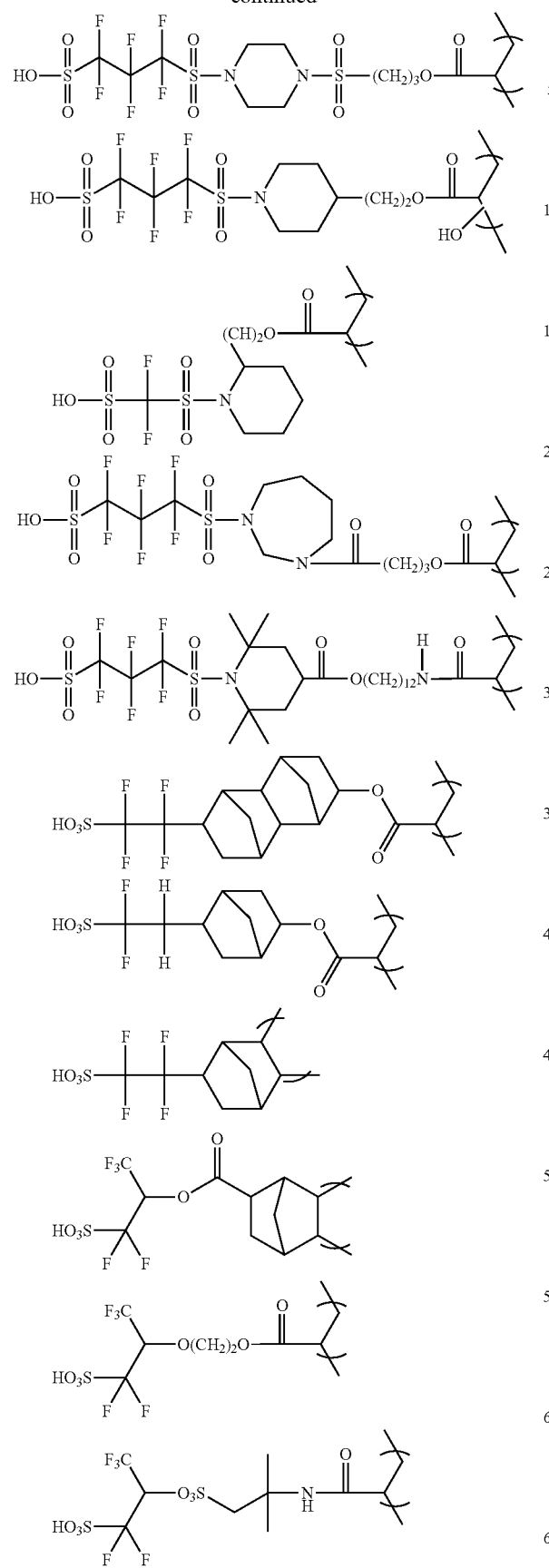
58
-continued
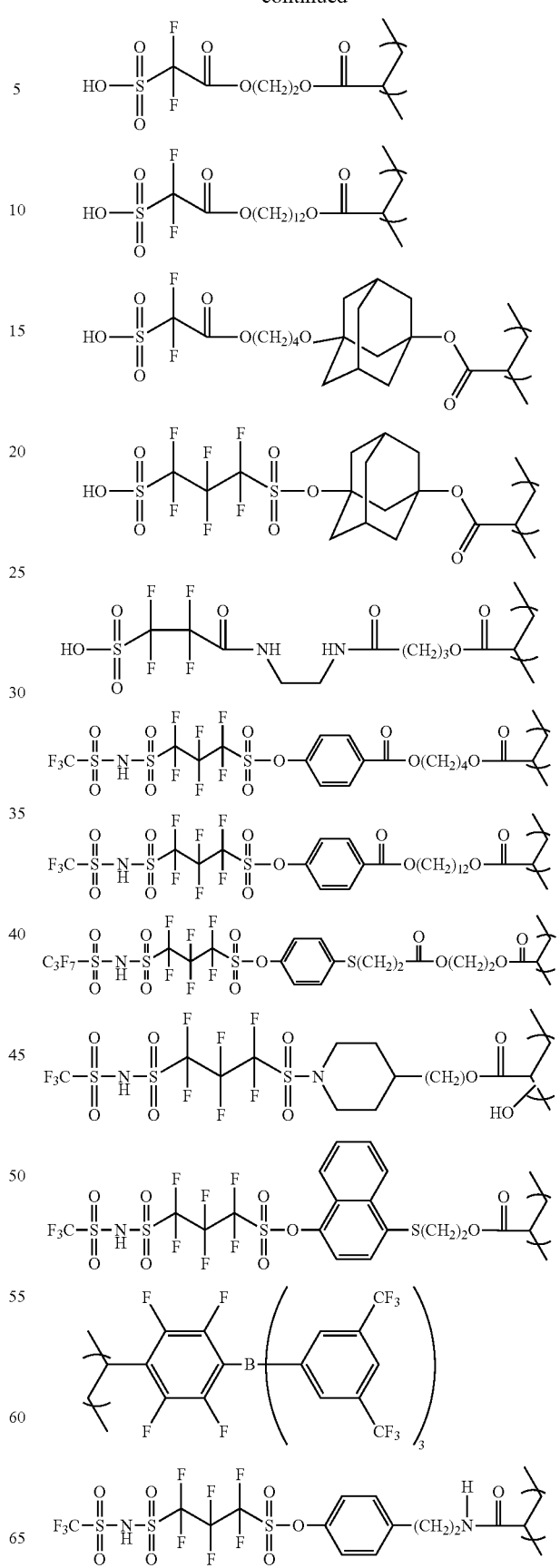

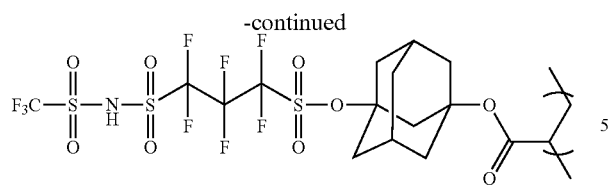
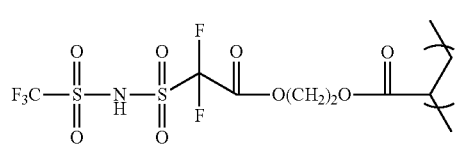
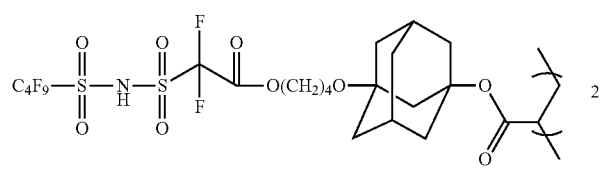
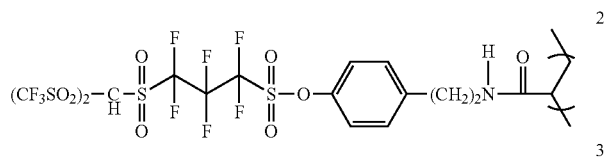
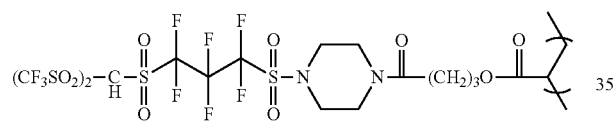
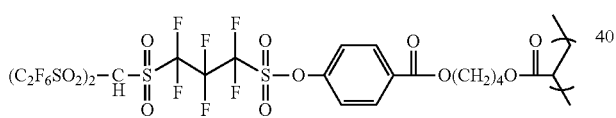
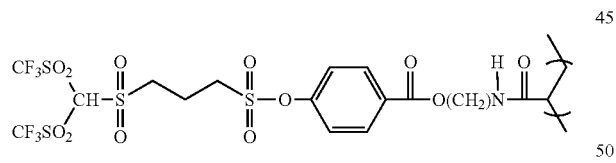
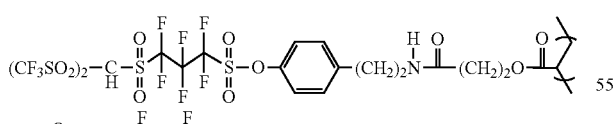
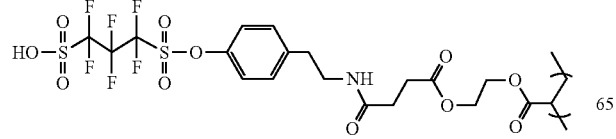
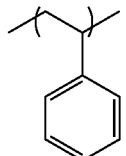
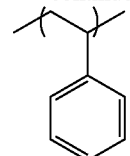
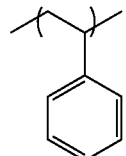
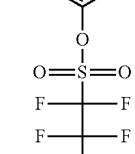
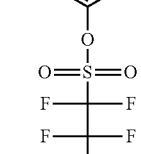
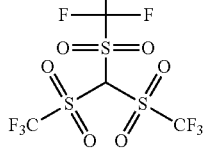
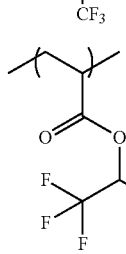
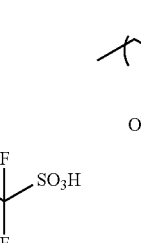
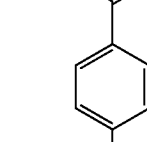
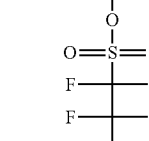
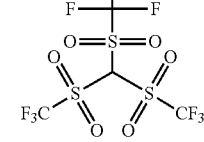
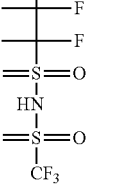

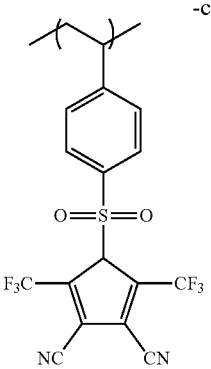

In the case where the counter anion is a polymer, other repeating units may be included.

Examples of such other repeating units include the repeating units explained for the aforementioned repeating unit having the triarylmethane structure containing a cation, and preferred examples thereof are also the same.

In the case where the counter anion contains an anion multimer, the amount of the anion multimer is preferably 90 moles to 200 moles, and more preferably 100 moles to 150 moles, with respect to 100 moles of the repeating units having a triarylmethane structure in a colorant used in the present invention.

Furthermore, in the case where the anion multimer further contains a repeating unit having a polymerizable group, the amount thereof is, for example, 10 moles to 50 moles, and more preferably 10 moles to 30 moles, with respect to 100 moles of all the repeating units.

Furthermore, in the case where the anion multimer further contains a repeating unit having an acid group, the proportion of the repeating units including the repeating unit having an acid group is, for example, 10 moles to 50 moles, and more preferably 10 moles to 30 moles, with respect to 100 moles of all the repeating units.

The colorant of the first embodiment used in the present invention is preferably a compound represented by the following General Formula (TP7).

TP7

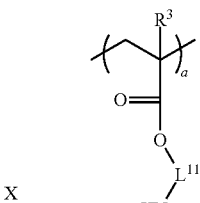

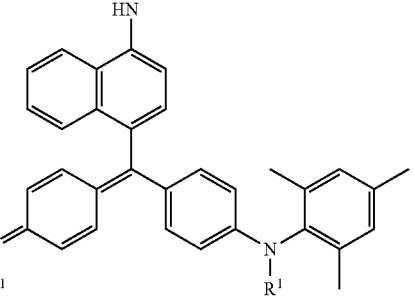

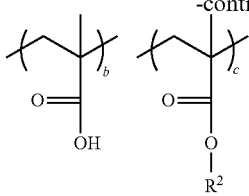

In General Formula (TP7), $R^1$'s each independently represent a hydrogen atom or an alkyl group having 1 to 6 carbon atoms, $R^3$ represents a hydrogen atom or a methyl group, and $L^{11}$ represents a divalent linking group having 2 to 30 carbon atoms; $R^2$ represents a hydrocarbon group having 1 to 10 carbon atoms or a cyclic ether group having 3 to 10 carbon atoms; X represents a compound containing a sulfonylimide anion, a sulfonylmethide anion, or a sulfonic acid anion; and a, b, and c are the molar ratios of the repeating units, a represents a number of more than 0, and b and c each independently represent a number of 0 or more.

The colorant of the first embodiment used in the present invention is preferably a compound represented by the following General Formula (TP8).

TP8

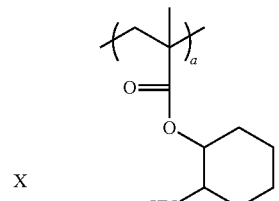

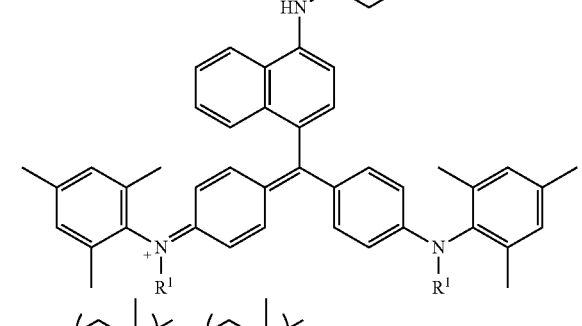

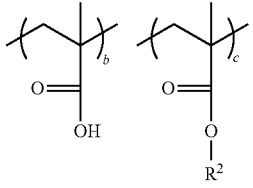

In Formula (TP8), $R^1$'s each independently represent a hydrogen atom or an alkyl group having 1 to 6 carbon atoms, and $R^2$ represents a hydrocarbon group having 1 to 10 carbon atoms or a cyclic ether group having 3 to 10 carbon atoms; X represents a compound containing a sulfonylimide anion, a sulfonylmethide anion, or a sulfonic acid anion; and a, b, and c are the molar ratios of the repeating units, a represents a number of more than 0, and b and c each independently represent a number of 0 or more.

In Formulae (TP7) and (TP8), $R^1$'s each independently represent a hydrogen atom or an alkyl group having 1 to 6 carbon atoms, with the alkyl group having 1 to 6 carbon atoms being preferable. The alkyl group preferably has 1 to 3 carbon atoms. The alkyl group is preferably linear.

R² represents a hydrocarbon group having 1 to 10 carbon atoms or a cyclic ether group having 1 to 10 carbon atoms.

The hydrocarbon group may be linear, branched, or cyclic, and is preferably linear or cyclic. The hydrocarbon group is preferably an aliphatic hydrocarbon group and is preferably an alkyl group. In particular, R² is preferably a cyclic alkyl group having 5 to 10 carbon atoms, a linear alkyl group having 1 to 8 carbon atoms, or a branched alkyl group having 3 to 8 carbon atoms. The cyclic alkyl group preferably has 6 to 8 carbon atoms, and more preferably has 6 carbon atoms. The linear alkyl group preferably has 1 or 2 carbon atoms, and more preferably has 1 carbon atom. The branched alkyl group preferably has 3 to 8 carbon atoms. The hydrocarbon group may have a substituent and as the substituent, a hydroxy group is preferable. As an example of the hydrocarbon group having a substituent, a hydroxyethyl group is preferable.

The cyclic ether group having 3 to 10 carbon atoms preferably has 3 to 7 carbon atoms, and more preferably 3 to 5 carbon atoms. Examples of the cyclic ether group having 3 to 10 carbon atoms include a glycidyl group, an oxetanyl group, and a tetrahydrofurfuryl group, with the glycidyl group or the tetrahydrofurfuryl group being preferable.

R³ in Formula (TP7) represents a hydrogen atom or a methyl group, with the methyl group being preferable.

$L^{11}$ represents a divalent linking group having 2 to 30 carbon atoms, and may be a linear, branched, or cyclic alkylene group having 5 to 20 carbon atoms, and in the case where an arylene group having 6 to 12 carbon atoms (preferably a phenylene group or a naphthalene group) has at least one linking group and has a plurality of linking groups, the linking groups may be linked to each other via —CO₂—, —O—, —NH—, or —SO₂—. Particularly preferably, linking groups in which brandied and cyclic alkylene groups having 4 to 6 carbon atoms are linked to each other or an alkylene group is linked to an arylene group via —CO₂— or —O— is preferable.

In Formulae (TP7) and (TP8), X represents a compound containing a sulfonylimide anion, a sulfonylmethide anion, or a sulfonic acid anion, and is preferably a compound containing a sulfonylimide anion.

The compound containing a sulfonylimide anion may be a monomer or a multimer. The compound containing a sulfonylimide anion is preferably the compound represented by General Formula (AN1) or General Formula (AN4) as described above.

The compound containing a sulfonylmethide anion is preferably the compound represented by General Formula (AN2) as described above.

The compound containing a sulfonic acid anion is preferably the compound represented by General Formula (AN3) as described above.

a to c represent the molar ratios of the respective repeating units, and when the sum of a to c is 1, a represents a number of more than 0, and b and c each independently represent a number of 0 or more. a is preferably 0.1 to 1. b represents 0 or more, and preferably 0 to 0.5. c represents 0 or more, and preferably 0 to 0.5.

The molecular weight of the compound represented by General Formula (TP7) or (TP8) is preferably 1,000 to 30,000, and more preferably 3,000 to 20,000.

Specific examples of the colorant of the first embodiment used in the present invention are shown below, but are not limited thereto. In the following structures, X⁻ represents a counter anion.

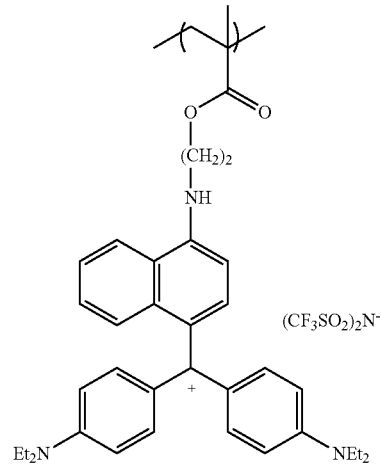

D-1

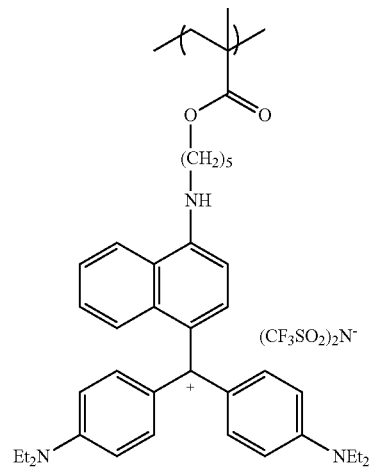

D-2

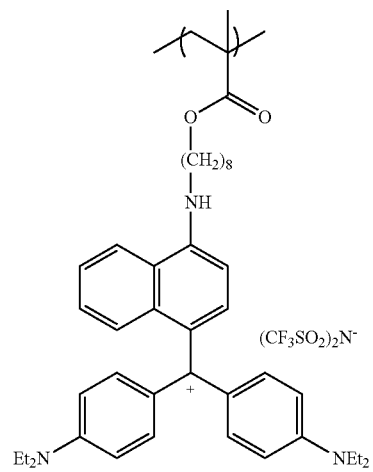

D-3

D-4
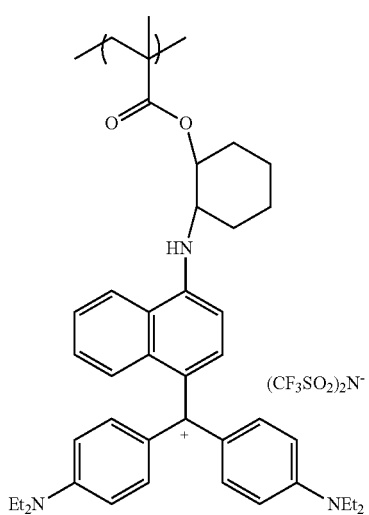
D-5
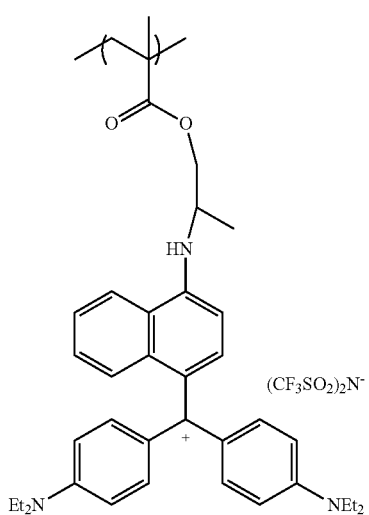
D-6
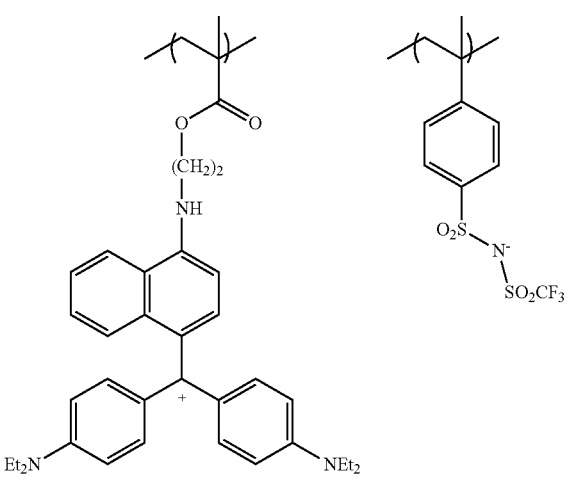
D-7
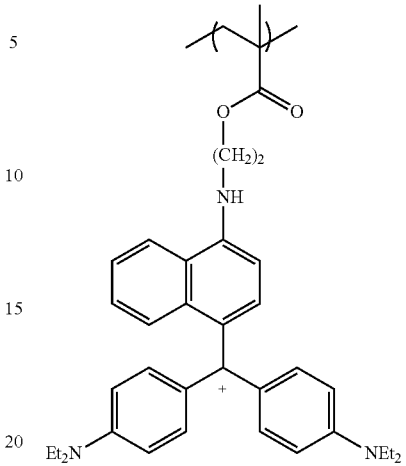
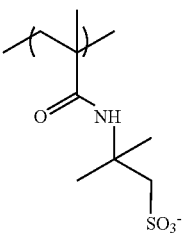
D-8
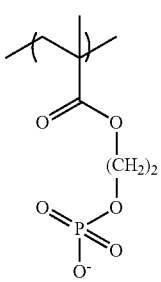
D-9
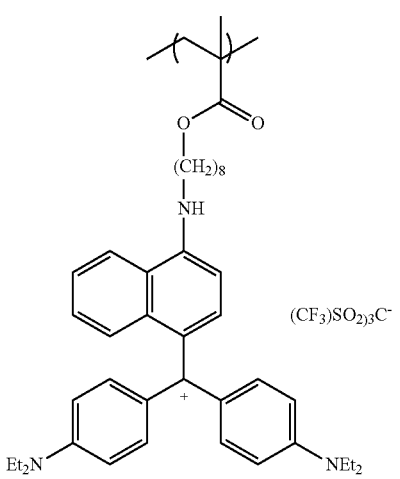

-continued
D-10
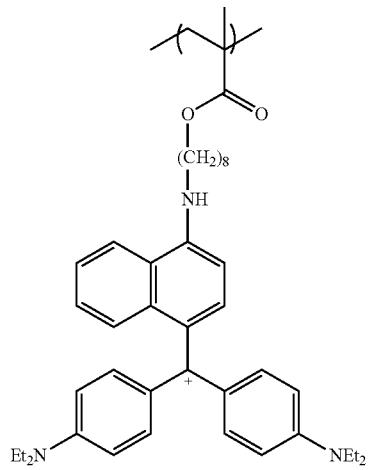
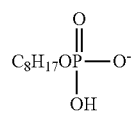
D-11
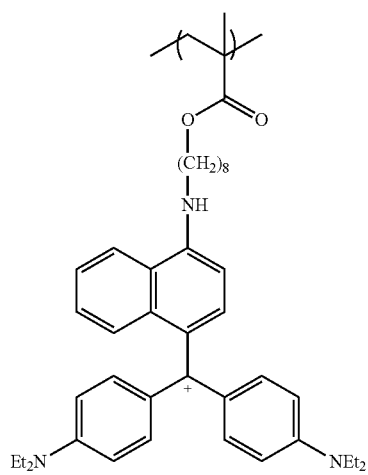
-continued
D-12
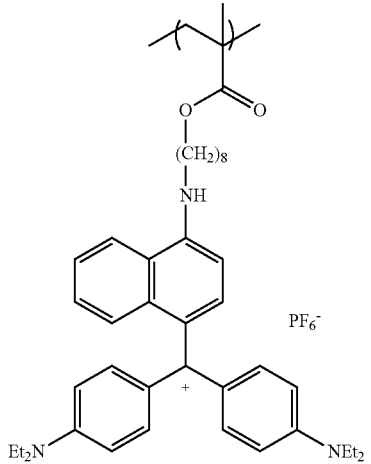
D-13
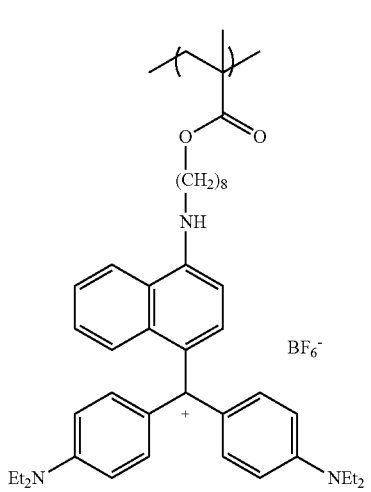
D-14
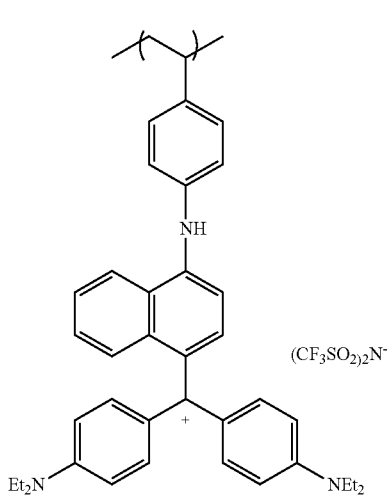

D-15
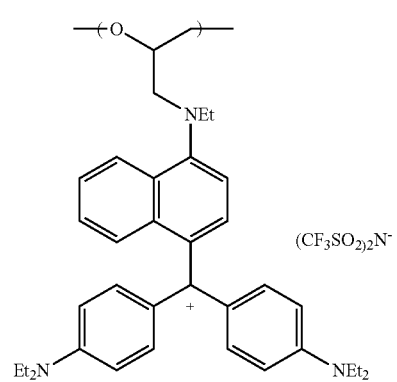
D-16
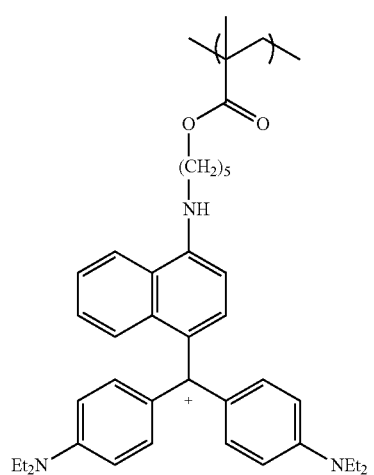
D-17
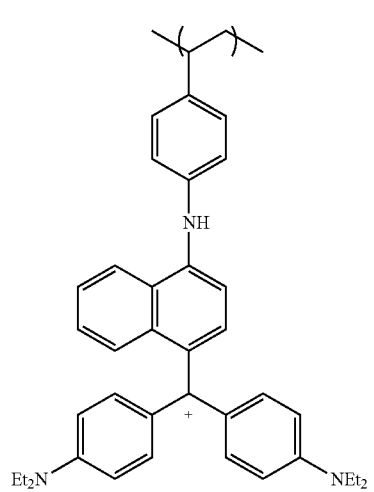
D-18
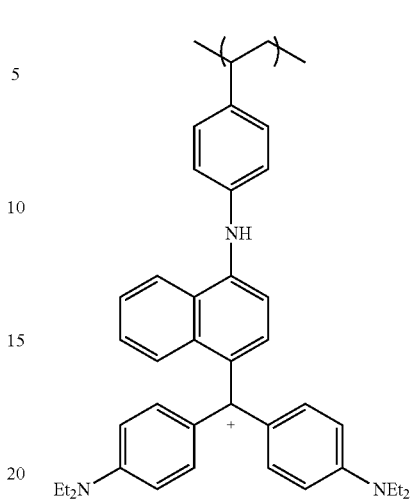
D-19
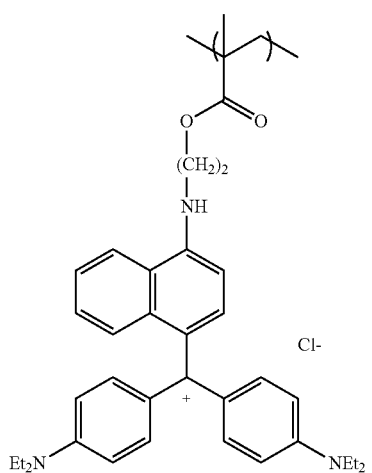
D-20
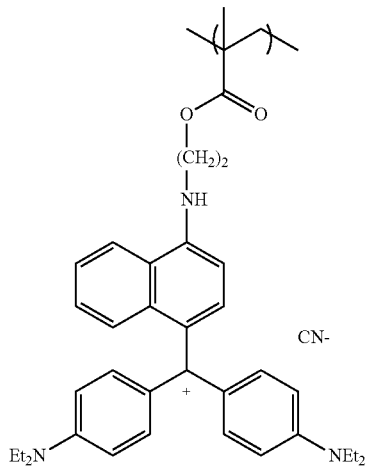

-continued
D-21
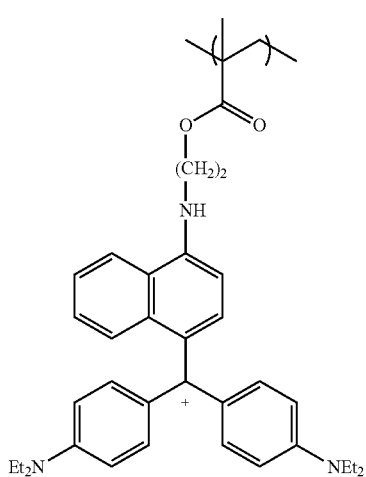
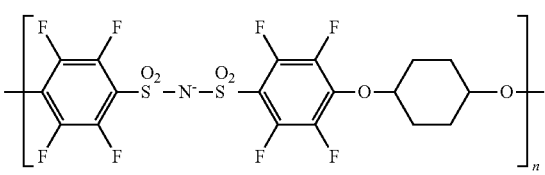
D-22
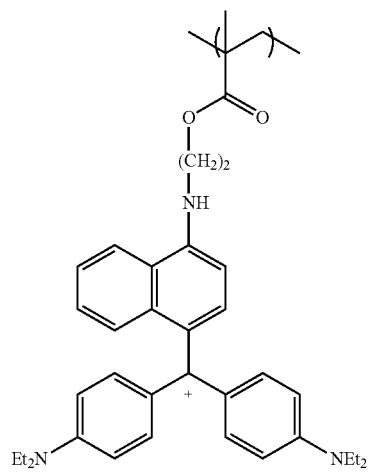
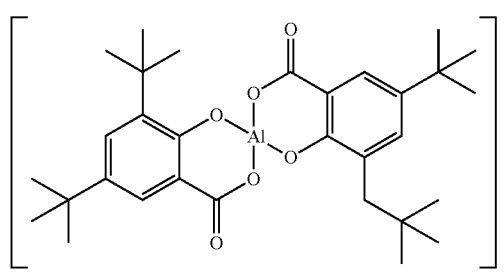
-continued
D-23
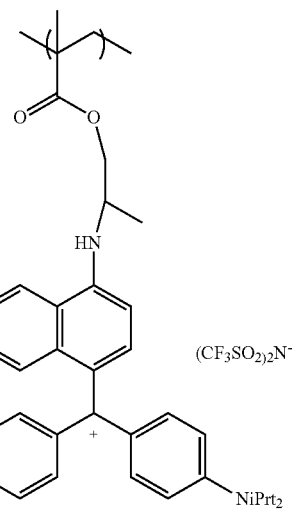
D-24
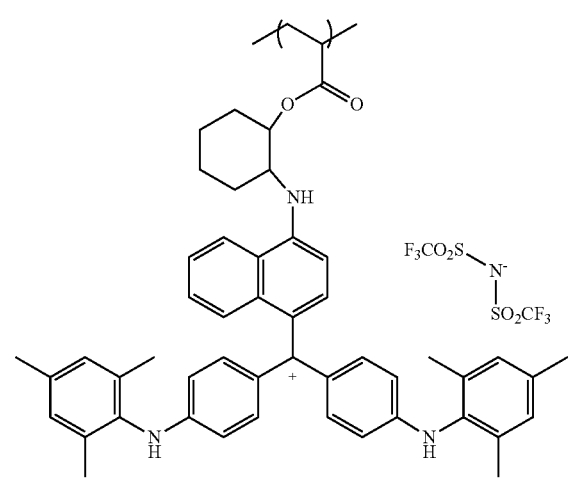
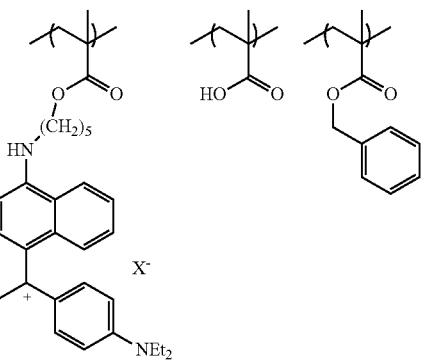

-continued

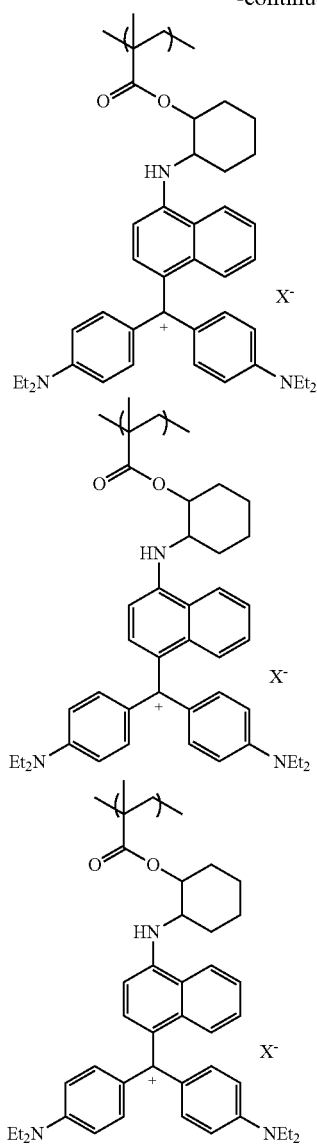
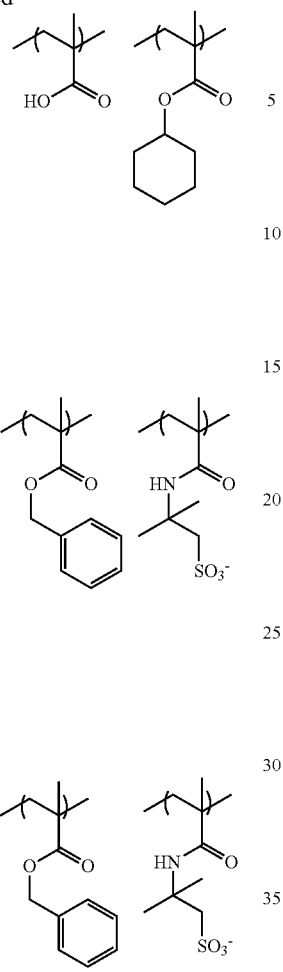
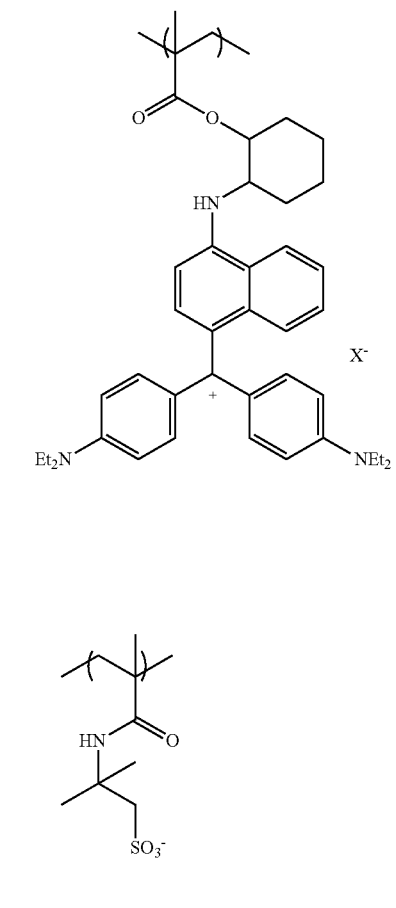

As the examples of the colorant, combinations of a monomer structure having a triarylmethane structure, a monomer constituting a copolymer, a counter anion, and a chain transfer agent structure are shown below.

TABLE 1

| Colorant | Triarylmethane repeating unit | Other repeating unit (copolymerization monomer) | | | Counter salt structure | Chain transfer agent structure |
|---|---|---|---|---|---|---|
| D-40 | D-30 | Cyclohexyl methacrylate | Methacrylic acid | | X-1 | T-1 |
| D-41 | D-31 | Cyclohexyl methacrylate | Methacrylic acid | | X-1 | T-1 |
| D-42 | D-32 | Cyclohexyl methacrylate | Methacrylic acid | | X-1 | T-1 |
| D-43 | D-33 | Cyclohexyl methacrylate | Methacrylic acid | | X-1 | T-1 |
| D-44 | D-34 | Cyclohexyl methacrylate | Methacrylic acid | | X-1 | T-1 |
| D-45 | D-30 | Cyclohexyl methacrylate | Methacrylic acid | | X-1 | T-2 |
| D-46 | D-30 | Cyclohexyl methacrylate | Methacrylic acid | | X-1 | T-3 |
| D-47 | D-30 | Cyclohexyl methacrylate | Glycidyl methacrylate | Methacrylic acid | X-1 | T-1 |
| D-48 | D-30 | | | | X-1 | T-2 |

TABLE 1-continued

| Colorant | Triarylmethane repeating unit | Other repeating unit (copolymerization monomer) | | Counter salt structure | Chain transfer agent structure |
|---|---|---|---|---|---|
| D-49 | D-30 | Cyclohexyl methacrylate | Methacrylic acid | X-2 | T-1 |
| D-50 | D-30 | Cyclohexyl methacrylate | Methacrylic acid | X-3 | T-1 |
| D-51 | D-30 | Cyclohexyl methacrylate | Methacrylic acid | X-4 | T-1 |
| D-52 | D-30 | Tetrahydrofurfuryl methacrylate | | X-1 | T-1 |
| D-53 | D-30 | Ethoxyethyl methacrylate | | X-1 | T-1 |
| D-54 | D-30 | Methyl methacrylate | | X-1 | T-1 |
| D-55 | D-30 | Hydroxyethyl methacrylate | | X-1 | T-1 |
| D-56 | D-30 | Cyclohexyl methacrylate | Methacrylic acid | X-4 | T-1 |

D-30

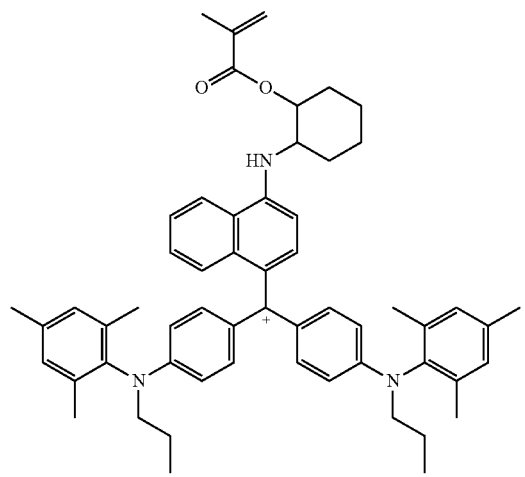

D-31

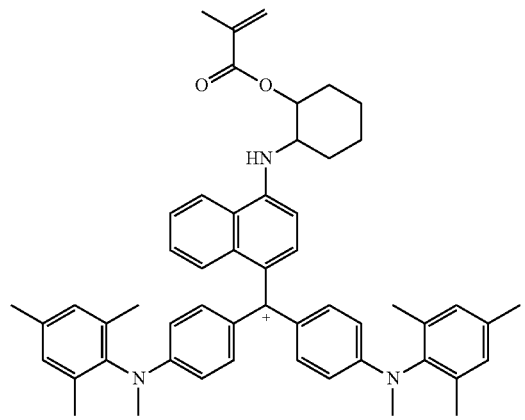

TABLE 1-continued
| Colorant | Triarylmethane repeating unit | Other repeating unit (copolymerization monomer) | Counter salt structure | Chain transfer agent structure |
|---|---|---|---|---|
| D-32 | 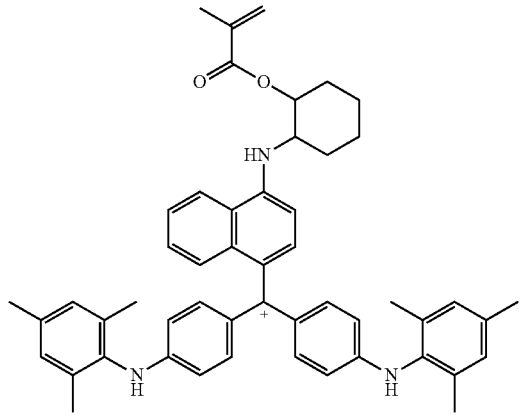 | | | |
| D-33 | 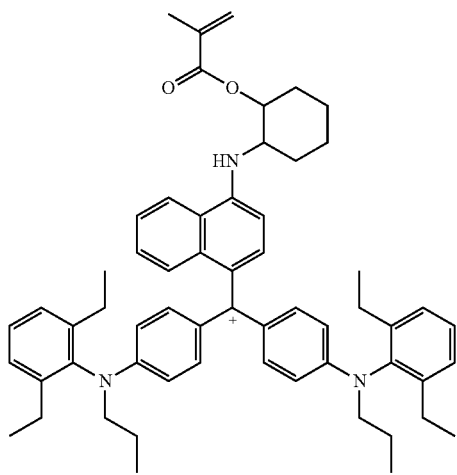 [SMILES: C=C(C)C(=O)OC1CCCCC1Nc1ccc([C+](c2ccc(N(CCC)c3c(CC)cccc3CC)cc2)c2ccc(N(CCC)c3c(CC)cccc3CC)cc2)c2ccccc12] | | | |
| D-34 | 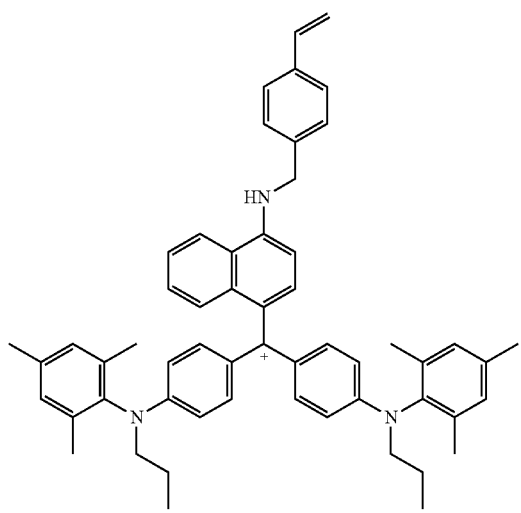 | | | |

TABLE 1-continued

| Colorant | Triarylmethane repeating unit | Other repeating unit (copolymerization monomer) | Counter salt structure | Chain transfer agent structure |
|---|---|---|---|---|
| D-A1 | | | | |
| D-A2 | | | | |
| D-A3 | | | | |
| D-A4 | | | | |

TABLE 1-continued

| Colorant | Triarylmethane repeating unit | Other repeating unit (copolymerization monomer) | Counter salt structure | Chain transfer agent structure |
|---|---|---|---|---|
| D-A5 | | | | |
| D-A6 | | | | |
| D-A7 | | | | |
| D-A8 | | | | |

TABLE 1-continued

| Colorant | Triarylmethane repeating unit | Other repeating unit (copolymerization monomer) | Counter salt structure | Chain transfer agent structure |
|---|---|---|---|---|

D-A9

[Structure: triarylmethane cation with two mesityl-N(Me)-phenyl groups, and a naphthyl group bearing -NH-CH2-CHCl-CH2-O-C(=O)-C(Me)=CH2]

D-A10

[Structure: triarylmethane cation with one mesityl-N(Me)-phenyl group, one N(Me)-containing diene substituted group, and a naphthyl group bearing -NH-CH2-CH(O-C(=O)-C(Me)=CH2)-CH2-O-CH2-CH=CH2]

X-1
CF$_3$SO$_2$N$^-$SO$_2$CF$_3$ x-2

[Cyclic structure: O$_2$S-N$^-$-SO$_2$ with F$_2$C-CF$_2$-CF$_2$ bridge]

x-3

[p-tolyl-S(O$_2$)-N$^-$-S(O$_2$)-CF$_3$]

x-4

[CH$_2$=C(Me)-C(=O)-O-CH$_2$CH$_2$CH$_2$-S(O$_2$)-N$^-$-S(O$_2$)-CF$_3$]

x-5
F$_3$CO$_2$S  SO$_2$CF$_3$
        C$^-$
        CO$_2$CF$_3$ x-6
CF$_3$SO$_3^-$

T-1
C$_{12}$H$_{25}$SH

T-2

CO$_2$H
|
CH
|
SH
|
CH$_2$
|
CO$_2$H

TABLE 1-continued

| Colorant | Triarylmethane repeating unit | Other repeating unit (copolymerization monomer) | Counter salt structure | Chain transfer agent structure |
| --- | --- | --- | --- | --- |
| T-3 | | | | |

[Structure of pentaerythritol tetrakis(3-mercaptopropionate)-type chain transfer agent with six SH groups]

Second Embodiment of Colorant

In the second embodiment of the colorant, the triarylmethane structure containing a cation is preferably represented by General Formula (TP1A) or General Formula (TP2A).

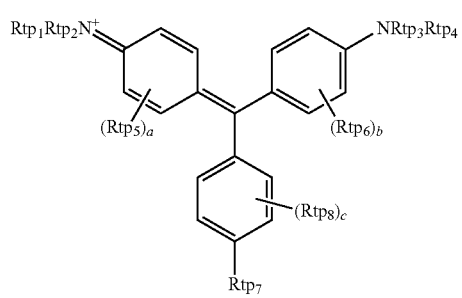

TP1A

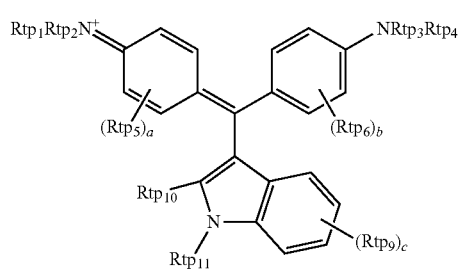

TP2A (in General Formulae (TP1A) and (TP2A), $Rtp_1$ to $Rtp_4$ each independently represent a hydrogen atom, an alkyl group, or an aryl group, $Rtp_5$, $Rtp_6$, $Rtp_8$, $Rtp_9$, and $Rtp_{11}$ each independently represent a substituent, $Rtp_7$ represents a hydrogen atom, an alkyl group, an aryl group, or $NRtp_{71}Rtp_{72}$, $Rtp_{71}$ and $Rtp_{72}$ each independently represent a hydrogen atom, an alkyl group, or an aryl group, $Rtp_{10}$ represents a hydrogen atom, an alkyl group, or an aryl group, a, b, and c each independently represent an integer of 0 to 4, and in the case where a, b, and c are 2 or more, two of $Rtp_5$, $Rtp_6$, and $Rtp_8$ may be bonded to each other to form a ring, any one of $Rtp_1$ to $Rtp_{11}$, $Rtp_{71}$, and $Rtp_{72}$ represents a site for bonding to the repeating unit, and at least one of $Rtp_1$ to $Rtp_{11}$, $Rtp_{71}$ and $Rtp_{72}$ may be substituted with General Formula (P)), General Formula (P)

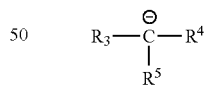

(in General Formula (P), L represents a single bond or a divalent linking group, and $X^1$ is selected from $-SO_3^-$, $-COO^-$, $-PO_4^-$, and at least one selected from a group including a structure represented by the following General Formula (A1) and a group including a structure represented by the following General Formula (A2)), General Formula (A1)

$$R^1 - \overset{\ominus}{N} - R^2$$

(in General Formula (A1), $R^1$ and $R^2$ each independently represent $-SO_2-$ or $-CO-$)
General Formula (A2), and $$R_3 - \overset{\ominus}{\underset{R^5}{C}} - R^4$$

(in General Formula (A2), $R^3$ represents $-SO_2-$ or $-CO-$, and $R^4$ and $R^5$ each independently represent $-SO_2-$, $-CO-$, or $-CN$)

In General Formulae (TP1A) and (TP2A), at least one of $Rtp_1$ to $Rtp_{11}$, $Rtp_{71}$, and $Rtp_{72}$ has the same definition as the triarylmethane structure containing a cation in the first embodiment as described above except that it may be substituted with General Formula (P), and a preferred range thereof is the same.

In General Formula (P), L represents a single bond or a divalent linking group. In the case where L represents a divalent linking group, a divalent linking group in which at least one hydrogen atom of the groups exemplified below is substituted with $X^1$ is preferable.

An alkyl group, a cycloalkyl group, an alkenyl group, a cycloalkenyl group, an alkynyl group, an aryl group, a heterocyclic group, a carboxyl group, an alkoxy group, an aryloxy group, a silyloxy group, a heterocyclic oxy group, an acyloxy group, a carbamoyloxy group, an amino group (including an alkylamino group and an anilino group), an acylamino group, an aminocarbonylamino group, an alkoxycarbonylamino group, an aryloxycarbonylamino group, a sulfamoylamino group, an alkylsulfonylamino or arylsulfonylamino group, an alkylthio group, an arylthio group, a heterocyclic thio group, a sulfamoyl group, a sulfo group, an alkylsulfinyl or arylsulfinyl group, an alkylsulfonyl or arylsulfonyl group, an acyl group, an aryloxycarbonyl group, an alkoxycarbonyl group, a carbamoyl group, an arylazo or heterocyclic azo group, an imide group, a phosphino group, a phosphinyl group, a phosphinyloxy group, a phosphinylamino group, a silyl group, an ether group, and a thioether group.

The alkyl group is preferably an alkyl group having 1 to 30 carbon atoms, and for example, a divalent alkyl group formed by removing one hydrogen atom from a methyl, ethyl, n-propyl, isopropyl, tert-butyl, n-octyl, 2-chloroethyl, 2-cyanoethyl, or 2-ethylhexyl group is preferable. $X^1$ may be introduced at any position in order to make these alkyl groups be divalent.

The cycloalkyl group is preferably a substituted or unsubstituted cycloalkyl group having 3 to 30 carbon atoms, and examples thereof include a cyclohexyl group and a cyclopentyl group. Other examples thereof include a group having a polycyclic structure such as, a polycycloalkyl group, for example, a bicycloalkyl group (preferably a substituted or unsubstituted bicycloalkyl group having 5 to 30 carbon atoms, for example, bicyclo[1,2,2]heptan-2-yl and bicyclo[2,2,2]octan-3-yl), and a tricycloalkyl group. A monocyclic cycloalkyl group and a bicycloalkyl group are preferable, and a monocyclic cycloalkyl group is particularly preferable, and $X^1$ may be introduced at any position in order to make the cycloalkyl group be divalent.

The alkenyl group may be linear or branched. The alkenyl group is preferably a substituted or unsubstituted alkenyl group having 2 to 30 carbon atoms. For example, vinyl, allyl, prenyl, geranyl, and oleyl are particularly preferable. $X^1$ may be introduced at any position in order to make these alkenyl groups be divalent.

The cycloalkenyl group is preferably a substituted or unsubstituted cycloalkenyl group having 3 to 30 carbon atoms. Examples thereof include 2-cyclopenten-1-yl and 2-cyclohexen-1-yl, a polycycloalkenyl group, for example, a bicycloalkenyl group, and preferably a substituted or unsubstituted bicycloalkenyl group having 5 to 30 carbon atoms, for example, bicyclo[2,2,1]hepto-2-en-1-yl and bicyclo[2,2,2]octo-2-en-4-yl, or a tricycloalkenyl group, and a monocyclic cycloalkenyl group is particularly preferable. $X^1$ may be introduced at any position in order to make these cycloalkenyl groups be divalent.

The alkynyl group is preferably a substituted or unsubstituted alkynyl group having 2 to 30 carbon atoms, and for example, ethynyl, propargyl, and trimethylsilylethanyl groups are preferable. $X^1$ may be introduced at any position in order to make these alkynyl groups be divalent.

The aryl group is preferably a substituted or unsubstituted aryl group having 6 to 30 carbon atoms, and for example, phenyl, p-tolyl, naphthyl, m-chlorophenyl, and o-hexadecanoylaminophenyl are preferable. $X^1$ may be introduced at any position in order to make these aryl groups be divalent.

The heterocyclic group is preferably a substituted or unsubstituted, saturated or unsaturated, aromatic or non-aromatic, and monocyclic or ring-fused 5- to 7-membered heterocyclic group, more preferably a heterocyclic group of Which ring-constituting atoms are selected from a carbon atom, a nitrogen atom, and a sulfur atom, and which has at least any one of hetero atoms including a nitrogen atom, an oxygen atom, and a sulfur atom, and still more preferably a 5- or 6-membered aromatic heterocyclic group having 3 to 30 carbon atoms, and for example, 2-furyl, 2-thienyl, 2-pyridyl, 4-pyridyl, 2-pyrimidinyl, and 2-benzothiazolyl groups are preferable. $X^1$ may be introduced at any position in order to make these heterocyclic groups be divalent.

The alkoxy group is preferably a substituted or unsubstituted alkoxy group having 1 to 30 carbon atoms, and for example, methoxy, ethoxy, isopropoxy, tert-butoxy, n-octyloxy, and 2-methoxyethoxy are preferable. $X^1$ may be introduced at any position in order to make these alkoxy groups be divalent.

The aryloxy group is preferably a substituted or unsubstituted aryloxy group having 6 to 30 carbon atoms, and for example, phenoxy, 2-methylphenoxy, 2,4-di-tert-amylphenoxy, 4-tert-butylphenoxy, 3-nitrophenoxy, and 2-tetradecanoylaminophenoxy groups are preferable. $X^1$ may be introduced at any position in order to make these aryloxy groups be divalent.

The silyloxy group is preferably a substituted or unsubstituted silyloxy group having 3 to 20 carbon atoms, and for example, trimethylsilyloxy, and tert-butyldimethylsilyloxy groups are preferable. $X^1$ may be introduced at any position in order to make these silyloxy groups be divalent.

The heterocyclic oxy group is preferably a substituted or unsubstituted heterocyclic oxy group having 2 to 30 carbon atoms. In the heterocycle, the heterocyclic moiety is preferably the heterocyclic moiety explained for the aforementioned heterocyclic group, and for example, 1-phenyltetrazol-5-oxy and 2-tetrahydropyranyloxy groups are preferable. $X^1$ may be introduced at any position in order to make these heterocyclic oxy groups be divalent.

The acyloxy group is preferably a substituted or unsubstituted alkylcarbonyloxy group having 2 to 30 carbon atoms, or a substituted or unsubstituted arylcarbonyloxy group having 6 to 30 carbon atoms, and for example, formyloxy, acetyloxy, pivaloyloxy, stearoyloxy, benzoyloxy, and p-methoxyphenylcarbonyloxy groups are preferable. $X^1$ may be introduced at any position in order to make these acyloxy groups be divalent.

The carbamoyloxy group is preferably a substituted or unsubstituted carbamoyloxy group having 1 to 30 carbon atoms, and for example, N,N-dimethylcarbamoyloxy, N,N-diethylcarbamoyloxy, morpholinocarbonyloxy, N,N-di-n-octylaminocarbonyloxy, and N-n-octylcarbamoyloxy groups are preferable. $X^1$ may be introduced at any position in order to make these carbamoyloxy group be divalent.

The alkoxycarbonyloxy group is preferably a substituted or unsubstituted alkoxycarbonyloxy group having 2 to 30 carbon atoms, and for example, methoxycarbonyloxy, ethoxycarbonyloxy, tert-butoxycarbonyloxy, and n-octylcarbonyloxy groups are preferable. $X^1$ may be introduced at any position in order to make these alkoxycarbonyloxy groups be divalent.

The aryloxycarbonyloxy group is preferably a substituted or unsubstituted aryloxycarbonyloxy group having 7 to 30 carbon atoms, and for example, phenoxycarbonyloxy, p-methoxyphenoxycarbonyloxy, and p-n-hexadecyloxyphenoxycarbonyloxy groups are preferable. $X^1$ may be introduced at any position in order to make these aryloxycarbonyloxy groups be divalent.

The amino group is preferably an amino group, a substituted or unsubstituted alkylamino group having 1 to 30 carbon atoms, a substituted or unsubstituted arylamino group having 6 to 30 carbon atoms, and a heterocyclic amino group having 0 to 30 carbon atoms, and for example, amino, methylamino, dimethylamino, anilino, diphenylamino, and N-1,3,5-triazin-2-ylamino groups are preferable. $X^1$ may be introduced at any position in order to make these amino groups be divalent.

The acylamino group is preferably a substituted or unsubstituted alkylcarbonylamino group having 1 to 30 carbon atoms, and a substituted or unsubstituted arylcarbonylamino group having 6 to 30 carbon atoms, and for example, formylamino, acetylamino, pivaloylamino, lauroylamino, benzoylamino, and 3,4,5-tri-n-octyloxyphenyl carbonylamino groups are preferable. $X^1$ may be introduced at any position in order to make these acylamino groups be divalent.

The aminocarbonylamino group is preferably a substituted or unsubstituted aminocarbonylamino group having 1 to 30 carbon atoms, and for example, carbamoylamino, N,N-dimethylaminocarbonyl amino, N,N-diethylaminocarbonylamino, and morpholinocarbonylamino groups are preferable. $X^1$ may be introduced at any position in order to make these aminocarbonylamino groups be divalent.

The alkoxycarbonylamino group is preferably a substituted or unsubstituted alkoxycarbonylamino group having 2 to 30 carbon atoms, and for example, methoxycarbonylamino, ethoxycarbonylamino, tert-butoxycarbonylamino, n-octadecyloxycarbonylamino, and N-methylmethoxycarbonylamino groups are preferable. $X^1$ may be introduced at any position in order to make these alkoxycarbonylamino groups be divalent.

The aryloxycarbonylamino group is preferably a substituted or unsubstituted aryloxycarbonylamino group having 7 to 30 carbon atoms, and for example, phenoxycarbonylamino, p-chlorophenoxycarbonylamino, and m-n-octyloxyphenoxycarbonylamino groups are preferable. $X^1$ may be introduced at any position in order to make these aryloxycarbonylamino groups be divalent.

The sulfamoylamino group is preferably a substituted or unsubstituted sulfamoylamino group having 0 to 30 carbon atoms, and for example, sulfamoylamino, N,N-dimethylaminosulfonylamino, and N-n-octylaminosulfonylamino groups are preferable. $X^1$ may be introduced at any position in order to make these sulfamoylamino groups be divalent.

The alkylsulfonylamino or arylsulfonylamino group is preferably a substituted or unsubstituted alkylsulfonylamino group having 1 to 30 carbon atoms, or a substituted or unsubstituted arylsulfonylamino group having 6 to 30 carbon atoms, and for example, methylsulfonylamino, butylsulfonylamino, phenylsulfonylamino, 2,3,5-trichlorophenylsulfonylamino, and p-methylphenylsulfonylamino groups are preferable. $X^1$ may be introduced at any position in order to make these arylsulfonylamino groups be divalent.

The alkylthio group is preferably a substituted or unsubstituted alkylthio group having 1 to 30 carbon atoms, and for example, methylthio, ethylthio, and n-hexadecylthio groups are preferable. $X^1$ may be introduced at any position in order to make these alkylthio groups be divalent.

The arylthio group is preferably a substituted or unsubstituted arylthio group having 6 to 30 carbon atoms, and for example, phenylthio, p-chlorophenylthio, and m-methoxyphenylthio groups are preferable. $X^1$ may be introduced at any position in order to make these arylthio groups be divalent.

The heterocyclic thio group is preferably a substituted or unsubstituted heterocyclic thio group having 2 to 30 carbon atoms, in which a heterocyclic moiety is preferably the heterocyclic moiety explained for the aforementioned heterocyclic group, for example, 2-benzothiazolylthio and 1-phenyltetrazol-5-ylthio groups are preferable. $X^1$ may be introduced at any position in order to make these heterocyclic thio groups be divalent.

The sulfamoyl group is preferably a substituted or unsubstituted sulfamoyl group having 0 to 30 carbon atoms, and for example, N-ethylsulfamoyl, N-(3-dodecyloxypropyl) sulfamoyl, N,N-dimethylsulfamoyl, N-acetylsulfamoyl, N-benzoylsulfamoyl, and N—(N'-phenylcarbamoyl)sulfamoyl groups are preferable. $X^1$ may be introduced at any position in order to make these sulfamoyl groups be divalent.

The alkylsulfinyl or arylsulfinyl group is preferably a substituted or unsubstituted alkylsulfinyl group having 1 to 30 carbon atoms or a substituted or unsubstituted arylsulfinyl group having 6 to 30 carbon atoms, and for example, methylsulfinyl, ethylsulfinyl, phenylsulfinyl, and p-methylphenylsulfinyl groups are preferable. $X^1$ may be introduced at any position in order to make these alkylsulfinyl or arylsulfinyl groups be divalent.

The alkylsulfonyl or arylsulfonyl group is preferably a substituted or unsubstituted alkylsulfonyl group having 1 to 30 carbon atoms or a substituted or unsubstituted arylsulfonyl group having 6 to 30 carbon atoms, and for example, methylsulfonyl, ethylsulfonyl, phenylsulfonyl, and p-methylphenylsulfonyl groups are preferable. $X^1$ may be introduced at any position in order to make these alkylsulfonyl or arylsulfonyl groups be divalent.

The acyl group is preferably a substituted or unsubstituted alkyl carbonyl group having 2 to 30 carbon atoms, or a substituted or unsubstituted arylcarbonyl group having 7 to 30 carbon atoms, and for example, acetyl, pivaloyl, 2-chloroacetyl, stearoyl, benzoyl, and p-n-octyloxyphenylcarbonyl groups are preferable. $X^1$ may be introduced at any position in order to make these acyl groups be divalent.

The aryloxycarbonyl group is preferably a substituted or unsubstituted aryloxycarbonyl group having 7 to 30 carbon atoms, and for example, phenoxycarbonyl, o-chlorophenoxycarbonyl, m-nitrophenoxycarbonyl, and p-tert-butylphenoxycarbonyl groups are preferable. $X^1$ may be introduced at any position in order to make these aryloxycarbonyl groups be divalent.

The alkoxycarbonyl group is preferably a substituted or unsubstituted alkoxycarbonyl group having 2 to 30 carbon atoms, and for example, methoxycarbonyl, ethoxycarbonyl, tert-butoxycarbonyl, and n-octadecyloxycarbonyl groups are preferable. $X^1$ may be introduced at any position in order to make these alkoxycarbonyl groups be divalent.

The carbamoyl group is preferably substituted or unsubstituted carbamoyl having 1 to 30 carbon atoms, and for example, carbamoyl, N-methylcarbamoyl, N,N-dimethylcarbamoyl, N,N-di-n-octylcarbamoyl, and N-(methylsulfonyl)carbamoyl groups are preferable. $X^1$ may be introduced at any position in order to make these carbamoyl groups be divalent.

The arylazo or heterocyclic azo group is preferably a substituted or unsubstituted arylazo group having 6 to 30 carbon atoms, or a substituted or unsubstituted heterocyclic azo group having 3 to 30 carbon atoms (the heterocyclic moiety is preferably the heterocyclic moiety explained for the aforementioned heterocyclic group), and for example, phenylazo, p-chlorophenylazo, and 5-ethylthio-1,3,4-thiadiazol-2-ylazo are preferable. $X^1$ may be introduced at any position in order to make these arylazo or heterocyclic azo groups be divalent.

The imide group is preferably a substituted or unsubstituted imide group having 2 to 30 carbon atoms, and for example, N-succinimide and N-phthalimide groups are preferable. $X^1$ may be introduced at any position in order to make these imide groups be divalent.

The phosphino group is preferably a substituted or unsubstituted phosphino group having 2 to 30 carbon atoms, and for example, dimethylphosphino, diphenylphosphino, and methylphenoxyphosphino groups are preferable. $X^1$ may be introduced at any position in order to make these phosphino groups be divalent.

The phosphinyl group is preferably a substituted or unsubstituted phosphinyl group having 2 to 30 carbon atoms, and for example, phosphinyl, dioctyloxyphosphinyl, and diethoxyphosphinyl groups are preferable. $X^1$ may be introduced at any position in order to make these phosphinyl groups be divalent.

The phosphinyloxy group is preferably a substituted or unsubstituted phosphinyloxy group having 2 to 30 carbon atoms, and for example, diphenoxyphosphinyloxy and dioctyloxyphosphinyloxy groups are preferable. $X^1$ may be introduced at any position in order to make these phosphinyloxy groups be divalent.

The phosphinylamino group is preferably a substituted or unsubstituted phosphinylamino group having 2 to 30 carbon atoms, and for example, dimethoxyphosphinylamino and dimethylaminophosphinylamino groups are preferable. $X^1$ may be introduced at any position in order to make these phosphinylamino groups be divalent.

The silyl group is preferably a substituted or unsubstituted silyl group having 3 to 30 carbon atoms, and for example, trimethylsilyl, tert-butyldimethylsilyl, and phenyldimethylsilyl groups are preferable. $X^1$ may be introduced at any position in order to make these silyl groups be divalent.

Furthermore, in the case where L represents a divalent linking group, it preferably represents —$NR^{10}$—, —O—, —$SO_2$—, a fluorine-substituted alkylene group, a fluorine-substituted phenylene group, or a group formed by combination of these groups. Particularly, L in General Formula (P) is preferably a group formed by combination of —$NR^{10}$—, —$SO_2$, and a fluorine-substituted alkylene group, a group formed by combination of —O— and a fluorine-substituted phenylene group, or a group formed by combination of —$NR^{10}$—, —$SO_2$, and a fluorine-substituted alkylene group.

In —$NR^{10}$—, $R^{10}$ represents a hydrogen atom or an alkyl group having 1 to 5 carbon atoms, with the hydrogen atom being preferable.

The fluorine-substituted alkylene group preferably has 1 to 10 carbon atoms, more preferably has 1 to 6 carbon atoms, and still more preferably has 1 to 3 carbon atoms. These alkylene groups are more preferably perfluoroalkylene groups. Specific examples of the fluorine-substituted alkylene group include a difluoromethylene group, a tetrafluoroethylene group, and a hexafluoropropylene group.

The fluorine-substituted phenylene group preferably has 6 to 20 carbon atoms, more preferably has 6 to 14 carbon atoms, and still more preferably has 6 to 10 carbon atoms. These alkylene groups are more preferably perfluoroalkylene groups. Specific examples of the fluorine-substituted phenylene group include a tetrafluorophenylene group, a hexafluoro-1-naphthylene group, and a hexafluoro-2-naphthylene group.

In General Formula (P), $X^1$ is a counter anion, and preferably selected from groups including —$SO_3^-$, —$PO_4^-$, and at least one selected from a structure represented by General Formula (A1) and a structure represented by General Formula (A2). Here, the structure represented by General Formula (A1) and the structure represented by General Formula (A2) have the same definitions as explained in the first embodiment as described above.

It is preferable that the group including the structure represented by General Formula (A1) has a fluorine-substituted alkyl group at one terminal of $R^1$ and $R^2$ in General Formula (A1), and it is more preferable that one of $R^1$ and $R^2$ is directly bonded to a fluorine-substituted alkyl group. The fluorine-substituted alkyl group preferably has 1 to 10 carbon atoms, more preferably has 1 to 6 carbon atoms, still more preferably has 1 to 3 carbon atoms, even still more preferably has 1 or 2 carbon atoms, and particularly preferably has 1 carbon atom. These alkyl groups are more preferably perfluoroalkyl groups. As a specific example of the fluorine-substituted alkyl group, a trifluoromethyl group is preferable.

It is preferable that the group including the structure represented by General Formula (A2) preferably has a fluorine-substituted alkyl group at one terminal of at least one of $R^3$ to $R^5$ in General Formula (A2), and it is more preferable that at least one of $R^3$ to $R^5$ is directly bonded to a fluorine-substituted alkyl group. Particularly, it is preferable that the group has a fluorine-substituted alkyl group at at least two terminals of $R^3$ to $R^5$, and it is more preferable that at least two of $R^3$ to $R^5$ is directly bonded to a fluorine-substituted alkyl group. The fluorine-substituted alkyl group has the same definition as that explained for the group including structure represented by General Formula (A1) and a preferred range thereof is the same.

Other specific examples of $X^1$ include the counter anion A as described above. In this case, any one of hydrogen atom or halogen atom constituting the counter anion A is bonded to L in General Formula (P).

In General Formulae (TP1A) and (TP2A), any one of $Rtp_1$ to $Rtp_{11}$, $Rtp_{71}$ and $Rtp_{72}$ may be substituted with a repeating unit having the triarylmethane structure containing a cation, and further, may be substituted with General Formula (P).

Furthermore, in General Formulae (TP1A) and (TP2A), one portion or two or more portions, which are substituted with General Formula (P), may be present. In the case where two or more portions substituted with General Formula (P) are present, cations in number corresponding to the number of counter anions, in addition to cations included in the triarylmethane structure, in the colorant.

Specific examples of the repeating unit having the triarylmethane structure containing the cation of the second embodiment used in the present invention are shown below, but are not limited thereto.

D-101 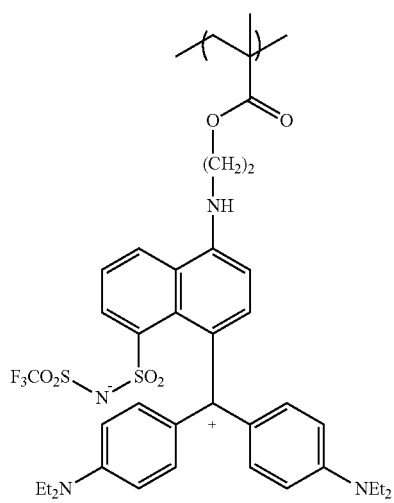
D-102 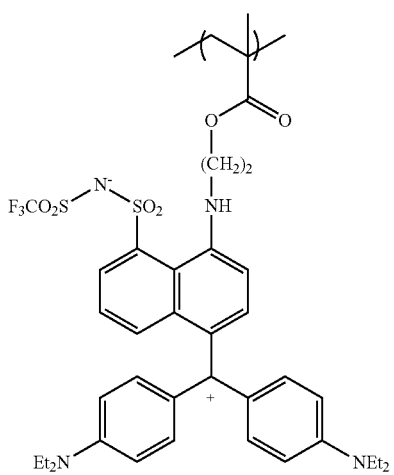
D-103 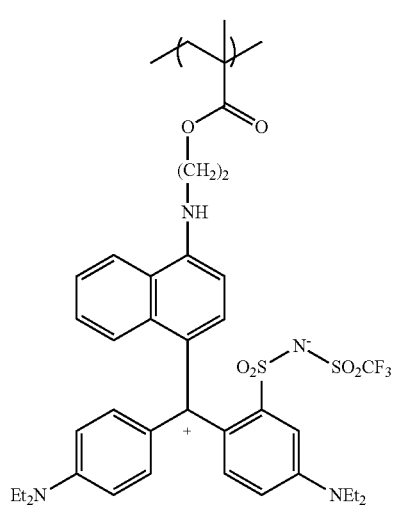
D-104 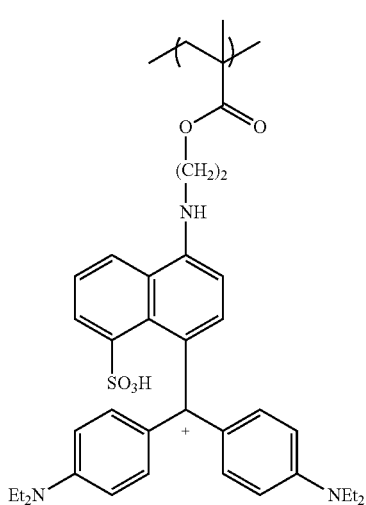
D-105 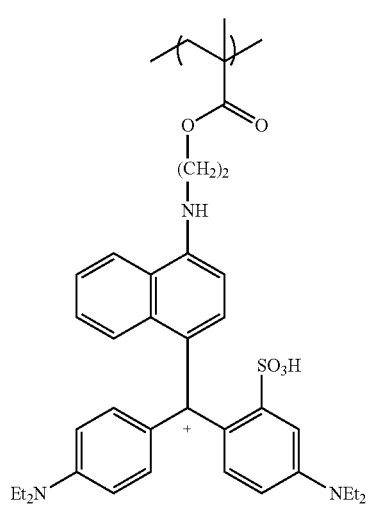
D-106 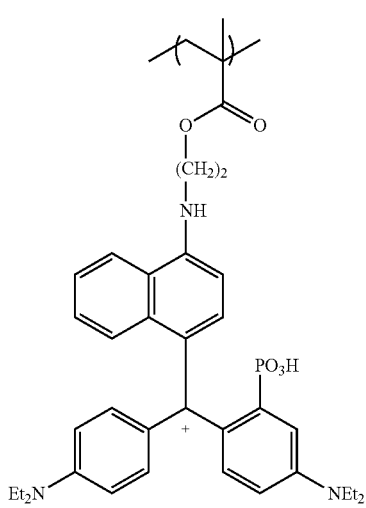

-continued
D-107
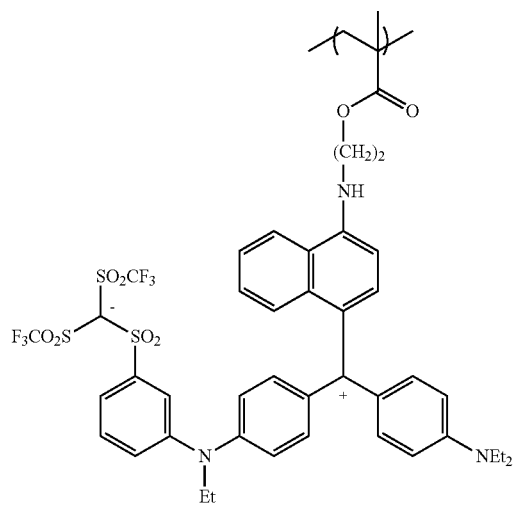
D-108
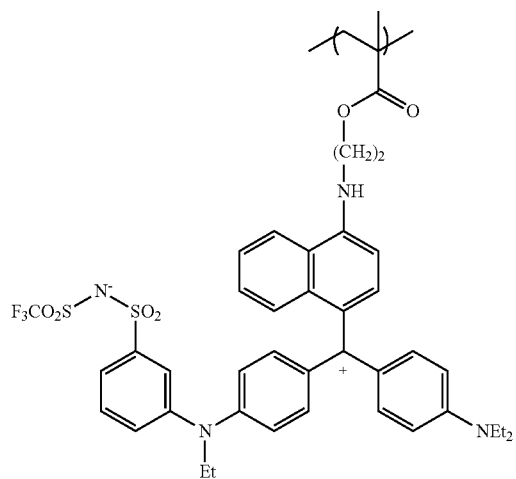
D-109
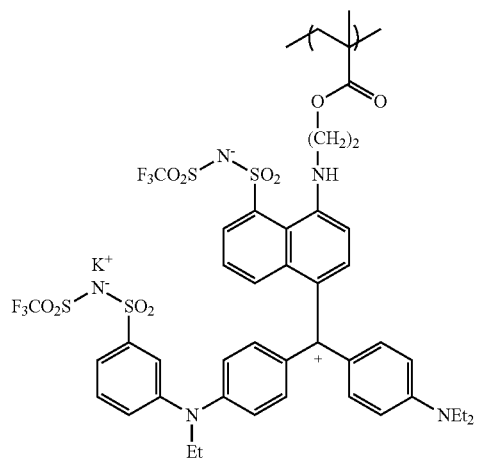
D-110
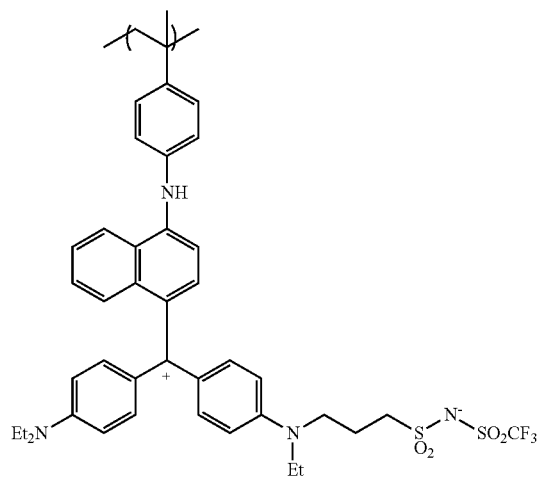
D-111
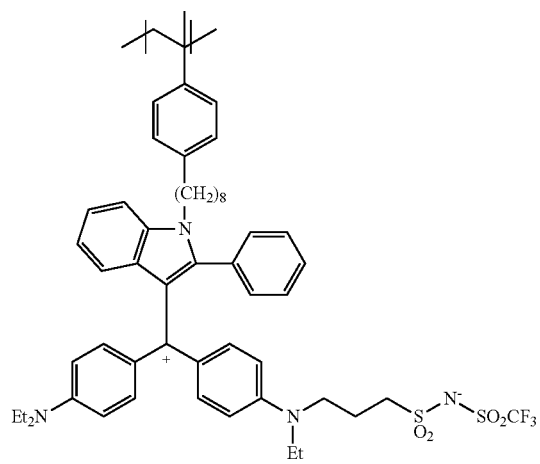
D-112
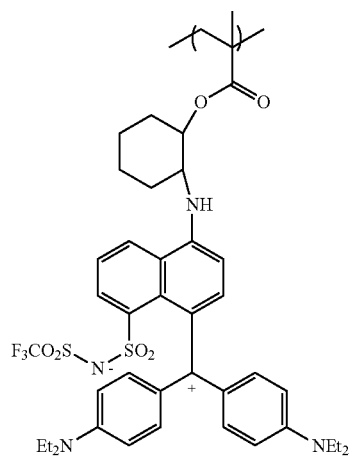

-continued
D-113
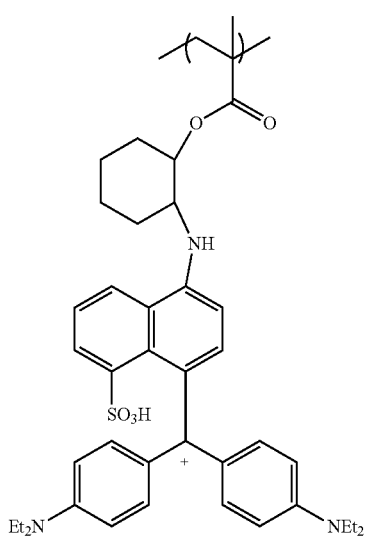
D-114
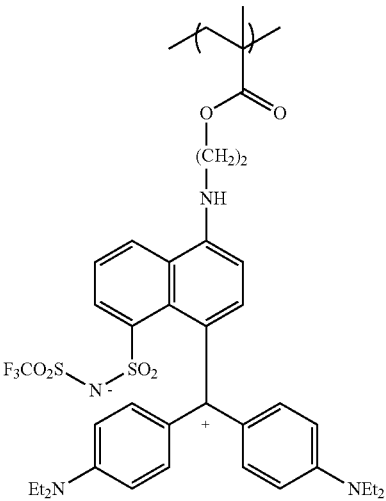
D-115
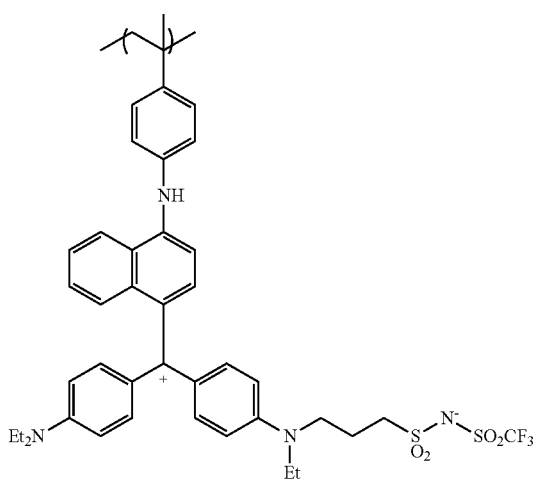
D-116
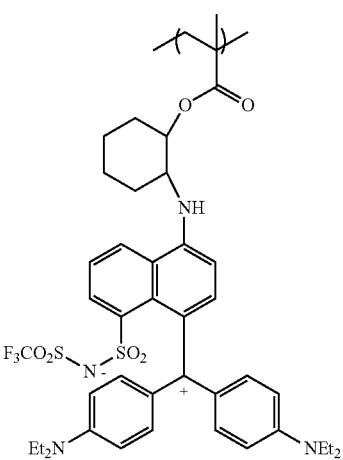
D-117
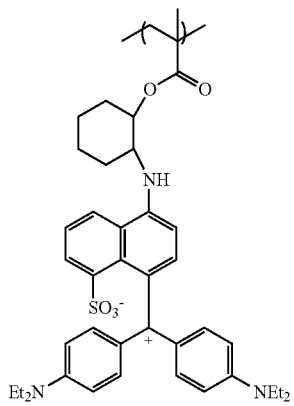
D-118
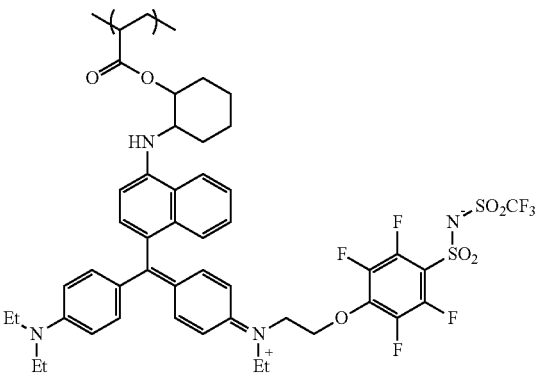

-continued
D-119
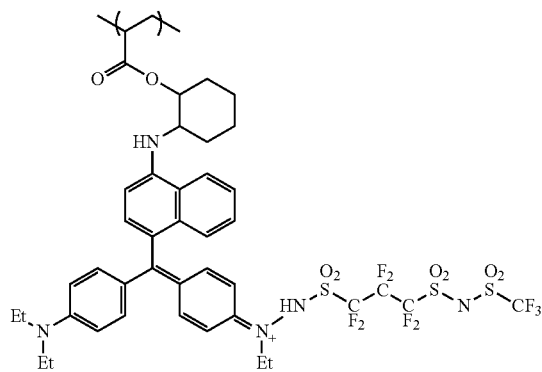
D-120
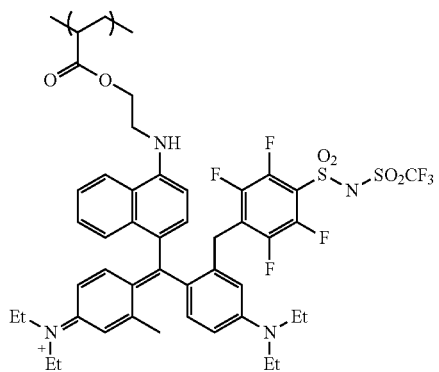
D-121
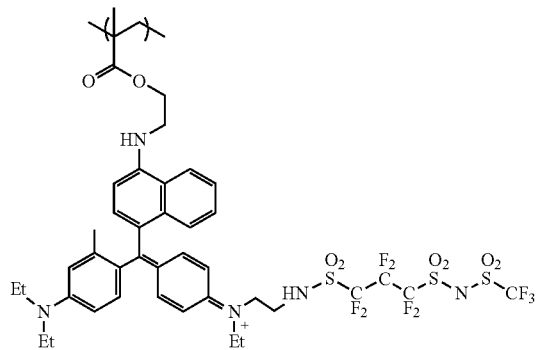
D-122
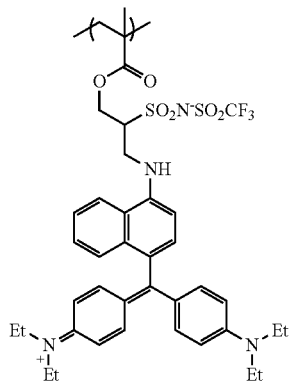
D-123
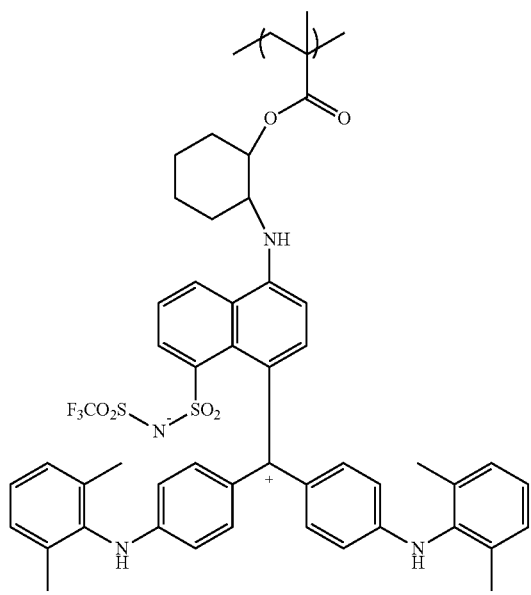
D-124
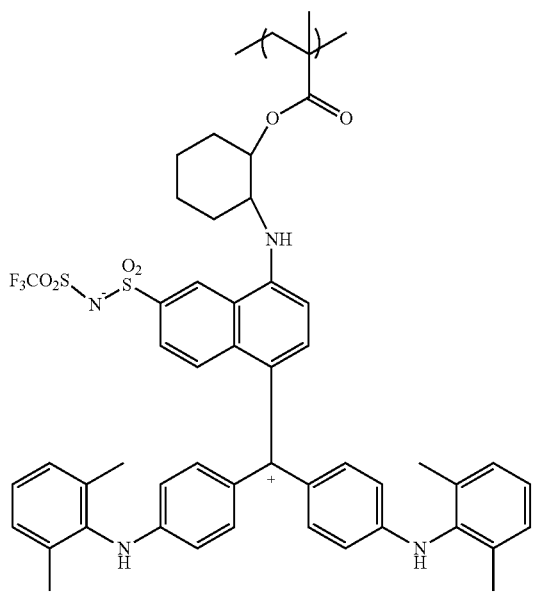

-continued
D-125
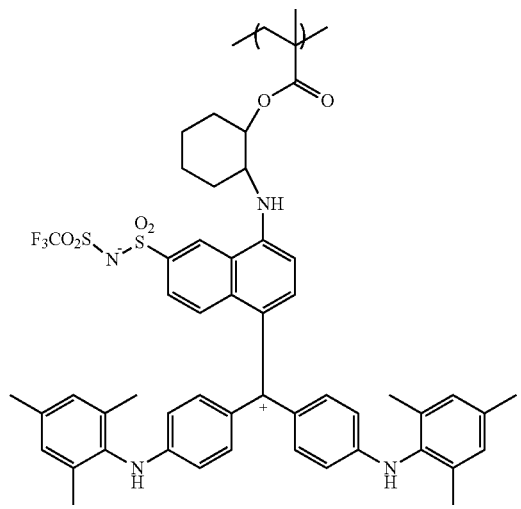
D-126
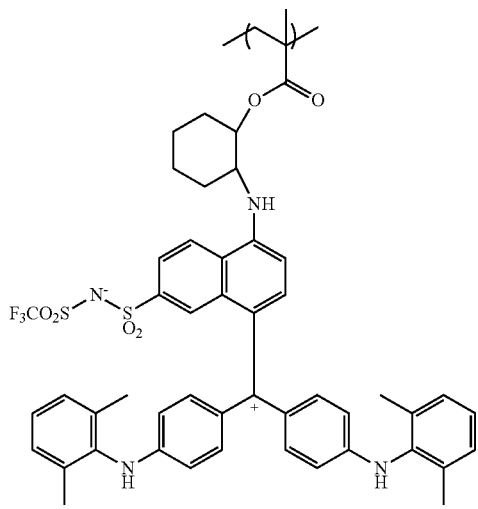
D-127
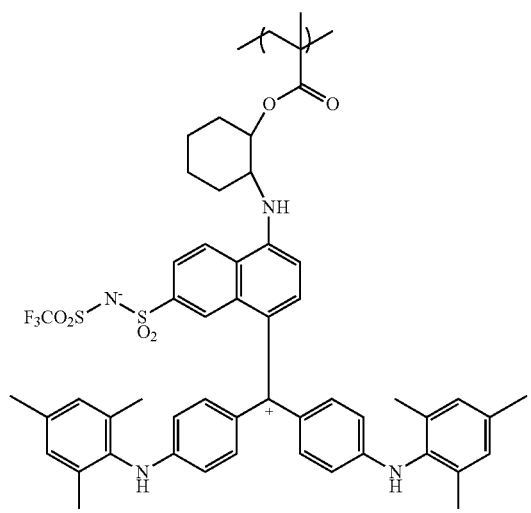
D-128
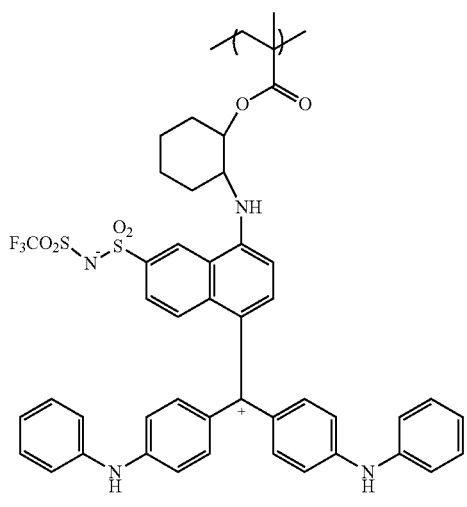
D-129
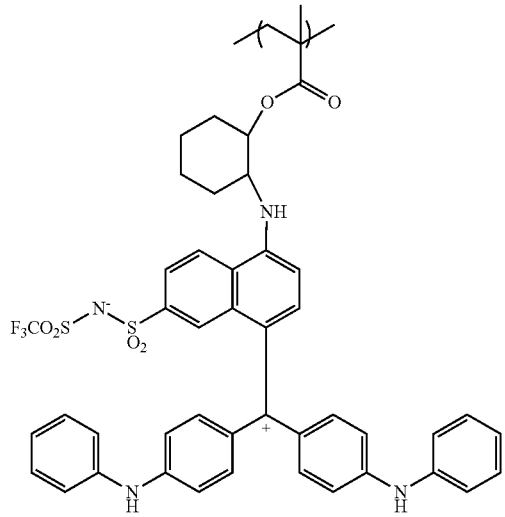
D-130
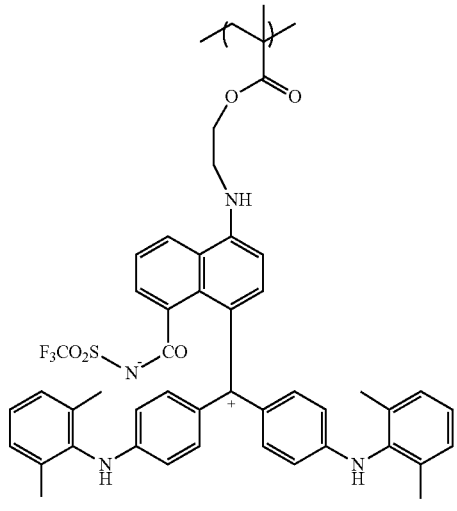

-continued
D-131
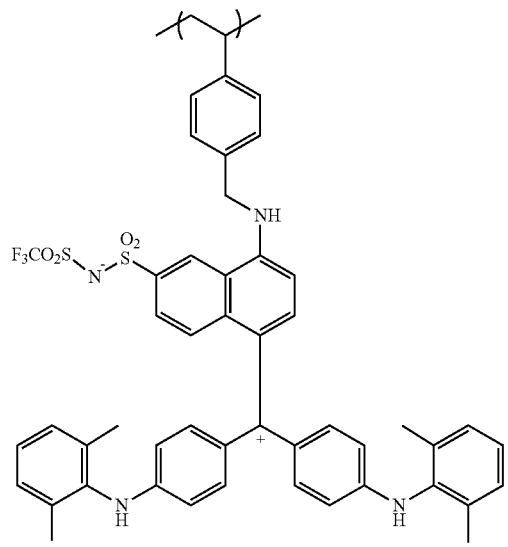
D-132
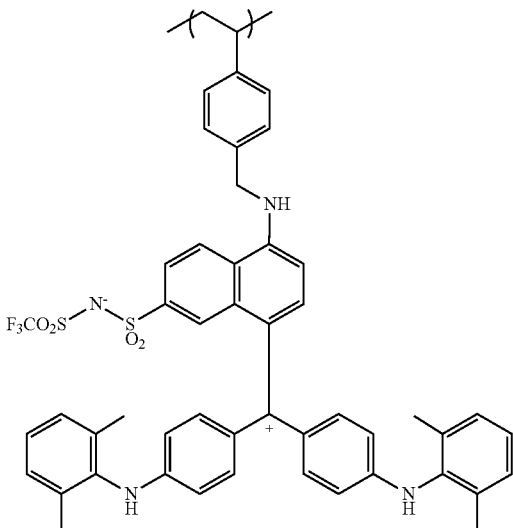
D-133
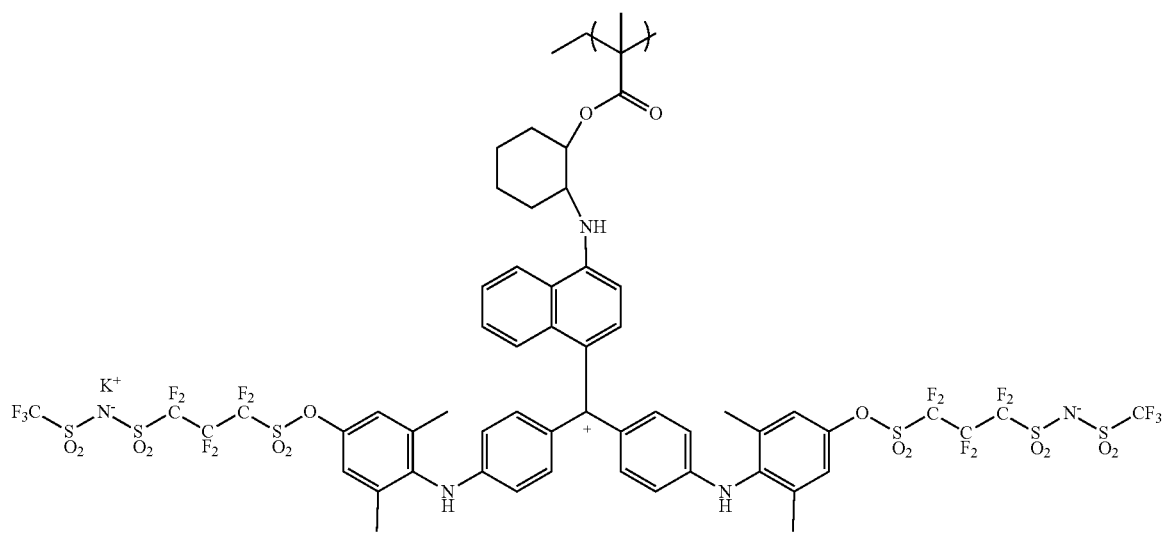

D-134
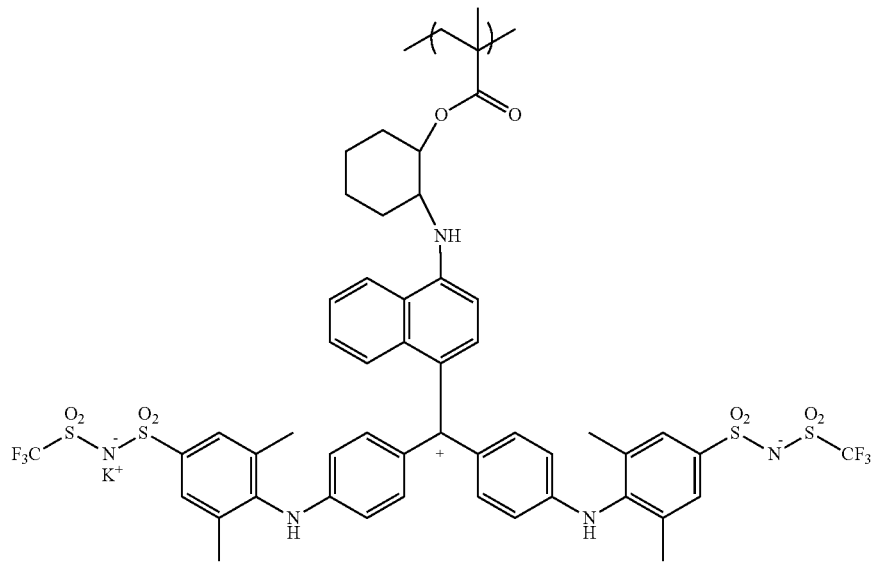
D135
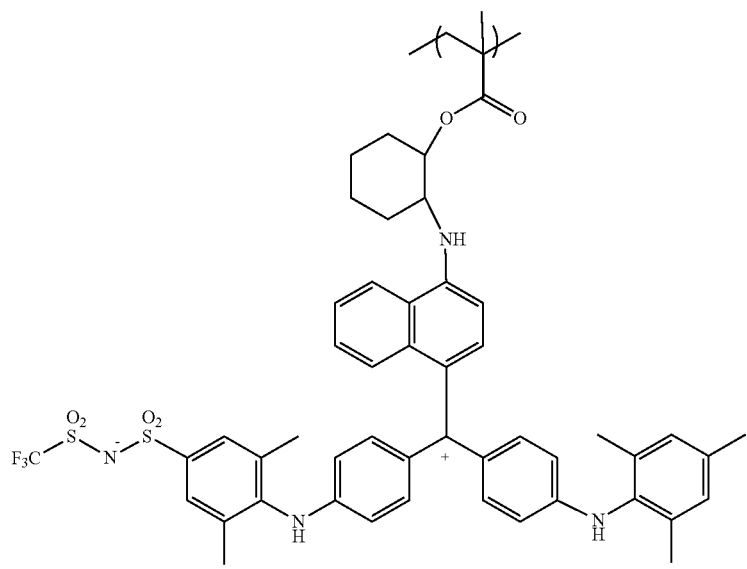
D-136  D-137
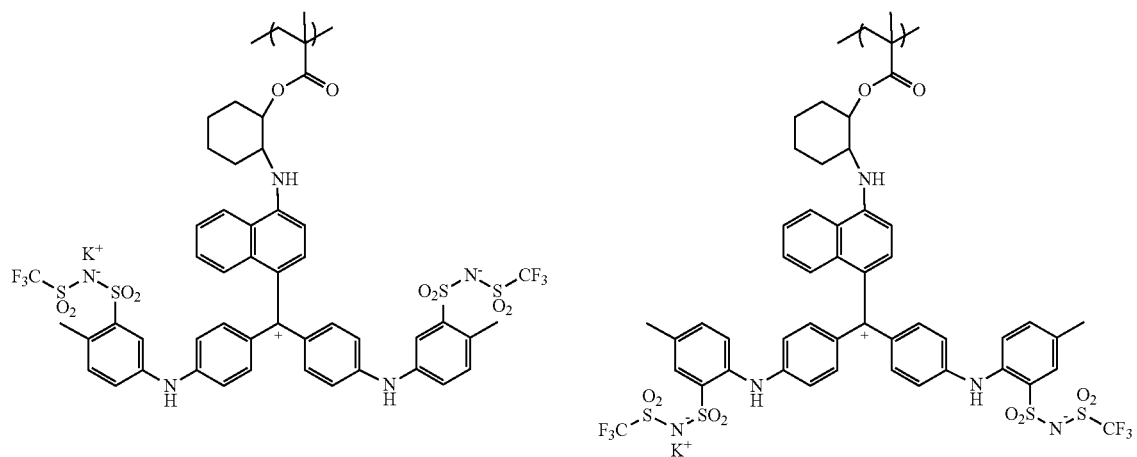

D-138

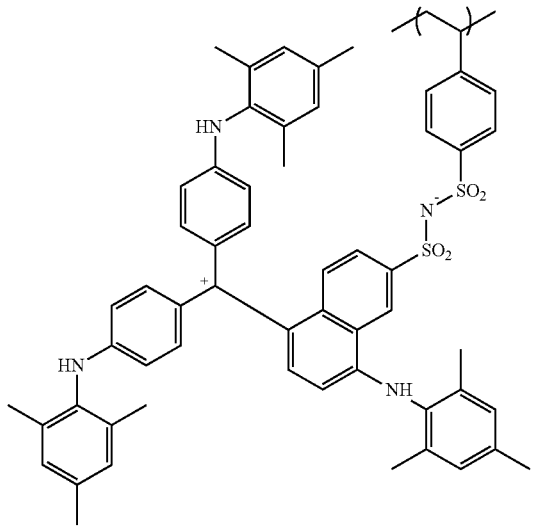

The weight average molecular weight of the triarylmethane dye is preferably 1,000 to 100,000.

One kind or a combination of two or more kinds of the triarylmethane dye may be included.

The content of the triarylmethane dye is preferably 10% by mass to 60% by mass, and more preferably 10% by mass to 40% by mass, with respect to the total solid content of the colored composition of the present invention.

<<Other Coloring Compounds>>

The colored composition of the present invention may include one kind or two or more kinds of coloring compounds other than the above-described colorant, that is, the triarylmethane dye. Examples of such other coloring compounds include a dye compound, a pigment compound, and a dispersion thereof.

Examples of the dye compound include an azo-based (for example, Solvent Yellow 162), an anthraquinone-based compound (for example, the anthraquinone compounds described in JP2001-10881A), a phthalocyanine-based compound (for example, the phthalocyanine compound described in US2008/0076044A), a xanthene-based compound (for example, C. I. Acid Red 289), a triarylmethane-based compound (for example, C. I. Acid Blue 7, C. I. Acid Blue 83, C. I. Acid Blue 90, C. I. Solvent Blue 38, C. I. Acid Violet 17, C. I. Acid Violet 49, and C. I. Acid Green 3), a methine dye, a xanthene dye (for example, JP2010-32999A), and a dipyrromethene metal complex compound (for example, JP2012-237985A).

Examples of the pigment compound include perylene, perynone, quinacridone, quinacridonequinone, anthraquinone, anthathrone, benzimidazolone, condensed disazo, disazo, azo, indanthrone, phthalocyanine, triarylcarbonium, dioxazine aminoanthraquinone, diketopyrrolopyrrole, indigo, thioindigo, isoindoline, isoindolinone, pyranthrone, and isoviolanthrone. More specific examples of the pigment compound include perylene-compound pigments such as Pigment•Red 190, Pigment•Red 224, Pigment•Violet 29; perynone-compound pigments such as Pigment•Orange 43 and Pigment•Red 194; quinacridone-compound pigments such as Pigment•Violet 19, Pigment•Violet 42, Pigment•Red 122, Pigment•Red 192, Pigment•Red 202, Pigment•Red 207, and Pigment•Red 209; quinacridonequinone-compound pigments such as Pigment•Red 206, Pigment•Orange 48, and Pigment•Orange 49; anthraquinone-compound pigments such as Pigment•Yellow 147; anthathrone-compound pigments such as Pigment•Red 168; benzimidazolone-compound pigments such as Pigment Brown 25, Pigment•Violet 32, Pigment•Orange 36, Pigment•Yellow 120, Pigment•Yellow 180, Pigment•Yellow 181, Pigment•Orange 62, and Pigment•Red 185; condensed disazo-compound pigments such as Pigment•Yellow 93, Pigment•Yellow 94, Pigment•Yellow 95, Pigment•Yellow 128, Pigment•Yellow 166, Pigment•Orange 34, Pigment•Orange 13, Pigment•Orange 31, Pigment•Red 144, Pigment•Red 166, Pigment•Red 220, Pigment•Red 221, Pigment•Red 242, Pigment•Red 248, Pigment•Red 262, and Pigment Brown 23; disazo-compound pigments such as Pigment•Yellow 13, Pigment•Yellow 83, and Pigment•Yellow 188; azo-compound pigments such as Pigment•Red 187, Pigment•Red 170, Pigment•Yellow 74, Pigment•Yellow 150, Pigment•Red 48, Pigment•Red 53, Pigment•Orange 64, and Pigment•Red 247; indanthrone-compound pigments such as Pigment•Blue 60; indanthrene-compound pigments such as Pigment•Green 7, Pigment•Green 36, Pigment•Green 37, Pigment•Green 58, Pigment•Blue 16, Pigment•Blue 75, and Pigment•Blue 15; triaryl carbonium-compound pigments such as Pigment•Blue 56 and Pigment•Blue 61; dioxazine-compound pigments such as Pigment•Violet 23 and Pigment•Violet 37; aminoanthraquinone-compound pigments such as Pigment•Red 177; diketopyrrolopyrrole-compound pigments such as Pigment•Red 254, Pigment•Red 255, Pigment•Red 264, Pigment•Red 272, Pigment•Orange 71, and Pigment•Orange 73; thioindigo-compound pigments such as Pigment•Red 88; isoindoline-compound pigments such as Pigment•Yellow 139 and Pigment•Orange 66; isoindolinone-compound pigments such as Pigment•Yellow 109 and Pigment•Orange 61; pyranthrone-compound pigments such as Pigment•Orange 40 and Pigment•Red 216; and isoviolanthrone-compound pigments such as Pigment•Violet 31.

In the present invention, green to cyan color materials are preferable, and phthalocyanine-compound pigments such as Pigment•Green 7, Pigment•Green 36, Pigment•Green 37, Pigment•Green 58, Pigment•Blue 16, Pigment•Blue 75, and Pigment•Blue 15; triarylcarbonium-compound pigments such as Pigment•Blue 56 and Pigment•Blue 61; dioxazine-compound pigments such as Pigment•Violet 23 and Pigment•Violet 37; aminoanthraquinone-compound pigments such as Pigment•Red 177; diketopyrrolopyrrole-compound pigments such as Pigment•Red 254, Pigment•Red 255, Pigment•Red 264, Pigment•Red 272, Pigment•Orange 71, and Pigment•Orange 73; thioindigo-compound pigments such as Pigment•Red 88; isoindoline-compound pigments such as Pigment•Yellow 139 and Pigment•Orange 66; isoindolinone-compound pigments such as Pigment•Yellow 109 and a Pigment•Orange 61; pyranthrone-compound pigments such as Pigment•Orange 40 and Pigment•Red 216; or isoviolanthrone-compound pigments such as Pigment•Violet 31 are preferable.

Particularly, other coloring compounds preferably further include at least one of a xanthene dye dipyrromethene metal complex compound, an oxazine pigment, and a phthalocyanine pigment.

<Xanthene Dye>

The xanthene dye is a dye including a compound having a xanthene skeleton in the molecule. Examples of the xanthene dye include C. I. Acid Red 51 (the descriptions of C. I. Acid Red are hereinafter omitted while only the numbers thereof are described, with the others shall be the same), 52, 87, 92, 94, 289, and 388, C. I. Acid Violet 9, 30, and 102, C. I. Basic Red 1 (Rhodamine 6G), 2, 3, 4, and 8, C. I. Basic Red 10 (Rhodamine B), 11, C. I. Basic Violet 10, 11, and 25, C. I. Solvent Red 218, C. I. Mordant Red 27, C. I. Reactive Red 36 (Rose Bengal B), Sulforhodamine G, the xanthene dyes described in JP2010-32999A, and the xanthene dyes described in JP4492760B. The xanthene dye is preferably one which is dissolved in an organic solvent.

As the xanthene dye, a dye including a compound represented by Formula (1a) (hereinafter referred to as a "compound (1a)" in some cases) is preferable. The compound (1a) may be a tautomer. In the case of using the compound (1a), the content of the compound (1a) in the xanthene dye is preferably 50% by mass or more, more preferably 70% by mass or more, and still more preferably 90% by mass or more. Particularly, it is preferable that as the xanthene dye, only the compound (1a) is used.

Formula (1a)

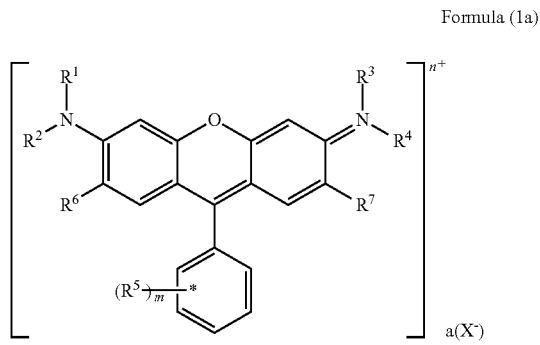

(In Formula (1a), $R^1$ to $R^4$ each independently represent a hydrogen atom, a monovalent saturated hydrocarbon group having 1 to 20 carbon atoms, which may have a substituent, or a monovalent aromatic hydrocarbon group having 6 to 10 carbon atoms, which may have a substituent, in which —$CH_2$— contained in the saturated hydrocarbon group may be substituted with —O—, —CO—, or —$NR^{11}$—.

$R^1$ and $R^2$ may be bonded to each other to form a ring containing a nitrogen atom. $R^3$ and $R^4$ may be bonded to each other to form a ring containing a nitrogen atom.

$R^5$ represents —OH, —$SO_3^-$, —$SO_3H$, —$SO_3^-Z^+$, —$CO_2H$, —$CO_2^-Z^+$, —$CO_2R^8$, —$SO_3R^8$, or —$SO_2NR^9R^{10}$.

$R^6$ and $R^7$ each independently represent a hydrogen atom or an alkyl group having 1 to 6 carbon atoms.

m represents an integer of 0 to 5. When m is 2 or more, a plurality of $R^5$'s may be the same as or different from each other.

a represents 0 or 1.

X represents a halogen atom.

n represents the total number of anions in the compound (1a).

$Z^+$ represents $N^+(R^{11})_4$, $Na^+$, or $K^+$, and four $R^{11}$'s may be the same as or different from each other.

$R^8$ represents a monovalent saturated hydrocarbon group having 1 to 20 carbon atoms, and the hydrogen atom contained in the saturated hydrocarbon group may be substituted with a halogen atom.

$R^9$ and $R^{10}$ each independently represent a hydrogen atom or a monovalent saturated hydrocarbon group having 1 to 20 carbon atoms, which may have a substituent, in which —$CH_2$— contained in the saturated aliphatic hydrocarbon group may be substituted with —O—, —CO—, —NH—, or —$NR^8$—, and $R^9$ and $R^{10}$ may be bonded to each other to form a 3- to 10-membered heterocycle containing a nitrogen atom.

$R^{11}$ represents a hydrogen atom, a monovalent saturated hydrocarbon group having 1 to 20 carbon atoms, or an aralkyl group having 7 to 10 carbon atoms.)

Examples of the monovalent aromatic hydrocarbon group having 6 to 10 carbon atoms in $R^1$ to $R^4$ include a phenyl group, a toluyl group, a xylyl group, a mesityl group, a propylphenyl group, and a butylphenyl group. Among these, a toluyl group, xylyl group, mesityl group, and a propylphenyl group are preferable, and a toluyl group and a xylyl group, especially a 2,6-di-substituted xylyl group are particularly preferable.

Examples of the substituent which the aromatic hydrocarbon group may have include a halogen atom, —$R^8$, —OH, —$OR^8$, —$SO_3$—, —$SO_3H$, —$SO_3^-Z^+$, —$CO_2H$, —$CO_2R^8$, —$SR^8$, —$SO_2R^8$, —$SO_3R^8$, and —$SO_2NR^9R^{10}$. Among these, as the substituent, —$SO_3$—, —$SO_3H$, —$SO_3^-Z^+$ and —$SO_2NR^9R^{10}$ are preferable, and —$SO_3^-Z^+$ and —$SO_2NR^9R^{10}$ are more preferable. As —$SO_3^-Z^+$ in this case, —$SO_3^-N^+(R^{11})_4$ is preferable. When $R^1$ to $R^4$ are these groups, it is possible to form a color filter having reduced generation of foreign materials and excellent heat resistance, with the colored composition of the present invention, including the compound (1a).

Examples of the ring formed by the mutual bonding of $R^1$ and $R^2$ and the ring formed by the mutual bonding of $R^3$ and $R^4$ include the following ones.

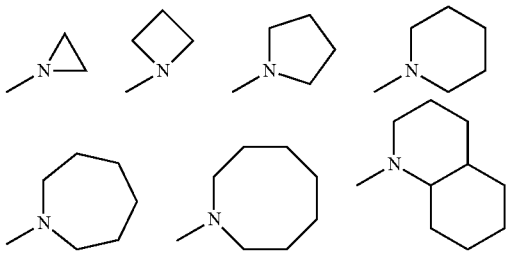

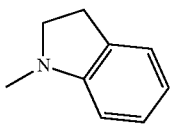

Among these, from the viewpoint of stability of the compound, the structures shown below are preferable.

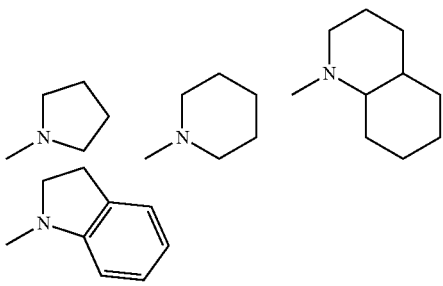

Examples of the monovalent saturated hydrocarbon group having 1 to 20 carbon atoms in $R^8$ to $R^{11}$ include a linear alkyl group such as a methyl group, an ethyl group, a propyl group, a butyl group, a pentyl group, a hexyl group, a heptyl group, an octyl group, a nonyl group, a decyl group, dodecyl group, a hexadecyl group, and an eicosyl group; a branched alkyl group such as an isopropyl group, an isobutyl group, an isopentyl group, a neopentyl group, and a 2-ethylhexyl group; and an alicyclic saturated hydrocarbon group having 3 to 20 carbon atoms, such as a cyclopropyl group, a cyclopentyl group, a cyclohexyl group, a cycloheptyl group, a cyclooctyl group, and a tricyclodecyl group.

Among these, a methyl group, an ethyl group, a propyl group, isopropyl group, a butyl group, a pentyl group, a hexyl group, a heptyl group, an octyl group, and a 2-ethylhexyl group are preferable, and a propyl group, an isopropyl group, a butyl group, a hexyl group, and a 2-ethylhexyl group are particularly preferable.

The hydrogen atom contained in the monovalent saturated hydrocarbon group having 1 to 20 carbon atoms may be substituted with, for example, an aromatic hydrocarbon group having 6 to 10 carbon atoms, or a halogen atom.

Examples of $-OR^8$ include a methoxy group, an ethoxy group, a propoxy group, a butoxy group, a pentyl group, a hexyloxy group, a heptyloxy group, an octyl group, a 2-ethylhexyloxy group, and an eicosyloxy group. Among these, a methoxy group, an ethoxy group, a propoxy group, and a butoxy group are preferable.

Examples of $-CO_2R^8$ include a methoxycarbonyl group, ethoxycarbonyl, a propoxycarbonyl group, a tert-butoxycarbonyl group, a hexyloxycarbonyl group, and an eicosyloxycarbonyl group. Among these, a methoxycarbonyl group, an ethoxycarbonyl, and a propoxycarbonyl group are preferable.

Examples of $-SR^8$ include a methylsulfanyl group, an ethylsulfanyl group, a butylsulfanyl group, a hexylsulfanyl group, a decylsulfanyl group, and an eicosylsulfanyl group.

Examples of $-SO_2R^8$ include a methylsulfonyl group, an ethylsulfonyl group, a butylsulfonyl group, a hexylsulfonyl group, a decylsulfonyl group, and an eicosylsulfonyl group.

Examples of $-SO_3R^8$ include a methoxysulfonyl group, an ethoxy sulfonyl group, a propoxysulfonyl group, a tert-butoxysulfonyl group, a hexyloxysulfonyl group, and eicosyloxysulfonyl group.

Examples of $-SO_2NR^9R^{10}$ include a sulfamoyl group; an N-monosubstituted sulfamoyl group such as an N-methylsulfamoyl group, an N-ethylsulfamoyl group, an N-propylsulfamoyl group, an N-isopropylsulfamoyl group, an N-butylsulfamoyl group, an N-isobutylsulfamoyl group, an N-sec-butylsulfamoyl group, an N-tert-butylsulfamoyl group, an N-pentylsulfamoyl group, an N-(1-ethylpropyl)sulfamoyl group, an N-(1,1-dimethylpropyl)sulfamoyl group, an N-(1,2-dimethylpropyl)sulfamoyl group, an N-(2-ethylhexyl)sulfamoyl group, an N-(2,2-dimethylpropyl)sulfamoyl group, an N-(1-methylbutyl)sulfamoyl group, an N-(2-methylbutyl)sulfamoyl group, an N-(3-methylbutyl)sulfamoyl group, an N-cyclopentylsulfamoyl group, an N-hexylsulfamoyl group, an N-(1,3-dimethylbutyl)sulfamoyl group, an N-(3,3-dimethylbutyl)sulfamoyl group, an N-heptylsulfamoyl group, an N-(1-methylhexyl)sulfamoyl group, an N-(1,4-dimethylpentyl)sulfamoyl group, an N-octylsulfamoyl group, an N-(2-ethylhexyl)sulfamoyl group, an N-(1,5-dimethyl)hexylsulfamoyl group, and an N-(1,1,2,2-tetramethylbutyl)sulfamoyl group; and an N,N-disubstituted sulfamoyl group such as an N,N-dimethylsulfamoyl group, an N,N-ethylmethylsulfamoyl group, an N,N-diethylsulfamoyl group, an N,N-propylmethylsulfamoyl group, an N,N-isopropylmethylsulfamoyl group, an N,N-tert-butylmethylsulfamoyl group, an N,N-butylethylsulfamoyl group, an N,N-bis(1-methylpropyl)sulfamoyl group, and an N,N-heptylmethylsulfamoyl group.

Among these, an N-methylsulfamoyl group, an N-ethylsulfamoyl group, an N-propylsulfamoyl group, an N-isopropylsulfamoyl group, an N-butylsulfamoyl group, an N-pentylsulfamoyl group, and an N-(2-ethylhexyl)sulfamoyl group are preferable, and an N-methylsulfamoyl group, an N-ethylsulfamoyl group, an N-propylsulfamoyl group, an N-butylsulfamoyl group, and an N-(2-ethylhexyl)sulfamoyl group are more preferable.

The monovalent saturated hydrocarbon group having 1 to 20 carbon atoms in $R^9$ or $R^{10}$ may have a substituent and examples of the substituent include a hydroxy group and a halogen atom.

$R^5$ represents $-OH$, $-SO_3^-$, $-SO_3H$, $-SO_3^-Z^+$, $-CO_2H$, $-CO_2^-Z^+$, $-CO_2R^8$, $-SO_3R^8$, or $-SO_2NR^9R^{10}$.

$R^5$ is preferably $-CO_2H$, $-CO_2^-Z^+$, $-CO_2R^8$, $-CO_2NHR^9$, $-SO_3^-$, $-SO_3^-Z^+$, $-SO_3H$, $-SO_2R^8$, or $-SO_2NHR^9$, and more preferably $-SO_3^-$, $-SO_3^-Z^+$, $-SO_3H$, or $-SO_2NHR^9$.

m is preferably an integer of 1 to 4, and more preferably 1 or 2.

Examples of the alkyl group having 1 to 6 carbon atoms in $R^6$ and $R^7$ include alkyl groups having 1 to 6 carbon atoms among the alkyl groups exemplified for the monovalent saturated hydrocarbon having 1 to 20 carbon atoms as described above.

Examples of the aralkyl group having 7 to 10 carbon atoms in $R^{11}$ include a benzyl group, a phenylethyl group, and a phenylbutyl group.

$Z^+$ is $N^+(R^{11})_4$, $Na^+$, or $K^+$, and preferably $N^+(R^{11})_4$.

$N^+(R^{11})_4$ is preferably a monovalent saturated hydrocarbon group in which at least two of four $R^{11}$'s have 5 to 20 carbon atoms. Further, the total number of carbon atoms of four $R^{11}$'s is preferably 20 to 80, and more preferably 20 to 60. In the case where $N^+(R^{11})_4$ is present in the compound (1a), a color filter having less foreign materials can be formed from the colored composition of the present invention, including the compound (1a), in which $R^{11}$ is the group above.

As the compound (1a), a compound represented by Formula (3a) (hereinafter referred to as a "compound (3a)" in some cases) is also preferable. The compound (3a) may be a tautomer thereof.

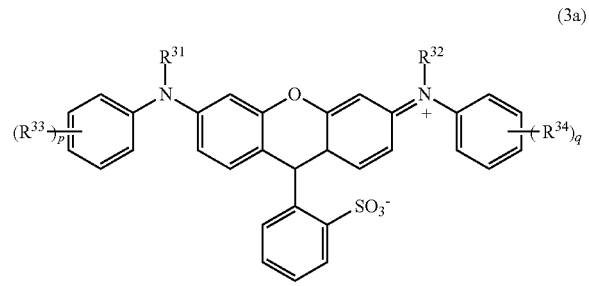

(3a)

(In Formula (3a), $R^{31}$ and $R^{32}$ each independently represent a monovalent saturated hydrocarbon group having 1 to 10 carbon atoms. The hydrogen atom contained in the monovalent saturated hydrocarbon group having 1 to 10 carbon atoms may be substituted with an aromatic hydrocarbon group having 6 to 10 carbon atoms, or a halogen atom. The hydrogen atom contained in the aromatic hydrocarbon group having 6 to 10 carbon atoms may be substituted with an alkoxy group having 1 to 3 carbon atoms, and —$CH_2$— contained in the monovalent saturated hydrocarbon group having 1 to 10 carbon atoms may be substituted with —O—, —CO—, or —$NR^{11}$—.

$R^{33}$ and $R^{34}$ each independently represent an alkyl group having 1 to 4 carbon atoms, an alkylsulfanyl group having 1 to 4 carbon atoms, or an alkylsulfonyl group having 1 to 4 carbon atoms.

$R^{31}$ and $R^{33}$ may be bonded to each other to form a ring containing a nitrogen atom, and $R^{32}$ and $R^{34}$ may be bonded to each other to form a ring containing a nitrogen atom.

p and q each independently represent an integer of 0 to 5. When p is 2 or more, a plurality of $R^{33}$'s may be the same as or different from each other. When q is 2 or more, a plurality of $R^{34}$'s may be the same as or different from each other.

$R^{11}$ has the same definition as $R^{11}$ in Formula (1a)).

Examples of the monovalent saturated hydrocarbon group having 1 to 10 carbon atoms in $R^{31}$ and $R^{32}$ include the monovalent saturated hydrocarbon group having 1 to 10 carbon atoms among the monovalent saturated hydrocarbon groups having 1 to 10 carbon atoms, explained for $R^8$ in Formula (1a). Among these, a methyl group, an ethyl group, a propyl group, a butyl group, a hexyl group, and a 2-ethylhexyl group are preferable. Examples of the aromatic hydrocarbon group having 6 to 10 carbon atoms, which may be included as the substituent, include the monovalent aromatic hydrocarbon group having 6 to 10 carbon atoms, explained for $R^1$ in Formula (1a).

Examples of the alkoxy group having 1 to 3 carbon atoms, which a hydrogen atom contained in the aromatic hydrocarbon group having 6 to 10 carbon atoms may be substituted include a methoxy group, an ethoxy group, and a propoxy group.

$R^{31}$ and $R^{32}$ each independently represent a monovalent saturated hydrocarbon group having 1 to 3 carbon atoms.

Examples of the alkyl group having 1 to 4 carbon atoms in $R^{33}$ and $R^{34}$ include a methyl group, an ethyl group, a propyl group, a butyl group, an isopropyl group, an isobutyl group, a sec-butyl group, and a tert-butyl group. Among these, a methyl group, an ethyl group, and a propyl group are preferable.

Examples of the alkylsulfanyl group having 1 to 4 carbon atoms in $R^{33}$ and $R^{34}$ include a methylsulfanyl group, an ethylsulfanyl group, a propylsulfanyl group, a butylsulfanyl group, and an isopropylsulfonyl group.

Examples of the alkylsulfonyl group having 1 to 4 carbon atoms in $R^{33}$ and $R^{34}$ include a methylsulfonyl group, an ethylsulfonyl group, a propylsulfonyl group, a butylsulfonyl group, and an isopropylsulfonyl group.

p and q are preferably an integer of 0 to 2, and more preferably 0 or 1.

Examples of the compound (1a) include compounds represented by Formulae (1-1) to (1-43). Further, in the formulae, R represents a monovalent saturated hydrocarbon group having 1 to 20 carbon atoms, and is preferably a branched alkyl group having 6 to 12 carbon atoms, and more preferably a 2-ethylhexyl group.

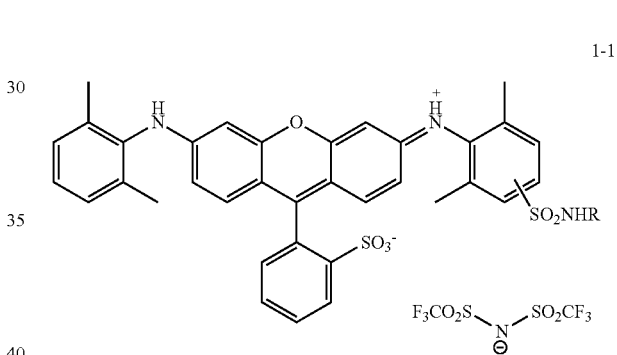

1-1

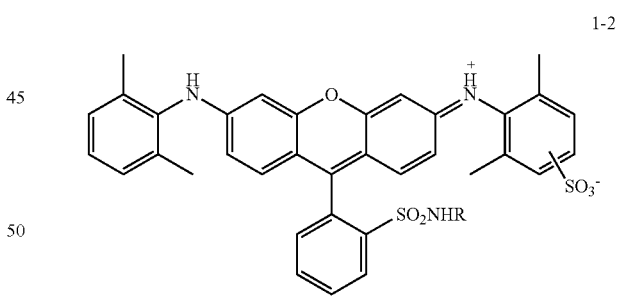

1-2

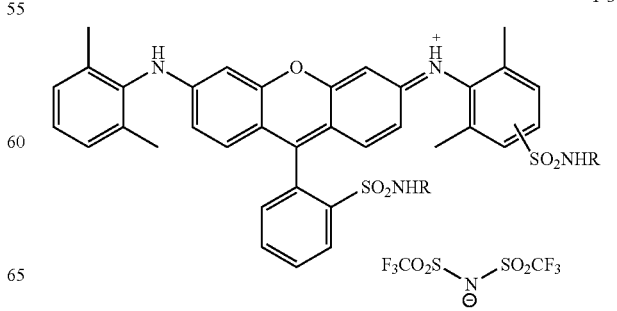

1-3

1-4
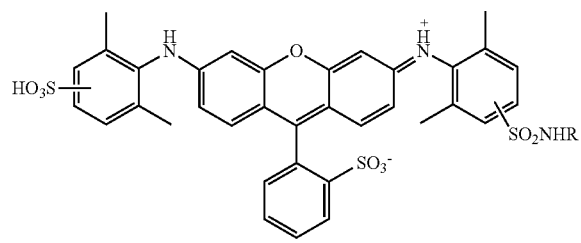
1-5
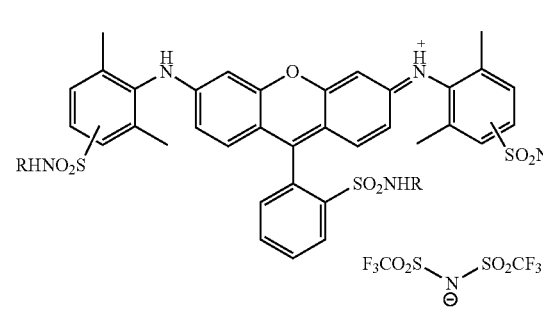
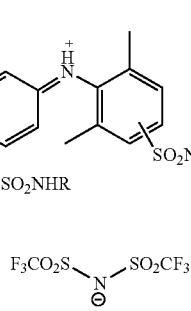
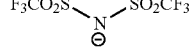
1-6
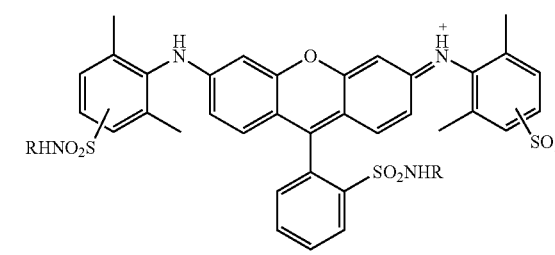
1-7
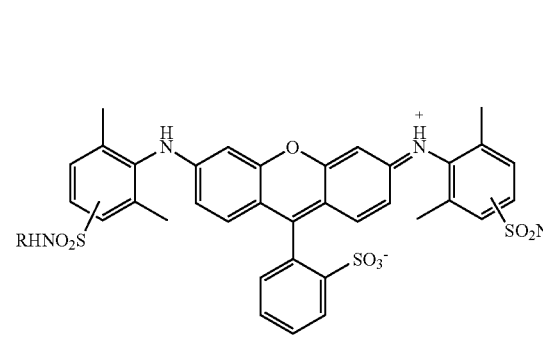
1-8
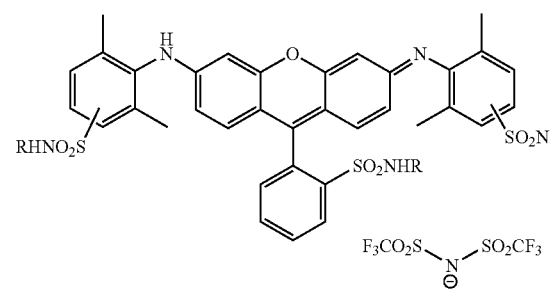
1-9
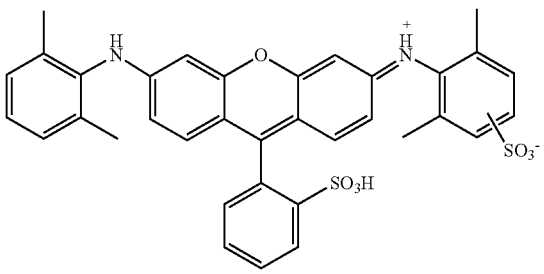
1-10
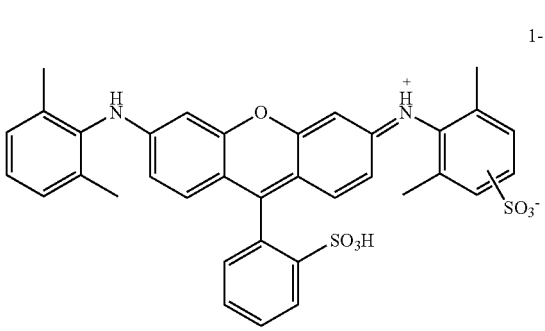
1-11
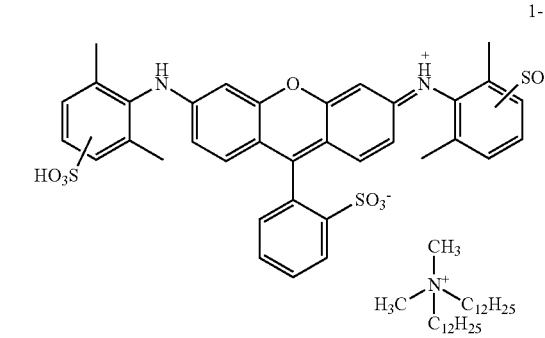
1-12
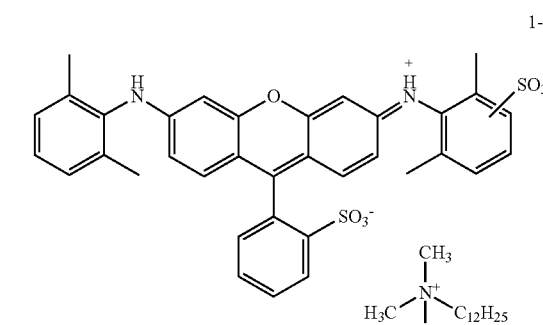
1-13
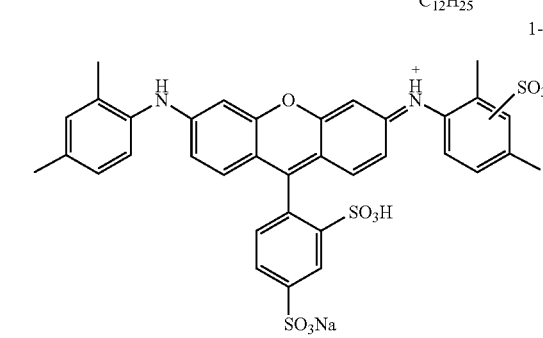

1-14
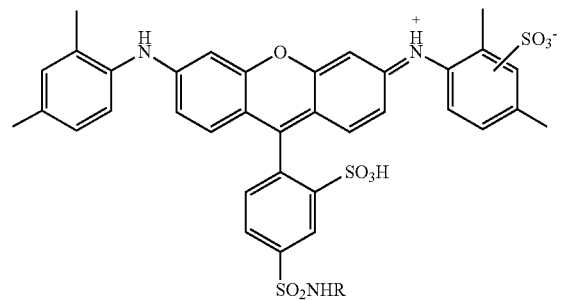
1-15
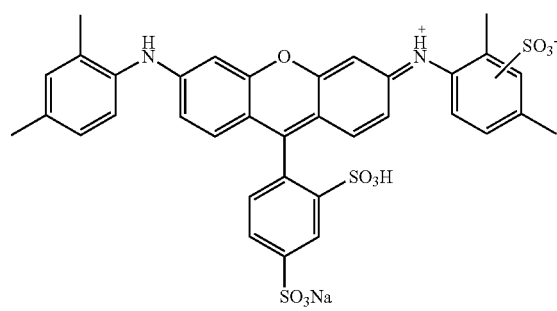
1-16
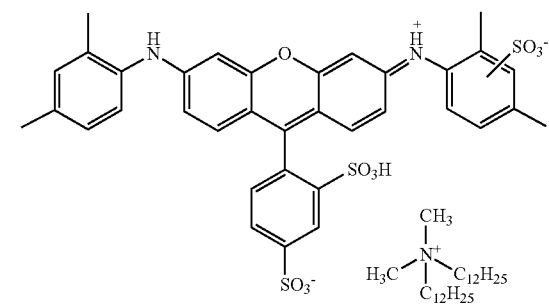
1-17
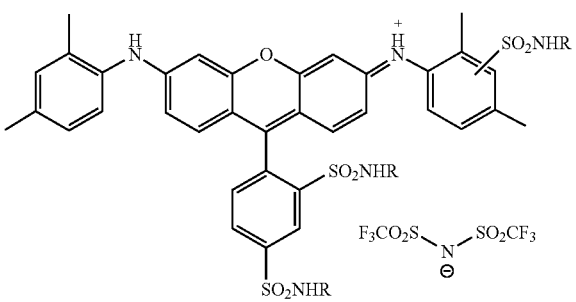
1-18
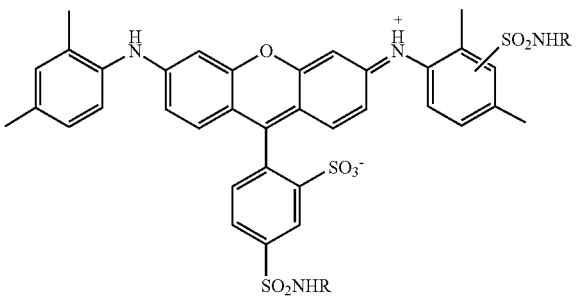
1-19
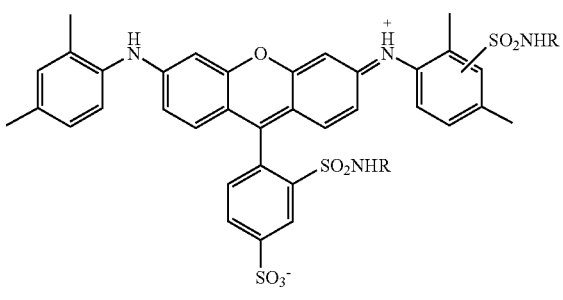
1-20
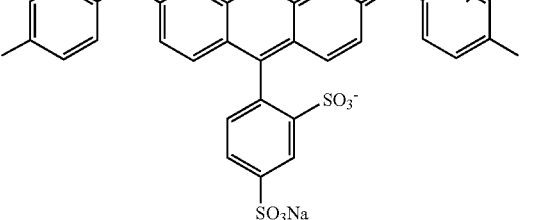
1-21
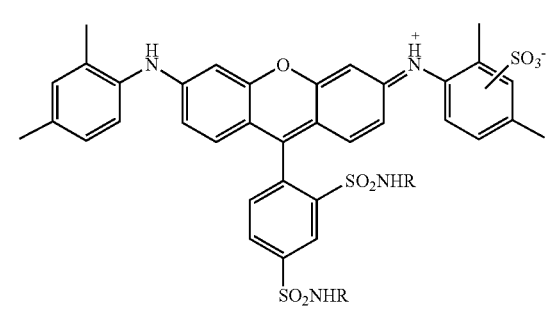
1-22
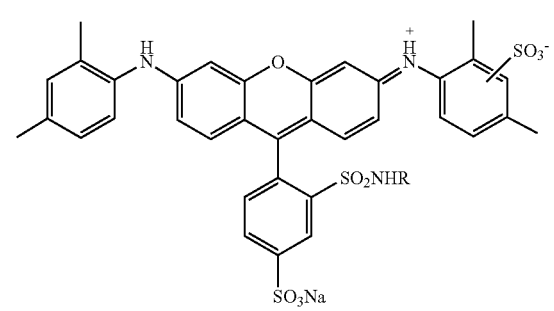
1-23
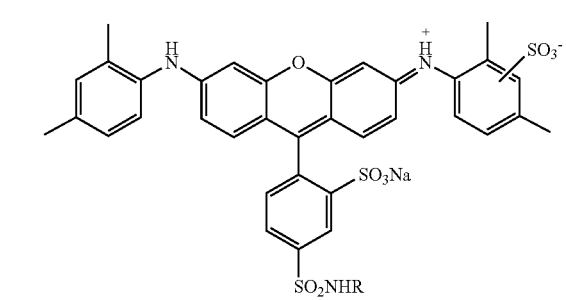

-continued
1-24
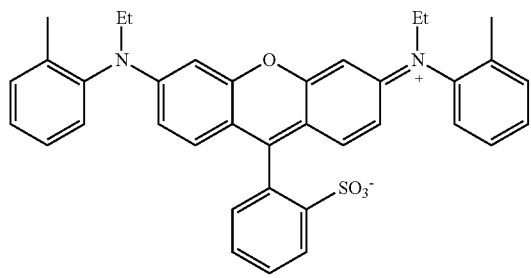
1-25
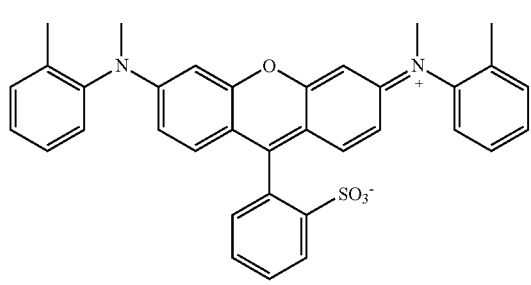
1-26
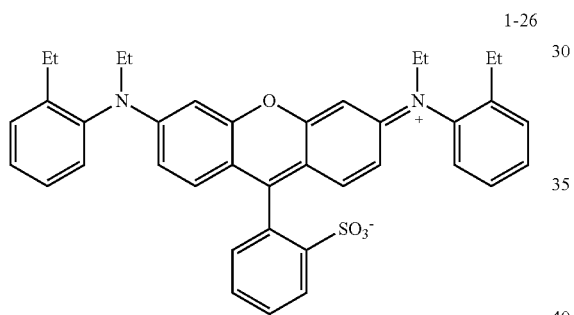
1-27
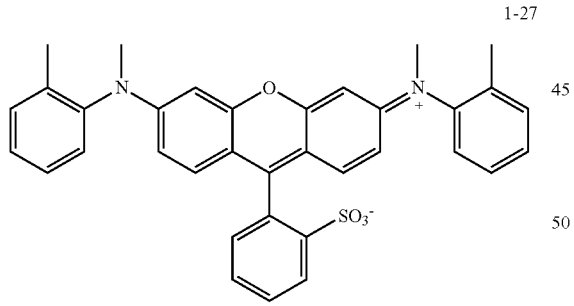
1-28
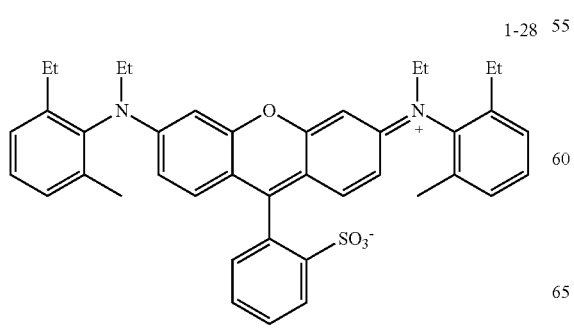
-continued
1-29
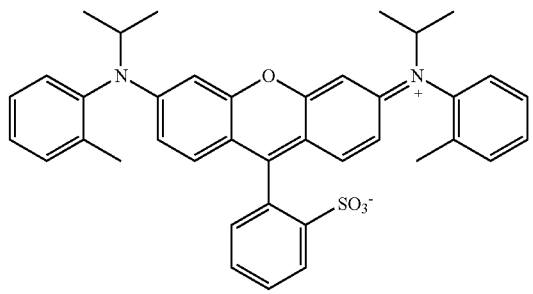
1-30
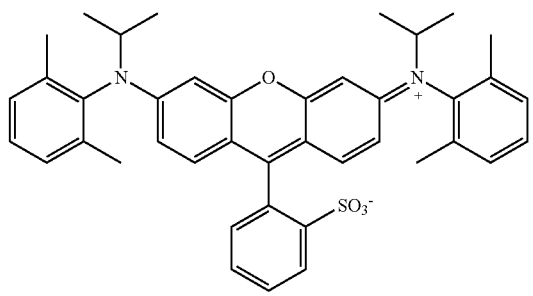
1-31
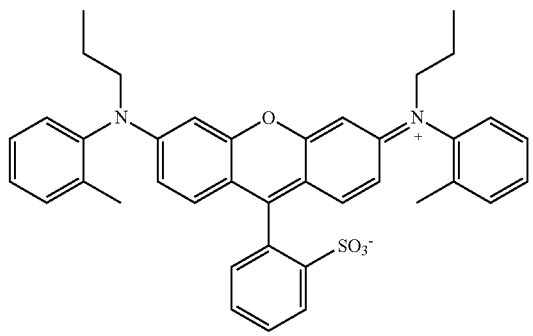
1-32
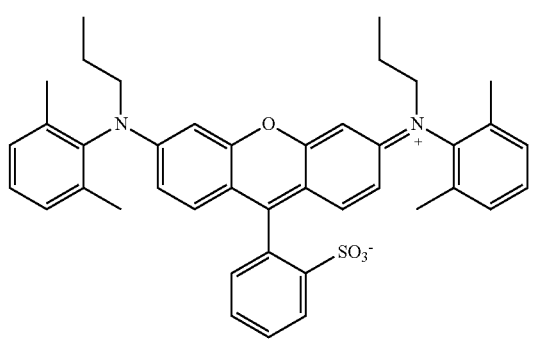

-continued
1-33
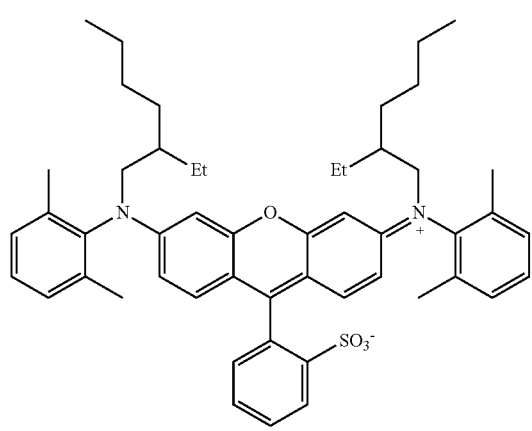
1-34
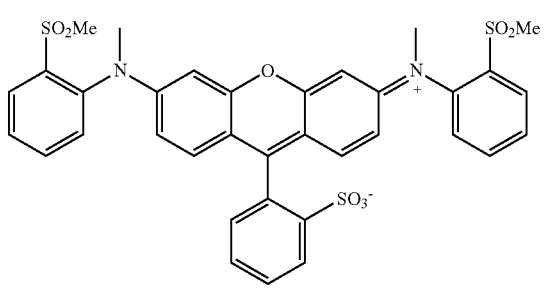
1-35
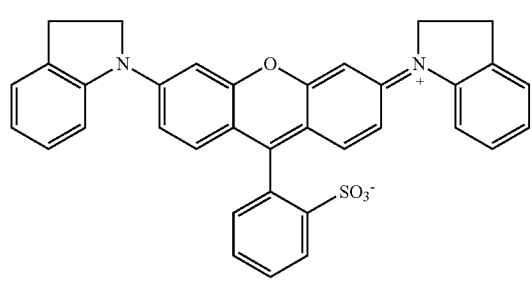
1-36
-continued
1-37
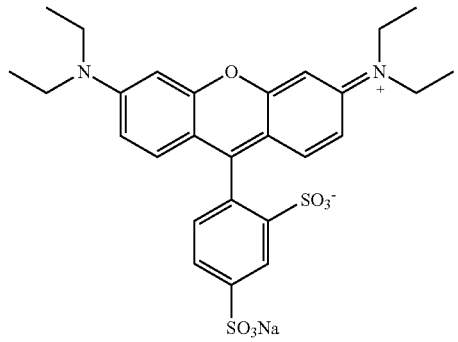
1-38
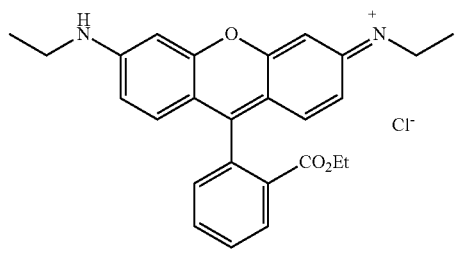
1-39
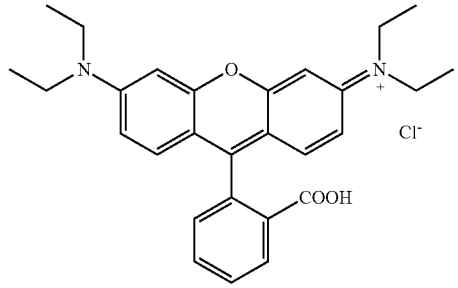
1-40
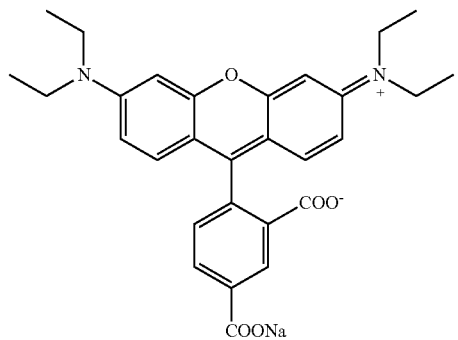
1-41
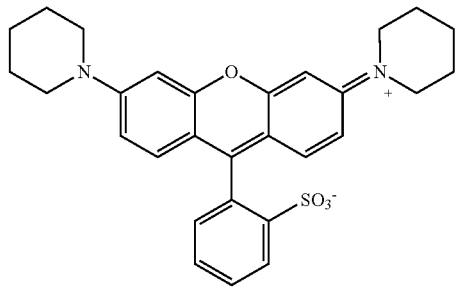

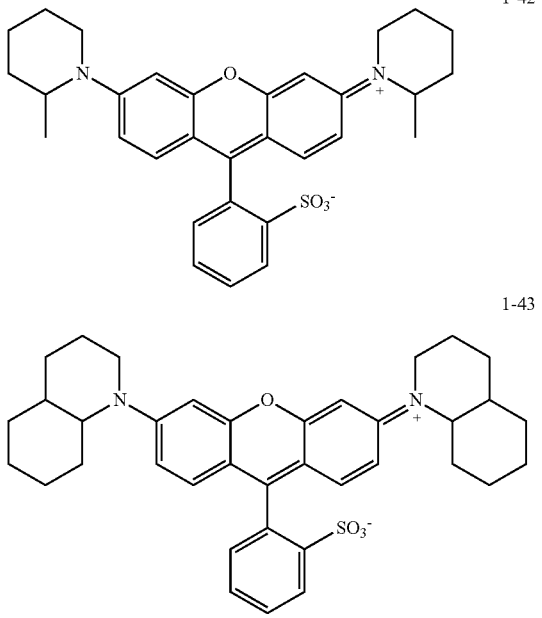

Among the exemplary compounds, sulfonamides of C. I. Acid Red 289, quaternary ammonium salts of C. I. Acid Red 289, sulfonamides of C. I. Acid Violet 102, or quaternary ammonium salts of C. I. Acid Violet 102 are preferable. Examples of such the compound include compounds represented by Formula (1-1) to (1-8), (1-11), or (1-12).

Furthermore, from the viewpoint that the solubility in an organic solvent is excellent, a compound represented by any one of Formulae (1-24) to (1-33) is also preferable.

As the xanthene dye, a commercially available xanthene dye (for example, "Chugai Aminol Fast Pink R-H/C" manufactured by Chugai Kasei K. K, "Rhodamin 6G" manufactured by Taoka Chemical Co., Ltd. can be used. Further, it also can be synthesized using a commercially available xanthene dye as a starting raw material with reference to JP2010-32999A, the contents of which are incorporated herein for reference.

<Dipyrromethene-Based Metal Complex Compound>

A compound in which a compound represented by General Formula (I) is coordinated with a metal atom or metal compound as a dipyrromethene-based metal complex compound will be described.

General Formula (I)

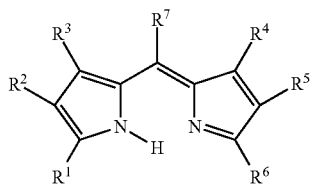

In General Formula (I), $R^1$ to $R^6$ each independently represent a hydrogen atom or a monovalent substituent which can be exemplified as the substituent group A as described above, and $R^7$ represents a hydrogen atom, a halogen atom, an alkyl group, an aryl group, or a heterocyclic group.

In the case where the monovalent group as described above can further be substituted, it may be substituted with any one of the respective groups as described above. Further, in the case where the monovalent group has two or more substituents, the substituents may be the same as or different from each other.

In General Formula (I), $R^1$ and $R^2$, $R^2$ and $R^3$, $R^4$ and $R^5$, and $R^5$ and $R^6$ may be independently bonded to each other to form a 5-, 6-, or 7-membered ring. Examples of the ring thus formed include a saturated ring and an unsaturated ring. Examples of the 5-, 6-, or 7-membered saturated ring or unsaturated ring include a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, and a pyridazine ring, and preferably a benzene ring and a pyridine ring.

Furthermore, in the case where the 5-, 6-, or 7-membered ring thus formed is a group which can further be substituted, it may be substituted with any one of the substituent group A, and in the case where the 5-, 6-, or 7-membered ring thus formed is substituted with 2 or more substituents, the substituents may be the same as or different from each other.

Moreover, the preferred range of $R^7$ in General Formula (I) has the same definition as the case where $R^1$ to $R^6$ are each a halogen atom, an alkyl group, an aryl group, or a heterocyclic group as described above, and a preferred range thereof are the same.

In General Formula (I), $R^1$ and $R^6$ are preferably an alkylamino group, an arylamino group, a carbonamido group, a ureido group, an imide group, an alkoxycarbonylamino group, or a sulfonamide group, more preferably a carbonamido group, a ureido group, an alkoxycarbonylamino group, or a sulfonamide group, still more preferably a carbonamido group, a ureido group, an alkoxycarbonylamino group, or a sulfonamide group, and particularly preferably a carbonamido group or a ureido group.

In General Formula (I), $R^2$ and $R^5$ are preferably an alkoxycarbonyl group, an aryloxycarbonyl group, a carbamoyl group, an alkylsulfonyl group, an arylsulfonyl group, a nitrile group, an imide group, or a carbamoylsulfonyl group, more preferably an alkoxycarbonyl group, an aryloxycarbonyl group, a carbamoyl group, an alkylsulfonyl group, a nitrile group, an imide group, or a carbamoylsulfonyl group, still more preferably an alkoxycarbonyl group, an aryloxycarbonyl group, a carbamoyl group, a nitrile group, an imide group, or a carbamoylsulfonyl group, and particularly preferably an alkoxycarbonyl group, an aryloxycarbonyl group, or a carbamoyl group.

In General Formula (I), $R^3$ and $R^4$ are preferably an alkyl group, an aryl group, or a heterocyclic group, and more preferably an alkyl group or an aryl group.

In General Formula (I), in the case where $R^3$ and $R^4$ represent an alkyl group, the alkyl group is preferably a linear, branched, or cyclic alkyl group having 1 to 12 carbon atoms, and examples thereof include a methyl group, an ethyl group, an n-propyl group, isopropyl group, a cyclopropyl group, an n-butyl group, an i-butyl group, a tert-butyl group, a cyclobutyl group, a cyclopentyl group, a cyclohexyl group, and a benzyl group. Further, a branched or cyclic alkyl group having 3 to 12 carbon atoms is more preferable, and examples thereof include an isopropyl group, a cyclopropyl group, an i-butyl group, a tert-butyl group, a cyclobutyl group, a cyclopentyl group, and a cyclohexyl group. In addition, a secondary or tertiary alkyl group having 1 to 12 carbon atoms is preferable, and examples thereof include an isopropyl group, a cyclopropyl group, an i-butyl group, a tert-butyl group, a cyclobutyl group, and a cyclohexyl group.

In General Formula (I), in the case where $R^3$ and $R^4$ represent an aryl group, as the aryl group, a phenyl group and a naphthyl group are preferable, and a phenyl group is more preferable.

In the case where $R^3$ and $R^4$ represent a heterocyclic group, as the heterocyclic group, a 2-thienyl group, a 4-pyridyl group, a 3-pyridyl group, a 2-pyridyl group, a 2-furyl group, a 2-pyrimidinyl group, a 2-benzothiazolyl group, a 1-imidazolyl group, a 1-pyrazolyl group, or a benzotriazol-1-yl is preferable, and a 2-thienyl group, a 4-pyridyl group, a 2-furyl group, a 2-pyrimidinyl group, or a 1-pyridyl group is more preferable.

Next, the metal atom or metal compound which forms a dipyrromethene-based metal complex compound will be described.

Herein, the metal or metal compound may be in any type of metal or metal compound as long as they can form a complex, and examples thereof include a divalent metal atom, a divalent metal oxide, a divalent metal hydroxide, and a divalent metal chloride. Examples of the metal or metal compound include Zn, Mg, Si, Sn, Rh, Pt, Pd, Mo, Mn, Pb, Cu, Ni, Co, Fe, and B, metal chlorides such as AlCl, InCl, FeCl, TiCl$_2$, SnCl$_2$, SiCl$_2$, and GeCl$_2$, metal oxides such as TiO and VO, and metal hydroxides such as Si(OH)$_2$.

Among these, in view of the stability, spectral characteristics, heat resistance, light fastness, and production suitability of the complex, Fe, Zn, Mg, Si, Pt, Pd, Mo, Mn, Cu, Ni, Co, TiO, B, or VO is preferable, Fe, Zn, Mg, Si, Pt, Pd, Cu, Ni, Co, B, or VO is more preferable, and Fe, Zn, Cu, Co, B, or VO (V=O) is particularly preferable. Among these, in particular, Zn is preferable.

In the dipyrromethene-based metal complex compound in which the compound represented by General Formula (I) is coordinated with a metal atom or metal compound, preferred embodiments are shown below. That is, an embodiment in which in General Formula (I), $R^1$ and $R^6$ each independently represent a hydrogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an amino group, an anilino group, a heterocyclic amino group, a carbonamido group, a ureido group, an imide group, an alkoxycarbonylamino group, an aryloxycarbonylamino group, a sulfonamido group, an azo group, an alkylthio group, an arylthio group, a heterocyclic thio group, an alkylsulfonyl group, an arylsulfonyl group, or a phosphinoylamino group, $R^2$ and $R^5$ each independently represent a hydrogen atom, a halogen atom, an alkyl group, an alkenyl group, an aryl group, a heterocyclic group, a hydroxyl group, a cyano group, a nitro group, an alkoxy group, an aryloxy group, a heterocyclic oxy group, an acyl group, an alkoxycarbonyl group, an aryloxycarbonyl group, a carbamoyl group, an imide group, an alkoxycarbonylamino group, a sulfonamido group, an azo group, an alkylthio group, an arylthio group, a heterocyclic thio group, an alkylsulfonyl group, an arylsulfonyl group, or a sulfamoyl group, $R^3$ and $R^4$ each independently represent a hydrogen atom, a halogen atom, an alkyl group, an alkenyl group, an aryl group, a heterocyclic group, silyl group, a hydroxyl group, a cyano group, an alkoxy group, an aryloxy group, a heterocyclic oxy group, an acyl group, an alkoxy-carbonyl group, a carbamoyl group, an anilino group, a carbonamido group, a ureido group, an imide group, an alkoxycarbonylamino group, a sulfonamido group, an azo group, an alkylthio group, an arylthio group, a heterocyclic thio group, an alkylsulfonyl group, an arylsulfonyl group, a sulfamoyl group, or a phosphinoylamino group, $R^7$ represents a hydrogen atom, a halogen atom, an alkyl group, an aryl group, or a heterocyclic group, and the metal atom or metal compound represents Zn, Mg, Si, Pt, Pd, Mo, Mn, Cu, Ni, Co, TiO, B, or VO can be mentioned.

A more preferred embodiment than that for the dipyrromethene-based metal complex compound is shown below. That is, an embodiment in which in General Formula (I), $R^1$ and $R^6$ each independently represent a hydrogen atom, an alkyl group, an alkenyl group, an aryl group, a heterocyclic group, a cyano group, an acyl group, an alkoxycarbonyl group, a carbamoyl group, an amino group, a heterocyclic amino group, a carbonamido group, ureido group, an imide group, an alkoxycarbonylamino group, an aryloxycarbonylamino group, a sulfonamido group, an azo group, an alkylsulfonyl group, an arylsulfonyl group, or a phosphinoylamino group, $R^2$ and $R^5$ each independently represent alkyl group, an alkenyl group, an aryl group, a heterocyclic group, a cyano group, a nitro group, an acyl group, an alkoxycarbonyl group, an aryloxycarbonyl group, a carbamoyl group, an imide group, an alkylsulfonyl group, an arylsulfonyl group, or a sulfamoyl group, $R^3$ and $R^4$ each independently represent a hydrogen atom, an alkyl group, an alkenyl group, an aryl group, a heterocyclic group, a cyano group, an acyl group, an alkoxycarbonyl group, a carbamoyl group, a carbonamido group, ureido group, an imide group, an alkoxycarbonylamino group, a sulfonamido group, an alkylthio group, an arylthio group, a heterocyclic thio group, an alkylsulfonyl group, an arylsulfonyl group, or a sulfamoyl group, $R^7$ represents a hydrogen atom, a halogen atom, an alkyl group, an aryl group, or a heterocyclic group, and the metal atom or metal compound represents Zn, Mg, Si, Pt, Pd, Cu, Ni, Co, B, or VO can be mentioned.

For a preferred embodiment of the dipyrromethene-based metal complex compound in which the compound represented by General Formula (I) is coordinated with a metal atom or metal compound, a complex compound represented by General Formula (I-1), (I-2), or (I-3) described in paragraphs "0153" to "0176" of JP2012-237985A, the contents of which are incorporated herein for reference.

Among the complex compound represented by General Formula (I-1), (I-2), or (I-3) which is the preferred embodiment of the dipyrromethene-based metal complex compound in which the compound represented by General Formula (I) is coordinated with a metal atom or metal compound, the complex compound represented by General Formula (I-3) is particularly preferable.

For the specific examples of the dipyrromethene-based metal complex compound in which the compound represented by General Formula (I) used in the present invention is coordinated with a metal atom or metal compound, reference can be made to the descriptions in paragraphs "0179" to "0186" of JP2012-237985A, the contents of which are incorporated herein for reference.

Furthermore, specific examples of the dipyrromethene-based metal complex compound also include the following compounds.

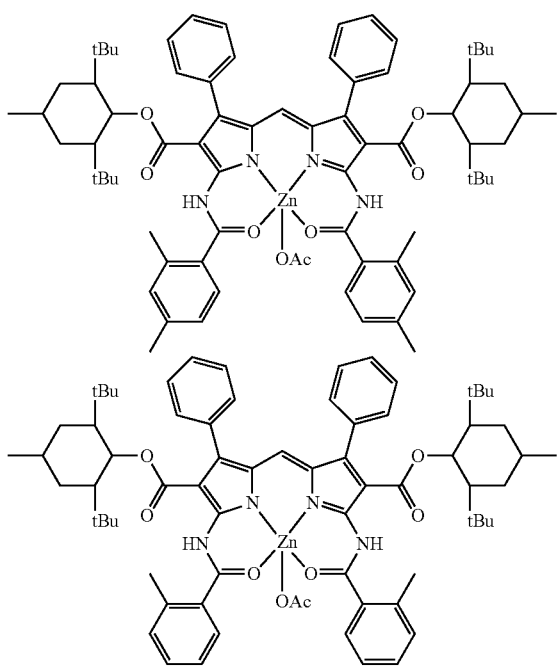

In the case where the dye or pigment is blended as a dispersion, the preparation can be carried out in accordance with the descriptions of JP1997-197118A (JP-H09-197118A) and JP2000-239544A.

The content of the dye or pigment can be used within a range not interfering with the effects of the present invention, and is preferably 0.5% by mass to 70% by mass with respect to the total solid content of the colored composition of the present invention. Further, the dye or pigment is preferably added to the colored composition such that the absorption strength ratio (absorption at 450 nm/absorption at 650 nm) is in the range of 0.95 to 1.05.

<<Polymering Compound>>

The colored composition of the present invention contains a polymerizable compound. Examples of the polymerizable compound include an addition-polymerizable compound having at least one ethylenically unsaturated double bond.

Specifically, the polymerizable compound is selected from the compounds having at least one ethylenically unsaturated bond, preferably two or more ethylenically unsaturated bonds at terminals. Such compound groups are widely known in the industrial field of the relevant art and can be used in the present invention without particular limitation. These may be in any type of chemical forms such as a monomer, a prepolymer, that is, a dimer, a trimer, an oligomer, a mixture thereof, and a (co)polymer thereof.

Examples of the monomer and a (co)polymer thereof include unsaturated carboxylic acid (for example, acrylic acid methacrylic acid, itaconic acid, crotonic acid, isocrotonic acid, and maleic acid), esters and amides thereof, and (co)polymers thereof, and preferably esters of an unsaturated carboxylic acid with an aliphatic polyhydric alcohol compound, amides of an unsaturated carboxylic acid with an aliphatic polyhydric amine compound, and (co)polymers thereof. Further, addition reaction products of an unsaturated carboxylic acid ester or amide having a nucleophilic substituent such as a hydroxyl group, an amino group or a mercapto group with a monofunctional or polyfunctional isocyanate or epoxy, and dehydration condensation reactants with a monofunctional or polyfunctional carboxylic acids are suitably used. Furthermore, addition reaction products of an unsaturated carboxylic acid ester or amide having an electrophilic substituent such as an isocyanate group and an epoxy group with a monofunctional or polyfunctional alcohol, amine or thiol, and substitution reaction products of an unsaturated carboxylic acid ester or amide having a splitting-off substituent such as a halogen group and a tosyloxy group with a monofunctional or polyfunctional alcohol, amine, or thiol are also suitably used. In addition, as other examples, the compound group in which the above-described unsaturated carboxylic acid is replaced by unsaturated phosphonic acid, styrene, vinyl ether, or the like may also be used.

As specific examples of the ester monomers of an aliphatic polyhydric alcohol compound with an unsaturated carboxylic acid, examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, a polyester acrylate oligomer, an isocyanuric acid-EO modified triacrylate.

Furthermore, examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis-[p-(methacryloxyethoxy)phenyl]dimethylmethane.

Further, examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate; examples of the crotonic acid ester include ethylene glycol dicrotonate, tetramethylene glycol dicrotonate, pentaerythritol dicrotonate, and sorbitol tetradicrotonate; examples of the isocrotonic acid ester include ethylene glycol diisocrotonate, pentaerythritol diisocrotonate, and sorbitol tetraisocrotonate; and examples of the maleic acid ester include ethylene glycol dimaleate, triethylene glycol dimaleate, pentaerythritol dimaleate, and sorbitol tetramaleate.

As examples of other esters, the aliphatic alcohol esters described in JP1976-47334B (JP-S51-47334B) and JP1982-196231A (JP-S57-196231A), those including an aromatic backbone described in JP1982-5240A (JP-S59-5240A), JP1982-5241A (JP-S59-5241A), and JP1990-226149A (JP-H02-226149A), and those including an amino group described in JP1989-165613A (JP-H01-165613A). Further, the above-described ester monomers can also be used as a mixture.

Moreover, urethane-based addition-polymerizable compounds which are produced by the addition-polymerization of isocyanate and a hydroxyl group are also suitable, and specific examples thereof include vinylurethane compounds having at least two polymerizable vinyl groups in a molecule obtained by adding vinyl monomers having a hydroxyl group represented by the following General Formula (A) to polyisocyanate compounds having at least two isocyanate groups in the molecule as described in JP1973-41708B (JP-S48-41708B).

$CH_2=C(R)COOCH_2CH(R')OH$ (A)

[In General Formula (A), R and R' each independently represent H or $CH_3$]

Incidentally, as the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd.), and a structure in which ethylene glycol or a propylene glycol residue is interposed between these (meth)acryloyl groups are also preferable. Oligomer types thereof can also be used.

The structure, the use form, namely, sole use or combination use, the amount added, and the details in use method of the polymerizable compound can be arbitrarily in accordance with the final performance design of the colored composition. For example, from the viewpoint of sensitivity, structures having a large content of unsaturated groups per molecule are preferable, and in many cases, bifunctional or higher functional compounds are preferable. Further, from the viewpoint of increasing the strength of the colored cured film, trifunctional or higher functional compounds are preferable and a method of using the compound in combination with a different polymerizable group different in the function number (for example, an acrylic acid ester, a methacrylic acid ester, a styrene-base compound, and a vinyl ether-base compound) to control both the sensitivity and the strength is also effective. In addition, the selection and use method of the polymerizable compound affect the compatibility and dispersibility with other components (for example, a photopolymerization initiator, a colorant (pigment), and a binder polymer) in the photosensitive layer and these are important factors. For example, by using a low purity compound or using two or more compounds in combination, the compatibility can be improved in some cases, and further, for the purpose of improving the adhesive property of a hard surface of a substrate or the like, a specific structure may be selected in some cases.

The content of the polymerizable compound in the total solid content of the colored composition is preferably 10% by mass to 80% by mass, more preferably 15% by mass to 75% by mass, and particularly preferably 20% by mass to 60% by mass, with respect to the total solid content.

The composition of the present invention may include one kind or two or more kinds of polymerizable compound. In the case where the composition includes two or more kinds of polymerizable compound, the total sum is preferably within the above range.

<<Photopolymerization Initiator>>

The colored composition of the invention preferably includes at least one kind of photopolymerization initiator. The photopolymerization initiator is not particularly limited as long as it may polymerize the polymerizable compound, and is preferably selected in view of properties, initiation efficiency, absorption wavelength, availability, cost, and the like.

Examples of the photopolymerization initiator include at least one active halogen compound selected from halomethyloxadiazole compounds and halomethyl-s-triazine compounds, 3-aryl-substituted coumarin compounds, lophine dimers, benzophenone compounds, acetophenone compounds, and derivatives thereof, cyclopentadiene-benzene-iron complexes and salts thereof, and oxime compounds. Specific examples of the photopolymerization initiator include those described in the paragraphs "0070" to "0077" of JP2004-295116A. Among these, oxime compounds or biimidazole-based compounds are preferable in view of a rapid polymerization reaction and the like.

The oxime-based compound (hereinafter also referred to as an "oxime-based photopolymerization initiator") is not particularly limited and examples thereof include the oxime-based compounds described in JP2000-80068A, WO02/100903A, JP2001-233842A, and the like.

For the specific examples of the oxime-based compound, reference can be made to the descriptions in paragraph "0053" of JP2013-182215A, the contents of which are incorporated herein for reference.

Moreover, in the present invention, the oxime compound is more preferably a compound represented by the following General Formula (1) or General Formula (2) from the viewpoints of sensitivity, stability over time, and discoloration during post-heating.

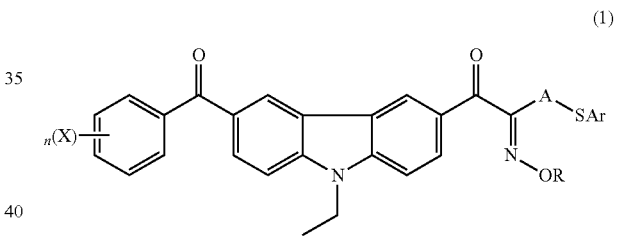

(1)

(in General Formula (1), R and X each represent a monovalent substituent, A represents a divalent organic group, Ar represents an aryl group, and n represents an integer of 1 to 5)

As R, an acyl group is preferable, and specifically, an acetyl group, a propionyl group, a benzoyl group, and a toluyl group are preferable, from the viewpoint of obtaining high sensitivity.

From the viewpoint of increasing sensitivity and suppressing coloration due to heating over time, A is preferably an unsubstituted alkylene group, an alkylene group substituted by an alkyl group (for example, a methyl group, an ethyl group, a tert-butyl group, and a dodecyl group), an alkylene group substituted by an alkenyl group (for example, a vinyl group and an allyl group), or an alkylene group substituted by an aryl group (for example, a phenyl group, a p-tolyl group, a xylyl group, a cumenyl group, a naphthyl group, an anthryl group, a phenanthryl group, and a styryl group).

From the viewpoint of increasing sensitivity and suppressing coloration due to heating over time, Ar is preferably a substituted or unsubstituted phenyl group. In the case where the phenyl group is substituted, the substituent is preferably a halogen group such as a fluorine atom, a chlorine atom, a bromine atom, and an iodine atom.

From the viewpoint of improving solubility in a solvent and absorption efficiency at a longer wavelength range, X is preferably an alkyl group which may have a substituent, an aryl group which may have a substituent, an alkenyl group which may have a substituent, an alkynyl group which may have a substituent, an alkoxy group which may have a substituent, an aryloxy group which may have a substituent, an alkylthioxy group which may have a substituent, an arylthioxy group which may have a substituent, or an amino group which may have a substituent. Further, n in General Formula (1) is preferably an integer of 1 to 2.

(2)

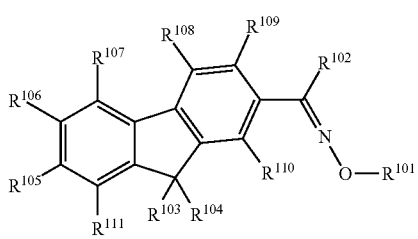

In General Formula (2), $R^{101}$ represents an alkyl group, an alkanoyl group, an alkenoyl group, an aryloyl group, an alkoxycarbonyl group, an aryloxycarbonyl group, a heterocyclic oxycarbonyl group, a heteroaryloxycarbonyl group, an alkylthiocarbonyl group, an arylthiocarbonyl group, a heterocyclic thiocarbonyl group, a heteroarylthiocarbonyl group, or —CO—CO—Rf. Rf represents a carbocyclic aromatic ring or a heterocyclic aromatic ring.

$R^{102}$ represents an alkyl group, an aryl group, or a heterocyclic group, and these may be substituted.

$R^{103}$ and $R^{104}$ each independently represent an alkyl group, an aryl group, or a heterocyclic group, and these may further be substituted with a halogen atom, an alkyl group, an aryl group, an alkoxy group, an alkylcarbonyl group, or the like.

$R^{105}$ to $R^{111}$ each independently represent a hydrogen atom, a halogen atom, an alkyl group, an aryl group, a heterocyclic group, an alkoxy group, an aryloyl group, a heteroaryloyl group, an alkylthio group, an aryloylthio group, alkylcarbonyl group, an arylcarbonyl group, a heteroarylcarbonyl group, an alkoxycarbonyl group, an aryloxycarbonyl group, a heterocyclic oxycarbonyl group, a nitro group, an amino group, a sulfonic acid group, a hydroxy group, a carboxylic acid group, an amide group, a carbamoyl group, or a cyano group.

It is preferable that one or two members out of $R^{105}$ to $R^{111}$ are an electron-withdrawing substituent, that is, a nitro group, a cyano group, a halogen atom, an alkylcarbonyl group, or an arylcarbonyl group since a colored composition having higher curability is obtained.

Specific examples of the compound having a fluorene structure represented by General Formula (2) are shown below, but are not limited to these compounds.

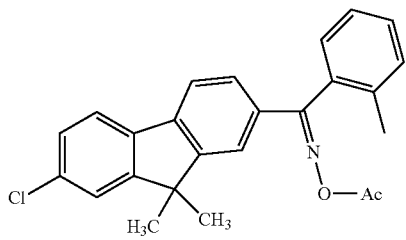

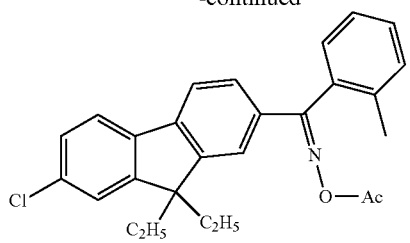

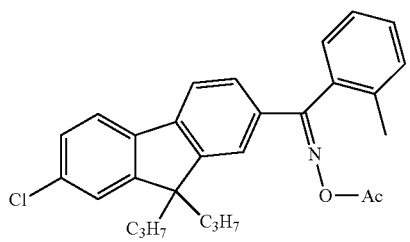

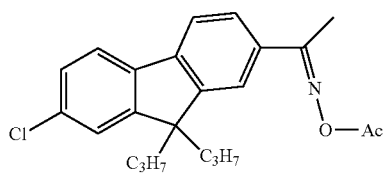

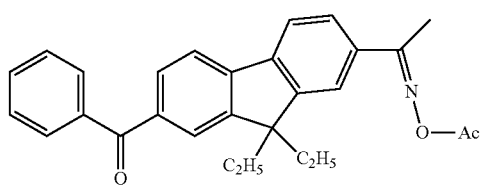

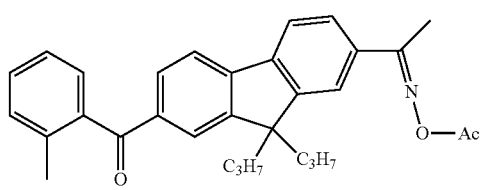

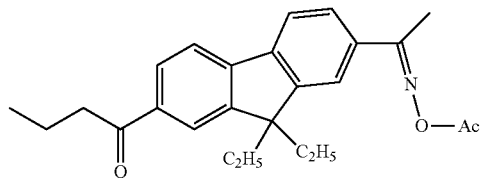

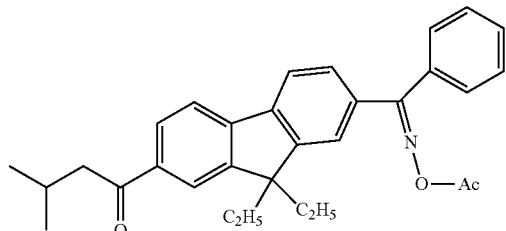

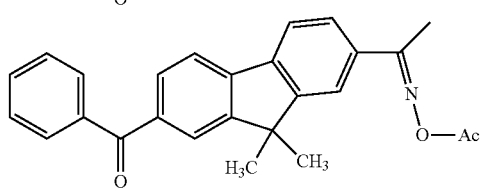

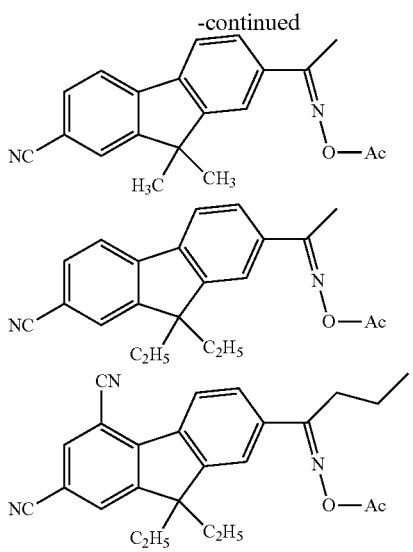

The compound having the fluorene structure represented by General Formula (2) can be synthesized in accordance with, for example, the synthesis method described in WO2014/050738A.

With regard to specific examples of the biimidazole-based compound, reference can be made to the descriptions in paragraphs "0061" to "0070" of JP2013-182213A, the contents of which are incorporated herein for reference.

Furthermore, for the colored composition of the present invention, other known photopolymerization initiators described in paragraph No. "0079" of JP2004-295116A may be used, in addition to the photopolymerization initiator.

The content of the photopolymerization initiator is preferably 3% by mass to 20% by mass, more preferably 4% by mass to 19% by mass, and particularly preferably 5% by mass to 18% by mass, with respect to the total solid content of the colored composition, from the viewpoint of more effectively obtaining the effects of the present invention.

The colored composition of the present invention may include one kind or two or more kinds of the photopolymerization initiator. In the case where the colored composition of the present invention includes two or more kinds of the photopolymerization initiator, the total sum thereof is preferably within the above range.

<<Organic Solvent>>

It is preferable that the colored composition of the present invention can include at least one kind of organic solvent.

Basically, the organic solvent is not particularly limited as long as the solubility of the respective components or the coatability when forming into a colored composition, and in particular, it is preferably selected in consideration of the solubility, the coatability, and the safety of a binder.

As the organic solvent, esters, ethers, ketones, or aromatic hydrocarbons are used, and specifically, those described in paragraph Nos. "0161" and "0162" of JP2012-032754A are exemplified.

From the solubility of the respective components; in the case of including the alkali-soluble polymer, the solubility of the alkali-soluble polymer; and the improvement of the coated surface conditions, the organic solvents may be used as a mixture of two or more kinds thereof. In this case, a mixed solution composed of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate is particularly preferable.

In the case where the colored composition has an organic solvent, the content of the organic solvent in the colored composition is an amount such that the total solid concentration in the composition preferably becomes 10% by mass to 80% by mass, and more preferably becomes 15% by mass to 60% by mass.

One kind or two or more kinds of the organic solvent may be used. In the case where two or more kinds of the organic solvent are used, the total sum thereof is preferably within the above range.

<<Alkali-Soluble Binder>>

The colored composition of the present invention preferably includes an alkali-soluble binder. The alkali-soluble binder is not particularly limited as long as it is alkali-soluble, and it can be preferably selected from the viewpoints of heat resistance, developability, availability, and the like.

A preferred alkali-soluble binder is a high-molecular weight organic linear polymer, which is soluble in an organic solvent and developable with a weakly alkaline aqueous solution. Examples of such a high-molecular weight organic linear polymer include polymers having a carboxylic acid in the side chain, such as the methacrylic acid copolymers, the acrylic acid copolymers, the itaconic acid copolymers, the crotonic acid copolymers, the maleic acid copolymers, the partially esterified maleic acid copolymers, and the like, described in JP1984-44615A (JP-S59-44615A), JP1979-34327B (JP-S54-34327B), JP1983-12577B (JP-S58-12577B), JP1979-25957B (JP-S54-25957B), JP1984-53836A (JP-S59-53836A), and JP1984-71048A (JP-S59-71048A), as well as acidic cellulose derivatives having a carboxylic acid in the side chain.

Besides the above-mentioned binders, adducts of polymers having hydroxy groups with acid anhydrides, polyhydroxystyrene resins, polysiloxane resins, poly(2-hydroxyethyl (meth)acrylate), polyvinyl pyrrolidone, polyethylene oxides, polyvinyl alcohols, and the like are also useful as the alkali-soluble binder in the invention. The linear organic high molecular polymer may be a copolymer with a hydrophilic monomer. Examples thereof include alkoxyalkyl (meth)acrylates, hydroxyalkyl (meth)acrylates, glycerol (meth)acrylates, (meth)acrylamides, N-methylolacrylamides, secondary or tertiary alkylacrylamides, dialkylaminoalkyl (meth)acrylates, morpholine (meth)acrylates, N-vinylpyrrolidone, N-vinylcaprolactam, vinylimidazole, vinyltriazole, methyl (meth)acrylates, ethyl (meth)acrylates, branched or straight chain propyl (meth)acrylates, branched or straight chain butyl (meth)acrylates, and phenoxyhydroxy propyl (meth)acrylates. Other examples of useful hydrophilic monomer include monomers including a tetrahydrofurfuryl group, a phosphoric acid group, a phosphoric acid ester group, a quaternary ammonium salt group, an ethyleneoxy chain, a propyleneoxy chain, a sulfonic acid group, and a group derived from a salt thereof, or a morpholinoethyl group.

Moreover, copolymers of maleimide and ethylene oxide, as represented by the following Formulae (b1) and (b2), can also be preferably used as the alkali-soluble binder.

Formula (b1)

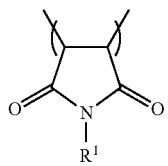

(In Formula (b1), $R^1$ represents a hydrogen atom, an aryl group, or an alkyl group)

In the case where $R^1$ represents an alkyl group, examples of the alkyl group include a linear alkyl group having 1 to 10 carbon atoms, a branched alkyl group having 3 to 10 carbon atoms, and a cyclic alkyl group having carbon atoms 5 to 20, and more specifically a methyl group, an ethyl group, a t-butyl group, and a cyclohexyl group.

The alkyl group may further include a substituent, and examples of the substituent which may be introduced into the alkyl group include a phenyl group, a carbonyl group, an alkoxy group, a hydroxy group, and an amino group.

In the case where $R^1$ represents an aryl group, examples of the aryl group include an aryl group having a monocyclic structure, an aryl group having a polycyclic structure, an aryl group having a condensed structure, and heteroaryl group having a hetero atom. More specific examples thereof include a phenyl group, a naphthyl group, a biphenyl group, a benzoimidazolyl group, a pyridyl group, and a furyl group.

The aryl group may further include a substituent, and examples of the substituent which may be introduced into the aryl group include alkyl groups such as a methyl group, an ethyl group, a t-butyl group, and a cyclohexyl group, alkoxy groups such as a methoxy group, a carboxy group, a hydroxy group, an amino group, a nitro group, a chloro group, and a bromo group.

Formula (b2)

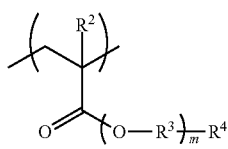

(in Formula (b2), $R^2$ represents a hydrogen atom or a methyl group. $R^3$ represents an alkylene group having 2 or 3 carbon atoms, $R^4$ represents a hydrogen atom, an aryl group, or an alkyl group, and m represents an integer of 1 to 15)

In the case where $R^4$ represents an alkyl group, examples of the alkyl group include a linear alkyl group having 1 to 20 carbon atoms, a branched alkyl group having 1 to 20 carbon atoms, and a cyclic alkyl group having carbon atoms 5 to 20, and more specifically a methyl group, an ethyl group, a t-butyl group, a cyclohexyl group, and a 2-ethylhexyl group.

The alkyl group may further include a substituent, and examples of the substituent which may be introduced into the alkyl group include a phenyl group, a carbonyl group, and an alkoxy group.

In the case where $R^4$ represents an aryl group, examples of the aryl group include an aryl group having a monocyclic structure, an aryl group having a polycyclic structure, an aryl group having a condensed structure, and heteroaryl group having a hetero atom. More specific examples thereof include a phenyl group, a naphthyl group, an anthranyl group, a biphenyl group, a benzoimidazolyl group, an indolyl group, an imidazolyl group, an oxazolyl group, a carbazolyl group, a pyridyl group, and a furyl group.

The aryl group may further include a substituent, and examples of the substituent which may be introduced into the aryl group include a nonyl group, alkyl groups such as a methyl group, an ethyl group, a t-butyl group, and a cyclohexyl group, alkoxy groups such as a methoxy group, a carboxy group, a hydroxy group, an amino group, a nitro group, a chloro group, and a bromo group.

Furthermore, in order to improve the crosslinking efficiency, the alkali-soluble binder may have a polymerizable group in the side chain, and polymers containing, for example, an allyl group, a (meth)acryl group, an allyloxyalkyl group, or the like in the side chain are also useful. Examples of the polymer containing a polymerizable group include KS RESIST-106 manufactured by Osaka Organic Chemical Industry Ltd.) and CYCLOMER P series (manufactured by Daicel Company Ltd.), which are commercially available products. In addition, in order to enhance the strength of a cured film, alcohol-soluble nylon, polyether formed of 2,2-bis-(4-hydroxyphenyl)-propane and epichlorohydrin, and the like are also useful.

Among various alkali-soluble binders above, from the viewpoint of heat resistance, a polyhydroxystyrene-based resin, a polysiloxane-based resin, an acrylic resin, an acrylamide-based resin, and an acryl/acrylamide copolymer resin are preferable, and from the viewpoint of controlling developability, an acryl-based resin, an acrylamide-based resin, and an acryl/acrylamide copolymer resin are preferred.

In particular, a copolymer having a repeating unit as represented by the following General Formula (2) and an acidic group is preferable, and more preferred examples of the copolymer include a copolymer having a structural unit represented by General Formula (3), in addition to General Formula (2) and the acidic group.

General Formula (2)

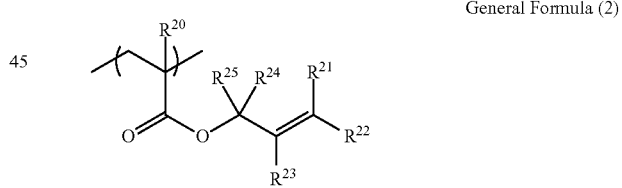

(in General Formula (2), $R^{20}$ represents a hydrogen atom or a methyl group, and $R^{21}$ to $R^{25}$ each independently represent a hydrogen atom, a halogen atom, a cyano group, an alkyl group, or an aryl group)

General Formula (3)

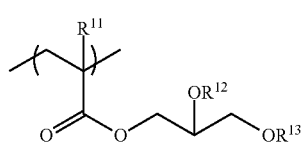

(in General Formula (3), $R^{11}$ represents a hydrogen atom or a methyl group. $R^{12}$ and $R^{13}$ each independently represent a hydrogen atom or a carbonyl group having 3 to 20 carbon atoms, including an unsaturated double bond as a partial structure, and both of $R^{12}$ and $R^{13}$ is a hydrogen atom in no case. In the case where at least one of $R^{12}$ and $R^{13}$ represents a carbonyl group having 3 to 20 carbon atoms, including an unsaturated double bond as a partial structure, it may further include a carboxy group as a partial structure.)

As the acryl-based resin, a copolymer formed from benzyl (meth)acrylate, (meth)acrylic acid, hydroxyethyl (meth)acrylate, (meth)acrylamide, and the like, and KS RESIST-106 manufactured by Osaka Organic Chemical Industry Ltd.), CYCLOMER P series (manufactured by Daicel Company Ltd.), and the like, which are commercially available products, are preferable.

Furthermore, the alkali-soluble binder may include a structural unit derived from an ethylenically unsaturated monomer represented by the following Formula (X).

General Formula (X)

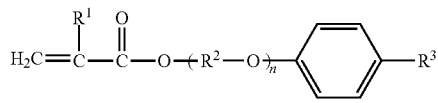

(in Formula (X), $R^1$ represents a hydrogen atom or a methyl group, $R^2$ represents an alkylene group having 2 to 10 carbon atoms, $R^3$ represents a hydrogen atom or an alkyl group having 1 to 20 carbon atoms, which may include a benzene ring, and n represents an integer of 1 to 15)

In Formula (X), the alkylene group of $R^2$ preferably has 2 to 3 carbon atoms. Further, the alkyl group of $R^3$ has 1 to 20 carbon atoms, and more preferably has 1 to 10 carbon atoms, and the alkyl group of $R^3$ may include a benzene ring. Examples of the alkyl group including a benzene ring, represented by $R^3$, include a benzyl group and a 2-phenyl (iso)propyl group.

The alkali-soluble binder is preferably a polymer having a weight average molecular weight (a value in terms of polystyrene as measured by a GPC method) of 1,000 to 200,000, more preferably 2,000 to 100,000, and particularly preferably 5,000 to 50,000 from the viewpoints of developability, liquid viscosity, and the like.

The blending amount of the alkali-soluble binder is preferably 10% by mass to 80% by mass, and more preferably 20% by mass to 60% by mass, with respect to the total solid content of the colored composition.

Further, the acid value of the alkali-soluble binder is preferably 10 mg/KOH to 1,000 mg/KOH, among which the acid value of 50 mg/KOH to 300 mg/KOH is more preferable, the acid value of 50 mg/KOH to 200 mg/KOH is still more preferable, and the acid value of 105 mg/KOH to 200 mg/KOH is particularly preferable.

The composition of the present invention may include one kind or two or more kinds of the alkali-soluble binder. In the case where the composition includes two or more kinds of the alkali-soluble binder, the total sum thereof is preferably within the above range.

<<Crosslinking Agent>>

The colored composition of the present invention may further include a crosslinking agent.

The crosslinking agent is not particularly limited as long as it can cure a film by a crosslinking reaction, and examples thereof include (a) an epoxy resin, (b) a melamine compound, a guanamine compound, a glycoluril compound, or a urea compound substituted with at least one substituent selected from a methylol group, an alkoxymethyl group, and an acyloxymethyl group, and (c) a phenol compound, a naphthol compound, or a hydroxyanthracene compound, which is substituted with at least one substituent selected from a methylol group, an alkoxymethyl group, and an acyloxymethyl group. Among these, a polyfunctional epoxy resin is preferable.

With regard to details of specific examples and the like of the crosslinking agent, reference can be made to the descriptions in paragraph Nos. "0134" to "0147" of JP2004-295116A, the contents of which are incorporated herein for reference.

<<Surfactant>>

The colored composition of the present invention may include a surfactant. The surfactant may be any one of a non-ionic surfactant, a cationic surfactant, and an anionic surfactant, but a surfactant having an ethylene oxide structure and a fluorine-based surfactant is preferable. In particular, a surfactant having an ethylene oxide structure, which has an HLB value in the range of 9.2 to 15.5, or the fluorine-based surfactant described in JP1990-54202A (JP-H02-54202A) is preferable.

In the case where the colored composition of the present invention includes a surfactant, the addition amount of the surfactant is preferably 0.0001% by mass to 2.0% by mass, and more preferably 0.005% by mass to 1.0% by mass, with respect to the total solid content of the colored composition.

The composition of the present invention may include one kind or two or more kinds of the surfactant. In the case where the composition includes two or more kinds of the composition of the present invention, the total sum thereof is preferably within the above range.

The colored composition of the present invention may further include various additives such as a filler, an antioxidant, an ultraviolet absorber, an aggregation inhibitor, a sensitizer, and a light stabilizer, as desired.

<<Dye Stabilizer>>

It is preferable to further add a dye stabilizer to the composition of the present invention, in addition to a triarylmethane dye. As the stabilizer, for example, a cationic stabilizer, an anionic stabilizer, a nonionic stabilizer, an amphoteric stabilizer, a silicone-based stabilizer, a fluorine-based surfactant, or the like can be used. Among the surfactants, a high-molecular surfactant (a high molecular weight dispersant) is preferable since it can provide uniform and fine dispersion.

Examples of the high molecular weight dispersant include (co)polymers of unsaturated carboxylic acid esters such as polyacrylic acid esters; (partial) amine salts, (partial) ammonium salts, or (partial) alkylamine salts of (co)polymers of unsaturated carboxylic acids such as polyacrylic acids; (co)polymers of hydroxyl group-containing unsaturated carboxylic acid esters such as hydroxyl group-containing polyacrylic acid esters, or combinations thereof; and polymerization products of sulfonic acid or phosphoric acid having a crosslinking group.

As the crosslinking group, known polymerizable groups which can be crosslinked by a radical, an acid, or heat can be used. Specific examples thereof include a (meth)acryl group, a styrene group, a vinyl group, a cyclic ether group, and a methylol group, but a (meth)acryl group, a styrene group, and a vinyl group are preferable, and a (meth)acryl group and a styrene group are more preferable.

In addition, in addition to these surfactants, it is also effective to add bistrifluoromethanesulfonimide sodium salts or salts (sodium salts, potassium salts, or the like) of the following anions.

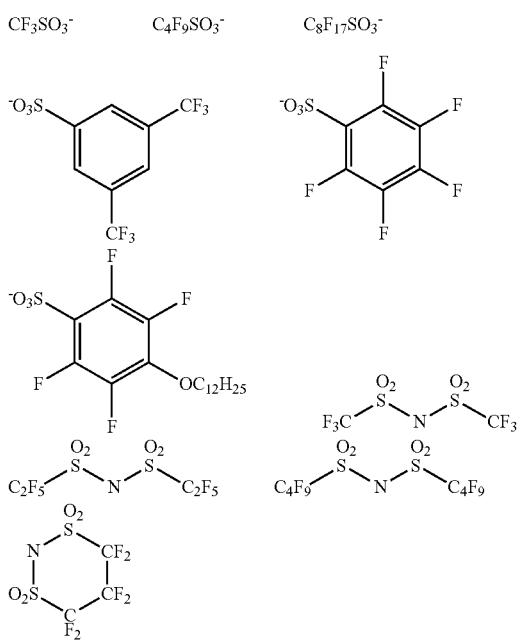

<Antioxidant>

The composition of the present invention may include an antioxidant. Examples of the antioxidant include a radical scavenger, a peroxide decomposer, an ultraviolet absorber, and a singlet oxygen quencher.

Examples of the radical scavenger include a phenol-based antioxidant and a hindered amine-based antioxidant. Examples of the phenol-based antioxidant include a hydroxyphenylpropionate-based compound, a hydroxybenzyl-based compound, a thiobisphenol-based compound, a thiomethylphenol-based compound, and an alkanediyl phenol-based compound. Among these, from the viewpoint of the stability of the color characteristics, a hydroxyphenyl propionate-based compound is preferable.

For example, the compounds described in paragraphs "0013" to "0034" of JP2012-155243A, and paragraphs "0030" to "0042" of JP2013-14748A can be preferably used.

The peroxide decomposer is a compound which decomposes peroxides generated by exposure to light or the like into harmless materials while not causing new radicals to be generated, and examples thereof include a phosphorus-based antioxidant and a sulfur-based antioxidant. Among these, a sulfur-based antioxidant is preferable from the viewpoint of the stability of color characteristics.

Examples of the ultraviolet absorber include a salicylic acid ester-based antioxidant and a benzophenone-based antioxidant.

The singlet oxygen quencher is a compound which can deactivate singlet oxygen by energy transfer from oxygen in a singlet state, and examples thereof include ethylenic compounds such as tetramethylethylene and cyclopentene, amines such as diethylamine, triethylamine, 1,4-diazabicyclooctane (DABCO), and N-ethylimidazole, condensed polycyclic aromatic compounds such as naphthalene which may be substituted, dimethylnaphthalene, dimethoxyanthracene, anthracene, and diphenylanthracene; and in addition to aromatic compounds such as 1,3-diphenylisobenzofuran, 1,2,3,4-tetraphenyl-1,3-cyclopentadiene, and pentaphenylcyclopentadiene, the compounds described as a singlet oxygen quencher in Harry H. wasserman, "Singlet Oxygen", Chapter 5, Academic Press (1979), Nicholas J. Turro, "Modern Molecular Photochemistry", Chapter 14, The Benjamin Cummings Publishing Co., Inc. (1978), and High Functional Chemicals for Color Photographic Photosensitive Materials, Chapter 7 (2002), published by CMC.

Other examples thereof include metal complexes having a compound containing a sulfur atom as a ligand. Examples of such a compound include transition metal chelate compounds of a nickel complex, a cobalt complex, a copper complex, a manganese complex, and a platinum complex, each of which has bisdithio-α-diketone, bisphenyldithiol, or thiobisphenol as a ligand.

Examples of the sulfur-based antioxidant include a thiopropionate-based compound and a mercaptobenzimidazole-based compound. Among these, a thiopropionate-based compound is preferable from the viewpoint of the stability of color characteristics.

In the present invention, the antioxidant may be used singly or as a mixture of two or more kinds thereof, and in the case where the colored composition has an antioxidant, the content of the antioxidant is preferably 0.01 parts by mass to 20 parts by mass, and particularly preferably 0.1 parts by mass to 10 parts by mass, with respect to 100 mass of the colorant.

<Curing Agent>

The colored composition of the present invention may include a compound which functions as a curing agent.

As the curing agent, for example, at least one compound selected from the group consisting of an aromatic amine compound, a tertiary amine compound, an amine salt, a phosphonium salt, an amidine salt, an amide compound, a thiol compound, a block isocyanate compound, and an imidazole ring-containing compound can be used.

The colored composition can realize low-temperature curing of a colored pattern by incorporating a curing agent selected from the specific compound group. Further, the preservation stability of the colored composition can also be further improved.

<Reduction Inhibitor>

A compound which is more likely to be reduced than a triarylmethane dye can also be added as a reduction inhibitor for the triarylmethane dye to the colored composition of the present invention, whereby it is possible to further inhibit dye reduction discoloration at a time of ITO sputtering after pixel formation. Specifically, a quinone compound is preferable, and a quinone compound having the following structure having a molecular weight of about 100 to 800 is preferable.

<Acid Generator>

The acid generator may be either a photoacid generator or a thermal acid generator, with the thermal acid generator being preferable. If the thermal acid generator is used, the heat resistance of the cured film tends to be further improve. This is one of the causes for reduction in heat resistance, which is based on reduction in the acidity due to penetration of an alkali developer into a cured film. That is, the acidity of the cured film is reduced by the post-curing baking treatment step, and thus, the heat resistance deteriorates, but acids are generated during the baking by blending a thermal acid generator, and thus, it is possible to inhibit the reduction in the acidity by the penetration of the alkali developer into the cured film.

The thermal acid generator refers to an acid generator which generates acids when heated to 100° C. to 250° C. at 1013.25 hPa. As the generated acids, acids having pKa 5 or less are preferable. Specific examples of the generated acids include sulfonic acid, carboxylic acid, and phosphoric acid, with sulfonic acid being more preferable.

For the photoacid generator, reference may be made to the description in paragraphs "0103" to "0113" of JP2006-259002A, the contents of which are incorporated herein for reference.

Examples of the thermal acid generator include an ionic compound (onium salt) and a non-ionic compound.

It is preferable that the ionic compound (onium salt) does not contain a heavy metal or a halogen ion, with the onium salt of the sulfonic acid being preferable.

Examples of the ionic thermal acid generator include triphenylsulfonium, 1-dimethylthionaphthalene, 1-dimethylthio-4-hydroxynaphthalene, 1-dimethylthio-4,7-dihydroxynaphthalene, 4-hydroxyphenyldimethylsulfonium, benzyl-4-hydroxyphenylmethylsulfonium, 2-methylbenzyl-4-hydroxyphenylmethylsulfonium, 2-methylbenzyl-4-acetylphenylmethylsulfonium, 2-methylbenzyl-4-benzoyloxyphenylmethylsulfonium, and methanesulfonates thereof, trifluoromethanesulfonates, camphorsulfonates, p-toluenesulfonates, and hexafluorophosphonates thereof.

The colored composition of the present invention may further include bistrifluoromethanesulfonylimide lithium. The content of bistrifluoromethanesulfonylimide lithium is preferably 0.1 moles to 2 moles, and more preferably 0.3 moles to 0.8 moles, with respect to 1 mole of a triarylmethane repeating unit.

The colored composition of the present invention may further include various additives such as a filler, an ultraviolet absorber, an aggregation inhibitor, a sensitizer, and a light stabilizer, as desired.

[Method for Preparing Colored Composition]

The colored composition of the present invention is prepared by mixing the respective components with optional components, as desired.

Furthermore, in the preparation of the colored composition, the respective components constituting the colored composition may be blended at once or the respective components may be dissolved/dispersed in solvents and then sequentially blended. Further, the order of introduction and operating conditions during the blending are not particularly limited. For example, all the components may be dissolved/dispersed in a solvent simultaneously to prepare a composition, or as desired, two or more solutions/dispersions may be appropriately prepared from the respective components and mixed during the use (during the coating) to prepare a composition.

The colored compositions prepared as described above can be provided for use after they are filtered off and separated through a filter preferably having a pore size of about 0.01 μm to 3.0 μm, more preferably 0.05 μm to 0.5 μm, or the like.

The colored composition of the present invention can form a cured film having excellent hue and contrast so that they can be conveniently used for forming colored pixels in a color filter and the like used for liquid crystal display devices (LCDs) and solid-state imaging elements (for example, a CCD and a CMOS) or for manufacturing an ink for printing, an ink for ink jet printing, a paint, and the like. In particular, the colored composition is suitable for forming colored pixels for liquid crystal display devices.

[Color Filter and Method for Manufacturing Same]

The color filter of the present invention is formed of a substrate and a colored region including the colored composition of the present invention on the substrate. The colored region on the substrate consists of colored films of, for example, red (R), green (G), blue (B) and the like, which form pixels in the color filter.

The color filter of the present invention may be formed by any method that allows formation of a cured colored region (colored pattern) by coating the colored composition of the present invention onto the substrate. The color filter is preferably manufactured by using the colored composition of the present invention.

Furthermore, in the case of manufacturing a color filter for a solid-state imaging element by using the colored composition of the present invention, the manufacturing method described in paragraphs "0359" to "0371" of JP2011-252065A can also be employed.

The method for manufacturing a color filter of the present invention includes a step (A) of applying (preferably coating) the colored composition as described above onto a substrate to form a colored layer (also referred to as a colored composition layer), and a step (B) of curing the colored composition layer formed in the step (A).

In the curing step, it is preferable that the colored composition layer is patternwise exposed (preferably through a mask) and uncured areas (unexposed areas) of the coated film are removed by development using a developer to form a colored region (colored pattern). Through these steps, a colored pattern consisting of pixels in the respective colors (three or four colors) is formed, whereby a color filter can be obtained. Further, in a preferred embodiment, the method for manufacturing a color filter of the present invention particularly further includes a step (C) of irradiating the colored pattern formed in the step (B) with ultraviolet rays and a step (D) of subjecting the colored pattern irradiated with ultraviolet rays in the step (C) to a heating treatment.

By using such a method, a color filter which is used in a liquid crystal display element or a solid-state imaging element can be manufactured with little difficulty in the process, high quality, and low cost.

Hereinafter, the method for manufacturing a color filter of the present invention will be described in more detail.

—Step (A)—

In the method for manufacturing a color filter of the present invention, a colored composition of the present invention as described above is first coated onto a substrate directly or via another layer by a desired coating method to form a coating layer formed of the colored composition (colored composition layer), and then precured (prebaked), as desired, to dry the colored composition layer.

Examples of the substrate include non-alkali glass, sodium glass, Pyrex (registered trademark) glass, quartz glass, and these glasses having a transparent conductive layer deposited thereon for use in liquid crystal display elements or the like, or substrates for photoelectric transducer elements for use in solid-state imaging element and the like such as a silicone substrate and a plastic substrate. Further, a black matrix separating pixels or a transparent resin layer for promoting adhesion or for other purposes may be formed on these substrates. Further, an undercoat layer may be provided on the substrate, as desired, to improve adhesion to the overlying layers or to prevent diffusion of substances or to smoothen the surface.

In addition, the plastic substrate preferably has a gas barrier layer and/or a solvent-resistant layer on the surface.

Alternatively, a driving substrate on which is mounted a thin-film transistor (TFT) for a thin-film transistor (TFT) type color liquid crystal display device (hereinafter also referred to as a "driving substrate for TFT type liquid crystals") can be used as a substrate, and a colored pattern formed by using the colored composition of the present invention can also be formed on the driving substrate to manufacture a color filter.

Examples of the substrates in a driving substrate for TFT type liquid crystals include glass, silicone, polycarbonate, polyester, aromatic polyamide, polyamideimide, and polyimide. These substrates may have undergone an appropriate pretreatment such as a chemical treatment with a silane coupling agent or the like, a plasma treatment, ion plating, sputtering, a gas phase reaction, and vacuum vapor deposition, as desired. For example, a driving substrate for TFT type liquid crystals on which a passivation layer such as a silicon nitride film has been formed on the surface of the substrate can be used.

The colored composition of the present invention is applied directly or via another layer on the substrate. As a method for applying the composition, coating is preferable, and the coating is preferably carried out using a coating method such as spin coating, slit coating, roll coating, bar coating, and ink jet coating.

In the coating step, the method for coating the colored composition of the present invention onto the substrate is not particularly limited, but it is preferably a method using a slit nozzle such as a slit-and-spin coating method and a spinless coating method (hereinafter referred to as a slit nozzle coating method).

In the slit nozzle coating method, conditions for the slit-and-spin coating method and the spinless coating method depend on the size of the coating substrate, but in the case where a fifth generation glass substrate (1,100 mm×1,250 mm) is coated by a spinless coating method, for example, the rate at which a colored composition is delivered from the slit nozzle is usually 500 μl/sec to 2,000 μl/sec, and preferably 800 μl/sec to 1,500 μl/sec, and the coating speed is typically 50 mm/sec to 300 mm/sec, and preferably 100 mm/sec to 200 mm/sec.

In addition, the solid content of the colored composition used in the coating step is typically 10% to 20%, and preferably 13% to 18%.

In the case where a coating film is formed on a substrate by using the colored composition of the present invention, the thickness of the coating film (after the prebaking treatment) is generally 0.3 μm to 5.0 μm, preferably 0.5 μm to 4.0 μm, and most preferably 0.5 μm to 3.0 μm.

In addition, in the case of a color filter for a solid-state imaging element, the thickness of the coating film (after the prebaking treatment) is preferably in the range of 0.5 μm to 5.0 μm.

During the applying step, a prebaking is typically carried out after applying. If desired, prebaking may be preceded by a vacuum treatment. The conditions for vacuum drying typically include a degree of vacuum of about 0.1 torr to 1.0 torr, preferably about 0.2 torr to 0.5 torr.

Furthermore, the prebaking treatment can be carried out using a hot plate, an oven, or the like under conditions of a temperature range of 50° C. to 140° C., and preferably about 70° C. to 110° C. for 10 seconds to 300 seconds. Incidentally, the prebaking may be combined with a high-frequency wave treatment or the like. The high-frequency wave treatment can also be used alone.

Examples of the prebaking conditions include heating with a hot plate or an oven at 70° C. to 130° C. for about 0.5 minutes to 15 minutes.

Moreover, the thickness of the colored composition layer formed with the colored composition is appropriately selected according to the purposes. In the color filter for a liquid crystal display device, the thickness of the colored composition layer is preferably in the range of 0.2 μm to 5.0 μm, more preferably in the range of 1.0 μm to 4.0 μm, and most preferably in the range of 1.5 μm to 3.5 μm. Further, in the color filter for a solid-state imaging element, the thickness of the colored composition layer is preferably in the range of 0.2 μm to 5.0 μm, more preferably in the range of 0.3 μm to 2.5 μm, and most preferably in the range of 0.3 μm to 1.5 μm.

Further, the film thickness of the colored composition layer is a film thickness after prebaking.

—Step (B)—

Next, in the method for manufacturing a color filter of the present invention, a film including the colored composition formed on the substrate as described above (colored composition layer) is subjected to exposure through, for example, a photomask. As the light or radiation that can be applied for the exposure, a g-ray, an h-ray, an i-ray, a j-ray, an KrF light, or an ArF light is preferable, and an i-ray is particularly preferable. In the case where the i-ray is used for irradiation, it is preferably irradiated at an exposure dose of 100 mJ/cm$^2$ to 10,000 mJ/cm$^2$.

Furthermore, other exposure light sources include mercury lamps at an ultra-high pressure, a high pressure, a medium pressure, and a low pressure, chemical lamps, carbon arc lamps, xenon lamps, metal halide lamps, various visible light and ultraviolet laser light sources, fluorescent lamps, tungsten lamps, solar light, or the like can also be used.

Exposure Step Using Laser Light Source

In the exposure method using a laser light source, an ultraviolet laser is used as a light source.

As irradiation light, an ultraviolet laser having a wavelength in the range of 300 nm to 380 nm is preferable, and an ultraviolet laser having a wavelength in the range of 300 nm to 360 nm is more preferable since it conforms to the photosensitive wavelength to which the resist is sensitive. Specifically, relatively inexpensive lasers with especially high output can be suitably used, including solid-state lasers such as the third harmonic generation (355 nm) of Nd:YAG laser or excimer lasers XeCl (308 nm) and XeF (353 nm).

The exposure dose of the target (pattern) is in the range of 1 mJ/cm$^2$ to 100 mJ/cm$^2$, and more preferably in the range of 1 mJ/cm$^2$ to 50 mJ/cm$^2$. The exposure doses in these ranges are preferable from the viewpoint of patterning productivity.

The exposure apparatus is not particularly limited, and commercial products such as Callisto (manufactured by V-Technology Co., Ltd.), EGIS (manufactured by V-Technology Co., Ltd.), DF2200G (manufactured by DAINIPPON SCREEN MFG. CO., LTD.), or the like can be used. Further, other apparatuses than those described above may also be suitably used.

When a color filter for a liquid crystal display device is manufactured, exposure primarily using an h-ray or an i-ray by a proximity exposure system or a mirror projection exposure system is preferably used. When a color filter for a solid-state imaging element is manufactured, it is preferable to primarily use an i-ray in a stepper exposure system. Further, the photomask used for manufacturing a color filter using a driving substrate for TFT liquid crystals has a pattern for forming a pixel (colored pattern) as well as a pattern for forming a through-hole or a U-shaped groove.

The colored composition layer exposed as described above can be heated.

In addition, exposure can also be carried out under a stream of nitrogen gas in the chamber to prevent oxidative discoloration of color materials in the colored composition layer.

Subsequently, the colored composition layer after the exposure is subjected to development with a developer. Thus, a negative or positive colored pattern (resist pattern) can be formed. In the developing step, uncured areas of the exposed coating layer are dissolved in the developer while only cured areas remain on the substrate.

Any developer can be used so far as it dissolves the coating layer of the colored composition (colored composition layer) in uncured areas while it does not dissolve cured areas. For example, a combination of various organic solvents or an aqueous alkaline solution can be used.

Examples of the organic solvents used for development include those already described as solvents that can be used to prepare the colored compositions of the present invention.

Examples of the aqueous alkaline solution include an aqueous alkaline solution of an alkaline compound such as tetraethylammonium hydroxide, tetrapropylammonium hydroxide, tetrabutylammonium hydroxide, trimethylbenzylammonium hydroxide, benzyltrimethylammonium hydroxide, sodium hydroxide, potassium hydroxide, sodium carbonate, sodium hydrogen carbonate, sodium silicate, sodium metasilicate, aqueous ammonia, ethylamine, diethylamine, dimethylethanolamine, tetramethylammonium hydroxide, tetraethylammonium hydroxide, corrin, pyrrole, piperidine, or 1,8-diazabicyclo-[5,4,0]-7-undecene dissolved at a concentration of 0.001% by mass to 10% by mass, and preferably 0.01% by mass to 1% by mass. When the developer is an aqueous alkaline solution, the alkaline concentration is adjusted such that the pH preferably becomes 11 to 13, and more preferably becomes 11.5 to 12.5.

The aqueous alkaline solution may contain an appropriate amount of a water-soluble organic solvent such as methanol and ethanol, a surfactant, and the like.

The developing temperature is typically in the range of 20° C. to 30° C. and the developing time is 20 seconds to 90 seconds.

Any development method can be used, such as a dipping mode, a shower mode, a spray mode, or the like of the development method, which may be combined with a swing mode, a spin mode, an ultrasonic mode, or the like. Uneven development can also be prevented by wetting the surface to be developed with water or the like before it contacts the developer. Further, development can also be carried out while the substrate is inclined.

In addition, puddle development is also used for manufacturing a color filter for a solid-state imaging element.

After the development treatment, a rinsing treatment for washing off an excess of the developer, then drying, and then a heat treatment (postbaking) to complete curing are carried out.

The rinsing treatment is typically carried out using pure water, but alternatively, it may also be carried out using pure water during final washing while using recycled pure water during initial washing to save water, or by washing the substrate inclined, or by washing under ultrasonic irradiation.

The rinsing treatment is followed by water removal and drying, and then a heat treatment typically at about 200° C. to 250° C. is carried out. This heat treatment (postbaking) can be carried out on the developed coated film by continuous or batch operation using a heating means such as a hot plate, a convection oven (hot-air circulation dryer), or a high-frequency heater under the conditions described above.

A color filter including multiple colored cured films (colored patterns) can be manufactured by successively repeating the above steps for each color to suit a desired number of hues.

The color filter of the present invention has a high contrast, an even color density, and good color properties so that they can be suitably used for a solid-state imaging element or a liquid crystal display element.

—Step (C)—

In particular, in the method for manufacturing a color filter of the present invention, the colored pattern (pixel) formed by using a colored composition of the present invention can also be postexposed by irradiation with ultraviolet rays.

—Step (D)—

The colored pattern postexposed by irradiation with ultraviolet rays as described above is preferably further subjected to a heat treatment. The heat treatment (so-called postbaking) of the formed colored pattern allows the colored pattern to be further cured. This heat treatment can be carried out using, for example, a hot plate, various heaters, an oven, or the like.

The temperature for the heat treatment is preferably 100° C. to 300° C., and more preferably 150° C. to 250° C. Further, the heating time is preferably about 10 minutes to 120 minutes.

The colored pattern obtained in this manner constitutes a pixel in a color filter. When a color filter having multiple hue pixels is manufactured, the step (A), the step (B), and optionally the step (C) or the step (D) may be repeated to suit a desired number of colors.

Alternatively, the step (C) and/or the step (D) may be carried out each time when the formation, exposure and development of a monochromatic colored composition layer is completed (for each color), or the step (C) and/or the step (D) may be carried out once after the formation, exposure and development of all colored composition layers of a desired number of colors have been completed.

Furthermore, it is also possible to apply the colored composition of the present invention to a method for manufacturing a color filter including a dry etching step. One example of such as a production method is a production method including a step of forming a colored composition layer using the colored composition of the present invention, a step of forming a photoresist layer on the colored composition layer, a step of patterning a photoresist layer by carrying out exposure and development to obtain a resist pattern, and a step of dry-etching the colored composition layer using the resist pattern as an etching mask. In the case where the colored composition of the present invention is used for a method for manufacturing a color filter including a dry-etching step, it may be a photocurable composition or a thermocurable composition. In the case of the thermocurable composition, a thermocuring agent can be used, and as the thermocuring agent, a compound having two or more epoxy groups in one molecule is preferable.

The color filter obtained by the method for manufacturing the color filter of the present invention (the color filter of the present invention) is excellent in hue and contrast since the colored composition of the present invention is used.

The color filter of the present invention can be used for a liquid crystal display element or a solid-state imaging element, and particularly suitable for use in a liquid crystal display device. In the case where the color filter is used in a liquid crystal display device, display of an image with excellent spectral characteristics and contrast can be realized while achieving a good hue by using a triarylmethane dye as a colorant.

The foregoing description relates to the colored composition of the present invention mainly for applications in which it is used for forming colored patterns in a color filter, but it can also be applied for forming black matrices separating colored patterns (pixels) constituting the color filter.

Black matrices on a substrate can be formed by the respective steps of coating, exposure and development using a colored composition containing a processed pigment of black pigment such as carbon black and titanium black, optionally followed by postbaking.

[Image Display Device (Liquid Crystal Display Device)]

The liquid crystal display element and the solid-state imaging element of the present invention include the color filter of the present invention. More specifically, a panel which is the liquid crystal display element of the present invention can be obtained by forming a polarizing film on the inner side of a color filter to face an electrode substrate and filling the gap with liquid crystals and sealing it, for example. Alternatively, the solid-state imaging element of the present invention can be obtained by forming a color filter on a light-receiving element, for example.

The definition of display devices or details of the respective display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989), and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

The color filter of the present invention may be used for a liquid crystal display device using a color TFT system. The liquid crystal display device using a color TFT system is described in, for example, "Color TFT Liquid Crystal Display (KYORITSU SHUPPAN Co., Ltd., published in 1996)". Further, the present invention can be applied to a liquid crystal display device having an enlarged view angle, which uses an in-plane switching driving system such as IPS and a pixel division system such as MVA, or to STN, TN, VA, OCS, FFS, R-OCB, and the like.

In addition, the color filter in the present invention can be provided to a color-filter on array (COA) system which is a bright and high-definition system.

If the color filter of the present invention is used in a liquid crystal display device, high contrast can be realized when the color filter is combined with a three-wavelength tube of a cold cathode tube known in the related art. Further, if a light source of LED in red, green, and blue (RGB-LED) is used as a backlight, a liquid crystal display device having high luminance, high color purity, and good color reproducibility can be provided.

<Solid-State Imaging Element>

The colored composition of the present invention can be preferably used in the applications of a solid-state imaging element A configuration of the solid-state imaging element is not particularly limited as long as it includes a color filter manufactured using the colored composition of the present invention and functions as a solid-state imaging element, examples thereof include the configurations as follows.

The solid-state imaging element is configured as follows: a plurality of photodiodes forming a light-receiving area of the solid-state imaging element (for example, a CCD image sensor and a CMOS image sensor) and a transmission electrode made of, for example, polysilicon are provided on a substrate; a light shielding film which is made of, for example, tungsten and has openings corresponding to only light-receiving portions of the photodiodes is provided on the photodiodes and the transmission electrode; a device protecting film which is made of, for example, silicon nitride is formed on the light shielding film so as to cover the entire surface of the light shielding film and the light-receiving portions of the photodiodes; and the color filter for a solid-state imaging element of the present invention is provided on the device protecting film.

In addition, the solid-state imaging element may also be configured such that it has a light-collecting unit (for example, a microlens. This shall apply hereinafter) on a device protective film and under a color filter (on the side closer to a supporter) or has a light-collecting unit on a color filter.

EXAMPLES

Hereinafter, the present invention will be described in more detail with reference to Examples. The materials, amounts used, ratios, the treatment specifications, the treatment orders, and the like shown in Examples below can be appropriately modified as long as the gist of the present invention is not impaired. Thus, the scope of the present invention is not limited to the specific examples shown below. Further, "%" and "part(s)" are based on mass unless otherwise specified.

Synthesis Example 1

(Synthesis of Compound I-9 (Triarylmethane Dye (I-9)))

A compound 1-9 was synthesized in accordance with the following route.

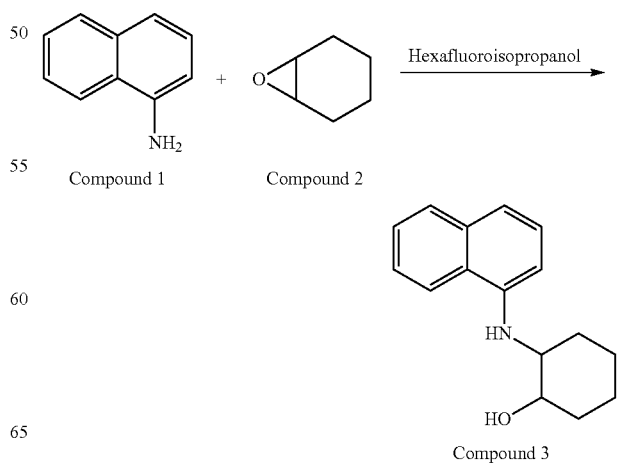

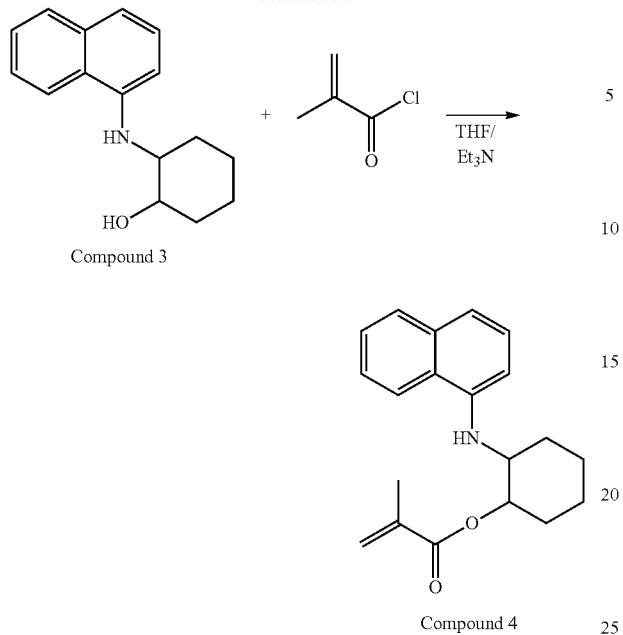

Compound 3

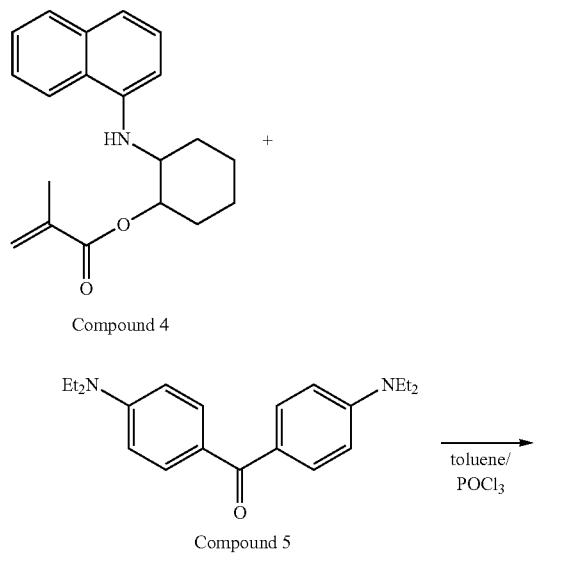

Compound 4

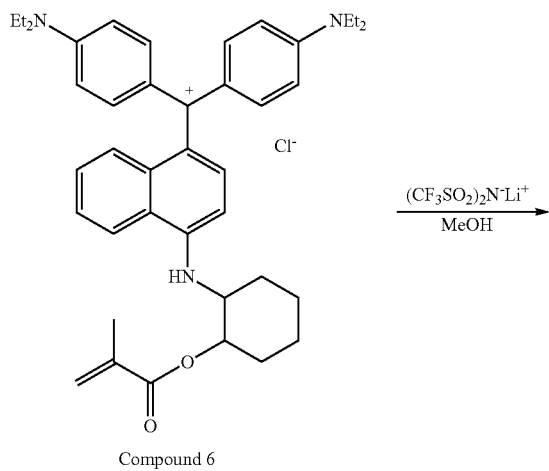

Compound 6

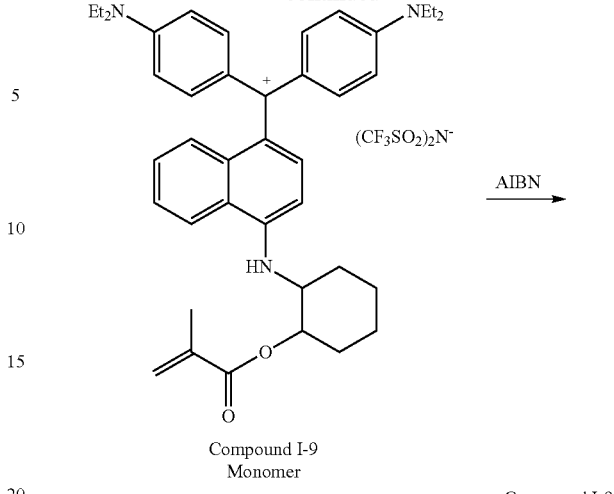

Compound I-9 Monomer

Compound I-9

(Synthesis of Synthesis Intermediate (Compound 3))

17.0 g (118.8 mmol) of a compound 1 (1-naphthylamine) and 11.65 g (118.7 mmol) of 1,2-epoxycyclohexane were dissolved in 50 mL of hexafluoroisopropanol, followed by heating and refluxing for 5 hours. After confirming the completion of the reaction, and a desired product was extracted and washed with 50 mL of ethyl acetate, water, and saline in an organic layer, and then concentrated. This crude product was dissolved in hexane, recrystallized, and then filtered to obtain 19.2 g of a compound 3 (yield: 67%).

(Synthesis of Synthesis Intermediate (Compound 4))

The compound 3 (2.4 g (10 mmol)) and 1.5 g (15 mmol) of triethylamine were dissolved in 10 mL of THE. This solution was cooled to 0° C. and then 1.15 g (11 mol) of methacrylic acid chloride was added dropwise thereto. After confirming the completion of the reaction, a desired product was extracted and washed with 20 mL of ethyl acetate, water, and saline in an organic layer, and then concentrated. This crude product was purified by column chromatography to obtain 1.8 g of a compound 4 (yield of 58%).

(Synthesis of Compound 1-9 Monomer)

The compound 4 (1.9 g (5.8 mmol)), a compound 5 (1.8 g (5.8 mmol)), and 1.0 g (6.4 mmol) of phosphorus oxychloride were dissolved in 6 mL of toluene, warmed to 90° C., and stirred for 1 hour. After confirming the completion of the reaction, an operation of adding 10 mL of ethyl acetate to this solution to obtain a desired product as a supernatant was repeated three times, and a compound 6 was collected as an ethyl acetate solution. 20 mL of a solution of 2.0 g (7.0 mmol) of a bistrifluoromethane sulfonimide lithium salt in 20 mL of methanol was added to this solution. After confirming the completion of a salt exchange reaction, 50 mL of water was added thereto, and the compound was extracted and concentrated in the ethyl acetate layer, and then purified by column chromatography to obtain 1.7 g (33%) of a desired compound 1-9 monomer.

$^1$H NMR (CHCl$_3$): 1.25 (m, 16H), 1.8 (s, 3H), 3.6 (t, 8H), 3.75 (bs, 1H), 5.2 (dt, 1H), 5.55 (s, 1H), 6.1 (s, 1H), 6.2 (d, 1H), 6.75 (d, 4H), 7.2-7.5 (m, 9H), 7.8 (d, 1H)

<Synthesis of Compound (I-9)>

Under a nitrogen atmosphere, 30 g of methyl ethyl ketone was placed and heated at 70° C. To this solution were added dropwise 17.9 g of the compound 1-9 monomer and a solution of AIBN (0.16 g) in 20 mL of methyl ethyl ketone for 3 hours. After the completion of addition dropwise, the solution was stirred for 15 hours, methyl ethyl ketone was concentrated, and then the reaction liquid was put into hexane. The obtained individual product was dried and hardened to obtain 17.0 g of a compound (I-9).

<Synthesis of Compound (I-21) (Triarylmethane Dye (I-21))>

In the same manner as above except that 17.9 g of the compound 1-9 monomer was changed to 12.6 g of the compound 1-9 monomer, 0.26 g of methacrylic acid, and 0.50 g of cyclohexyl methacrylate, 13.0 g of a compound (I-21) was obtained.

Example 1

(Preparation of Colored Composition (Coating Liquid))
<Composition>

| | |
|---|---|
| The following triarylmethane dye (I-1) | 2 parts by mass |
| The following polymerizable compound: (T-1) | 10.3 parts by mass |
| The following alkali-soluble binder (U-1) (value in terms of solid content: 8.5 parts by mass) | 21.2 parts by mass |
| The following photopolymerization initiator (V-3) | 1.0 parts by mass |
| The following solvent (X-1) | 7.2 parts by mass |
| The following solvent (X-2) | 0.4 parts by mass |
| The following surfactant (Z-1) | 0.006 parts by mass |

Triarylmethane dye (I-1): Compound of the Following Structure

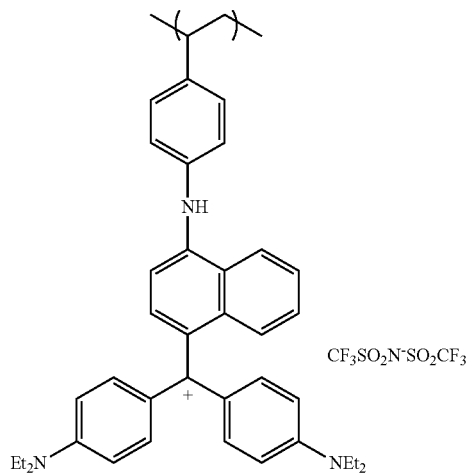

Polymerizable compound (T-1): KAYARAD DPHA (manufactured by Nippon Kayaku Co., Ltd., a mixture of dipentaerythritol pentaacrylate and dipentaerythritol hexaacrylate)

Alkali-soluble binder (U-1): A propylene glycol methyl ether acetate solution (solid content of 40.0% by mass) (acid value of 100 mgKOH/g) of a benzyl methacrylate/methacrylic acid (85/15) [mass ratio] copolymer (weight average molecular weight: 12,000)

Photopolymerization initiator (V-3): an oxime-based compound of the following structure

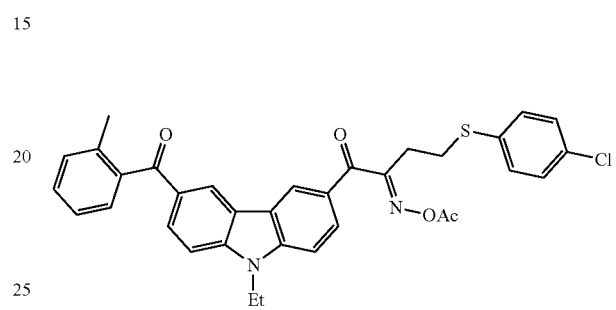

Solvent (X-1): Propylene glycol methyl ether acetate

Solvent (X-2): Ethyl 3-ethoxypropionate

Surfactant (Z-1): Megaface F781-F (manufactured by DIC Corporation)

Examples 2 to 27

In the same manner as in Example 1 except that the triarylmethane dye (I-1) was changed to the following (I-2) to (I-21) and (I-101) to (I-106), a colored composition was prepared.

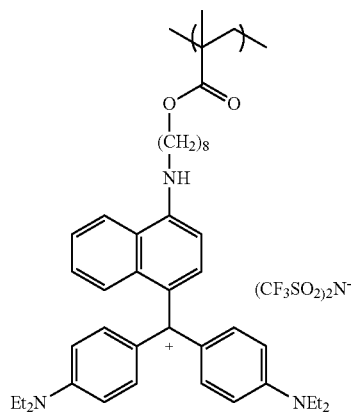

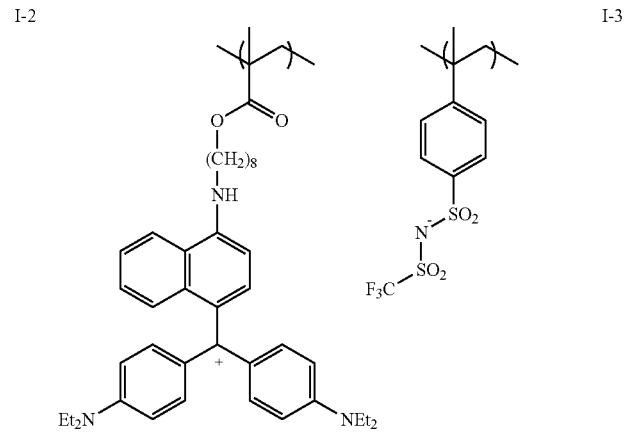

-continued
I-4
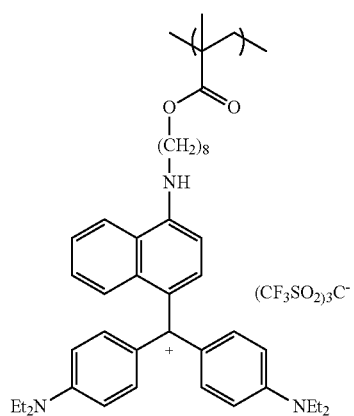
I-5
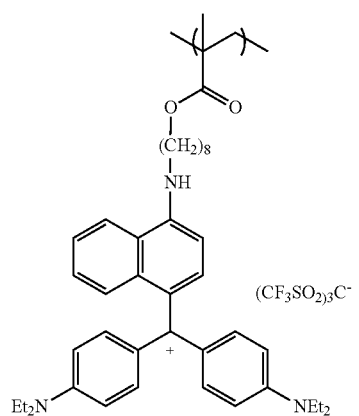
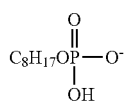
I-6
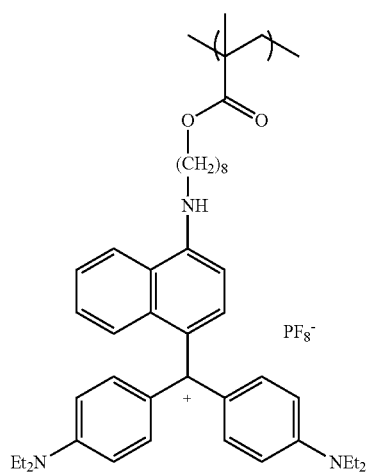
I-7
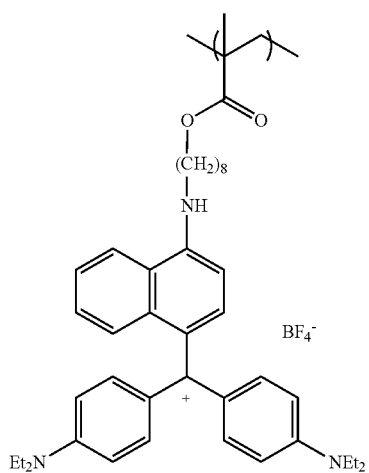
I-8
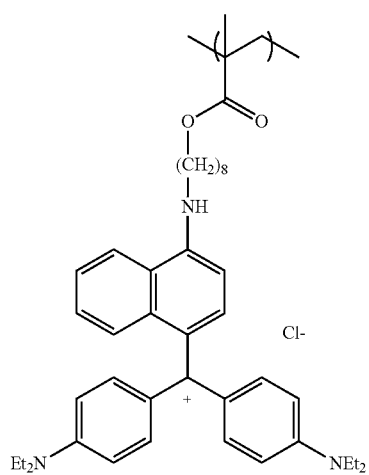
I-9
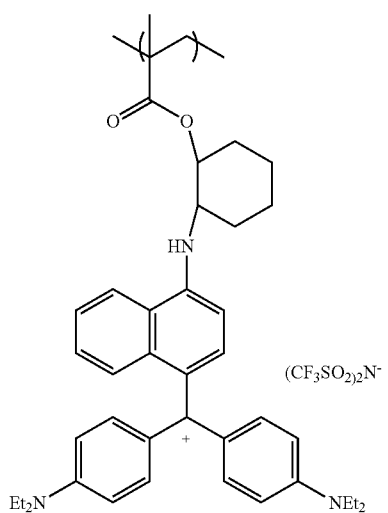

-continued
I-10
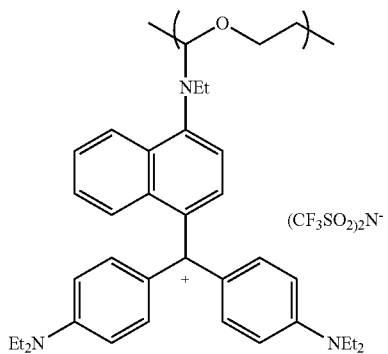
I-11
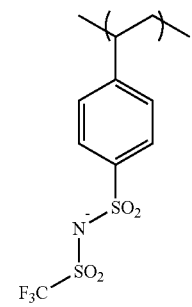
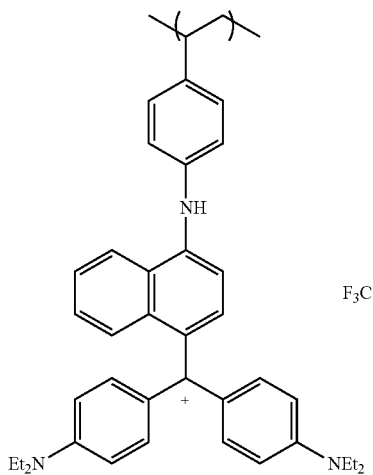
I-12
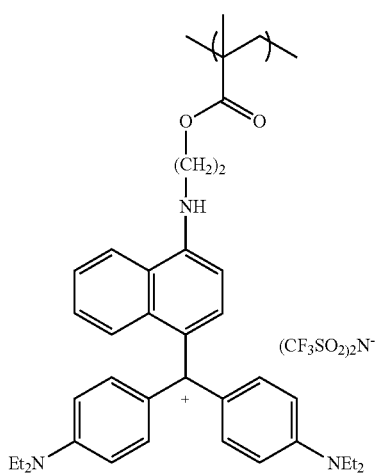
I-13
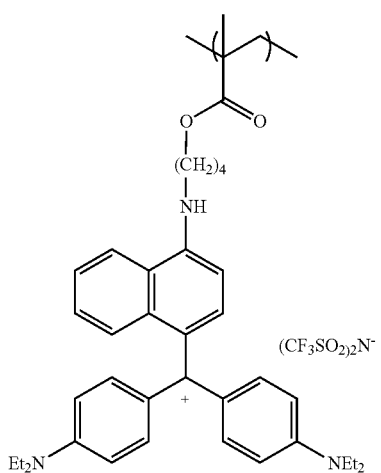
I-14
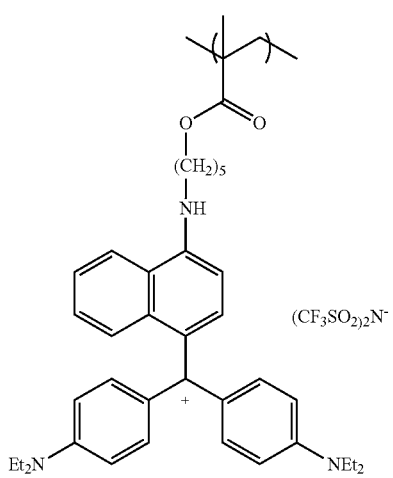
I-15
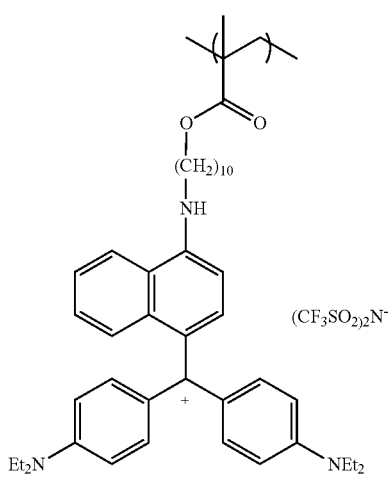

-continued
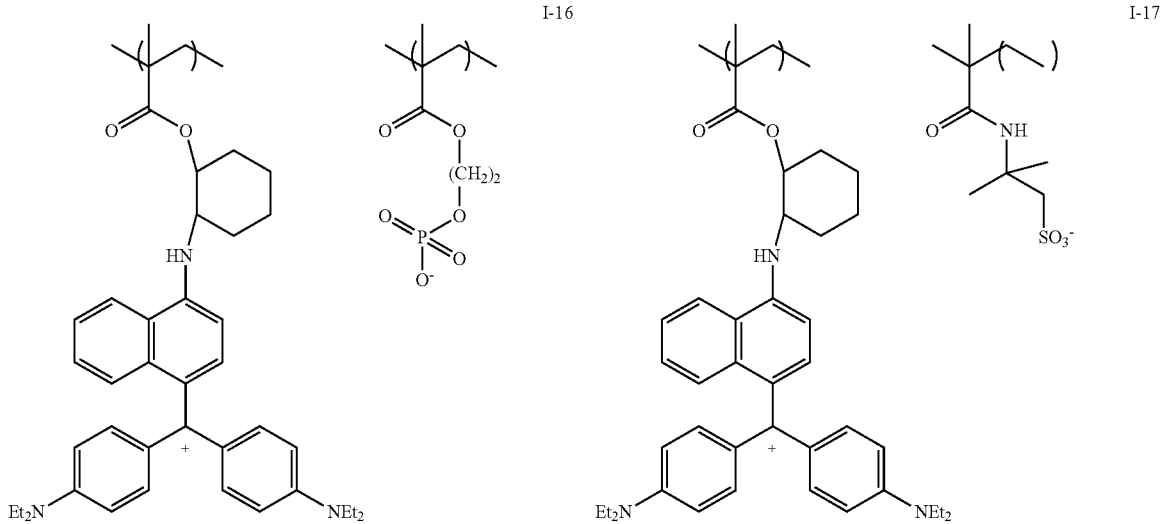
I-16
I-17
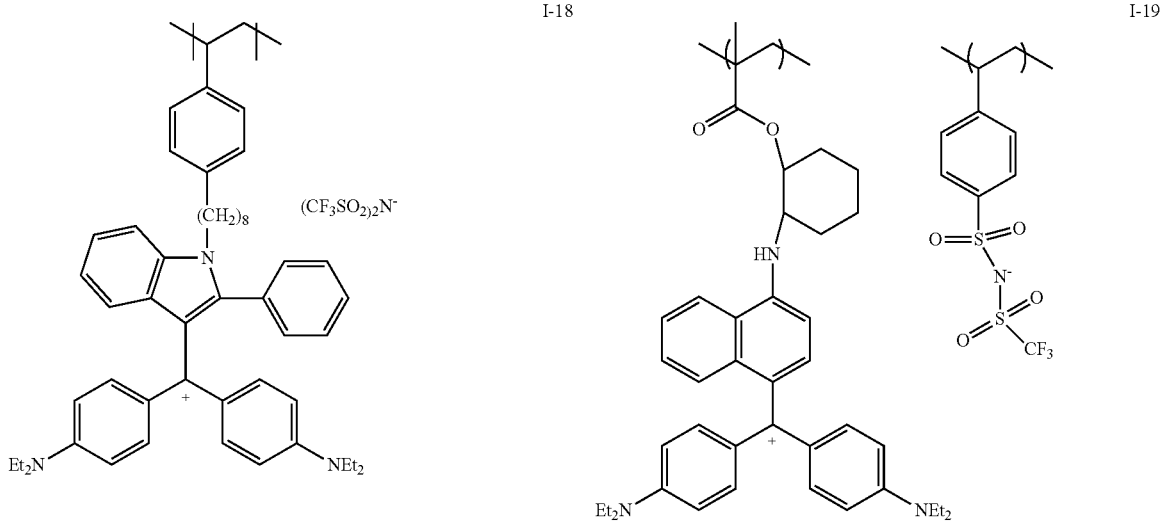
I-18
I-19
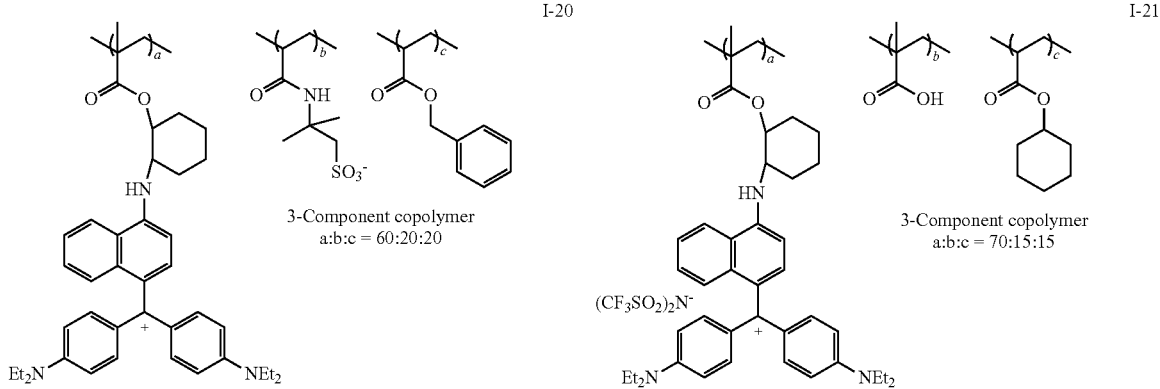
I-20
I-21

-continued
I-101
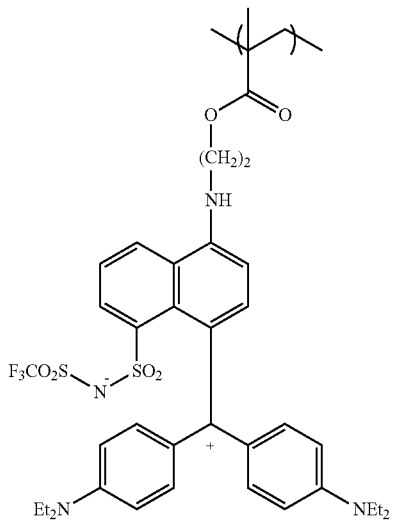
I-102
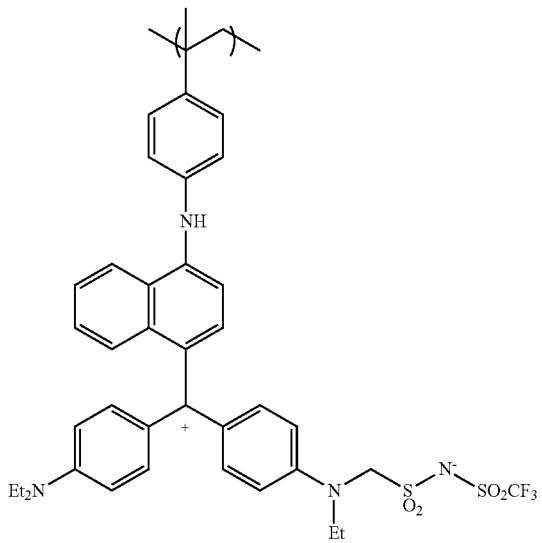
I-103
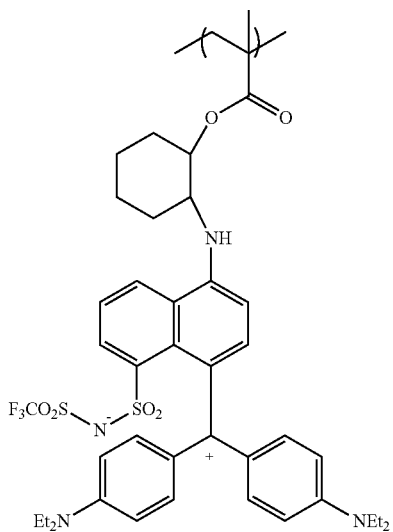
I-104
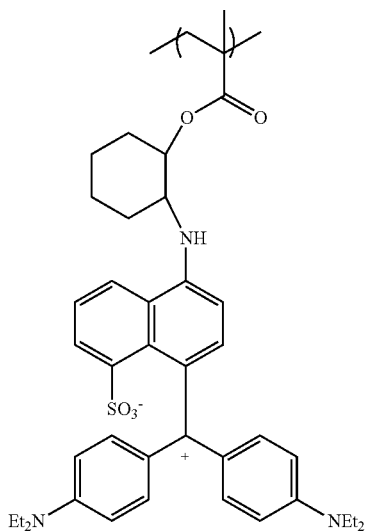
I-105
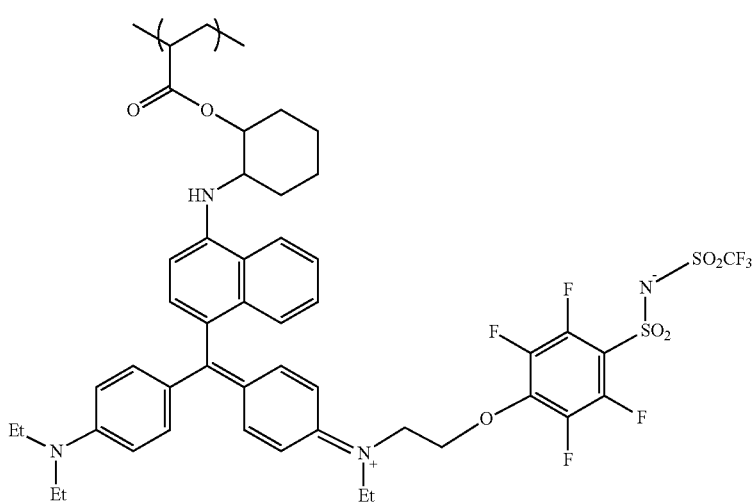

-continued

I-106

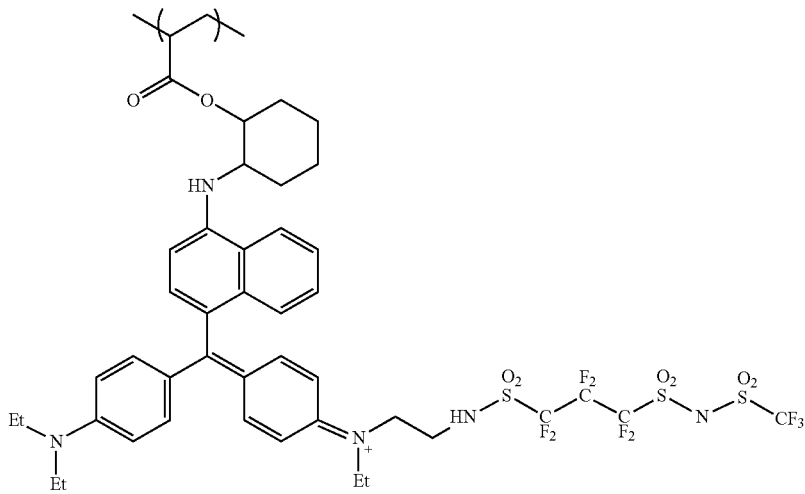

Example 28

In the same manner as in Example 1 except that the alkali-soluble binder (U-1) used in Example 1 was changed to the following alkali-soluble binder (U-1-1), a colored composition was prepared.

Alkali-soluble binder (U-1-1): A propylene glycol methyl ether acetate solution (solid content of 40.0% by mass) acid value (250 mgKOH/g) of a benzyl methacrylate/methacrylic acid/allyl methacrylate (20/60/20) [mass ratio] copolymer (weight average molecular weight: 20,000)

Example 29

In the same manner as in Example 1 except that the alkali-soluble binder (U-1) used in Example 1 was changed to the following alkali-soluble binder (U-2-1), a colored composition was prepared.

Alkali-soluble binder (U-2-1): A propylene glycol methyl ether acetate solution (solid content of 40.0% by mass) acid value (125 mgKOH/g) of a GMA-MAA/methacrylic acid/cyclohexyl methacrylate (26/38/36) [mass ratio] copolymer (weight average molecular weight: 3,000)

Furthermore, GMA-MAA represents the following structure.

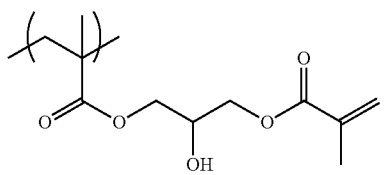

Example 30

In the same manner as in Example 1 except that the alkali-soluble binder (U-1) used in Example 1 was changed to the following alkali-soluble binder (U-1-2), a colored composition was prepared.

alkali-soluble binder (U-1-2): A propylene glycol methyl ether acetate solution (solid content of 40.0% by mass) acid value (110 mgKOH/g) of a benzyl methacrylate/methacrylic acid/allyl methacrylate/N-phenylmaleimide (15/20/30/35) [mass ratio] copolymer (weight average molecular weight: 20,000)

Comparative Example 1

In the same manner as in Example 1 except that the triarylmethane dye was changed to the following Comparative Compound 1 described in Example 2 of WO2010-123071A, a colored composition was prepared.

Comparative Compound 1

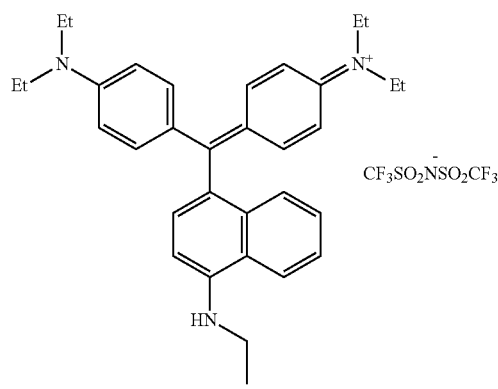

Comparative Example 2

In the same manner as in Example 1 except that the triarylmethane dye was changed to the following Comparative Compound 2, a colored composition was prepared.

Comparative Compound 2: (manufactured by Tokyo Chemical Industry Co., Ltd., trade name: Basic Blue 7)

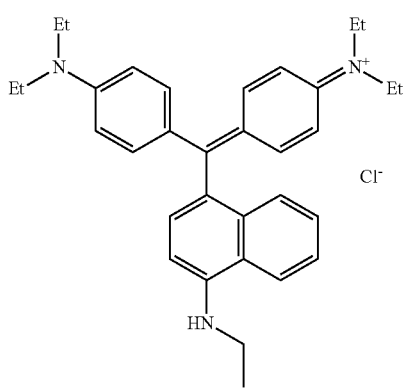 [SMILES: CCNc1ccc(C(=C2C=CC(=[N+](CC)CC)C=C2)c2ccc(N(CC)CC)cc2)c2ccccc12 ; [Cl-]]

<Manufacture of Colored Film of Colored Composition>

The colored composition obtained above was coated onto a glass substrate (1737, manufactured by Corning Inc.) in 100 mm×100 mm such that the maximum absorption at 600 nm to 700 nm would be 1.5 to 2.0, and dried in an oven at 100° C. for 180 seconds to manufacture a colored film on a substrate.

The colored film obtained above was evaluated as follows.

<Heat Resistance>

The colored film was heated at 230° C. for 40 minutes and then a change in chromaticity, that is, an ΔEab value was calculated. The ΔEab value was calculated from the UV-Vis spectra before and after heating. A smaller ΔEab value indicates superior heat resistance.

<Solvent Resistance (Difference in Chromaticity)>

The colored film that had been heated at 230° C. for 20 minutes was deposited in N-methylpyrrolidone (NMP) at 25° C. for 10 minutes, and the chromaticity before and after immersion was measured to calculate a color change index ΔEab. The ΔEab value was calculated from the UV-Vis spectra before and after heating. Further, in the case where the value of ΔEab is 3 or less, it is considered that the change in color is small and the solvent resistance is excellent.

<Voltage Holding Ratio>

The colored composition was coated on a glass substrate equipped with an ITO electrode (trade name: 1737, manufactured by Corning Inc.) such that the film thickness after drying would be 2.0 μm, and this was dried (prebaked) in an oven at 90° C. for 60 seconds. Thereafter, the coating film was exposed at 100 mJ/cm² (with an illuminance of 20 mW/cm²), not through a mask, and developed at 25° C. using a 1% aqueous solution of an alkali developer (trade name: CDK-1, manufactured by FUJIFILM Electronic Materials Co., Ltd.), and this coating film after water-washing and drying was subjected to a heating treatment (post-baked) in an oven at 230° C. for 30 minutes to form a colored cured film. Then, the substrate on which the cured film had been formed and the substrate on which only an ITO electrode was deposited in a predetermined shape were adhered to each other using a sealing agent that was mixed with 5-μm glass beads, and a liquid crystal MJ971189 (trade name) manufactured by Merck was injected between the substrates, thereby manufacturing a liquid crystal cell.

Next, the liquid crystal cell was put into a constant-temperature bath at 70° C. for 48 hours, and then the voltage holding ratio of the liquid crystal cell was measured under the following measurement conditions, using a liquid crystal voltage holding ratio measurement system, Model VHR-1A (trade name), manufactured by Toyo Corporation, and evaluated with scores shown in the following criteria. A higher score indicates a better voltage holding ratio.

Measurement Conditions

Distance between electrodes: 5 μm to 15 μm,
Pulse amplitude of applied voltage: 5 V
Pulse frequency of applied voltage: 60 Hz
Pulse width of applied voltage: 16.67 msec
Voltage holding ratio: Value of a voltage applied at a liquid crystal cell potential difference/0 msec after 16.7 msec Evaluation Method 90% or more: 5
From 85% to less than 90%: 4
From 80% to less than 85%: 3
From 75% to less than 80%: 2
From less than 75%: 1

TABLE 2

| | Dye | Heat resistance | Solvent resistance | Voltage holding ratio |
|---|---|---|---|---|
| Example 1 | I-1 | 2.8 | 2.8 | 5 |
| Example 2 | I-2 | 2.8 | 2.8 | 5 |
| Example 3 | I-3 | 2.6 | 2.6 | 5 |
| Example 4 | I-4 | 2.8 | 2.8 | 5 |
| Example 5 | I-5 | 3.5 | 2.8 | 4 |
| Example 6 | I-6 | 4.0 | 2.8 | 4 |
| Example 7 | I-7 | 4.5 | 2.8 | 3 |
| Example 8 | I-8 | 6.0 | 2.8 | 3 |
| Example 9 | I-9 | 2.6 | 2.6 | 5 |
| Example 10 | I-10 | 3.0 | 2.8 | 5 |
| Example 11 | I-11 | 2.7 | 2.7 | 5 |
| Example 12 | I-12 | 3.0 | 2.8 | 5 |
| Example 13 | I-13 | 3.0 | 2.9 | 5 |
| Example 14 | I-14 | 3.0 | 2.8 | 5 |
| Example 15 | I-15 | 3.2 | 2.8 | 5 |
| Example 16 | I-16 | 3.2 | 2.8 | 4 |
| Example 17 | I-17 | 3.2 | 2.8 | 4 |
| Example 18 | I-18 | 3.0 | 2.8 | 4 |
| Example 19 | I-19 | 2.7 | 2.6 | 5 |
| Example 20 | I-20 | 3.2 | 2.6 | 5 |
| Example 21 | I-21 | 2.6 | 2.6 | 5 |
| Example 22 | I-101 | 3.0 | 2.8 | 5 |
| Example 23 | I-102 | 3.0 | 2.8 | 5 |
| Example 24 | I-103 | 2.9 | 2.8 | 5 |
| Example 25 | I-104 | 3.1 | 2.8 | 5 |
| Example 26 | I-105 | 2.8 | 2.8 | 5 |
| Example 27 | I-106 | 2.7 | 2.8 | 5 |
| Example 28 | I-1 | 2.8 | 2.8 | 5 |
| Example 29 | I-1 | 2.6 | 2.6 | 5 |
| Example 30 | I-1 | 2.8 | 2.8 | 5 |
| Comparative Example 1 | Comparative Compound 1 | 2.8 | 6.2 | 2 |
| Comparative Example 2 | Comparative Compound 2 | 9.0 | 7.0 | 2 |

From the results above, it could be seen that in the present invention, it is possible to provide a colored composition having excellent heat resistance, excellent solvent resistance, and an excellent voltage holding ratio.

On the other hand, it could be seen that in the colored compositions of Comparative Examples, the heat resistance, the solvent resistance, and the voltage holding ratio were not good.

<Synthesis of Colorant D-40>

A mixed solution of a triarylmethane compound (a salt of the above-described compound D-30 and the counter anion X-1, 2.3 parts by mass), methacrylic acid (0.35 parts by mass), cyclohexyl methacrylate (0.35 parts by mass), dodecylmercaptan (0.11 parts by mass), and propylene glycol methyl ether acetate (7 parts by mass) was dissolved at 75° C. under a stream of nitrogen gas.

Next, a thermal polymerization initiator (V-601, manufactured by Wako Pure Chemical Industry Ltd., 0.07 parts by mass) was added thereto, and reacted for 2 hours. Further, 0.07 parts by mass of a thermal polymerization initiator was added thereto twice at an interval of 2 hours, and thus reacted for 6 hours in total.

After the reaction, hexane (30 parts by mass) was added thereto to precipitate a polymer having a triarylmethane structure, which was filtered and collected.

The charging molecular weight of the obtained polymer on the synthesis was 5,400. In FIG. 1, the absorption spectrum of a colorant D-40 is shown. The absorption spectrum was measured by dissolving the colorant D-40 (1 mg) in 100 mL of ethyl acetate and using an ultraviolet ray-visible light spectrophotometer.

<Synthesis of Colorant D-46>

A mixed solution of a triarylmethane compound (a salt of the above-described compound D-30 and the counter anion X-1, 2.1 parts by mass), dipentaerythritol hexa(3-mercaptopropionate) (T-3, 0.48 parts by mass), and propylene glycol methyl ether acetate (7 parts by mass) was dissolved at 75° C. under a stream of nitrogen gas.

Next, a thermal polymerization initiator (V-601, manufactured by Wako Pure Chemical Industry Ltd., 0.1 parts by mass) was added thereto, and reacted for 2 hours. Further, a thermal polymerization initiator (0.1 parts by mass) was added thereto, and thus reacted for 2 hours (for 4 hours in total). Next, methacrylic acid (0.45 parts by mass), cyclohexyl methacrylic acid (0.45 parts by mass), and a thermal polymerization initiator (V-601, 0.1 parts by mass) was added thereto, and reacted for 2 hours. Further, a thermal polymerization initiator (V-601, 0.1 parts by mass) was added thereto, and thus reacted for 2 hours.

Hexane (30 parts by mass) was added to the reaction liquid to precipitate a polymer having triarylmethane, which was filtered and collected. From the charging ratio, it is presumed that four triarylmethane structures on average were added to a hexafunctional mercapto group, and copolymerization of methacrylic acid and cyclohexyl methacrylate proceeds from the remaining two structures.

The charging molecular weight of the obtained polymer on the synthesis was 6,500.

<Synthesis of Colorant D-51>

A mixed solution of a triarylmethane compound (a salt of the above-described compound D-30 and a chlorine atom, 1.7 parts by mass), methacrylic acid (0.35 parts by mass), cyclohexyl methacrylate (0.35 parts by mass), dodecylmercaptan (0.11 parts by mass), propylene glycol monomethyl ether (7 parts by mass) was dissolved at 75° C. under a stream of nitrogen gas.

Next, a thermal polymerization initiator (V-601, manufactured by Wako Pure Chemical Industry Ltd., 0.07 parts by mass) was added thereto, and reacted for 2 hours. Further, 0.07 parts by mass of a thermal polymerization initiator was added thereto twice at an interval of 2 hours, and thus reacted for 6 hours in total.

A counter salt structure (a potassium salt of X-4, 0.7 parts by mass), methoxyhydroquinone (0.2 parts by mass), and propylene glycol monomethyl ether (3 parts by mass) were added to the reaction liquid, the mixture was stirred at 75° C. for 1 hour, and the chlorine atom was exchanged with the X-4 structure.

Thereafter, hexane (30 parts by mass) was added thereto to precipitate a polymer having a dye structure, which was filtered and collected.

The charging molecular weight of the obtained polymer on the synthesis was 5,600.

Combinations of the structure of the triarylmethane repeating unit, the structure of the counter salt, the structures of the other repeating units, and the structure of the chain transfer agent are shown below. The synthesis of the colorants D-41 to D-50, and D-52 to D-59 was carried out by the method of D-40.

Figure 2:
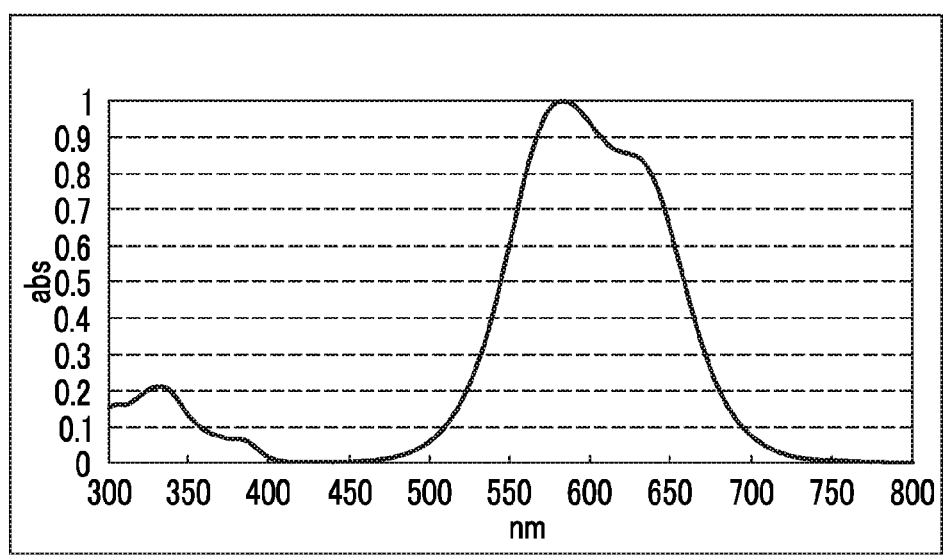
FIG. 2 is a view showing the absorption spectrum of a colorant D-48.

Moreover, in FIG. 2, the absorption spectrum of the colorant D-48 is shown. The absorption spectrum was measured by dissolving the colorant D-48 (1 mg) in 100 mL of ethyl acetate and using an ultraviolet ray-visible light spectrophotometer.

TABLE 3

| Colorant | Triarylmethane repeating unit | Structure of counter salt | Other repeating unit (copolymerization monomer) | | Structure of chain transfer agent | Charging molecular weight |
|---|---|---|---|---|---|---|
| D-40 | D-30 | X-1<br>2.3 parts<br>by mass | Cyclohexyl methacrylate<br>0.35 parts<br>by mass | Methacrylic acid<br>0.35 parts<br>by mass | T-1<br>0.11 parts<br>by mass | 5,400 |
| D-41 | D-31 | X-1<br>2.3 parts<br>by mass | Cyclohexyl methacrylate<br>0.35 parts<br>by mass | Methacrylic acid<br>0.35 parts<br>by mass | T-1<br>0.11 parts<br>by mass | 5,300 |
| D-42 | D-32 | X-1<br>2.3 parts<br>by mass | Cyclohexyl methacrylate<br>0.35 parts<br>by mass | Methacrylic acid<br>0.35 parts<br>by mass | T-1<br>0.11 parts<br>by mass | 5,300 |
| D-43 | D-33 | X-1<br>2.3 parts<br>by mass | Cyclohexyl methacrylate<br>0.35 parts<br>by mass | Methacrylic acid<br>0.35 parts<br>by mass | T-1<br>0.11 parts<br>by mass | 5300 |
| D-44 | D-34 | X-1<br>2.3 parts<br>by mass | Cyclohexyl methacrylate<br>0.35 parts<br>by mass | Methacrylic acid<br>0.35 parts<br>by mass | T-1<br>0.11 parts<br>by mass | 5300 |
| D-45 | D-30 | X-1<br>2.3 parts<br>by mass | Cyclohexyl methacrylate<br>0.35 parts<br>by mass | Methacrylic acid<br>0.35 parts<br>by mass | T-2<br>0.09 parts<br>by mass | 5200 |
| D-46 | D-30 | X-1 | Cyclohexyl methacrylate | Methacrylic acid | T-3 | 6,500 |

TABLE 3-continued

| Colorant | Triarylmethane repeating unit | Structure of counter salt | Other repeating unit (copolymerization monomer) | | | Structure of chain transfer agent | Charging molecular weight |
|---|---|---|---|---|---|---|---|
| D-47 | D-30 | X-1 2.1 parts by mass | Cyclohexyl methacrylate 0.45 parts by mass | glycidyl methacrylate 0.45 parts by mass | Methacrylic acid 0.3 parts by mass | T-1 0.48 parts by mass | 5500 |
| D-48 | D-30 | X-1 2.1 parts by mass | 0.3 parts by mass | 0.3 parts by mass | | T-2 0.11 parts by mass | 5,200 |
| D-49 | D-30 | X-2 2.1 parts by mass | Cyclohexyl methacrylate | Methacrylic acid | | T-1 0.06 parts by mass | 5300 |
| D-50 | D-30 | X-3 2.3 parts by mass | Cyclohexyl methacrylate 0.35 parts by mass | Methacrylic acid 0.35 parts by mass | | T-1 0.09 parts by mass | 5300 |
| D-51 | D-30/Chlorine salt 1.7 parts by mass | X-4/Potassium salt 0.7 parts by mass | Cyclohexyl methacrylate 0.35 parts by mass | Methacrylic acid 0.35 parts by mass | | T-1 0.09 parts by mass | 5,600 |
| D-52 | D-30 | X-5 2.3 parts by mass | Cyclohexyl methacrylate 0.35 parts by mass | Methacrylic acid 0.35 parts by mass | | T-1 0.11 parts by mass | 5300 |
| D-53 | D-30 | X-6 2.3 parts by mass | Cyclohexyl methacrylate 0.35 parts by mass | Methacrylic acid 0.35 parts by mass | | T-1 0.11 parts by mass | 5300 |
| D-54 | D-30 | X-1 2.3 parts by mass | Tetrahydrofurfuryl methacrylate 0.7 parts by mass | | | T-1 0.11 parts by mass | 5300 |
| D-55 | D-30 | X-1 2.3 parts by mass | Ethoxyethyl methacrylate 0.7 parts by mass | | | T-1 0.11 parts by mass | 5300 |
| D-56 | D-30 | X-1 2.3 parts by mass | Methyl methacrylate 0.7 parts by mass | | | T-1 0.11 parts by mass | 5300 |
| D-57 | D-30 | X-1 2.3 parts by mass | Hydroxyethyl methacrylate 0.7 parts by mass | | | T-1 0.11 parts by mass | 5300 |
| D-58 | D-30 | Chlorine atom 1.7 parts by mass | Cyclohexyl methacrylate 0.35 parts by mass | Methacrylic acid 0.35 parts by mass | X-4/potassium salt 0.7 parts by mass | T-1 0.11 parts by mass | 5500 |
| D-59 | D-30 | X-1 2.3 parts by mass | Cyclohexyl methacrylate 0.35 parts by mass | Methacrylic acid 0.35 parts by mass | | T-1 0.05 parts by mass | 12,000 |

TABLE 4

| Colorant | Triarylmethane repeating unit | Structure of counter salt | Other repeating unit (copolymerization monomer) | | Structure of chain transfer agent | Charging molecular weight |
|---|---|---|---|---|---|---|
| D-60 | D-A1 | X-1 2.3 parts by mass | Cyclohexyl methacrylate 0.35 parts by mass | Methacrylic acid 0.35 parts by mass | T-1 0.11 parts by mass | 5300 |
| D-61 | D-A2 | X-1 2.3 parts by mass | Cyclohexyl methacrylate 0.35 parts by mass | Methacrylic acid 0.35 parts by mass | T-1 0.11 parts by mass | 5300 |
| D-62 | D-A3 | X-1 2.3 parts by mass | Cyclohexyl methacrylate 0.35 parts by mass | Methacrylic acid 0.35 parts by mass | T-1 0.11 parts by mass | 5300 |

TABLE 4-continued

| Colorant | Triarylmethane repeating unit | Structure of counter salt | Other repeating unit (copolymerization monomer) | | Structure of chain transfer agent | Charging molecular weight |
|---|---|---|---|---|---|---|
| D-63 | D-A4 | X-1 2.3 parts by mass | Cyclohexyl methacrylate 0.35 parts by mass | Methacrylic acid 0.35 parts by mass | T-1 0.11 parts by mass | 5300 |
| D-64 | D-A5 | X-1 2.3 parts by mass | Cyclohexyl methacrylate 0.35 parts by mass | Methacrylic acid 0.35 parts by mass | T-1 0.11 parts by mass | 5300 |
| D-65 | D-A6 | X-1 2.3 parts by mass | Cyclohexyl methacrylate 0.35 parts by mass | Methacrylic acid 0.35 parts by mass | T-2 0.11 parts by mass | 5200 |
| D-66 | D-A7 | X-1 2.3 parts by mass | Cyclohexyl methacrylate 0.35 parts by mass | Methacrylic acid 0.35 parts by mass | T-3 0.11 parts by mass | 6500 |
| D-67 | D-A8 | X-1 2.3 parts by mass | Cyclohexyl methacrylate 0.35 parts by mass | Methacrylic acid 0.35 parts by mass | T-1 0.11 parts by mass | 5500 |
| D-68 | D-A9 | X-1 2.3 parts by mass | Cyclohexyl methacrylate 0.35 parts by mass | Methacrylic acid 0.35 parts by mass | T-2 0.11 parts by mass | 5200 |
| D-69 | D-A10 | X-1 2.3 parts by mass | Cyclohexyl methacrylate 0.35 parts by mass | Methacrylic acid 0.35 parts by mass | T-1 0.11 parts by mass | 5300 |
| D-70 | D-A1 | X-1 2.3 parts by mass | glycidyl methacrylate 0.35 parts by mass | Methacrylic acid 0.35 parts by mass | T-1 0.05 parts by mass | 11000 |
| D-71 | D-A4 | X-1 2.0 parts by mass | Cyclohexyl methacrylate 0.5 parts by mass | Methacrylic acid 0.5 parts by mass | T-1 0.05 parts by mass | 12000 |
| D-72 | D-A5 | X-1 2.0 parts by mass | Cyclohexyl methacrylate 0.3 parts by mass | Methacrylic acid 0.35 parts by mass glycidyl methacrylate 0.35 parts by mass | T-1 0.05 parts by mass | 11000 |
| D-73 | D-30 | X-1 2.3 parts by mass | Cyclohexyl methacrylate 0.35 parts by mass | Methacrylic acid 0.35 parts by mass | T-1 0.11 parts by mass | 5300 |

<Colored Layer A>
<<Preparation of Colored Composition>>
Composition 1
The following components were mixed.

| | |
|---|---|
| Colorant | X parts by mass (described in the table as described below) |
| (T-1) Polymerizable compound | 6.0 parts by mass |
| (U-2) Alkali-soluble binder | 5.3 parts by mass |
| (V-4) Photopolymerization initiator | 0.3 parts by mass |
| (V-5) Curing accelerator | 0.2 parts by mass |
| (X-1) Solvent | 71 parts by mass |
| (X-3) Solvent | 13 parts by mass |
| (Z-1) Surfactant | 0.01 parts by mass |

Composition 2
The following compound was added to the composition 1 to obtain a composition 2.

| | |
|---|---|
| Bistrifluoromethanesulfonylimide lithium | 0.4 parts by mass |

Composition 3
The following compound was added to the composition 2 to obtain a composition 3.

| | |
|---|---|
| Singlet oxygen quencher AO-60 (manufactured by ADEKA) | 0.3 parts by mass |

Polymerizable compound (T-1): The polymerizable compound (T-1) as described above
Surfactant (Z-1): The surfactant (Z-1) as described above
Solvent (X-1): The solvent (X-1) as described above
Solvent (X-3): (Methylethyl diglycol (MEGD), manufactured by Nippon Nyukazai Co., Ltd.)
Alkali-soluble binder (U-2): An allyl methacrylate/methacrylic acid (77/23) [mass ratio] copolymer (weight average molecular weight of 37,000, acid value of 137 mgKOH/g)
Photopolymerization initiator (V-4): IRGACURE OXE-02 (BASF Japan)
Curing accelerator (V-5): KARENZ MTBD-1 (Showa Denko K. K.)
AO-60: Adekastab AO-60 (manufactured by ADEKA)
<<Formation of Colored Layer A>>
The colored composition as prepared above was coated onto a glass (#1737, manufactured by Corning Inc.) substrate by a spin coating method, and then dried at room temperature for 30 minutes to volatilize the volatile components. This colored layer was irradiated with i-rays (wavelength of 365 nm) with overall exposure, not through a photomask, to form a latent image. For a light source for the i-rays, an ultra-high pressure mercury lamp was used to form parallel light, which was then irradiated. At this time, the irradiation dose was set to 40 mJ/cm$^2$. Next, the colored layer on which this latent image had been formed was developed using an aqueous solution (concentration of 2.4%) of sodium carbonate/sodium hydrogen carbonate at 26° C. for 45 seconds, rinsed with running water for 20 seconds, and then dried by a spray. The film after drying was calcined in a clean oven at 230° C.×20 minutes to obtain a colored layer A.

<<Formation of Colored Layer B>>

By the same preparation procedure as for the colored layer A except that a 20-μm photomask in a L & S pattern was used for exposure of the colored layer, a colored layer B was obtained.

—Evaluation—

<Heat Resistance>

The color difference ΔE*ab between the transmission spectrum of the colored layer A and the transmission spectrum when the colored layer A was further calcined at 230° C.×60 minutes was calculated.

<ITO Resistance>

The colored layer A was subjected to DC sputtering by using a sputtering apparatus (SIH-3030 manufactured by ULVAC Inc.) in an atmosphere with an oxygen flow rate of 2 sccm, an Ar flow rate of 84 sccm, and a sputtering temperature of 230° C. such that the film thickness of ITO would be 1,500 angstroms. The color difference ΔE*ab between the transmission spectrum of the colored layer A equipped with ITO which had been subjected to sputtering and the transmission spectrum when the colored layer A equipped with ITO was further calcined at 230° C.×60 minutes was calculated.

<Light Fastness>

The color difference ΔE*ab between the transmission spectrum of the colored layer A obtained above and the transmission spectrum of the colored layer A after irradiating the colored layer A using a xenon fade meter (XL-75 manufactured by Suga Testing Machine Co., Ltd.) at an irradiance of 390 W/m$^2$ for 48 hours was calculated.

<Solvent Resistance>

This was evaluated in the same manner as the solvent resistance as described above.

<Voltage Holding Ratio>

This was evaluated in the same manner as the voltage holding ratio as described above.

<Pattern Formability>

A cross-section of the pixel forming layer obtained in the colored layer B was observed by a scanning electron microscope, and the taper angle (the inclination angle of the resist pattern at the boundary with the non-image portion) of the pixel forming area from the captured image was evaluated.

A: Taper angle of 30° to 40°

B: Taper angle of 200 or more and less than 30° or of more than 40° and 50° or less C: Taper angle of less than 20° or more than 50°

TABLE 5

| | Colorant | Amount of colorant | Composition | Heat resistance | ITO resistance | Light fastness | Solvent resistance | Voltage holding ratio | Pattern formability |
|---|---|---|---|---|---|---|---|---|---|
| Example 40 | D-40 | 4 | 1 | 2 | 2.5 | 2.6 | 2.8 | 5 | A |
| Example 41 | D-41 | 4 | 1 | 2 | 2.5 | 2.6 | 2.8 | 5 | A |
| Example 42 | D-42 | 4 | 1 | 1.8 | 2 | 3.2 | 2.8 | 5 | A |
| Example 43 | D-43 | 4 | 1 | 2.5 | 2.8 | 2.6 | 2.8 | 5 | A |
| Example 44 | D-44 | 4 | 1 | 3 | 3.5 | 2.8 | 2.8 | 5 | A |
| Example 45 | D-45 | 4 | 1 | 2 | 2.5 | 2.6 | 2.8 | 5 | A |
| Example 46 | D-46 | 4 | 1 | 2.1 | 2.4 | 2.6 | 2.6 | 5 | A |
| Example 47 | D-47 | 4 | 1 | 2.4 | 2.6 | 2.6 | 1.8 | 5 | A |
| Example 48 | D-48 | 4 | 1 | 2.2 | 2.6 | 2.6 | 2.8 | 5 | B |
| Example 49 | D-49 | 4 | 1 | 2 | 2.5 | 2.8 | 2.8 | 5 | A |
| Example 50 | D-50 | 4 | 1 | 3 | 3.5 | 2.6 | 2.8 | 5 | A |
| Example 51 | D-51 | 4 | 1 | 3.3 | 3.8 | 2.6 | 2.8 | 5 | A |
| Example 52 | D-52 | 4 | 1 | 1.6 | 1.8 | 2.6 | 2.8 | 5 | A |
| Example 53 | D-53 | 4 | 1 | 3.5 | 3.9 | 2.6 | 2.8 | 5 | A |
| Example 54 | D-54 | 4 | 1 | 2 | 2.5 | 2.6 | 2.9 | 5 | B |
| Example 55 | D-55 | 4 | 1 | 2.1 | 2.4 | 2.6 | 2.8 | 5 | B |
| Example 56 | D-56 | 4 | 1 | 2.1 | 2.5 | 2.6 | 2.8 | 5 | B |
| Example 57 | D-57 | 4 | 1 | 2.2 | 2.5 | 2.6 | 2.8 | 5 | B |
| Example 58 | D-58 | 4 | 1 | 3.7 | 3.9 | 2.8 | 2.8 | 5 | A |
| Example 59 | D-59 | 4 | 1 | 2 | 2.5 | 2.6 | 2.8 | 5 | B |
| Example 60 | D-40 | 4 | 2 | 1.4 | 2.1 | 2.6 | 2.8 | 4 | A |
| Example 61 | D-40 | 4 | 3 | 1.2 | 1.7 | 1.4 | 2.8 | 4 | A |
| Example 62 | D-40 P1 | 4 1 | 1 | 1.4 | 1.9 | 1.6 | 2.2 | 5 | B |
| Example 63 | D-40 P1 | 4 1 | 2 | 1.3 | 1.6 | 1.6 | 2.2 | 5 | B |
| Example 64 | D-40 P1 | 4 1 | 3 | 1.2 | 1.4 | 1.6 | 2.2 | 5 | B |
| Example 65 | D-40 P1 | 4 2 | 3 | 1 | 1 | 1.2 | 2 | 5 | B |
| Example 66 | D-40 Dye001 | 4 1 | 1 | 1.8 | 2.3 | 2.8 | 2.8 | 4 | A |
| Example 67 | D-40 Dye001 | 4 1 | 2 | 1.7 | 2.2 | 2.8 | 2.8 | 4 | A |
| Example 68 | D-40 Dye001 | 4 1 | 3 | 1.5 | 2 | 2.8 | 2.8 | 4 | A |
| Example 69 | D-40 Dye001 | 4 2 | 3 | 1.4 | 1.8 | 2.8 | 2.8 | 4 | A |

TABLE 5-continued

| | Colorant | Amount of colorant | Composition | Heat resistance | ITO resistance | Light fastness | Solvent resistance | Voltage holding ratio | Pattern formability |
|---|---|---|---|---|---|---|---|---|---|
| Example 70 | D-40<br>Dye002 | 4<br>1 | 1 | 1.6 | 2.1 | 2.6 | 2.6 | 4 | A |
| Example 71 | D-40<br>Dye002 | 4<br>1 | 2 | 1.4 | 1.8 | 2.6 | 2.6 | 4 | A |
| Example 72 | D-40<br>Dye002 | 4<br>1 | 3 | 1.2 | 1.5 | 2.6 | 2.6 | 4 | A |
| Example 73 | D-40<br>Dye003 | 4<br>2 | 1 | 1.4 | 1.9 | 2.8 | 2.8 | 4 | A |
| Example 74 | D-40<br>P2 | 4<br>1 | 2 | 1.5 | 2 | 1.8 | 2.2 | 5 | B |
| Example 75 | D-40<br>P2 | 4<br>1 | 3 | 1.3 | 1.8 | 1.8 | 2.2 | 5 | B |
| Example 76 | D-40<br>P2 | 4<br>2 | 1 | 1.3 | 1.9 | 1.9 | 2.2 | 5 | B |
| Example 77 | D-40<br>P1<br>Dye001 | 4<br>1<br>1 | 2 | 1.5 | 2.1 | 2 | 2.4 | 5 | B |
| Example 78 | D-40<br>P1<br>Dye001 | 4<br>1<br>1 | 3 | 1.3 | 1.8 | 2 | 2.3 | 5 | B |
| Example 79 | D-40<br>P1<br>P2 | 4<br>1<br>1 | 3 | 1.2 | 1.6 | 2.1 | 2.3 | 5 | B |
| Comparative Example 3 | Comparative Compound 1 | 3 | 1 | 7.2 | 8.1 | 3.3 | 6.3 | 2 | B |
| Comparative Example 4 | Comparative Compound 1 | 3 | 2 | 5.8 | 6.7 | 3.3 | 6.3 | 1 | B |
| Comparative Example 5 | Comparative Compound 1 | 3 | 3 | 5.2 | 6.2 | 2.8 | 6.2 | 1 | B |

TABLE 6

| | Colorant | Amount of colorant | Composition | Heat resistance | ITO resistance | Light fastness | Solvent resistance | Voltage holding ratio | Pattern formability |
|---|---|---|---|---|---|---|---|---|---|
| Example 80 | D-60 | 4 | 3 | 1.2 | 1.5 | 1.4 | 2.6 | 4 | A |
| Example 81 | D-61 | 4 | 3 | 1.3 | 1.6 | 1.8 | 2.8 | 4 | A |
| Example 82 | D-62 | 4 | 3 | 1.2 | 1.7 | 1.9 | 2.7 | 4 | A |
| Example 83 | D-63 | 4 | 3 | 1.3 | 1.6 | 1.6 | 2.8 | 4 | A |
| Example 84 | D-64 | 4 | 3 | 1.4 | 1.6 | 1.6 | 2.9 | 4 | A |
| Example 85 | D-65 | 4 | 3 | 1.2 | 1.6 | 1.5 | 2.8 | 4 | A |
| Example 86 | D-66 | 4 | 3 | 1.3 | 1.7 | 1.9 | 2.9 | 4 | A |
| Example 87 | D-67 | 4 | 3 | 1.4 | 1.6 | 1.5 | 2.8 | 4 | A |
| Example 88 | D-68 | 4 | 3 | 2.6 | 2.8 | 1.8 | 2.8 | 4 | A |
| Example 89 | D-69 | 4 | 3 | 2.6 | 3 | 1.9 | 2.9 | 4 | A |
| Example 90 | D-70 | 4 | 3 | 1.3 | 1.5 | 1.5 | 2.7 | 4 | A |
| Example 91 | D-71 | 4.4 | 3 | 1.4 | 1.6 | 1.6 | 2.9 | 4 | A |
| Example 92 | D-72 | 4.4 | 3 | 1.3 | 1.5 | 1.6 | 2.8 | 4 | A |
| Example 93 | D-73 | 4 | 3 | 1.4 | 1.6 | 1.9 | 2.8 | 4 | A |

In the tables, PB15:6, PV23, Dye001, Dye002, and Dye003 represent the following compounds.

P1: PB15:6 (C. I. Pigment•Blue 15:6)

P2: PV23 (C. I. Pigment•Violet 23)

Dye001 (xanthene dye, the following structure)

Dye002 (dipyrromethene metal complex compound, the following structure)

Dye003 (anthraquinone dye, the following structure)

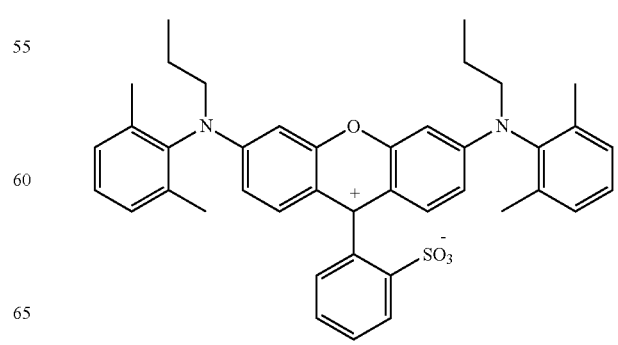

-continued

Dye002

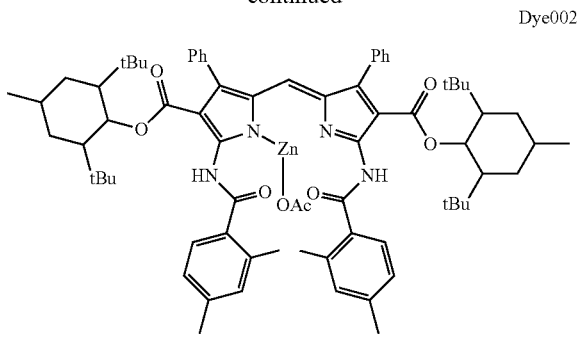

Dye003

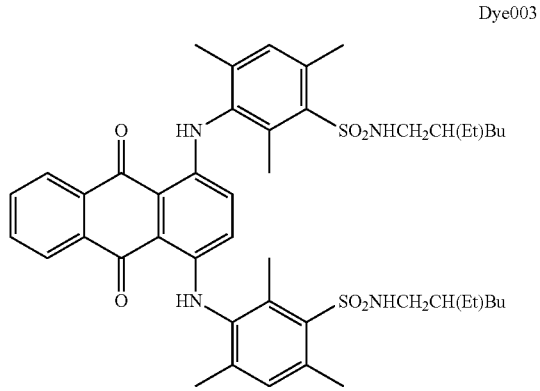

From the above results, it could be seen that in the present invention, it is possible to provide a colored composition having excellent heat resistance, excellent solvent resistance, and an excellent voltage holding ratio, and it could also be seen that it is possible to provide a colored composition having excellent ITO resistance, light fastness, and pattern formability.

It could be seen that the resistance is further improved by using at least one of PB15:6 and PV23 as another colorant in combination with the triarylmethane dye. Further, it could be seen that the heat resistance is further improved by using a xanthene dye, a dipyrromethene metal complex compound, or an anthraquinone dye as another colorant in combination with the triarylmethane dye.

It could be seen that by incorporating bistrifluoromethanesulfonylimide lithium into the colored composition, the heat resistance is further improved. Further, by incorporating a singlet oxygen quencher into the colored composition, the heat resistance is further improved.

In the synthesis of the colorant D-40, in the case where a dye polymer is precipitated and collected by filtration in the same manner as for Synthesis of Colorant D-40 except that bistrifluoromethanesulfonylimide lithium in the amount of 0.2 parts by mass with respect to 1 part by mass of the triarylmethane repeating unit is added to the mixed solution and the mixture is stirred at 40° C. for 1 hour, the content of the imide counter salt further increases and the heat resistance is further improved.

In the preparation of the colored composition, also in the case where bistrifluoromethanesulfonylimide lithium used in the composition 2 is added during the synthesis of a colorant, not during the preparation of the composition, the same effects are obtained. The amount of bistrifluoromethanesulfonylimide lithium to be added is preferably 0.1 moles to 2 moles, and more preferably 0.3 moles to 0.8 moles, with respect to 1 mole of the triarylmethane repeating unit.

What is claimed is:

1. A colored composition comprising:
   a colorant comprising a repeating unit having a triarylmethane structure containing a cation, and a counter anion; and
   a polymerizable compound,
   wherein the repeating unit having the triarylmethane structure containing a cation is represented by General Formula (TP3-1):

TP3-1

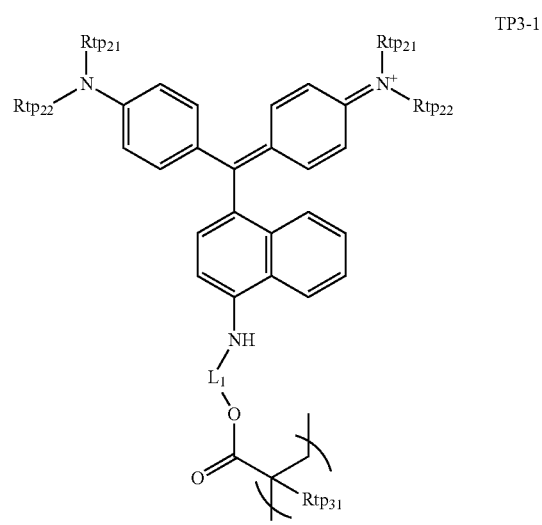

wherein $Rtp_{21}$'s each independently represent a hydrogen atom or an alkyl group having 1 to 6 carbon atoms, and $Rtp_{22}$'s each independently represent an aryl group having 6 to 10 carbon atoms; and $L_1$ represents a divalent linking group having 2 to 30 carbon atoms, and $Rtp_{31}$ represents a hydrogen atom or a methyl group.

2. The colored composition according to claim 1, wherein the counter anion is selected from:
   at least one selected from a fluorine anion, a chlorine anion, a bromine anion, an iodine anion, a cyanide ion, a perchloric acid anion, a borate anion, $PF_6^-$, and $SbF_6^-$, and
   at least one selected from $-SO_3^-$, $-COO^-$, $-PO_4^-$, a structure represented by the following General Formula (A1), and a structure represented by the following General Formula (A2):

General Formula (A1)

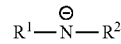

wherein R1 and $R^2$ each independently represent $-SO_2-$ or $-CO-$;

General Formula (A2)

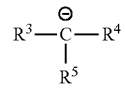

wherein $R^3$ represents $-SO_2-$ or $-CO-$; and $R^4$ and $R^5$ each independently represent $-SO_2-$, $-CO-$, or $-CN$.

3. The colored composition according to claim 1, wherein the repeating unit having the triarylmethane structure containing a cation is represented by the following General Formula (TP3-2):

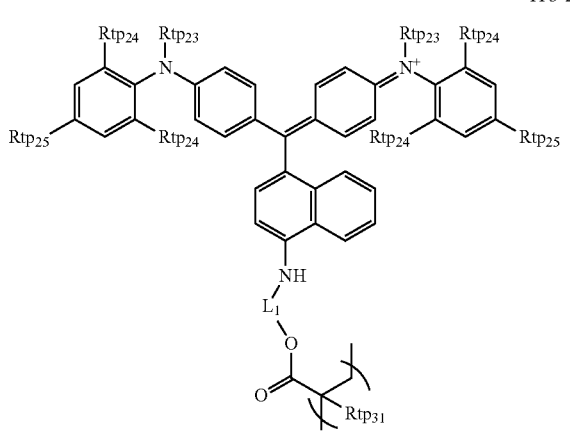

TP3-2 wherein $Rtp_{23}$ and $Rtp_{24}$ each independently represent an alkyl group having 1 to 4 carbon atoms and $Rtp_{25}$ represents a hydrogen atom or an alkyl group having 1 to 3 carbon atoms; $Rtp_{31}$ represents a hydrogen atom or a methyl group; and $L_1$ represents a divalent linking group.

4. The colored composition according to claim 1, wherein the repeating unit having the triarylmethane structure containing a cation is represented by the following General Formula (TP6):

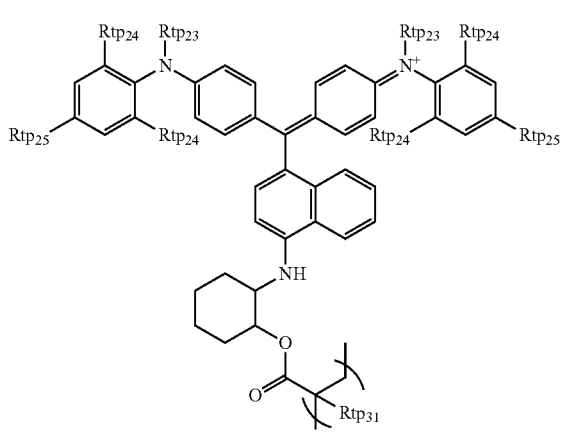

TP6 wherein $Rtp_{23}$ and $Rtp_{24}$ each independently represent an alkyl group having 1 to 4 carbon atoms and $Rtp_{25}$ represents a hydrogen atom or an alkyl group having 1 to 3 carbon atoms; and $Rtp_{31}$ represents a hydrogen atom or a methyl group.

5. The colored composition according to claim 4, wherein in General Formula (TP6), $Rtp_{31}$ is a methyl group.

6. The colored composition according to claim 1, wherein the counter anion is a sulfonylimide anion, a sulfonylmethide anion, or a sulfonic acid anion.

7. The colored composition according to claim 1, wherein the colorant further comprises a repeating unit derived from at least one of a (meth) acrylic acid, a (meth)acrylic acid ester, and a (meth) acrylic acid amide.

8. The colored composition according to claim 1, wherein the counter anion is included in a compound containing a crosslinkable group.

9. The colored composition according to claim 1, wherein the counter anion is included in the repeating unit.

10. The colored composition according to claim 1, further comprising at least one selected from a xanthene dye, a dipyrromethene metal complex compound, an oxazine pigment, and a phthalocyanine pigment.

11. The colored composition according to claim 1, further comprising a photopolymerization initiator.

12. The colored composition according to claim 1, further comprising bistrifluoromethanesulfonylimide lithium.

13. The colored composition according to claim 1, which is used for forming a colored layer of a color filter.

14. A colored cured film obtained by curing the colored composition according to claim 1.

15. A color filter comprising the colored cured film according to claim 14.

16. A solid-state imaging element comprising the color filter according to claim 15.

17. An image display device comprising the color filter according to claim 15.

18. A method for manufacturing a color filter, comprising:
applying the colored composition according to claim 1 onto a support to form a colored composition layer;
patternwise exposing the colored composition layer; and
removing an unexposed area by development to form a colored pattern.

19. A color filter manufactured by the method for manufacturing a color filter according to claim 18.

20. A method for manufacturing a color filter, comprising:
applying the colored composition according to claim 1 onto a support to form a colored composition layer, and curing the colored composition layer to form a colored layer;
forming a photoresist layer on the colored layer;
patterning the photoresist layer by exposure and development to obtain a resist pattern; and
dry-etching the colored layer using a resist pattern as an etching mask.

21. A colored composition comprising:
a colorant comprising a repeating unit having a triarylmethane structure containing a cation, and a counter anion; and
a polymerizable compound,
wherein the repeating unit having the triarylmethane structure containing a cation is represented by the following General Formula (TP4) or (TP5):

179 / 180

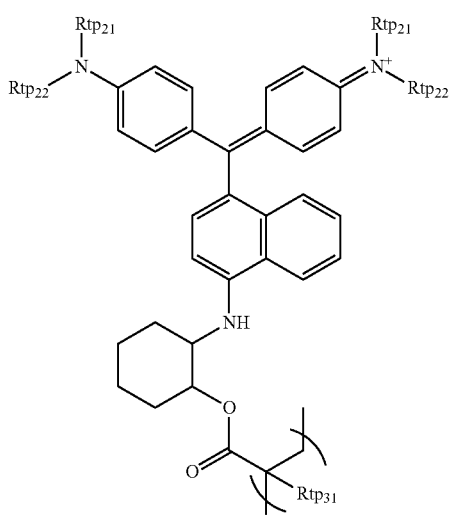

TP4

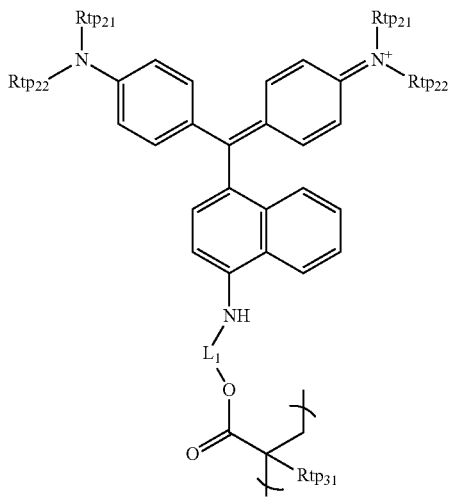

wherein $Rtp_{21}$'s each independently represent a hydrogen atom or an alkyl group having 1 to 6 carbon atoms, and $Rtp_{22}$'s each independently represent an aryl group having 6 to 10 carbon atoms; and $L_1$ represents a divalent linking group having 2 to 30 carbon atoms, and $Rtp_{31}$ represents a hydrogen atom or a methyl group; and at least one of the $Rtp_{21}$'s, the $Rtp_{22}$'s, and $Rtp_{31}$ may be substituted with General Formula (P);

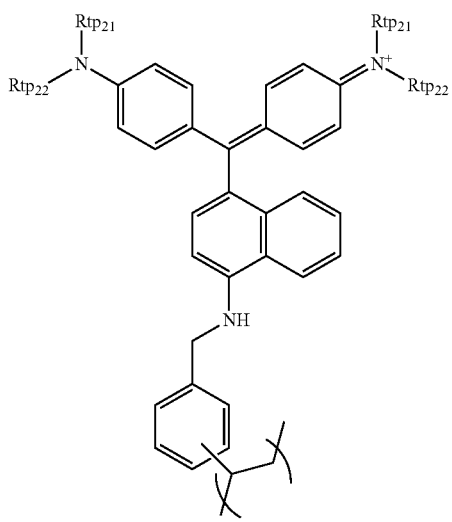

TP5

General Formula (P)

wherein L represents a single bond or a divalent linking group, $X^1$ is selected from $-SO_3^-$, $-COO^-$, $-PO_4^-$, and at least one selected from a group including a structure represented by the following General Formula (A1) and a group including a structure represented by the following General Formula (A2));

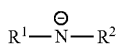

General Formula (A1)

wherein, $Rtp_{21}$'s each independently represent a hydrogen atom or an alkyl group having 1 to 6 carbon atoms and $Rtp_{22}$'s each independently represent an aryl group having 6 to 10 carbon atoms; and $Rtp_{31}$ represents a hydrogen atom or a methyl group.

wherein $R^1$ and $R^2$ each independently represent $-SO_2-$ or $-CO-$

General Formula (A2), and

22. The colored composition according to claim 21, wherein in General Formula (TP4), $Rtp_{31}$ is a methyl group.

23. A colored composition comprising:

a colorant comprising a repeating unit having the triarylmethane structure containing a cation, and a counter anion; and a polymerizable compound, wherein the triarylmethane structure containing a cation is represented by General Formula (TP3-1A):

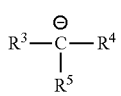

wherein $R^3$ represents $-SO_2-$ or $-CO-$; and $R^4$ and $R^5$ each independently represent $-SO_2-$, $-CO-$, or $-CN$.

24. A compound represented by the following General Formula (TP7):

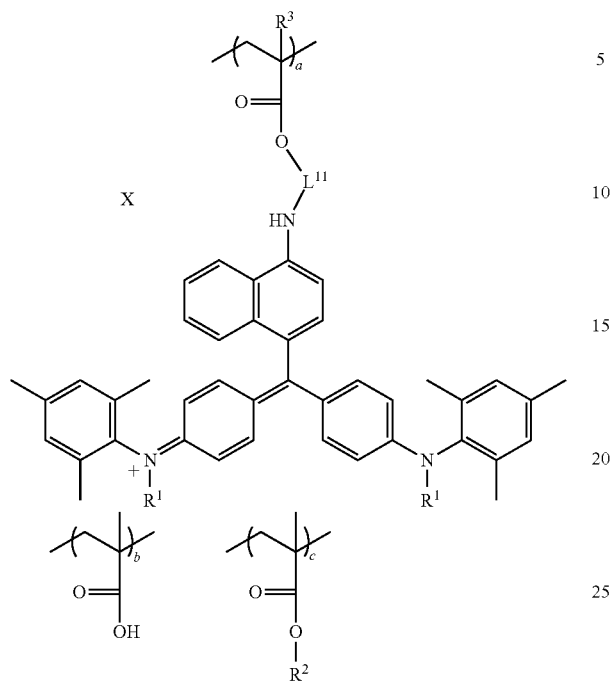

wherein R¹'s each independently represent a hydrogen atom or an alkyl group having 1 to 6 carbon atoms, $R^3$ represents a hydrogen atom or a methyl group, and $L^{11}$ represents a divalent linking group having 2 to 30 carbon atoms; $R^2$ represents a hydrocarbon group having 1 to 10 carbon atoms or a cyclic ether group having 3 to 10 carbon atoms; X represents a compound containing a sulfonylimide anion, a sulfonylmethide anion, or a sulfonic acid anion; and a, b, and c are the molar ratios of the repeating units, a represents a number of more than 0, and b and c each independently represent a number of 0 or more.

25. The compound according to claim 24, represented by the following General Formula (TP8):

wherein R¹'s each independently represent a hydrogen atom or an alkyl group having 1 to 6 carbon atoms, and $R^2$ represents a hydrocarbon group having 1 to 10 carbon atoms or a cyclic ether group having 3 to 10 carbon atoms; X represents a compound containing a sulfonylimide anion, a sulfonylmethide anion, or a sulfonic acid anion; and a, b, and c are the molar ratios of the repeating units, a represents a number of more than 0, and b and c each independently represent a number of 0 or more.

* * * * *